US007482208B2

(12) United States Patent
Kim et al.

(10) Patent No.: US 7,482,208 B2
(45) Date of Patent: Jan. 27, 2009

(54) THIN FILM TRANSISTOR ARRAY PANEL AND METHOD OF MANUFACTURING THE SAME

(75) Inventors: Sang-Gab Kim, Seoul (KR); Je-Min Lee, Gunpo-si (KR); Gwan-Young Cho, Cheonan-si (KR); Jong-Tae Jeong, Suwon-si (KR); In-Ho Song, Seoul (KR); Hee-Hwan Choe, Incheon-si (KR); Sung-Chul Kang, Yongin-si (KR); Ho-Min Kang, Suwon-si (KR); Beohm-Rock Choi, Seoul (KR); Joon-Hoo Choi, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 25 days.

(21) Appl. No.: 10/572,234

(22) PCT Filed: Sep. 16, 2004

(86) PCT No.: PCT/KR2004/002376

§ 371 (c)(1), (2), (4) Date: Mar. 17, 2006

(87) PCT Pub. No.: WO2005/027187

PCT Pub. Date: Mar. 24, 2005

(65) Prior Publication Data

US 2007/0065991 A1 Mar. 22, 2007

(30) Foreign Application Priority Data

Sep. 18, 2003 (KR) ...................... 10-2003-0064816
Sep. 25, 2003 (KR) ...................... 10-2003-0066484
Apr. 12, 2004 (KR) ...................... 10-2004-0024951

(51) Int. Cl.
*H01L 21/00* (2006.01)
*H01L 21/302* (2006.01)

(52) U.S. Cl. ...................... 438/149; 438/151; 438/689; 438/704; 438/708; 257/E51.004

(58) Field of Classification Search ...................... None
See application file for complete search history.

(56) References Cited

U.S. PATENT DOCUMENTS 5,986,723 A 11/1999 Nakamura et al.

(Continued)

FOREIGN PATENT DOCUMENTS

CN 1290922 4/2001

OTHER PUBLICATIONS

Patent Abstracts of Japan, Publication No. 10-253985, Sep. 25, 1998, 1 p.

(Continued)

*Primary Examiner*—Matthew Smith
*Assistant Examiner*—Phillip Green
(74) *Attorney, Agent, or Firm*—MacPherson Kwok Chen & Heid, LLP.; Alma P. Levy

(57) ABSTRACT

The present invention relates to a thin film transistor array panel, a liquid crystal display, and a manufacturing method of the same. A TFT array for a LCD or an EL display is used as a circuit board for driving the respective pixels in an independent manner. The present invention provides pixel electrodes and contact assistants, which connect expansions of gate lines and data lines to an external circuit, having a structure of double layers including IZO layer and ITO layer. The ITO layer is disposed on the IZO layer. In the present invention, the pixel electrodes are formed to have double layers of IZO layer and ITO layer to avoid wires from getting damage by the ITO etchant and to prevent prove pins from having accumulation of foreign body during the gross test. In the present invention, the contact assistants may only be formed to have double layers of IZO layer and ITO layer to prevent prove pins from having accumulation of foreign body during the gross test. Since the consumption of ITO is reduced, manufacturing cost decreases.

13 Claims, 114 Drawing Sheets

U.S. PATENT DOCUMENTS

| | | | | |
|---|---|---|---|---|
| 6,522,376 | B1 | 2/2003 | Park et al. | |
| 7,329,365 | B2 * | 2/2008 | Cho et al. | 216/83 |
| 2001/0012077 | A1 | 8/2001 | Choi | |
| 2002/0117691 | A1 | 8/2002 | Choi et al. | |
| 2006/0290829 | A1 * | 12/2006 | Kim | 349/44 |

FOREIGN PATENT DOCUMENTS

| | | | |
|---|---|---|---|
| CN | 1328696 | A | 12/2001 |
| CN | 1383214 | | 12/2002 |
| CN | 1392960 | | 1/2003 |
| CN | 1421906 | A | 6/2003 |
| JP | 10-253985 | | 9/1887 |
| JP | 10-186412 | | 7/1998 |
| JP | 11-264995 | | 9/1999 |
| JP | 2001-318389 | | 11/2001 |
| JP | 2002-49049 | | 2/2002 |
| KR | 2001-0057019 | | 7/2001 |
| KR | 2001-0113266 | | 12/2001 |
| KR | 20010113266 | * | 12/2001 |
| KR | 2002-0010213 | | 2/2002 |
| KR | 2002-0056701 | | 7/2002 |
| KR | 2004097586 | * | 11/2004 |
| KR | 2005249316 | * | 11/2005 |

OTHER PUBLICATIONS

Korean Patent Abstracts, Publication No. 1020010057019, Jul. 4, 2001, 1 p.

Korean Patent Abstracts, Publication No. 1020010113266, Dec. 28, 2001, 1 p.

Patent Abstracts of Japan, Publication No. 10-186412, Jul. 14, 1998, 1 p.

Patent Abstracts of Japan, Publication No. 11-264995, Sep. 28, 1999, 1 p.

Patent Abstracts of Japan, Publication No. 2001-318389, Nov. 16, 2001, 1 p.

Patent Abstracts of Japan, Publication No. 2002-049049, Feb. 15, 2002, 1 p.

Korean Patent Abstracts, Publication No. 1020010113266, Dec. 28, 2001, 2 pp.

Korean Patent Abstracts, Publication No. 1020020010213, Feb. 4, 2002, 1 p.

Korean Patent Abstracts, Publication No. 1020020056701, Jul. 10, 2002, 1 p.

English Language Abstract, Publication No. CN1290922, Apr. 11, 2001, 1 p.

English Language Abstract, Publication No. CN1383214, Dec. 4, 2002, 1 p.

English Language Abstract, International Publication No. WO 02/31544 corresponding to Publication No. CN 1392960, Jan. 22, 2003, 54 pp.

* cited by examiner

THIN FILM TRANSISTOR ARRAY PANEL AND METHOD OF MANUFACTURING THE SAME

BACKGROUND OF THE INVENTION (a) Field of the Invention

The present invention relates to a wire structure, a thin film transistor array panel having the wire structure, and a manufacturing method of the same.

(b) Description of the Related Art

Generally, a thin film transistor array ("TFT") panel for a liquid crystal display ("LCD") or an electro-luminescence ("EL") display is used as a circuit board for driving the respective pixels in an independent manner. The TFT array panel includes a scanning signal wire or a gate wire transmitting scanning signals, an image signal wire or a data wire transmitting image signals, TFTs connected to the gate and the data wire, pixel electrodes connected to the TFTs, a gate insulating layer covering the gate wire for insulation, and a passivation layer covering the TFTs and the data wire for insulation. The TFT includes a gate electrode, which is a part of the gate wire, a semiconductor layer forming a channel, source and drain electrodes, which are parts of the data wire, a gate insulating layer, and a passivation layer. The TFT is a switching element for transmitting the image signals from the data wire to the pixel electrode in response to the scanning signals from the gate wire.

The TFT array panel has been extensively used for the LCD. An LCD uses separate light sources. Especially, a transmitting type LCD and a trans-reflection type LCD have pixel electrodes made of transmittable conductive material such as indium tin oxide (ITO) and indium zinc oxide (IZO).

Both of ITO and IZO have demerits.

ITO needs strong acid as an etchant. Strong etchant can smear through pinholes of insulating layer and corrode data or gate wires.

IZO does not induce such a problem but is easily scribed by a test probe and stick to it. This feature of IZO disturb gross test which is done before mounting driving IC by increasing contact resistance of the test probe.

SUMMARY OF THE INVENTION

It is an object of the present invention to provide a thin film transistor array panel without such problems.

The present invention provides a pixel electrode formed of double layers including IZO and ITO or contact assistants formed of double layers including IZO and ITO, that connecting expansions of gate lines and data lines to an external circuit.

BRIEF DESCRIPTION OF THE DRAWINGS

FIG. 5B is a sectional view of the TFT array panel shown in FIG. 5A taken along the line Vb-Vb' in the step following the step shown in FIG. 4B;

DESCRIPTION OF THE REFERENCE NUMERALS IN THE DRAWINGS

Figure 1:
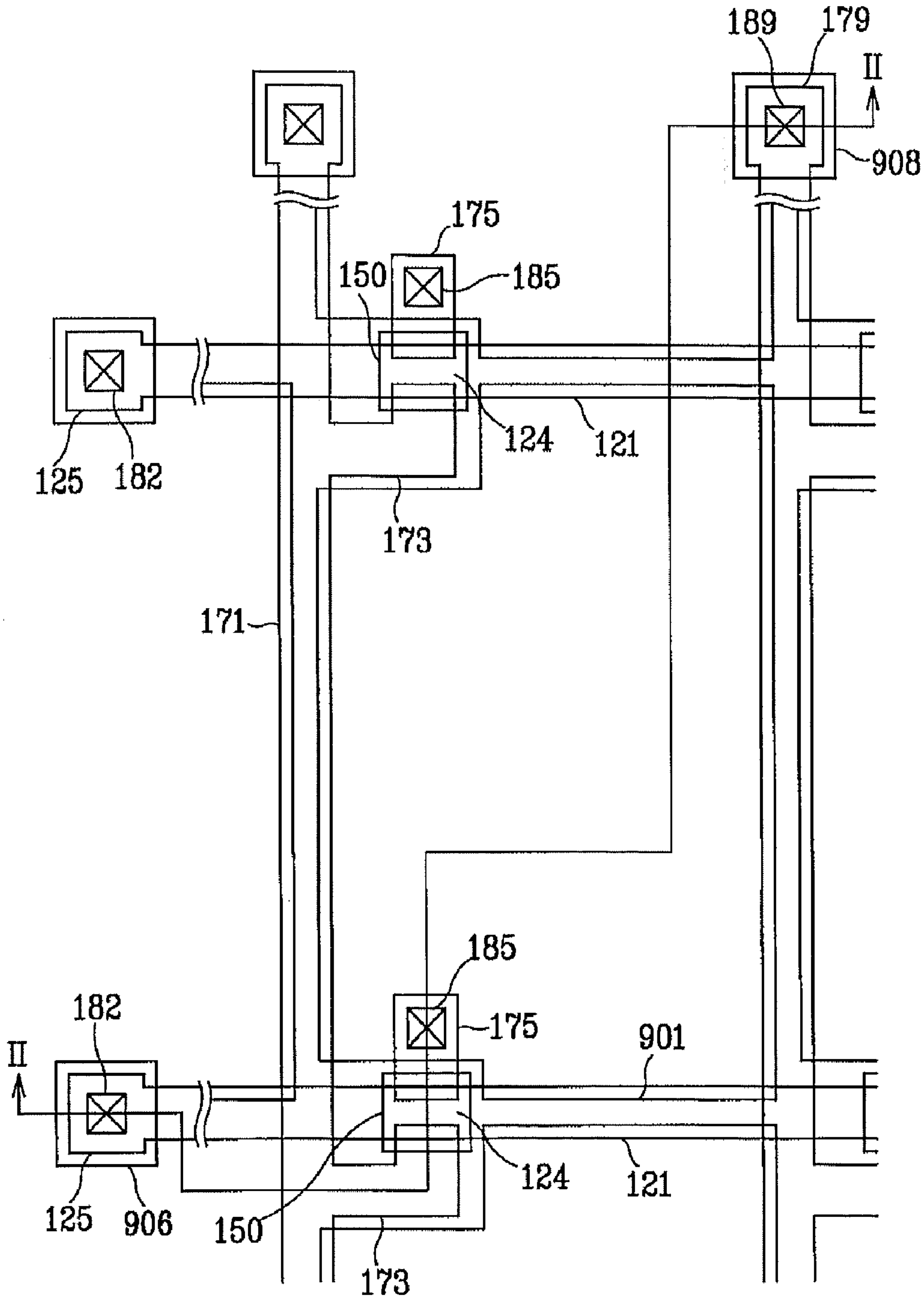
FIG. 1 is a layout view of a TFT array panel for a LCD according to an embodiment of the present invention.

| | |
|---|---|
| 110: an insulating substrate | 124: a gate electrode |
| 131: a storage electrode line | 140: a gate insulating layer |
| 150: an amorphous silicon layer | 160: a doped amorphous silicon layer |
| 170: a conductor layer | 173: a source electrode |
| 175: a drain electrode | 177: a storage conductor |
| 180: a passivation layer | 182, 185, 187, 189: contact holes |
| 901: a pixel electrode | 906, 908: contact assistants |

DETAILED DESCRIPTION OF THE PREFERRED EMBODIMENTS

Preferred embodiments of the present invention will now be described more fully hereinafter with reference to the accompanying drawings, in which preferred embodiments of the invention are shown. The present invention may, however, be embodied in different forms and should not be construed as being limited to the embodiments set forth herein. Rather, these embodiments are provided so that this disclosure will be thorough and complete, and will fully convey the scope of the invention to those skilled in the art.

In the drawings, the thickness of layers, films, and regions are exaggerated for clarity. Like numerals refer to like elements throughout. It will be understood that when an element such as a layer, film, region, or substrate is referred to as being "on" another element, it can be directly on the other element or intervening elements may also be present.

Now, TFT array panels and manufacturing methods thereof according to embodiments of this invention will be described in detail with reference to the accompanying drawings for ordinary skill in the art to easily carry out.

As shown in FIG. 1, a TFT array panel according to an embodiment includes thin film transistors, pixel electrodes, and signal lines which are disposed on a display area and expansions of the signal lines disposed on the boundary area.

Figure 2:
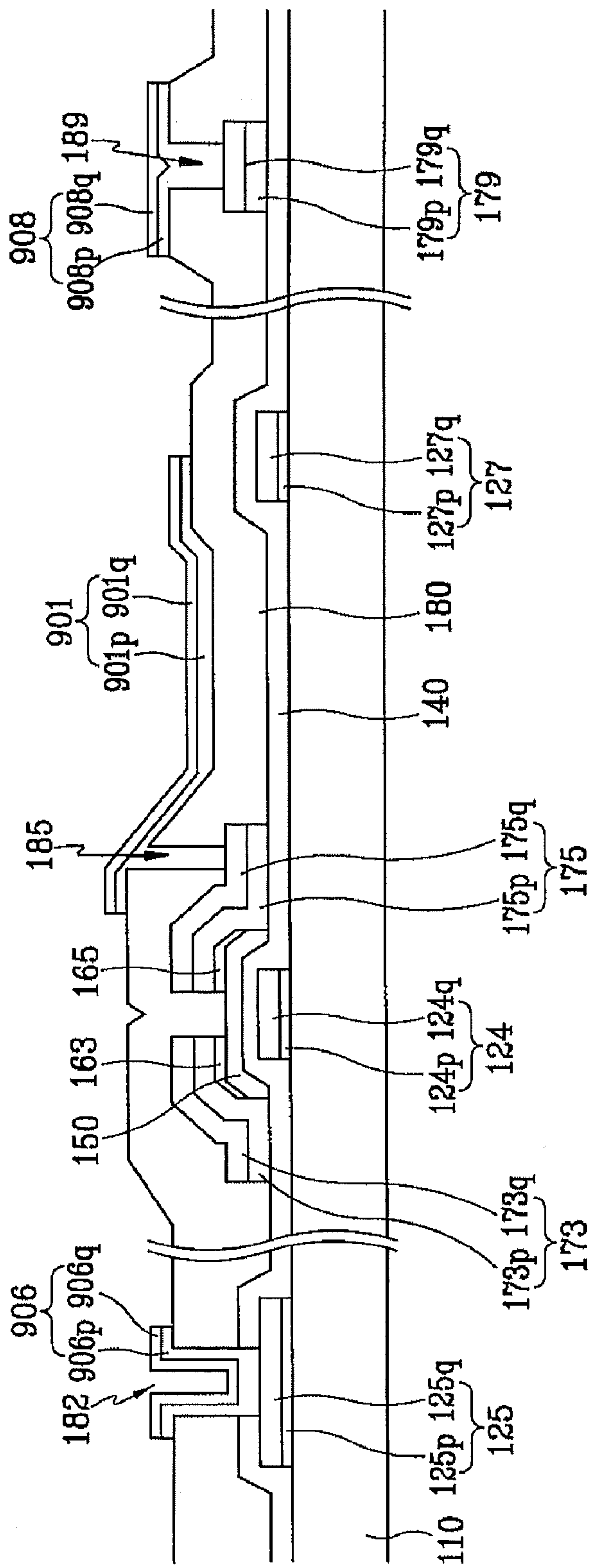
FIG. 2 is a sectional view of the TFT array panel shown in FIG. 1 taken along the line II-II.

FIG. 1 is a layout view of a TFT array panel for an LCD according to a first embodiment of the present invention, and FIG. 2 is a sectional view of the TFT array panel shown in FIG. 1 taken along the line II-II.

A plurality of gate lines 121 for transmitting gate signals are formed on an insulating substrate 110.

Each gate line 121 includes a plurality of portions projecting downward to form a plurality of gate electrodes 124 and an expansion 125 having a large area for contact with another layer or an external device. Larger portion of the gate line 121 is disposed on a display area and the expansion 125 of the gate line 121 is disposed on the boundary area of the display area.

The gate lines 121 include two films having different physical characteristics, a lower film 121*p* and an upper film 121*q*. The upper film 121*q* is preferably made of low specific resistance metal including Al containing metal such as Al and Al alloy for reducing signal delay or voltage drop in the gate lines 121. On the other hand, the lower film 121*p* is preferably made of material such as Cr, Mo, Mo alloy such as MoW, Ta and Ti, which has good physical, chemical, and electrical contact characteristics with other materials such as indium tin oxide (ITO) and indium zinc oxide (IZO). A good example of combination of the lower film 121*p* and the upper film 121*q* is Cr layer and Al—Nd alloy layer. In FIG. 2, the lower and the upper films of the gate electrodes 124 are indicated by reference numerals 124*p* and 124*q*, respectively, and the lower and the upper films of the expansions 125 are indicated by reference numerals 125*p* and 125*q*, respectively.

In addition, the lateral sides of the upper and lower films 121*p* and 121*q* are inclined relative to a surface of the substrate 110, and the inclination angle thereof ranges about 30-80 degrees.

A gate insulating layer 140 preferably made of silicon nitride (SiNx) is formed on the gate lines 121.

A plurality of semiconductors 150 preferably made of hydrogenated amorphous silicon (abbreviated to "a-Si") are formed on the gate insulating layer 140. Each semiconductor 150 is disposed on the gate electrodes 124 and covers the gate electrode 124 and the boundary region of the gate electrode 124.

A plurality of ohmic contact islands 163 and 165 preferably made of silicide or n+hydrogenated a-Si heavily doped with n type impurity are formed on the semiconductor islands 150. The ohmic contact islands 163 and 165 are located in pairs on the semiconductor islands 150.

The lateral sides of the semiconductor stripes 151 and the ohmic contacts 163 and 165 are inclined relative to a surface of the substrate 110, and the inclination angles thereof are preferably in a range between about 30-80 degrees.

A plurality of data lines 171 and a plurality of drain electrodes 175 are formed on the ohmic contacts 163 and 165 and the gate insulating layer 140.

The data lines 171 for transmitting data voltages extend substantially in the longitudinal direction and intersect the gate lines 121. Each data line 171 includes an expansion 179 having a larger area for contact with another layer or an external device. Larger portion of the data line 171 is disposed on the display area but the expansion 179 is disposed on the boundary area.

A plurality of branches of each data line 171, which project toward the drain electrodes 175, form a plurality of source electrodes 173. Each pair of the source electrodes 173 and the drain electrodes 175 are separated from each other and opposite each other with respect to a gate electrode 124. A gate electrode 124, a source electrode 173, and a drain electrode 175 along with the semiconductor islands 150 form a TFT having a channel formed in the semiconductor islands 150 disposed between the source electrode 173 and the drain electrode 175.

The data lines 171 and the drain electrodes 175 include a lower film 171*p* and 175*p* preferably made of Mo, a Mo alloy, and Cr and an upper film 171*q* and 175*q* located thereon and preferably made of an Al containing metal or an Ag containing metal. The expansion 179 of the data line 171 also includes an upper film 179*q* and a lower film 179*p*.

Like the gate lines 121, the upper films 171*p*, 175*p* and the lower films 171*q* and 175*q* of the data lines 171 and the drain electrodes 175 have tapered lateral sides relative to the surface of the substrate 110, and the inclination angles thereof range about 30-80 degrees.

The ohmic contacts 163 and 165 are interposed only between the underlying semiconductor 150 and the overlying source electrodes 173 and the overlying drain electrodes 175 thereon and reduce the contact resistance therebetween. The semiconductor 150 includes exposed portions, which are not covered with the source electrodes 173 and the drain electrodes 175.

A passivation layer 180 is formed on the data lines 171 and the drain electrodes 175 and exposed portions of the semiconductors 150. The passivation layer 180 is preferably made of photosensitive organic material having a good flatness characteristic, low dielectric insulating material such as a-Si:C:O and a-Si:O:F formed by plasma enhanced chemical vapor deposition (PECVD), or inorganic material such as silicon nitride and silicon oxide.

The passivation layer 180 has a plurality of contact holes 185 and 189 exposing the drain electrodes 175 and the expansions 179 of the data lines 171, respectively. The passivation layer 180 and the gate insulating layer 140 have a plurality of contact holes 182 exposing the expansion 125 of the gate lines 121.

A plurality of pixel electrodes 901 and a plurality of contact assistants 906 and 908 are formed on the passivation layer 180.

The pixel electrodes 901 have double layers of a lower film 901*p* and an upper film 901*q*. Here, the lower film 901*p* is made of IZO and the upper film 901*q* is made of ITO.

The pixel electrodes 901 are physically and electrically connected to the drain electrodes 175 through the contact holes 185 such that the pixel electrodes 901 receive the data voltages from the drain electrodes 175.

The pixel electrodes 901 supplied with the data voltages generate electric fields in cooperation with a common electrode (not shown) on another panel (not shown), which reorient liquid crystal molecules in a liquid crystal layer (not shown) disposed therebetween.

A pixel electrode 901 and a common electrode form a liquid crystal capacitor, which stores applied voltages after turn-off of the TFT. An additional capacitor called a "storage capacitor," which is connected in parallel to the liquid crystal capacitor, may be provided for enhancing the voltage storing capacity.

The contact assistants 906 and 908 are connected to the exposed expansions 125 of the gate lines 121 and the exposed expansions 179 of the data lines 171 through the contact holes 182 and 189, respectively. The contact assistants 906 and 908 protect the expansions 125 and 179 and complement the adhesion between the expansions 125 and 179 and external devices. The contact assistants 906 and 908 are not an essential element. Therefore, they maybe omitted The contact assistants 906 and 908 have double layers of lower films 906_p_ and 908_p_ and upper films 906_q_ and 908_q_. Here, the lower films 906_p_ and 908_p_ are made of IZO and the upper films 906_q_ and 908_q_ are made of ITO.

Here, the IZO layers 901_p_, 906_p_, and 908_p_ have a thickness between 500 Å to 1500 Å and the ITO layers 901_q_, 906_q_, and 908_q_ have a thickness between 50 Å to 250 Å. Especially, the IZO layers 901_p_, 906_p_, and 908_p_ preferably have thickness of 900 Å and the ITO layers 901_q_, 906_q_, and 908_q_ have thickness of 200 Å.

The thicknesses of the IZO layers and the ITO layers are determined by considering processing conditions such as an etching time, a condition that the ITO layers are not breakable by the probe pin during gross test, ability of deposition equipments, and light transmission ratio.

With regard to etching time, it takes about 130 second to etch 400 Å of ITO layer by an ITO etchant and it takes about 45 second to etch 900 Å of IZO layer by an IZO etchant. It takes about 60 second to etch 900 Å of IZO layer and 200 A of ITO layer by an IZO etchant. The etching time takes longer as the thickness of the IZO layer and the ITO layer is going thicker. When the thickness of the ITO layer is over some value, the ITO layer is not etched by the IZO etchant. When the IZO layer and the ITO layer have excessive thicknesses, the light transmission ratio is degraded. When both the etching and light transmission are considered, it is preferable that the IZO layer has a thickness under 1,500 Å and the ITO layer has a thickness under 250 Å .

Next, the ITO layer preferably has a thickness over some value to avoid breaking by probe pin during the gross test. Deposition equipment of the ITO layer has limitation of deposition ability. When these things are considered, it is preferable that the ITO layer has a thickness of over 50 Å. When resistance of the pixel electrode is considered, the IZO layer preferably has a thickness over 500 Å.

A method of manufacturing a TFT array panel will be now described in detail with reference to FIGS. 3A to 6B as well as FIGS. 1 and 2.

FIGS. 3A, 4A, 5A and 6A are layout views sequentially illustrating the intermediate steps of a method of manufacturing a TFT array panel for an LCD according to an embodiment of the present invention. FIG. 3B is a sectional view of the TFT array panel shown in FIG. 3A taken along the line IIIb-IIIb'. FIG. 4B is a sectional view of the TFT array panel shown in FIG. 4A taken along the line IVb-IVb' in the step following the step shown in FIG. 3B. FIG. 5B is a sectional view of the TFT array panel shown in FIG. 5A taken along the line Vb-Vb' in the step following the step shown in FIG. 4B. FIG. 6B is a sectional view of the TFT array panel shown in FIG. 6A taken along the line VIb-VIb' in the step following the step shown in FIG. 5B.

Two conductive films, a lower conductive film and an upper conductive film are sputtered in sequence on an insulating substrate 110 such as transparent glass. The upper conductive film is preferably made of an Al containing metal and preferably has a thickness of about 2,500 Å. The Al—Nd target preferably includes 2 atm % of Nd.

Figure 3A:
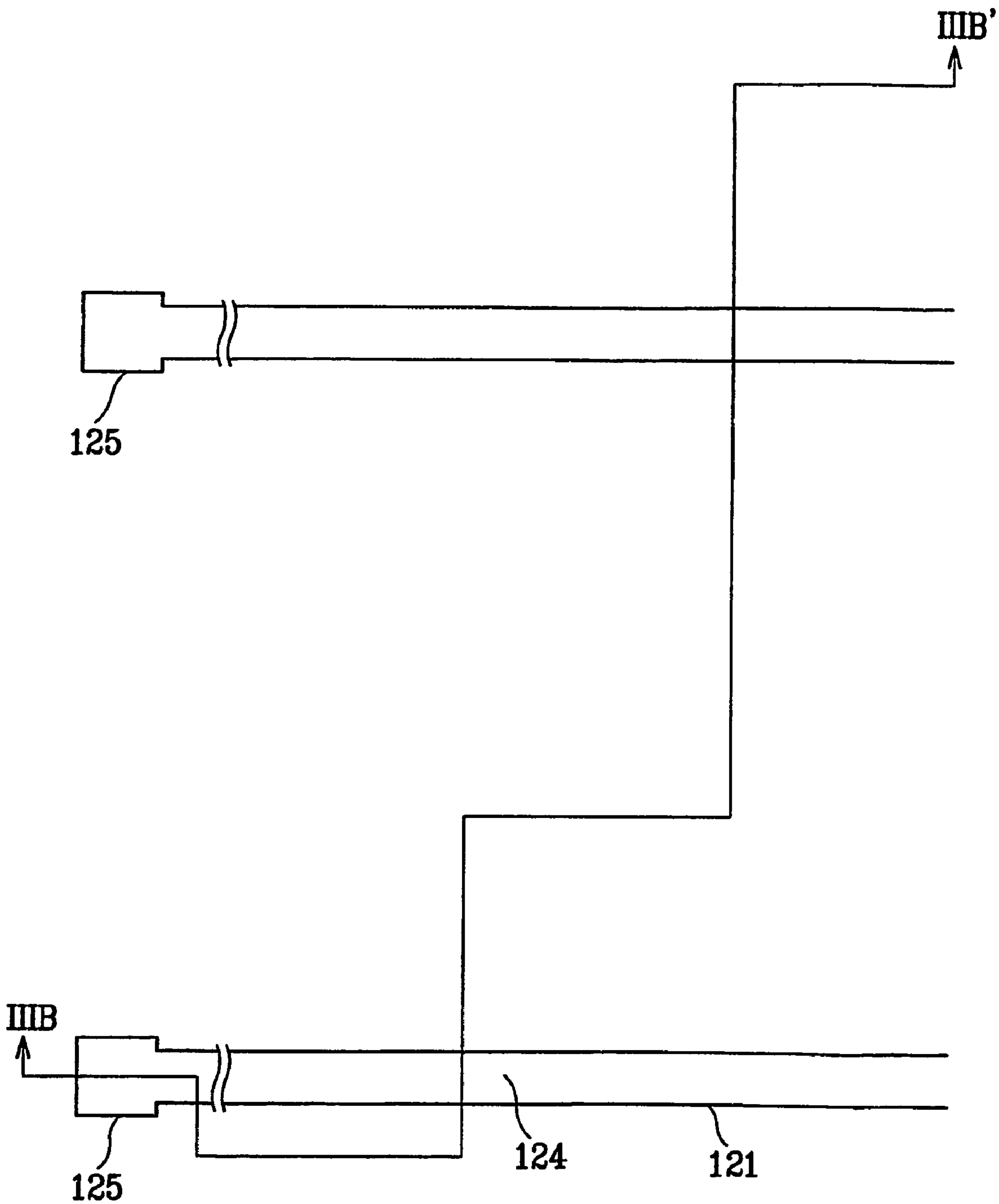
FIGS. 3A, 4A, 5A and 6A are layout views sequentially illustrating the intermediate steps of a method of manufacturing a TFT array panel for an LCD according to an embodiment of the present invention.
Figure 3B:
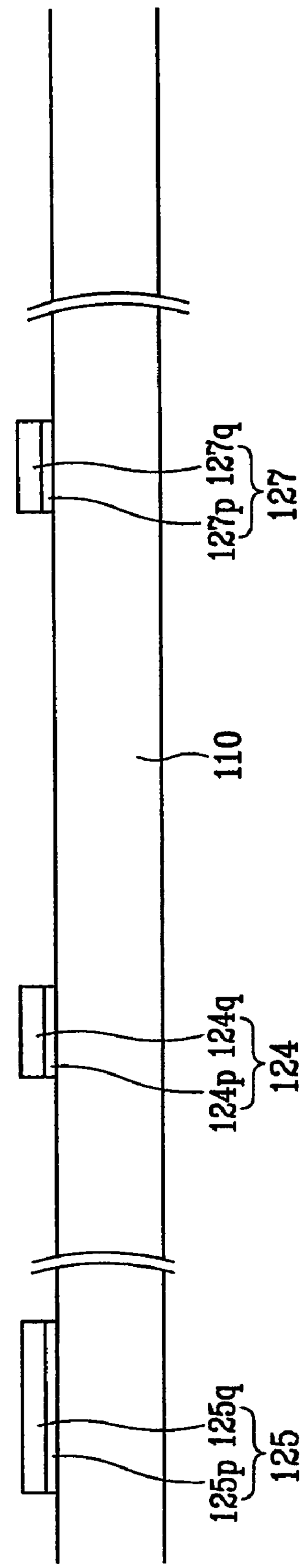
FIG. 3B is a sectional view of the TFT array panel shown in FIG. 3A taken along the line IIIb-IIIb'.

Referring to FIGS. 3A and 3B, the upper conductive film and the lower conductive film are patterned in sequence by photo-etching with a photoresist pattern to form a plurality of gate lines 121 including a plurality of gate electrodes 124.

Figure 4A:
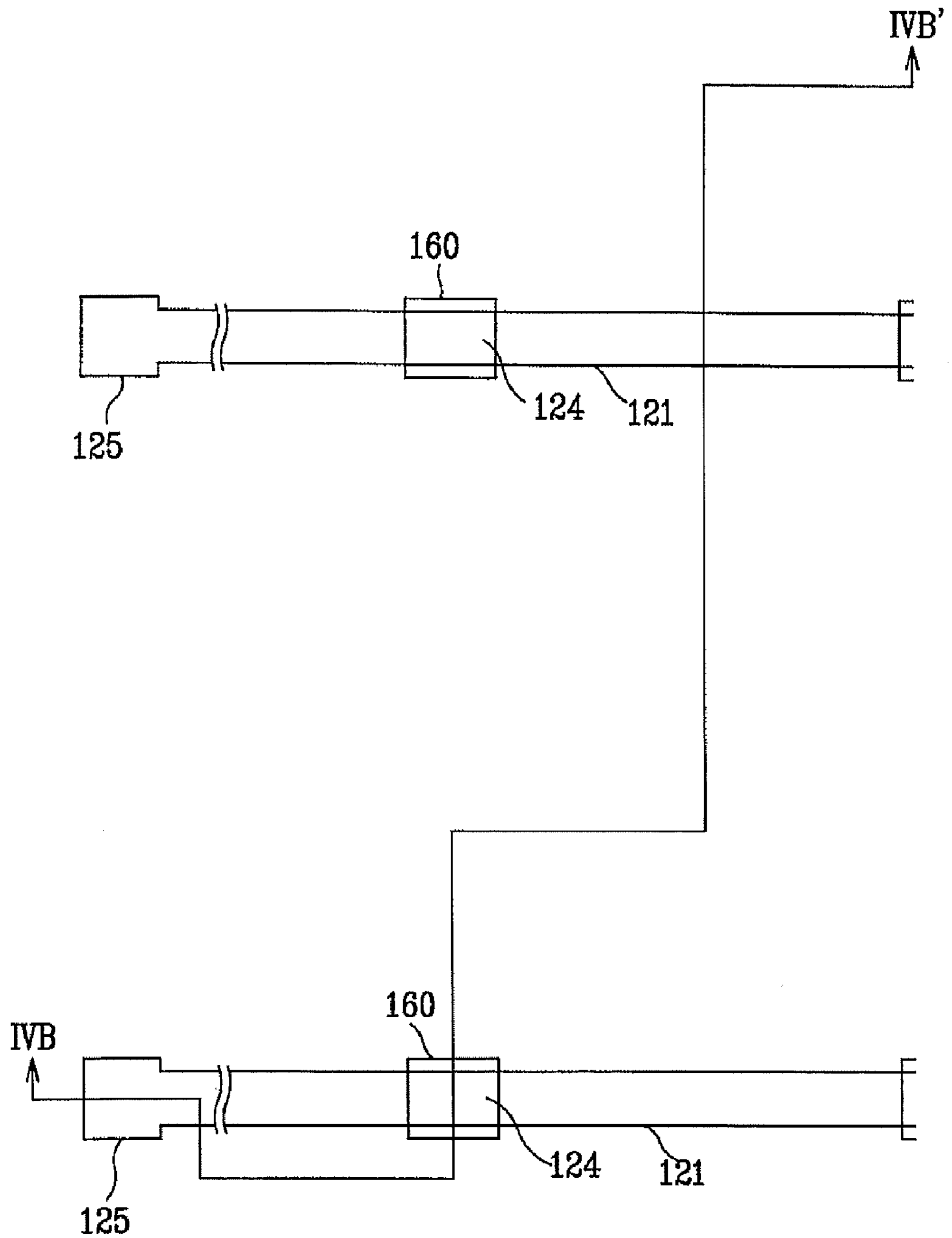
Figure 4B:
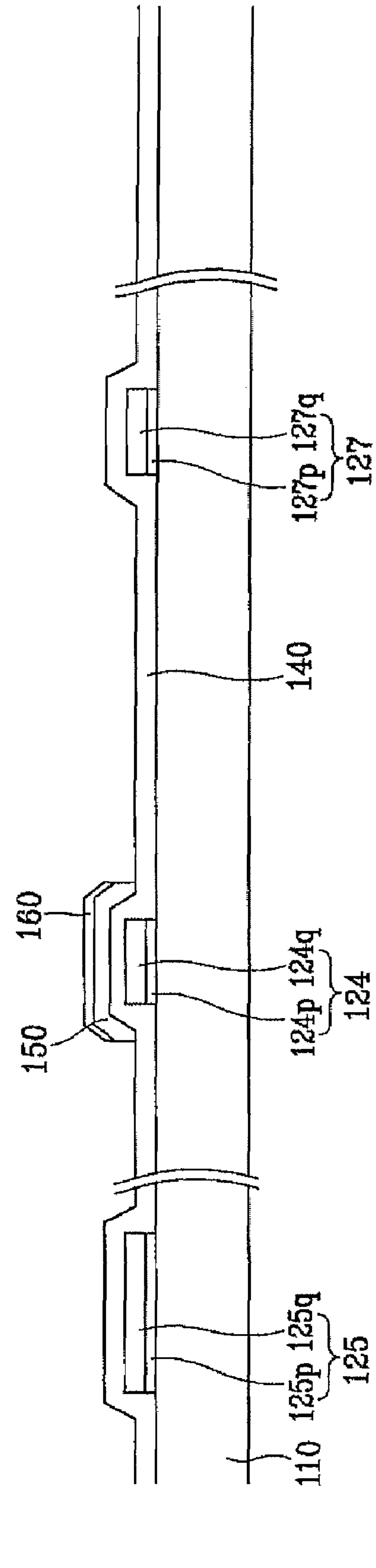
FIG. 4B is a sectional view of the TFT array panel shown in FIG. 4A taken along the line IVb-IVb' in the step following the step shown in FIG. 3B.

Referring to FIGS. 4A and 4B, after sequential deposition of a gate insulating layer 140, an intrinsic a-Si layer, and an extrinsic a-Si layer, the extrinsic a-Si layer and the intrinsic a-Si layer are photo-etched to form a plurality of extrinsic semiconductors 160 and a plurality of intrinsic semiconductors 150. The gate insulating layer 140 is preferably made of silicon nitride with thickness of about 2,000 Å to about 5,000 Å, and the deposition temperature is preferably in a range between about 250° C. and about 500° C.

Figure 5A:
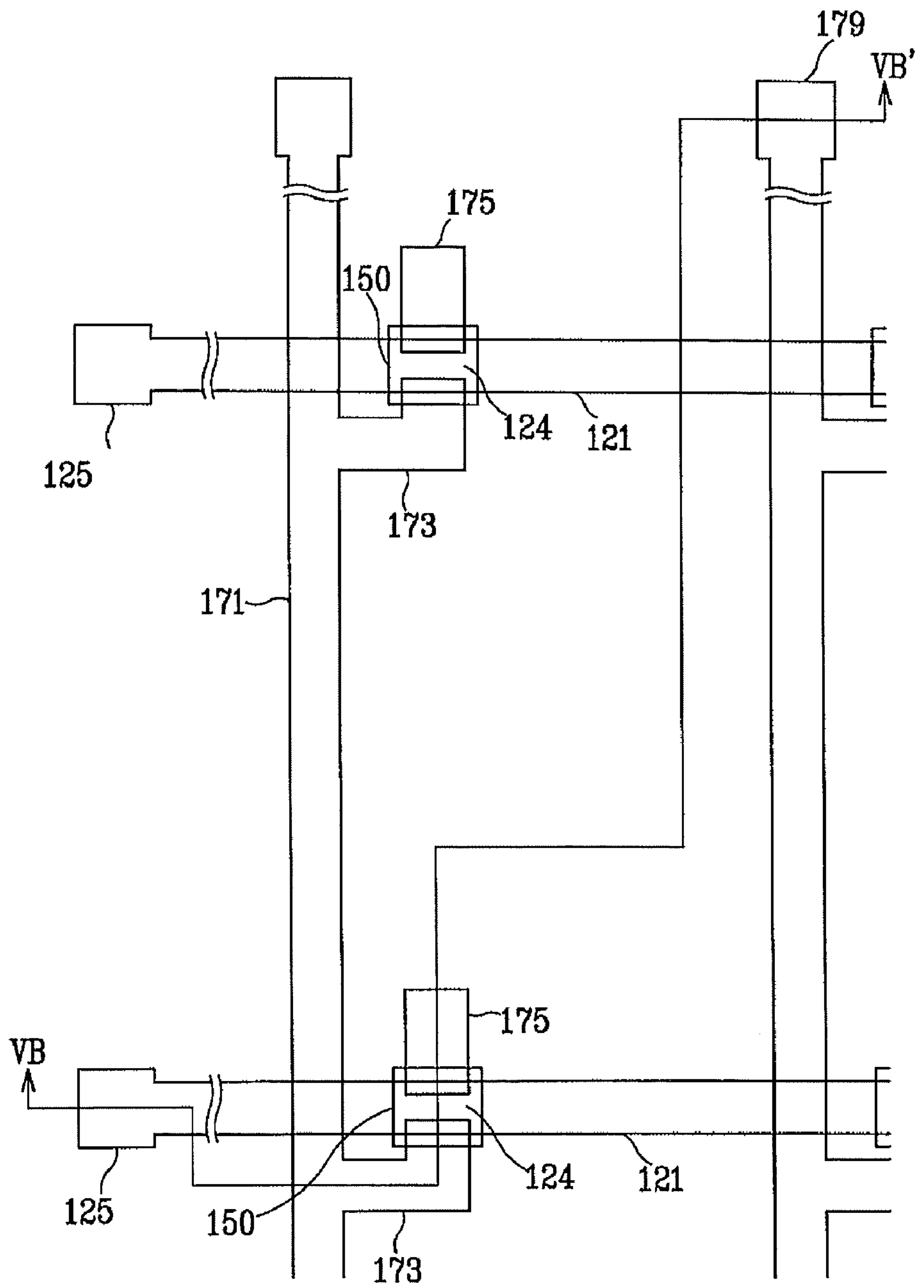

Referring to FIGS. 5A and 5B, two conductive films, a lower conductive film and an upper conductive film are sputtered in sequence. The lower conductive film is preferably made of a metal such as Cr, Mo, and Mo alloy and preferably has a thickness of about 500 Å. The upper conductive film preferably has a thickness of about 2,500 Å. The target for the upper film is preferably made of Al or Al—Nd containing 2 atomic % of Nd. The sputtering temperature is preferably about 150° C.

Next, the upper and lower conductive films are etched to form a plurality of data lines 171 including a plurality of source electrodes 173 and a plurality of drain electrodes 175. At this time, the upper and lower films may be etched by a wet etch simultaneously or the upper film is etched by a wet etch and the lower film is etched by a dry etch. When the lower film 171_p_ is made of Mo or a Mo alloy, it may be etched along with the upper film 171_q_ under a etch condition.

Next, portions of the extrinsic semiconductors 160, which are not covered with the data lines 171 and the drain electrodes 175 are removed by etch to complete a plurality of ohmic contacts 163 and 165 and to expose portions of the intrinsic semiconductors 150. Oxygen plasma treatment may follow thereafter in order to stabilize the exposed surfaces of the semiconductors 150.

Figure 6A:
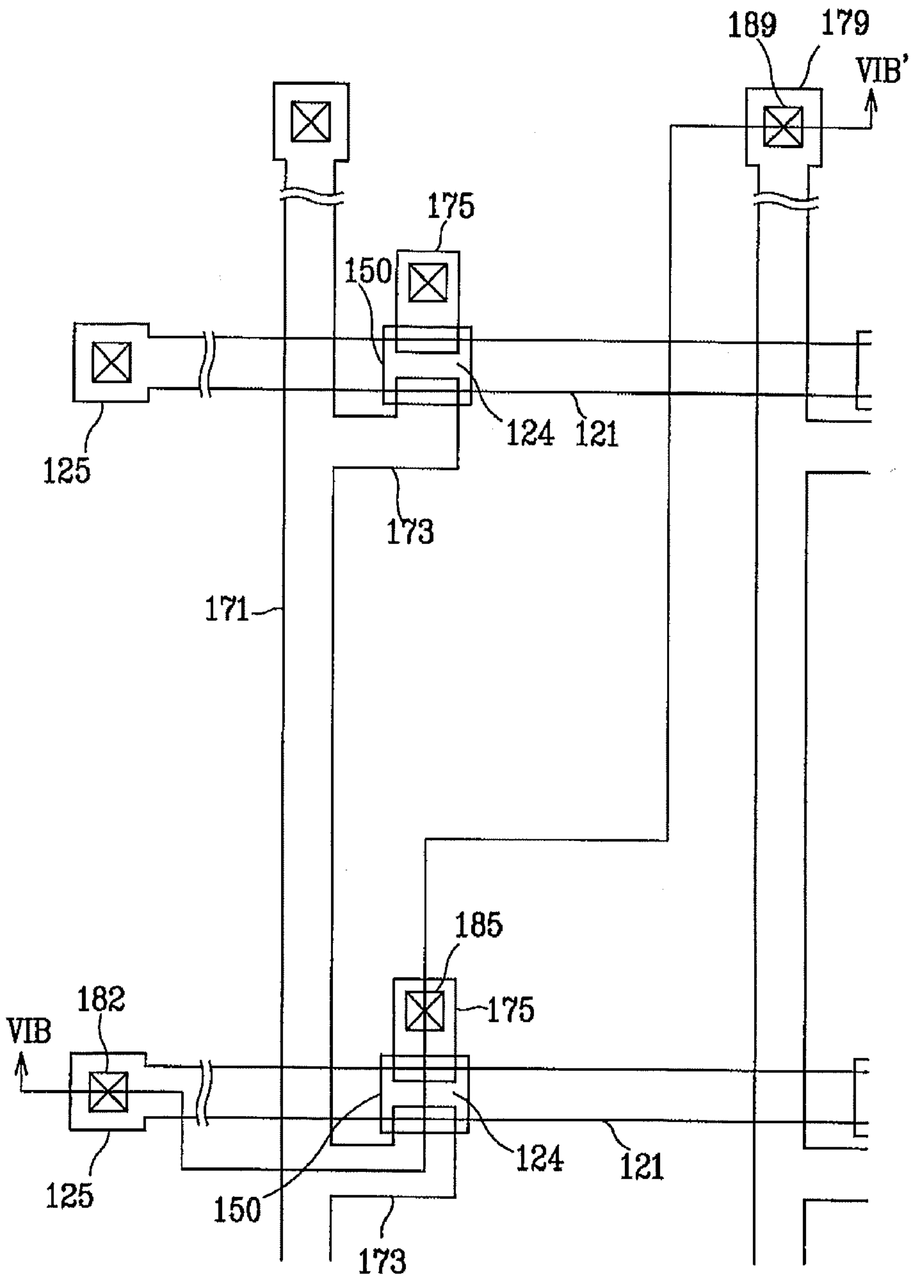
Figure 6B:
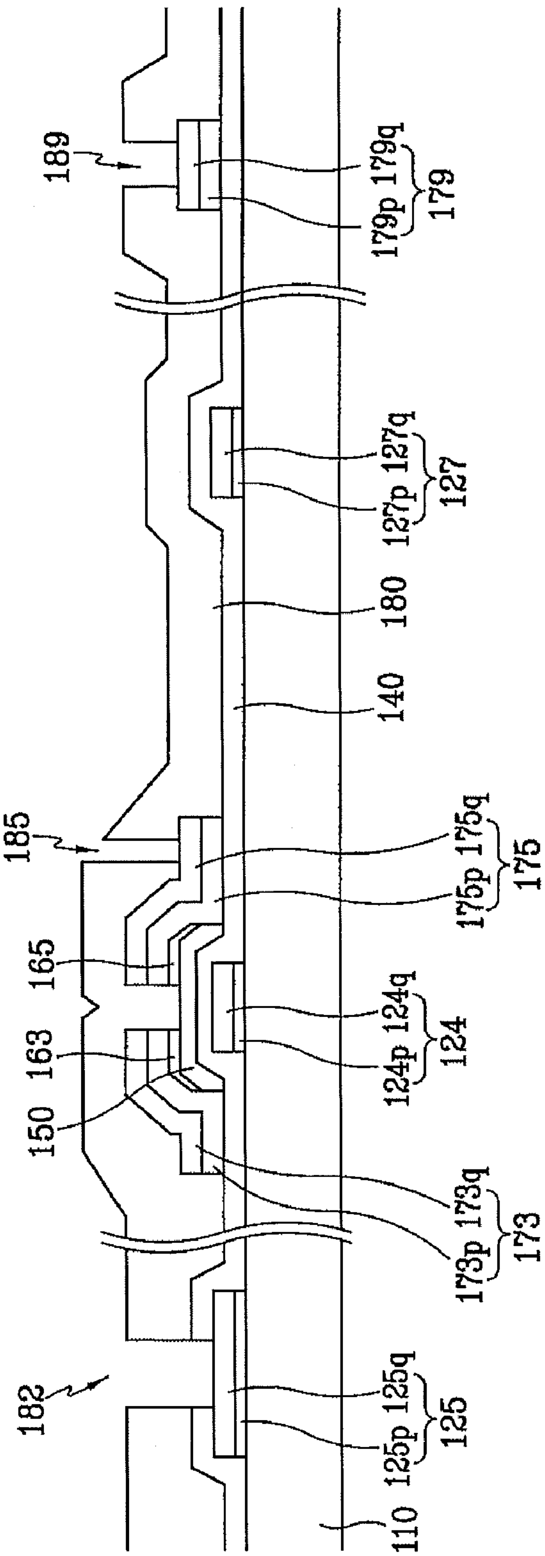
FIG. 6B is a sectional view of the TFT array panel shown in FIG. 6A taken along the line VIb-VIb' in the step following the step shown in FIG. 5B.
Figure 16A:
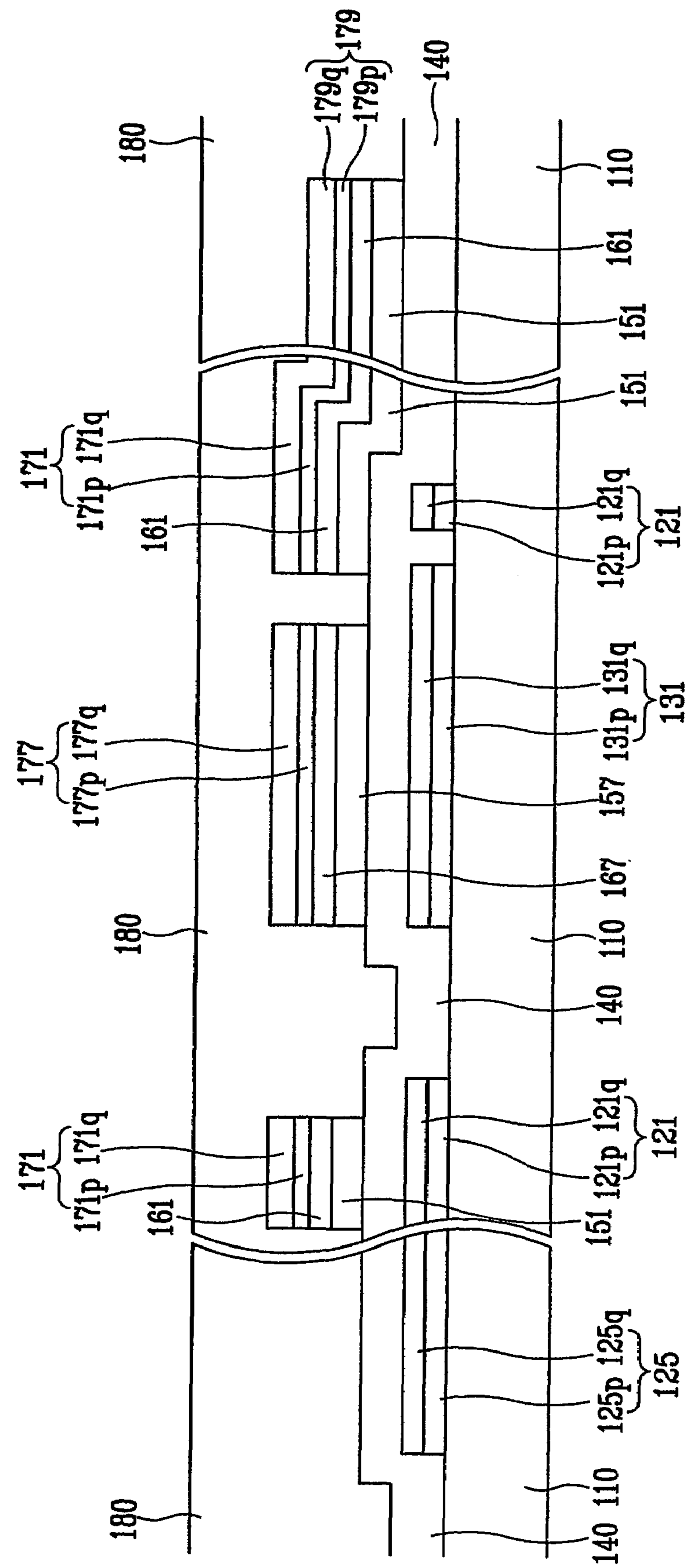
FIGS. 16A and 16B are sectional views of the TFT array panel in the step following the step illustrated in FIGS. 15A and 15B.
Figure 16B:
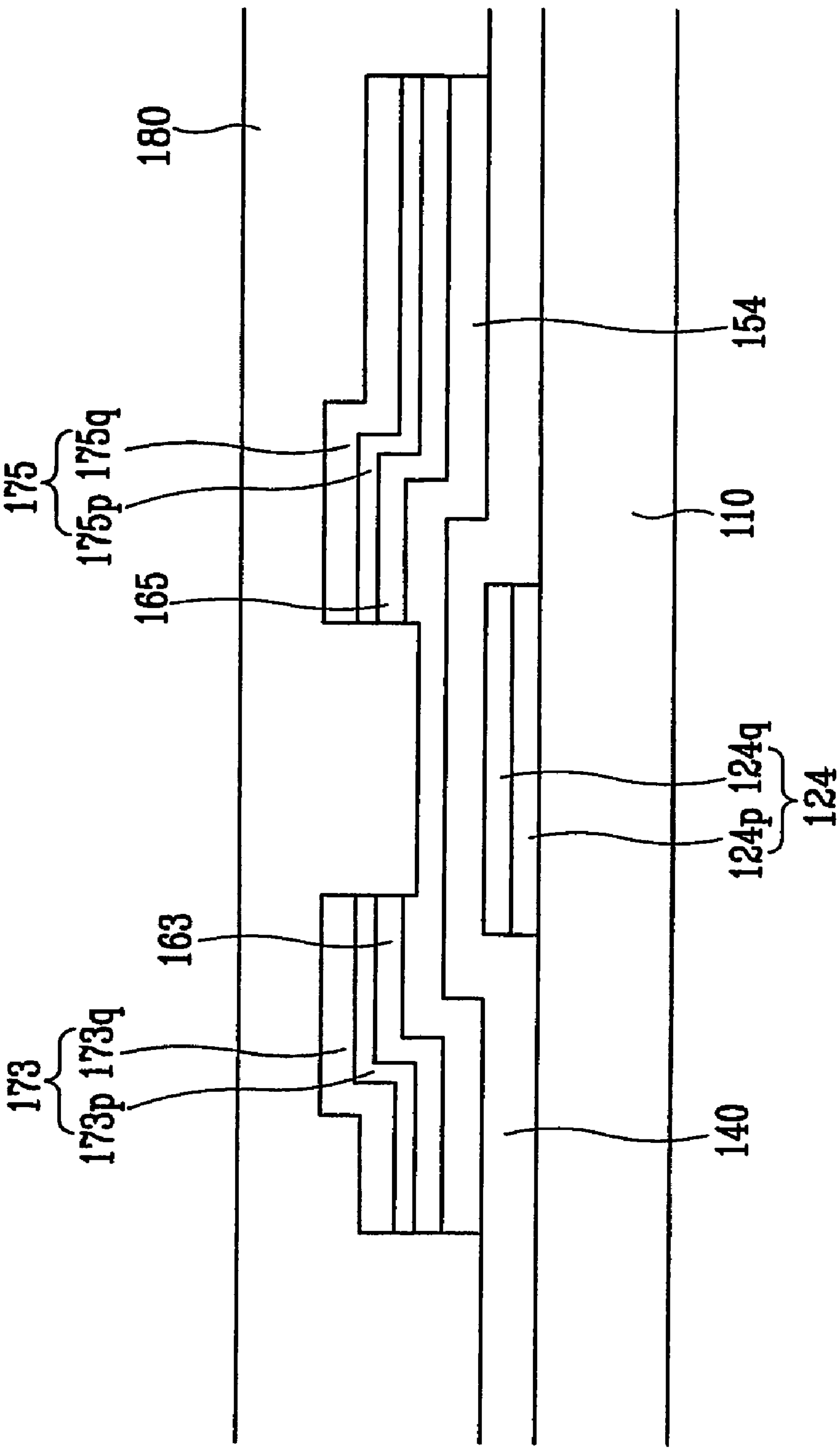

Referring to FIGS. 6A and 16B, a passivation layer 180 is deposited and dry etched along with the gate insulating layer 140 to form a plurality of contact holes 182, 185, and 189. The gate insulating layer 140 and the passivation layer 180 are preferably etched under an etch condition having substantially the same etch ratio for both the gate insulating layer 140 and the passivation layer 180.

Finally, as shown in FIGS. 1 and 2, a plurality of pixel electrodes 901 and a plurality of contact assistants 906 and 908 including double layers are formed by sputtering and photo-etching an IZO layer and an ITO layer.

Here, an IZO etchant is used for etching the IZO layer and the ITO layer. The IZO etchant contains HCl, $CH_3COOH$, deionized water, and a surfactant. Preheating for deposition of the IZO layer and the ITO layer is performed under $N_2$ gas atmosphere in order to prevent formation of a metal oxide layer on the portions of the metal layers 125, 175, and 179, which are exposed through the contact holes 182, 185, and 189.

As described above, when the pixel electrode 901 is formed of double layers including the lower layer of IZO and the upper layer of ITO, an etchant for Cr, Al, etc. may be used to form the pixel electrode 901 such that damage of under layers such as metal wires is prevented. Further, prove pins contact the ITO layer during the gross test such that the prove pins do not have accumulation of foreign body.

A TFT array panel for an LCD according to another embodiment of the present invention will be described in detail with reference to FIGS. 7-17C.

Figure 7:
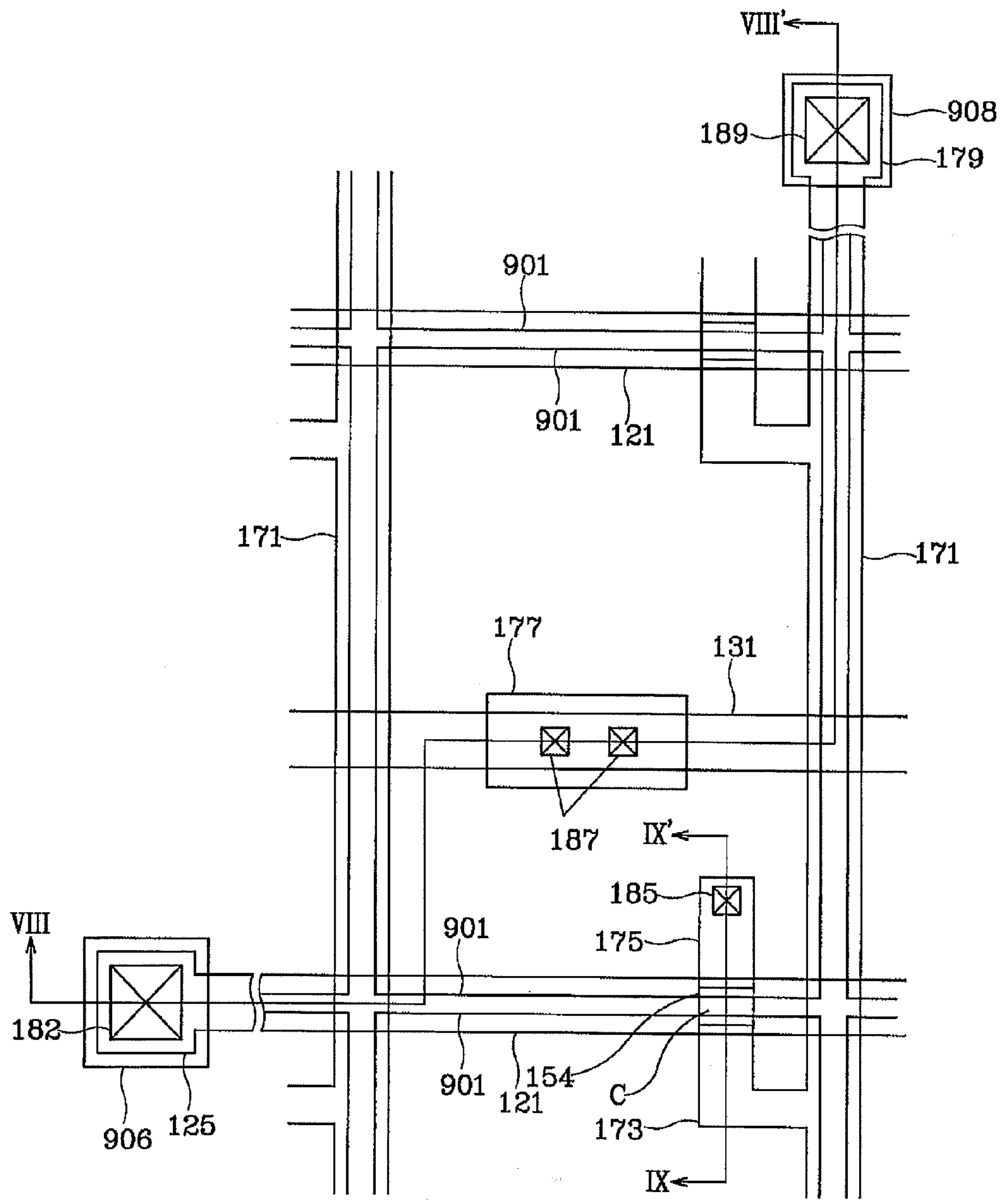
FIG. 7 is a layout view of a TFT array panel for a LCD according to another embodiment of the present invention.
Figure 8:
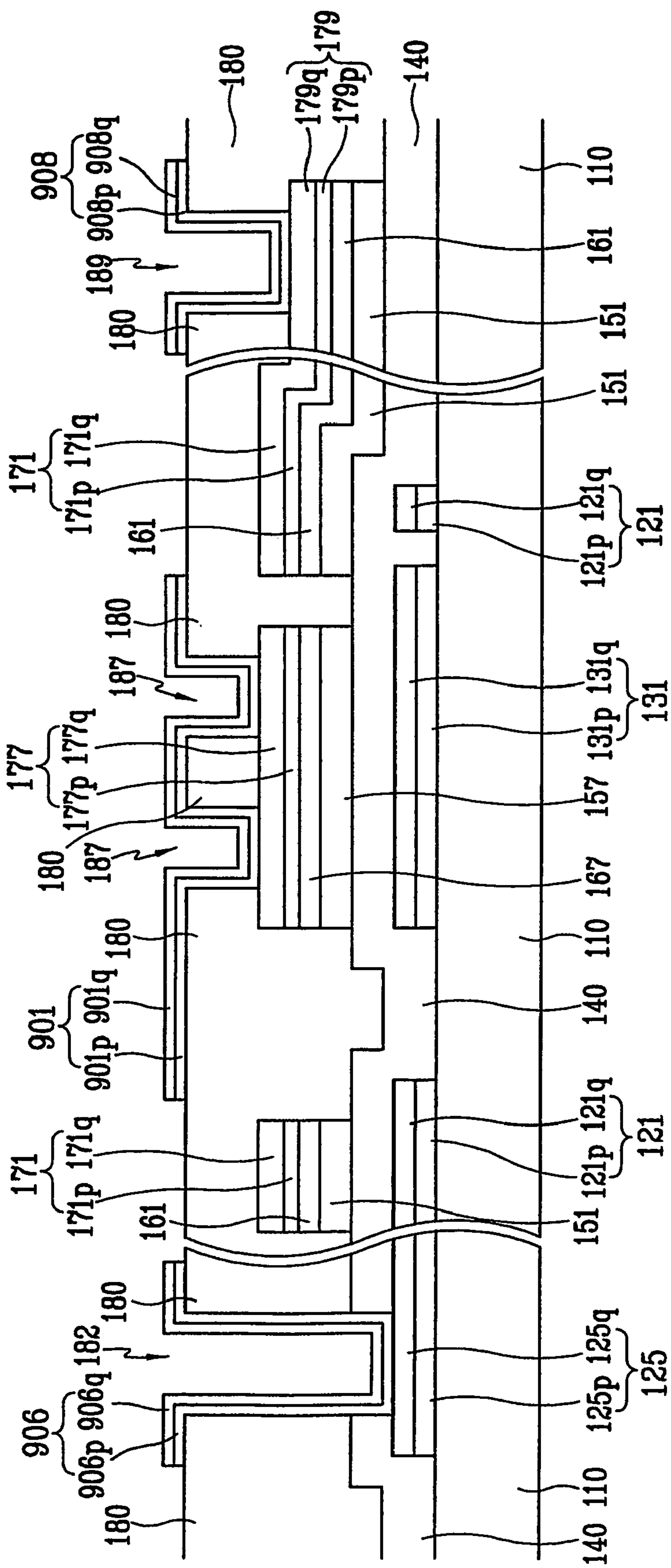
FIGS. 8 and 9 are sectional views of the TFT array panel shown in FIG. 7 taken along the line VIII-VIII' and the line IX-IX', respectively.
Figure 9:
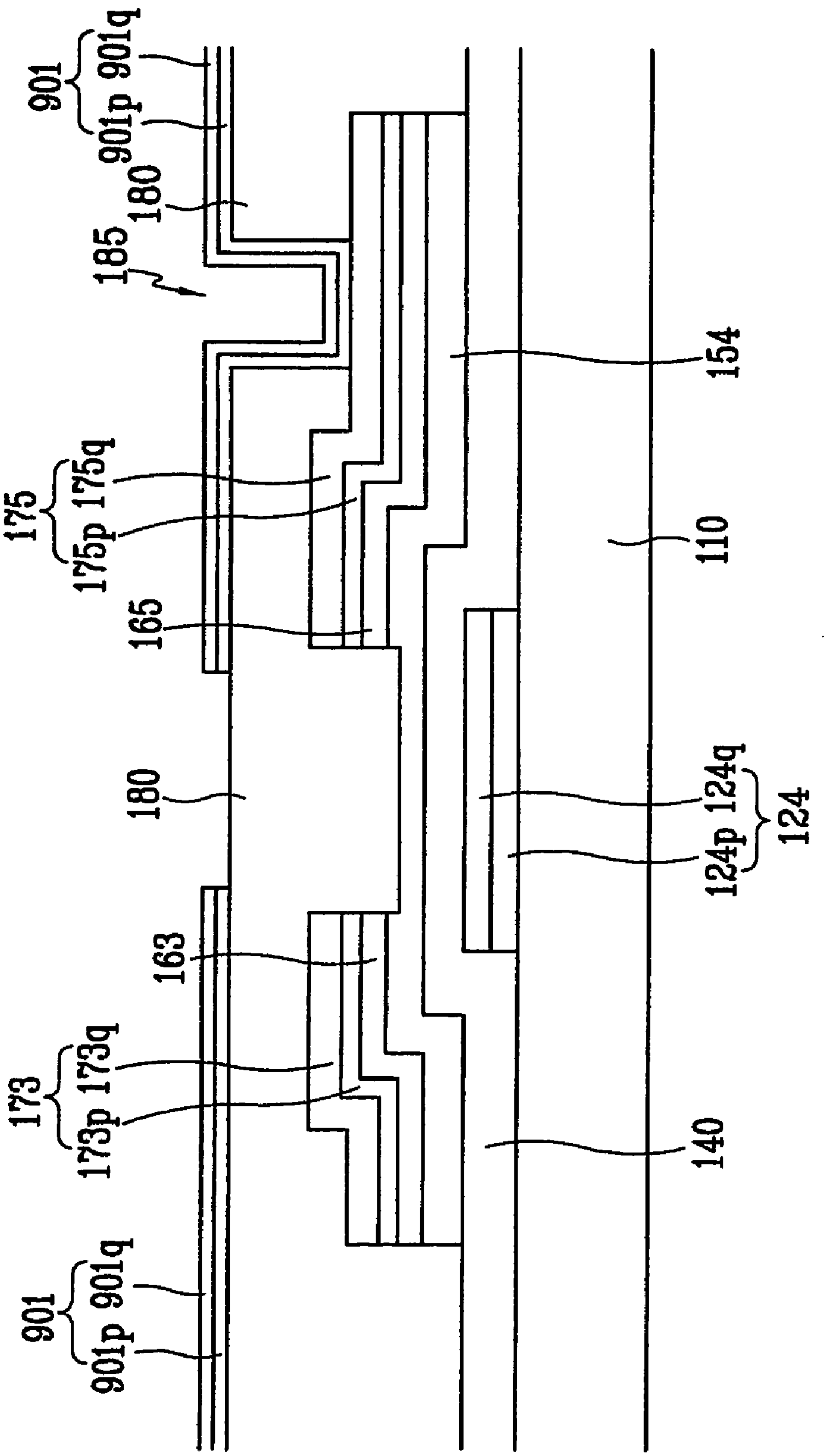

FIG. 7 is a layout view of a TFT array panel for a LCD according to another embodiment of the present invention. FIGS. 8 and 9 are sectional views of the TFT array panel shown in FIG. 7 taken along the line VIII-VIII' and the line IX-IX', respectively;

Referring to FIGS. 7 to 9, a plurality of gate lines 121 including a plurality of gate electrodes 124 and expansions 125 for contacting an external circuit and a plurality of storage electrode lines 131 which are electrically separated from the gate lines 121 are formed on a substrate 110.

The gate lines 121 and the storage electrode lines 131 include two films having different physical characteristics, a lower film 121*p* and 131*p* and an upper film 121*q* and 131*q*. The upper film 121*q* of the gate lines 121 is preferably made of low specific resistance metal including Al containing metal such as Al and Al alloy for reducing signal delay or voltage drop in the gate lines 121. On the other hand, the lower film 121*p* is preferably made of material such as Cr, Mo, Mo alloy such as MoW, Ta and Ti, which has good physical, chemical, and electrical contact characteristics with other materials such as ITO and IZO. Good examples of combination of the lower film 121*p* material and the upper films 121*q* material is Cr and Al—Nd alloy.

The storage electrode lines 131 also have a lower film 131*p* and an upper film 131*q* and are supplied with a predetermined voltage such as the common voltage. The storage electrode lines 131 may be omitted if the storage capacitance generated by the overlapping of the gate lines 121 and the pixel electrodes 901 is sufficient. In such a case, storage capacitor conductors 177 are also omitted.

In addition, the lateral sides of the lower films 121*p* and 131*p* and the upper films 121*q* and 131*q* are inclined relative to a surface of the substrate 110, and the inclination angle thereof ranges about 30-80 degrees.

A gate insulating layer 140 preferably made of silicon nitride (SiNx) is formed on the gate lines 121.

A plurality of semiconductor stripes 151 preferably made of hydrogenated amorphous silicon (abbreviated to "a-Si") are formed on the gate insulating layer 140. Each semiconductor stripe 151 extends substantially in the longitudinal direction and has a plurality of projections 154 branched out toward the gate electrodes 124. A plurality of semiconductor segments 157 are formed to cover portions of the storage electrode lines 131.

A plurality of ohmic contact stripes 161, islands 165, and segments 167 preferably made of silicide or n+ hydrogenated a-Si heavily doped with n type impurity are formed on the semiconductor stripes 151. Each ohmic contact stripe 161 has a plurality of projections 163, and the projections 163 and the ohmic contact islands 165 are located in pairs on the projections 154 of the semiconductor stripes 151 The ohmic contact segments 167 are formed on the semiconductor segments 157.

The lateral sides of the semiconductors 151 and 157 and the ohmic contacts 161, 165, and 167 are inclined relative to a surface of the substrate 110, and the inclination angles thereof are preferably in a range between about 30-80 degrees.

A plurality of data lines 171, a plurality of drain electrodes 175, and a plurality of storage capacitor conductors 177 are formed on the ohmic contacts 161, 165, and 167 and the gate insulating layer 140.

The data lines 171 for transmitting data voltages extend substantially in the longitudinal direction and intersect the gate lines 121. Each data line 171 includes an expansion 179 having a larger area for contact with another layer or an external device. Larger portion of the data line 171 is disposed on the display area but the expansion 179 of the data line 171 is disposed on the boundary area.

A plurality of branches of each data line 171, which project toward the drain electrodes 175, form a plurality of source electrodes 173. Each pair of the source electrodes 173 and the drain electrodes 175 are separated from each other and opposite each other with respect to a gate electrode 124. A gate electrode 124, a source electrode 173, and a drain electrode 175 along with a projection 154 of a semiconductor stripe 151 form a TFT having a channel formed in the projection 154 disposed between the source electrode 173 and the drain electrode 175.

The storage capacitor conductors 177 overlap portions of the storage electrode lines 131 and the storage capacitor conductors 177 is formed on the ohmic contact segments 167 and the semiconductor segments 157.

The data lines 171, the drain electrodes 175, and the storage capacitor conductors 177 include lower films 171*p*, 175*p*, and 177*p* made of Mo, a Mo alloy, or Cr and upper films 171*q*, 175*q*, and 177*q* located thereon and made of an Al containing metal or an Ag containing metal. The expansion 179 of the data line 171 also includes an upper film 179*q* and a lower film 179*p*.

Like the gate lines 121 and the storage electrode lines 131, the upper film 171*p*, 175*p*, and 177*p* and the lower films 171*q* and 175*q* of the data lines 171, the drain electrodes 175, and the storage capacitor conductors 177 have tapered lateral sides relative to the surface of the substrate 110, and the inclination angles thereof range about 30-80 degrees.

The ohmic contacts 161, 165, and 167 are interposed only between the underlying semiconductors 151 and 157 and the overlying data lines 171, drain electrodes 175, and storage capacitor conductors 177 and reduce the contact resistance therebetween. The semiconductor stripes 151 include a plurality of exposed portions, which are not covered with the data lines 171 and the drain electrodes 175, such as portions located between the source electrodes 173 and the drain electrodes 175. The semiconductor segments 157 are disposed under the ohmic contact segments 167 formed under the storage capacitor conductors 177.

A passivation layer 180 is formed on the data lines 171, the drain electrodes 175, the storage electrode capacitors 177, and exposed portions of the semiconductor stripes 151, which are not covered with the data lines 171 and the drain electrodes 175. The passivation layer 180 is preferably made of photosensitive organic material having a good flatness characteristic, dielectric insulating material having low dielectric constant under 4.0 such as a-Si:C:O and a-Si:O:F formed by plasma enhanced chemical vapor deposition (PECVD), or inorganic material such as silicon nitride and silicon oxide.

The passivation layer 180 has a plurality of contact holes 185, 187, and 189 exposing the drain electrodes 175, the lower layer 177*p* of the storage conductors 177, and the expansions 179 of the data lines 171, respectively. The passivation layer 180 and the gate insulating layer 140 have a plurality of contact holes 181 exposing the expansions 125 of the gate lines 121.

A plurality of pixel electrodes 901 and a plurality of contact assistants 906 and 908 are formed on the passivation layer 180.

The pixel electrodes 901 have double layers of a lower film 901*p* and an upper film 901*q*. Here, the lower film 901*p* is made of IZO and the upper film 901*q* is made of ITO.

The pixel electrodes 901 are physically and electrically connected to the drain electrodes 175 through the contact holes 185 and to the storage capacitor conductors 177 through the contact holes 187 such that the pixel electrodes 901 receive the data voltages from the drain electrodes 175 and transmit the received data voltages to the storage capacitor conductors 177.

The pixel electrodes 901 supplied with the data voltages generate electric fields in cooperation with a common electrode (not shown) on another panel (not shown), which reorient liquid crystal molecules in a liquid crystal layer (not shown) disposed therebetween.

A pixel electrode 901 and a common electrode form a liquid crystal capacitor, which stores applied voltages after turn-off of the TFT. An additional capacitor called a "storage capacitor" is connected in parallel to the liquid crystal capacitor. The storage capacitors are implemented by overlapping the pixel electrodes 190 with the storage lines 131. The storage capacitor conductor 177 is disposed under the passivation layer 180 to reduce distance between the storage electrode line 131 and the pixel electrode 901.

The pixel electrodes 901 overlap the gate lines 121 and the data lines 171 to increase aperture ratio but it is optional.

The contact assistants 906 and 908 are connected to the exposed expansions 125 of the gate lines 121 and the exposed expansions 179 of the data lines 171 through the contact holes 182 and 189, respectively. The contact assistants 906 and 908 protect the expansions 125 and 179 and complement the adhesion between the expansions 125 and 179 and external devices.

The contact assistants 906 and 908 also have double layers of lower films 906*p* and 908*p* and upper films 906*q* and 908*q*. Here, the lower films 906*p* and 908*p* are made of IZO and the upper films 906*q* and 908*q* are made of ITO.

Here, the IZO layers 901*p*, 906*p*, and 908*p* have a thickness between 500 Å to 1500 Å and the ITO layers 901*q*, 906*q*, and 908*q* have a thickness between 50 Å to 250 Å. Especially, the IZO layers 901*p*, 906*p*, and 908*p* preferably have thickness of 900 Å and the ITO layers 901*q*, 906*q*, and 908*q* have thickness of 200 Å.

A method of manufacturing the TFT array panel illustrated in FIGS. 7, 8, and 9 will be now described in detail with reference to FIGS. 10A to 17C as well as FIGS. 8 and 9.

Figure 10A:
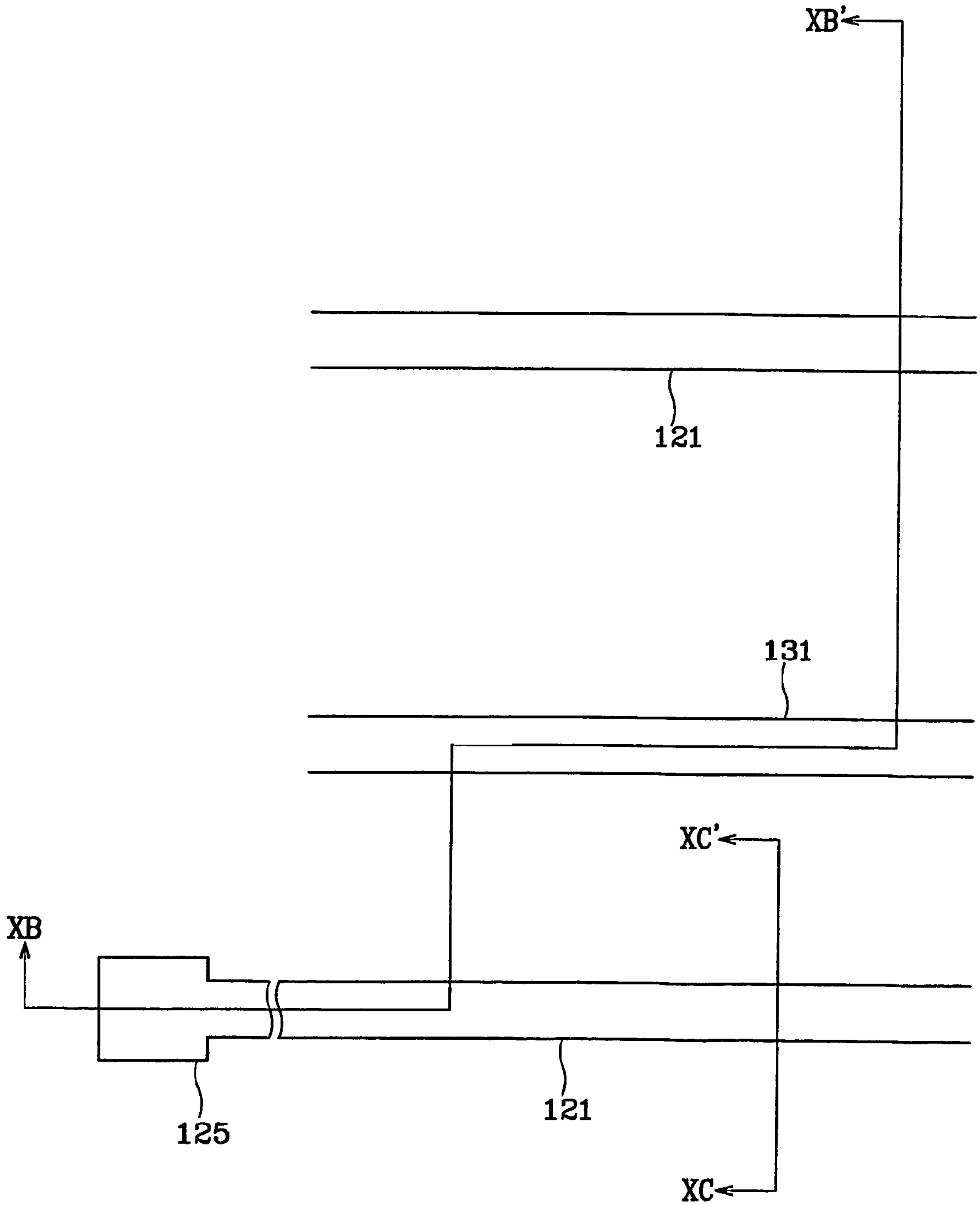
FIG. 10A is a layout view of the TFT array panel shown in FIGS. 7 to 9 in the first step of a manufacturing method according to an embodiment of the present invention.
Figure 10B:
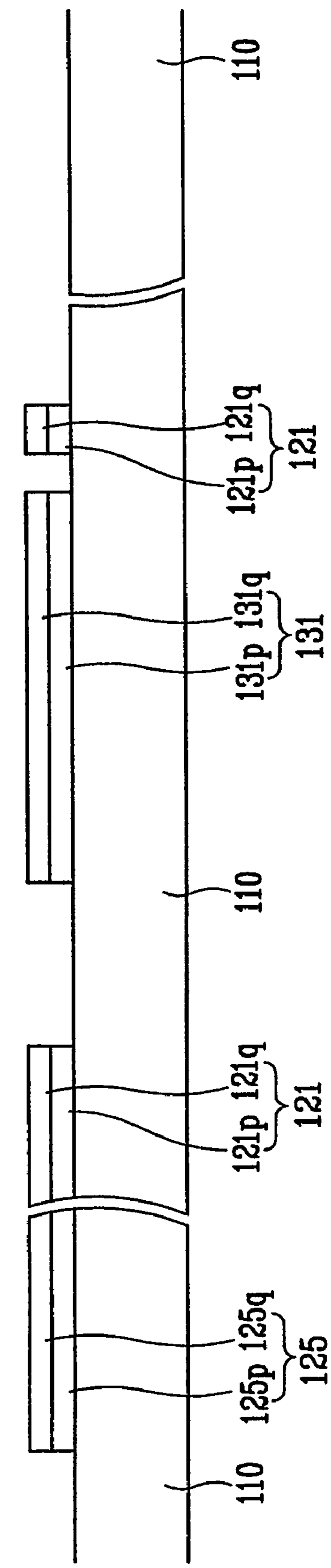
FIGS. 10B and 10C are sectional views of the TFT array panel shown in FIG. 10A taken along the line Xb-Xb' and the line Xc-Xc', respectively.
Figure 10C:
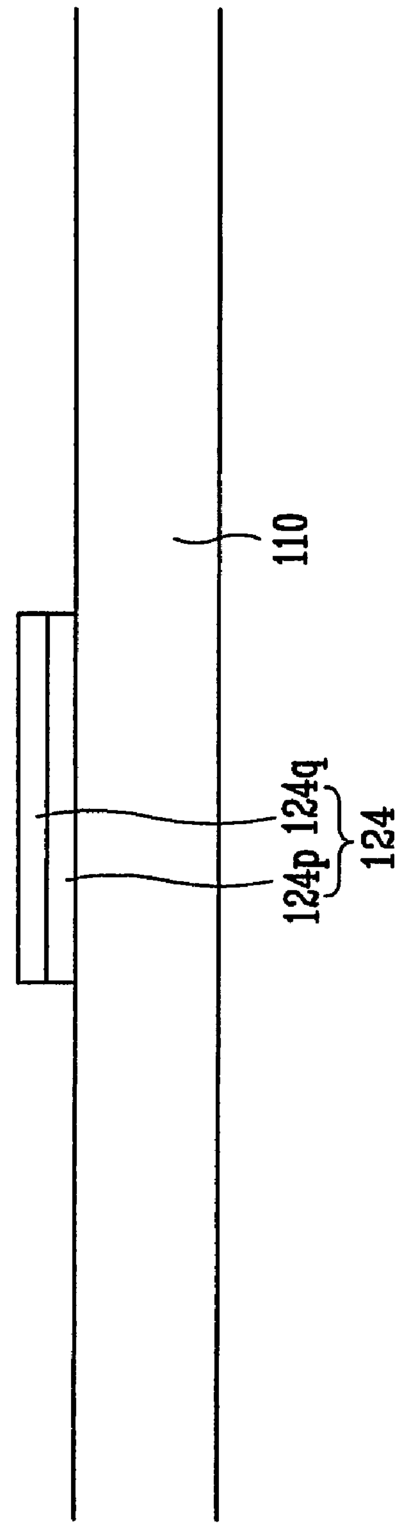
Figure 11A:
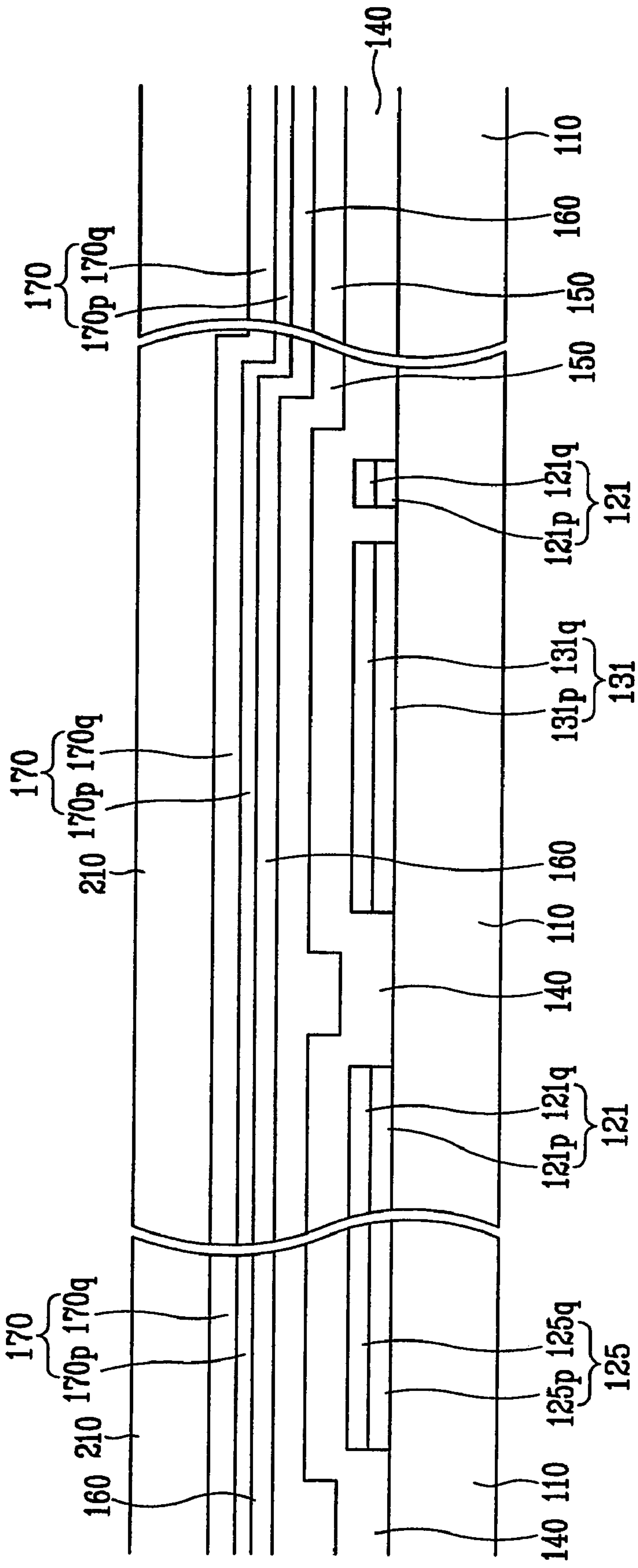
FIGS. 11A and 11B are sectional views of the TFT array panel shown in FIG. 10A taken along the line Xb-Xb' and the line Xc-Xc', respectively, in the step following the step illustrated in FIGS. 10B and 10C.
Figure 11B:
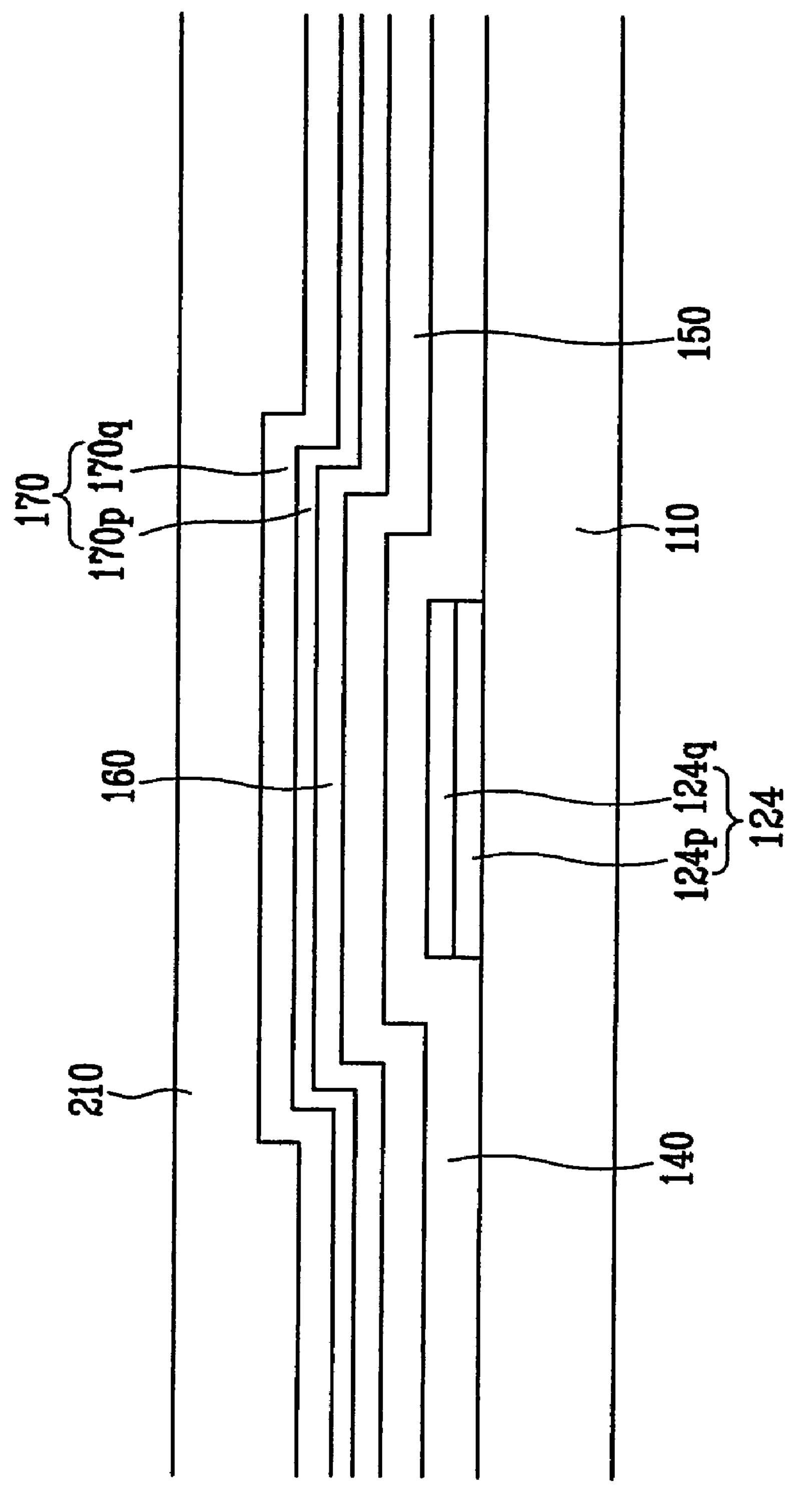
Figure 12A:
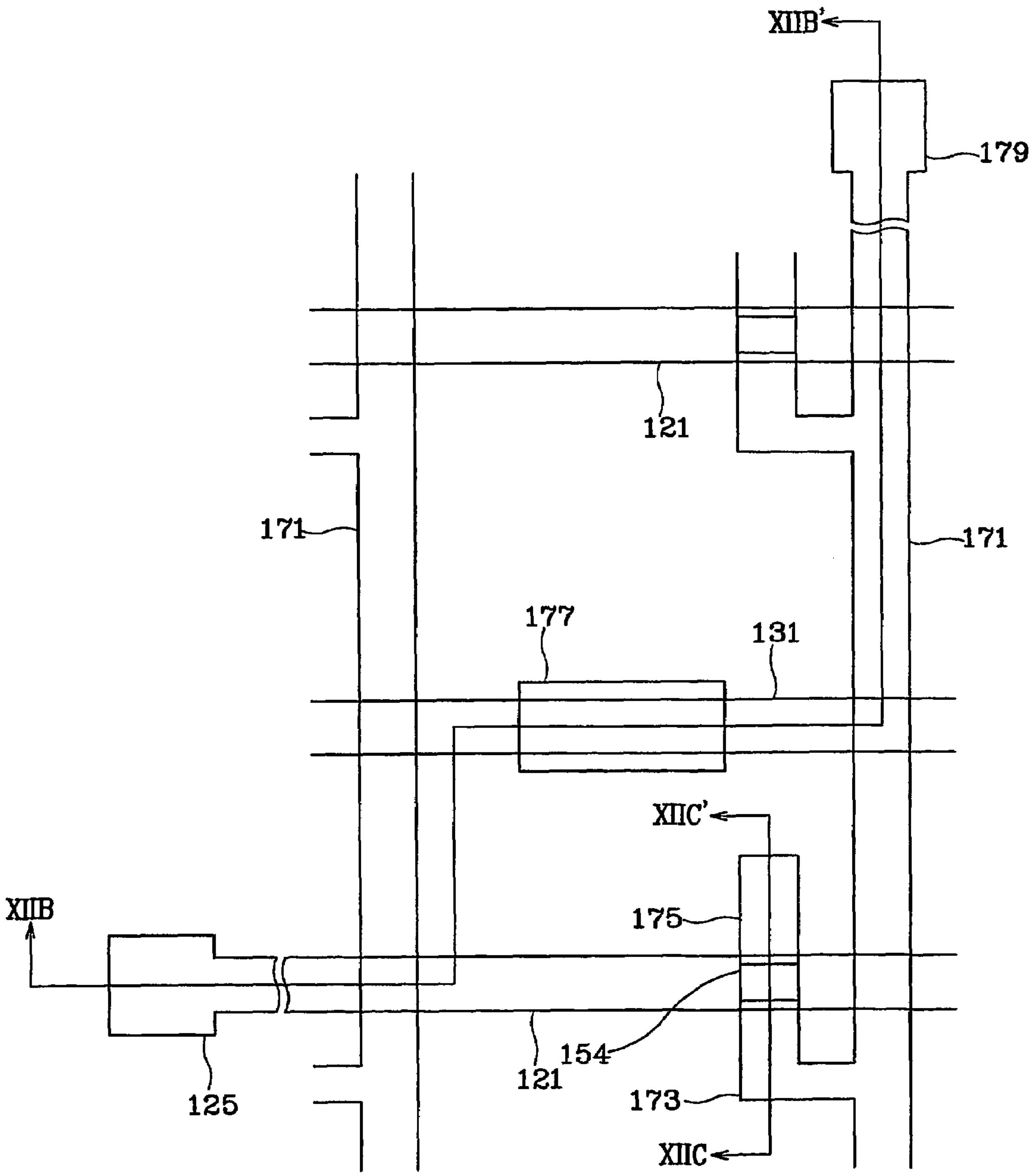
FIG. 12A is a layout view of the TFT array panel in the step following the step illustrated in FIGS. 11A and 1/B.
Figure 12B:
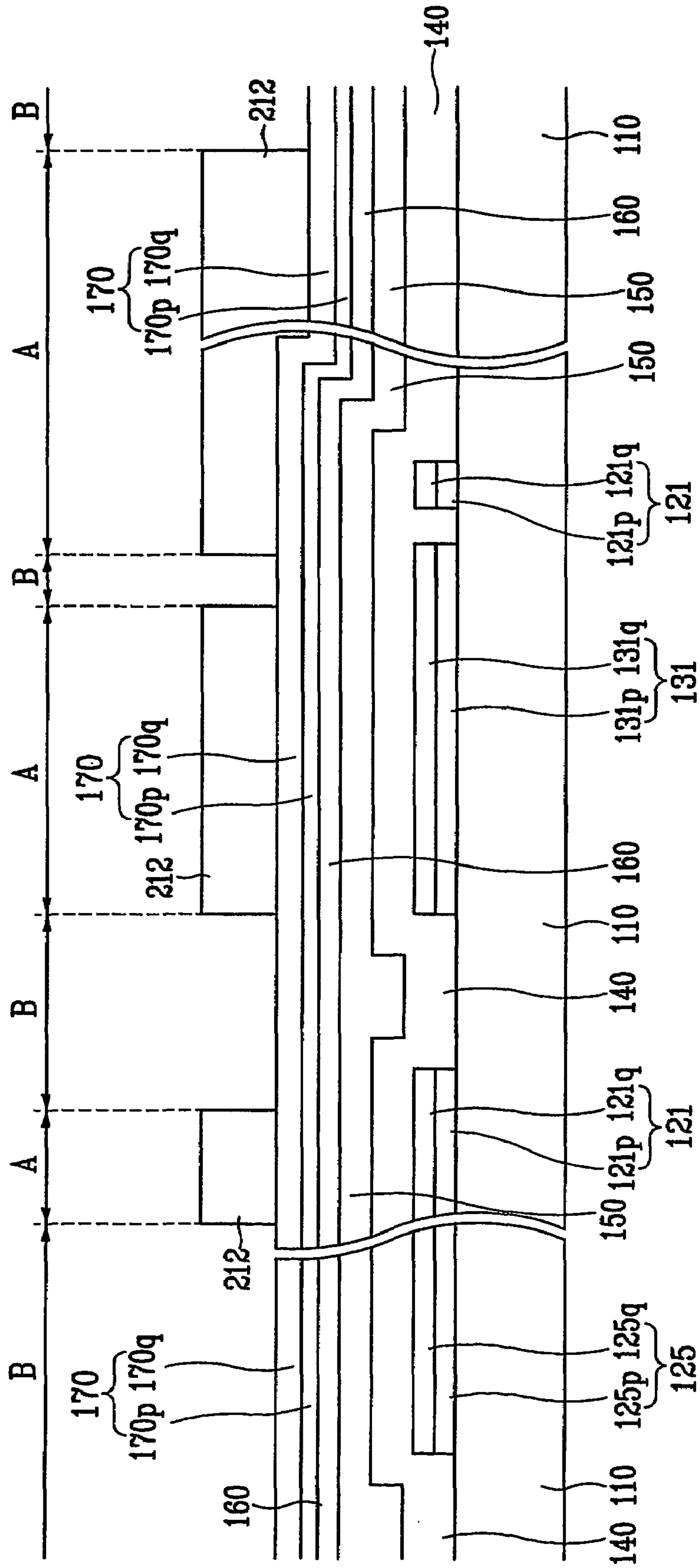
FIGS. 12B and 12C are sectional views of the TFT array panel shown in FIG. 12A taken along the line XIIb-XIIb' and the line XIIc-XIIc', respectively.
Figure 12C:
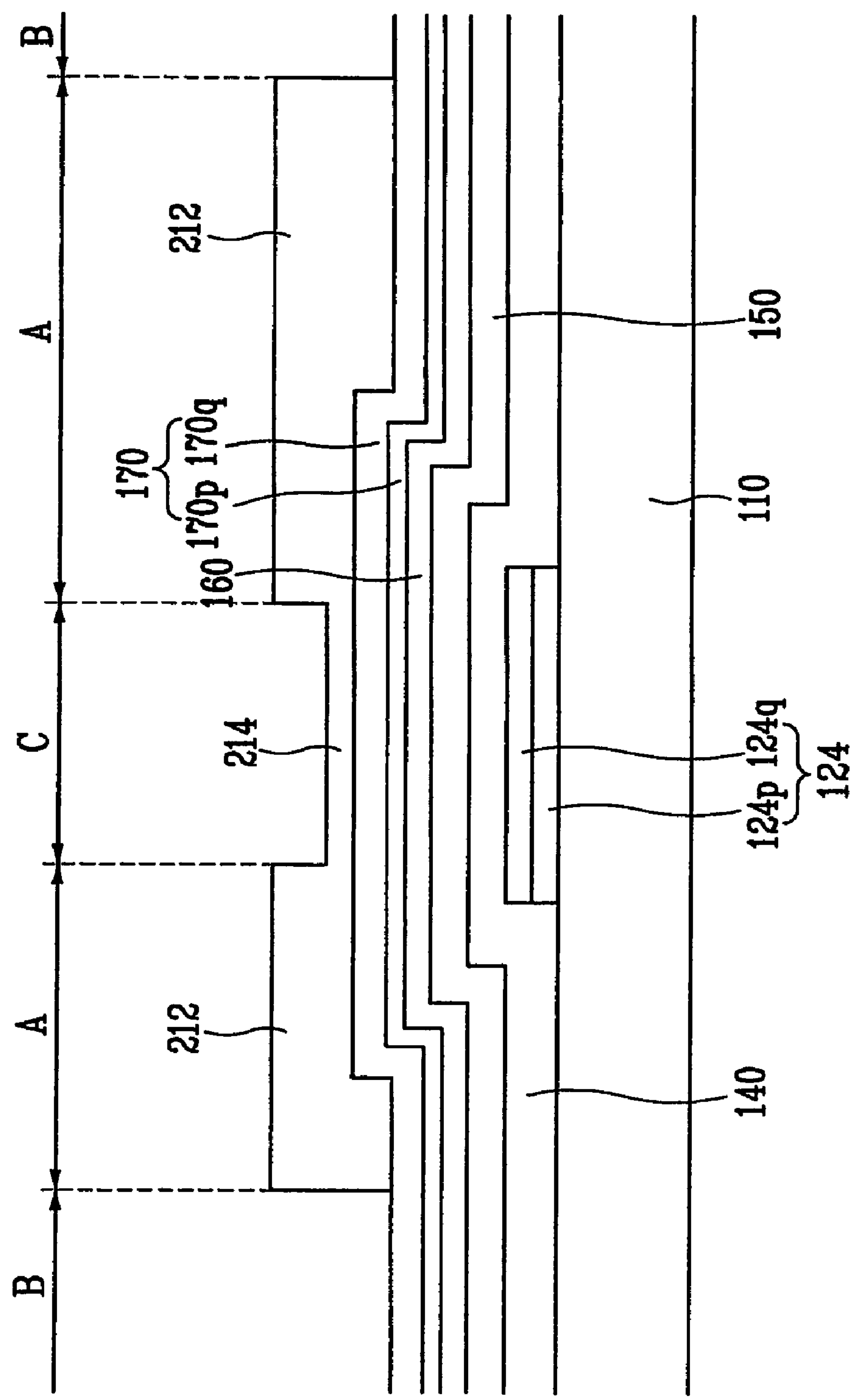
Figure 17A:
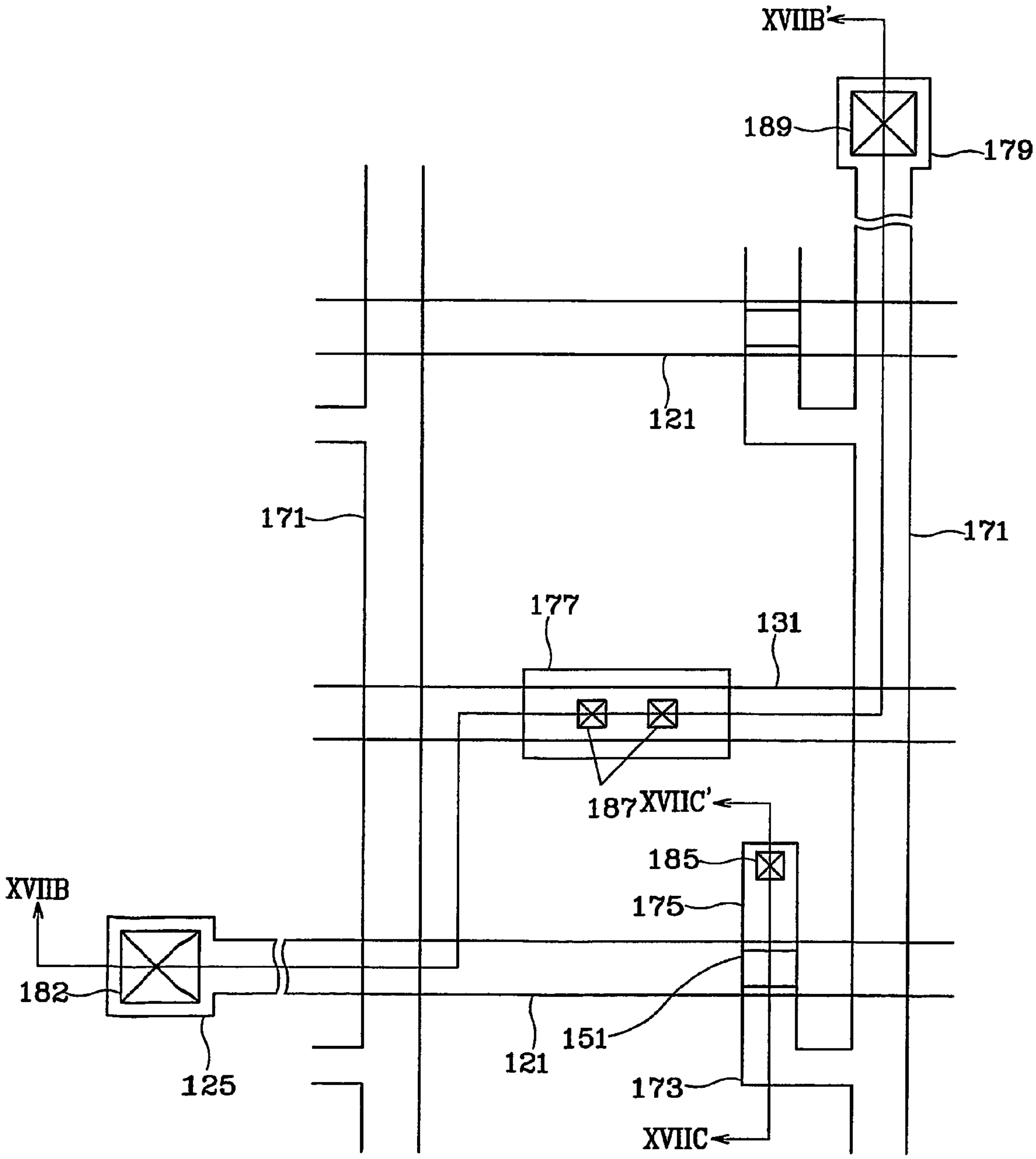
FIG. 17A is a layout view of the TFT array panel in the step following the step illustrated in FIGS. 16A and 16B.
Figure 17B:
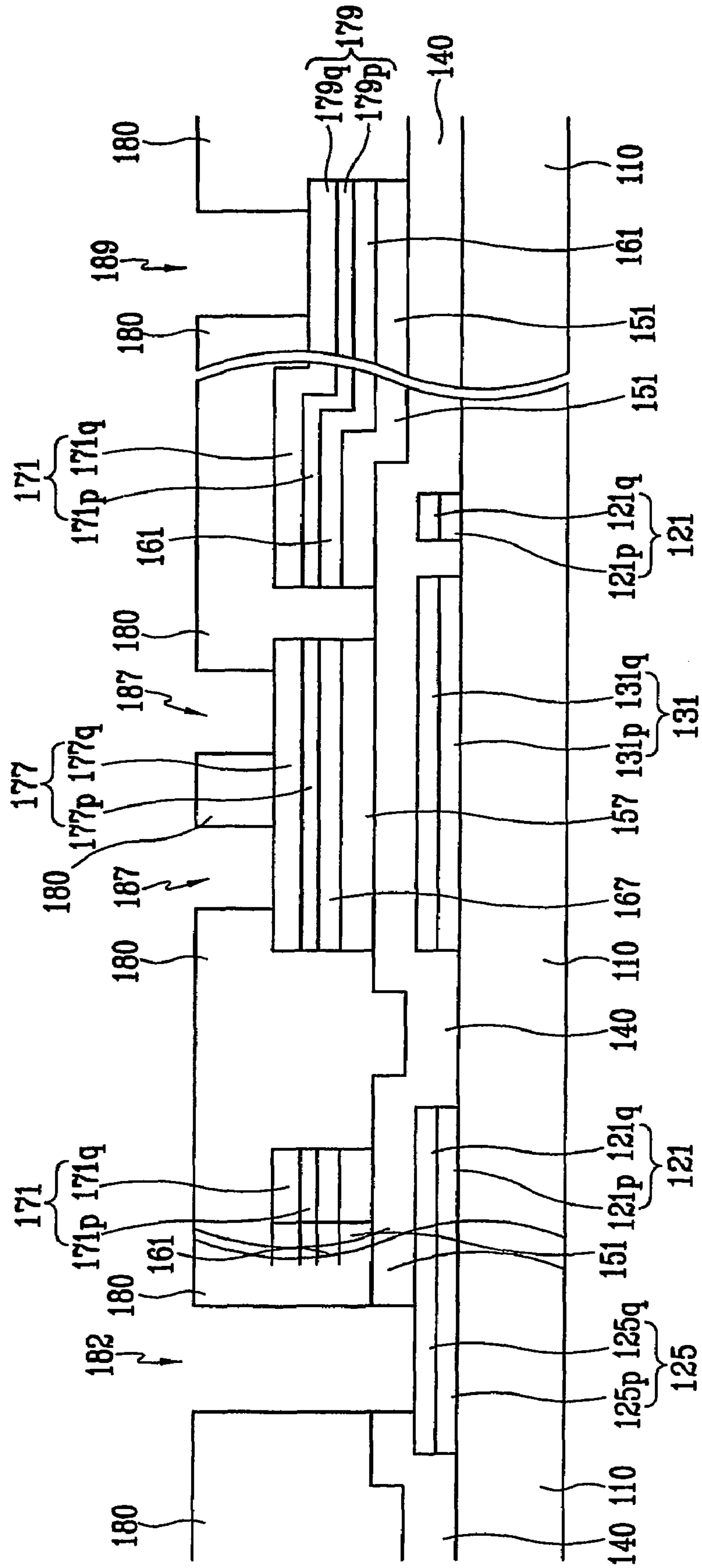
FIGS. 17B and 17C are sectional view of the TFT array panel shown in FIG. 17A taken along the line XVIIb-XVIIb' and the line XVIIc-XVIIc', respectively.
Figure 17C:
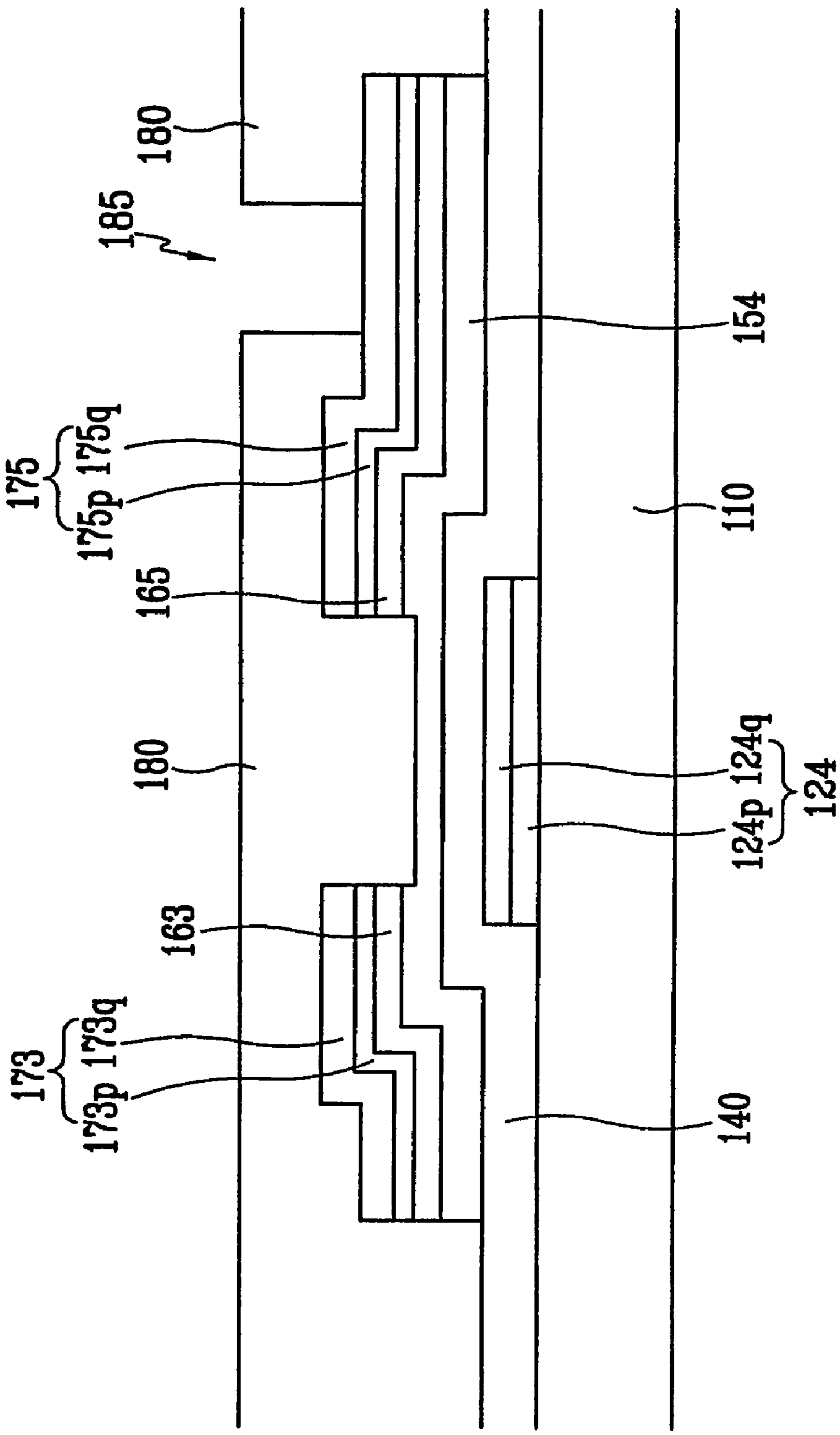

FIG. 10A is a layout view of the TFT array panel shown in FIGS. 7 to 9 in the first step of a manufacturing method according to an embodiment of the present invention. FIGS. 10B and 10C are sectional views of the TFT array panel shown in FIG. 10A taken along the line Xb-Xb' and the line Xc-Xc', respectively. FIGS. 11A and 11B are sectional views of the TFT array panel shown in FIG. 10A taken along the line Xb-Xb' and the line Xc-Xc', respectively, in the step following the step illustrated in FIGS. 10B and 10C. FIG. 12A is a layout view of the TFT array panel in the step following the step illustrated in FIGS. 11A and 11B. FIGS. 12B and 12C are sectional views of the TFT array panel shown in FIG. 12A taken along the line XII-XIIb' and the line XIIc-XIIc', respectively. FIGS. 13A, 14A and 15A and FIGS. 13B, 14B and 12B are sectional views of the TFT array panel shown in FIG. 12A taken along the line XIIb-XIIb' and the line XIIc-XIIc', respectively, sequentially illustrating the steps following the step illustrated in FIGS. 12B and 12C. FIGS. 16A and 16B are sectional views of the TFT array panel in the step following the step illustrated in FIGS. 15A and 15B. FIG. 17A is a layout view of the TFT array panel in the step following the step illustrated in FIGS. 16A and 16B. FIGS. 17B and 17C are sectional view of the TFT array panel shown in FIG. 17A taken along the line XVIIb-XVIIb' and the line XVIIc-XVIIc', respectively.

Two conductive films, a lower conductive film and an upper conductive film are sputtered in sequence on an insulating substrate 110 such as transparent glass. The upper conductive film is preferably made of an Al containing metal such as Al—Nd and preferably has a thickness of about 2,500 Å. The Al—Nd target preferably includes 2 atm % of Nd.

Referring to FIGS. 10A and 10C, the upper conductive film and the lower conductive film are patterned in sequence by photo-etching with a photoresist pattern to form a plurality of gate lines 121 including a plurality of gate electrodes 124 and a plurality of storage electrode lines 131.

Referring to FIGS. 11A and 11B, a gate insulating layer 140 made of SiNx, an intrinsic a-Si layer, and an extrinsic a-Si layer are sequentially deposited. A conductive layer including a lower film and an upper film is deposited by sputtering, and a photoresist film 210 is coated on the conductive layer.

The photoresist film 210 is exposed to light through an exposure mask (not shown), and developed such that the developed photoresist has a position dependent thickness as shown in FIGS. 12B and 12C. The developed photoresist includes a plurality of first to third portions 214 and 212. The first portions 214 located on channel areas C and the second portions 212 located on the data line areas A, and no reference numeral is assigned to the third portions located on remaining areas B since they have substantially zero thickness. Here, the thickness ratio of the first portions 214 to the second portions 212 is adjusted depending upon the process conditions in the subsequent process steps. It is preferable that the thickness of the first portions 214 is equal to or less than half of the thickness of the second portions 212.

The position-dependent thickness of the photoresist is obtained by several techniques, for example, by providing translucent areas on the exposure mask as well as transparent areas and light blocking opaque areas. The translucent areas may have a slit pattern, a lattice pattern, a thin film(s) with intermediate transmittance or intermediate thickness. When using a slit pattern, it is preferable that the width of the slits or the distance between the slits is smaller than the resolution of a light exposer used for the photolithography. Another example is to use reflowable photoresist. In detail, once a photoresist pattern made of a reflowable material is formed by using a normal exposure mask only with transparent areas and opaque areas, it is subject to reflow process to flow onto areas without the photoresist, thereby forming thin portions.

Next, the photoresist film 212 and 214 and the underlying layers are etched such that the data wire and the underlying layers are left on the data areas A, only the intrinsic semiconductor layer is left on the channel areas C, and the gate insulating layer 140 is exposed on the remaining areas B.

Figure 13A:
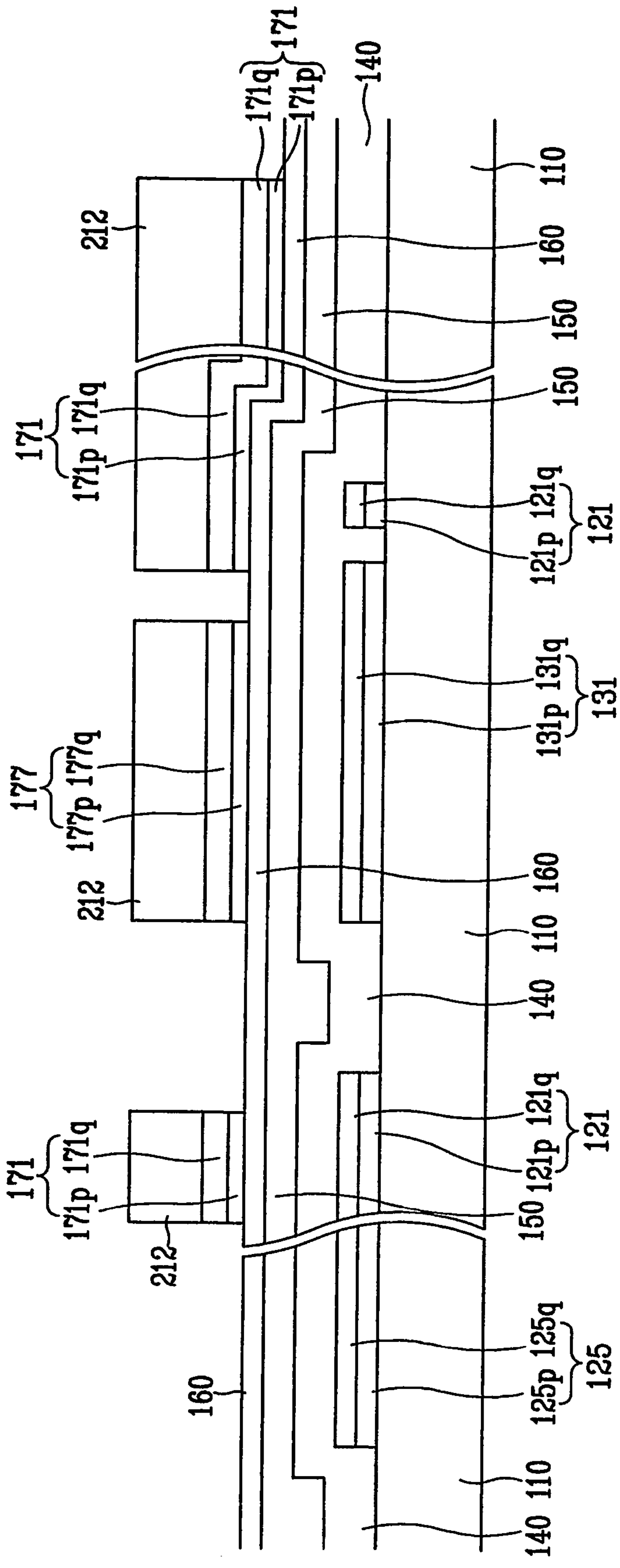
FIGS. 13A, 14A and 15A and FIGS. 13B, 14B and 15B are sectional views of the TFT array panel shown in FIG. 12A taken along the line XIIb-XIIb' and the line XIIc-XIIc', respectively, sequentially illustrating the steps following the step illustrated in FIGS. 12B and 12C.
Figure 13B:
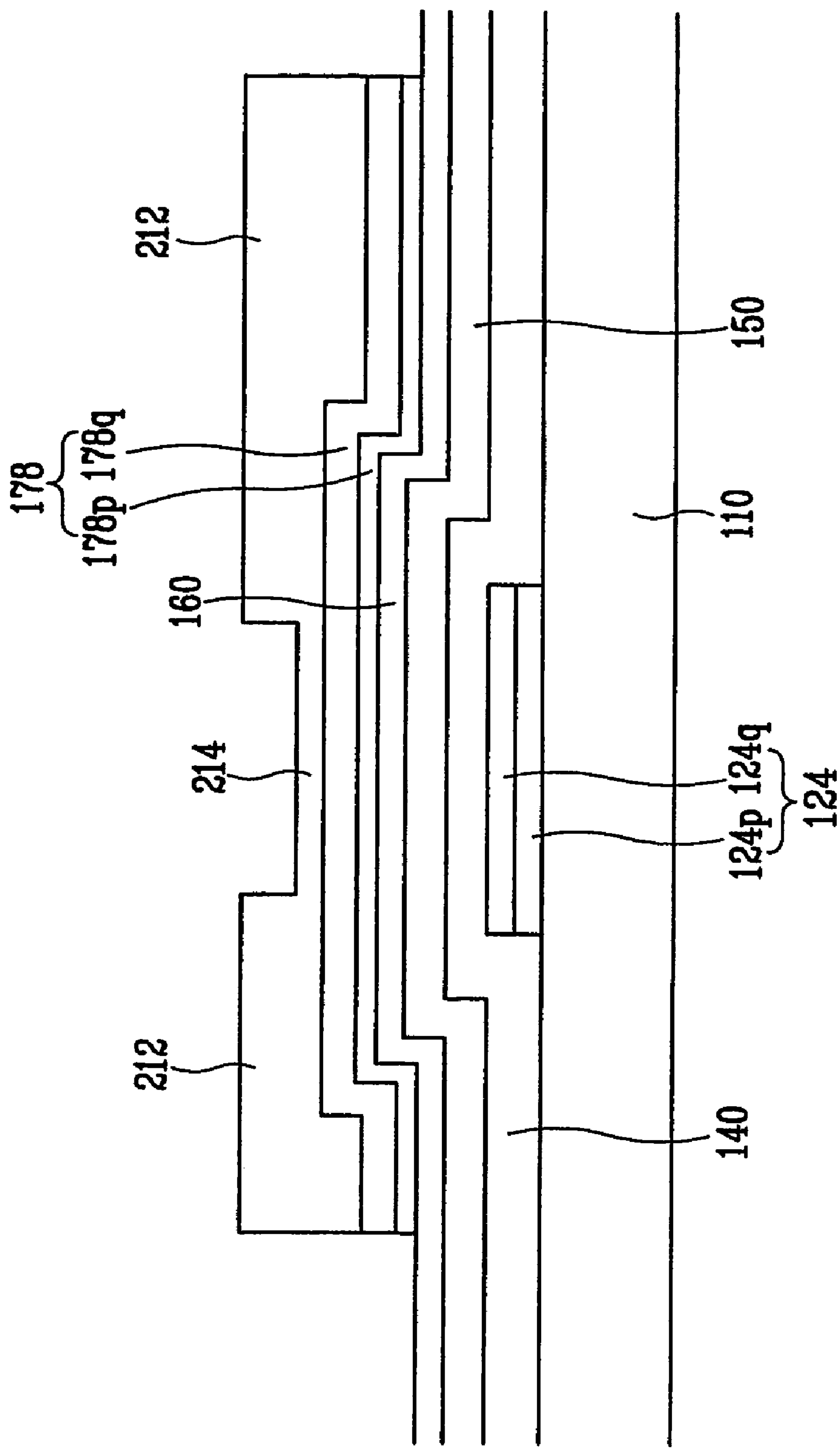

First, as shown in FIGS. 13A and 13B, the exposed portions of the conductive layer on the other areas B are removed to expose the underlying portions of the extrinsic semiconductor layer 160. Both dry etch and wet etch are selectively used in this step and preferably performed under the condition that the conductive layer is easily etched and the photoresist pattern 212 and 214 are hardly etched. However, since it is hard to identify the above-described condition for dry etch, and the dry etch may be performed under the condition that the photoresist pattern 212 and 214 and the conductive layer are etched simultaneously. In this case, the first portion 214 for dry etch is preferably made to be thicker than that for the wet etch to prevent the removal of the first portion 214 and thus the exposure of the underlying portions of the conductive layer.

As a result, as shown in FIG. 13A and FIG. 13B, the portions of the conductive layer on the channel areas C and the data areas A, that is, the source/drain ("S/D") conductors 178 and the storage capacitor conductors 177 are left and the remaining portions of the conductive layer on the remaining areas B are removed to expose the underlying portions of the extrinsic semiconductor layer 160. Here, the S/D conductors 178 have substantially the same planar shapes as the source and drain electrodes 173 and 175 illustrated in FIGS. 7 to 9 except that the source electrodes 173 and the drain electrodes 175 are not disconnected from but connected to each other.

Figure 14A:
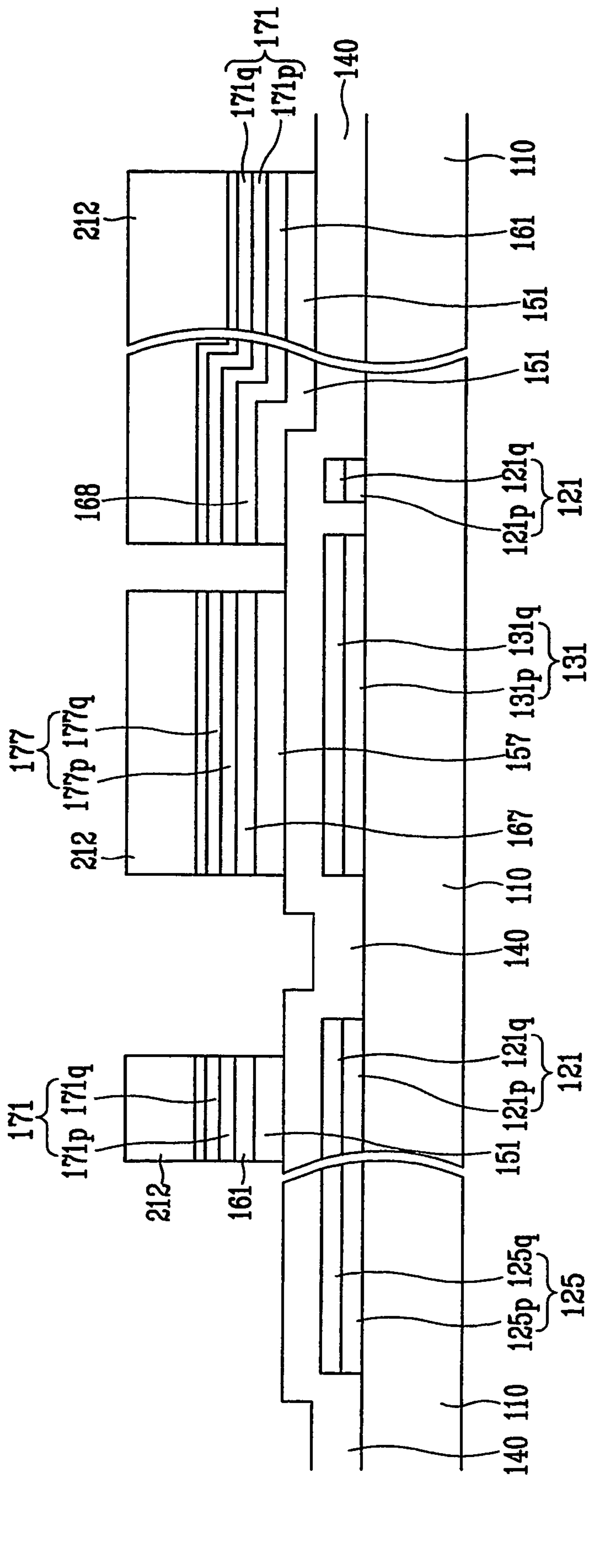
Figure 14B:
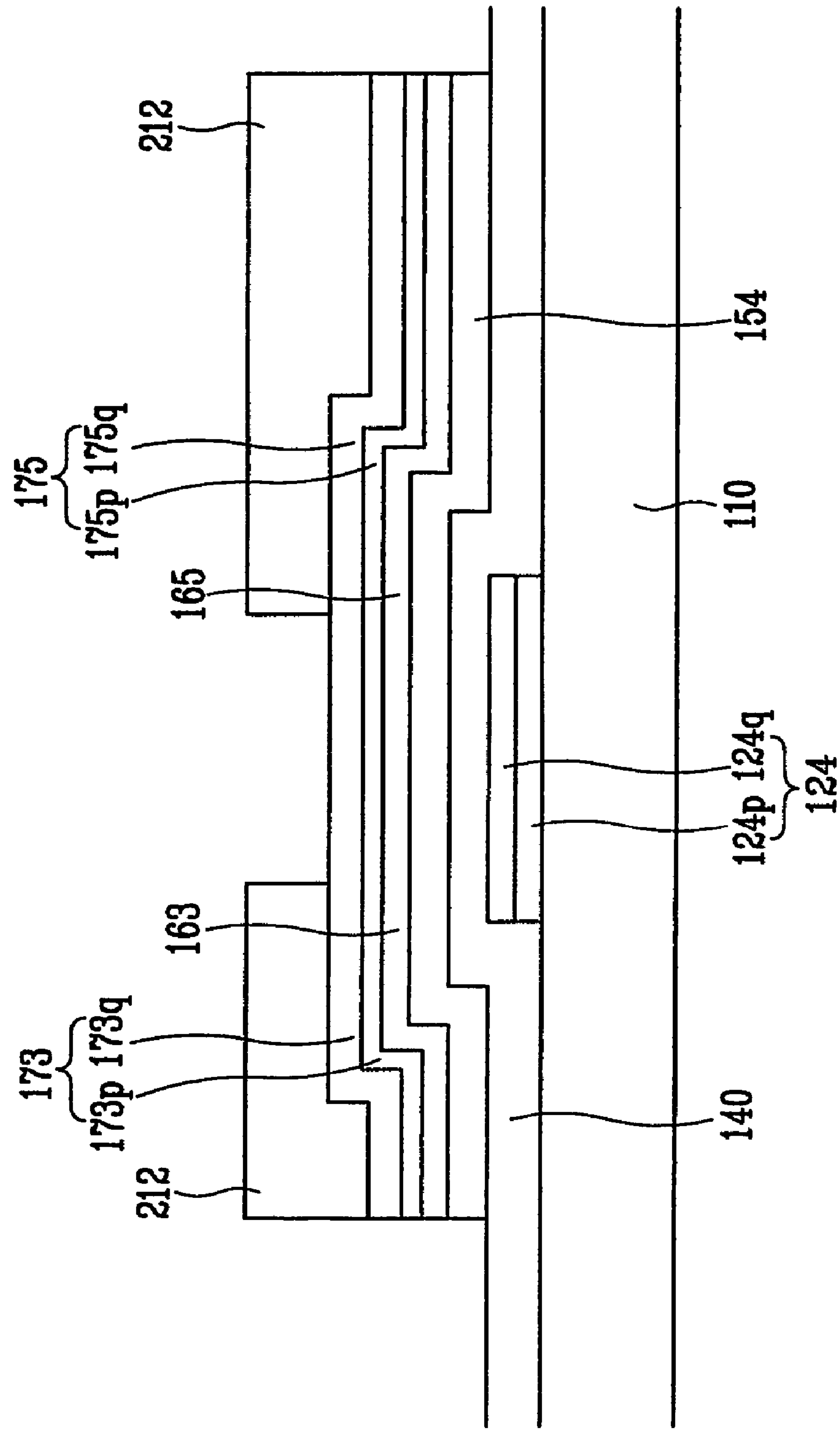

Next, as shown in FIG. 14A and FIG-14B, the exposed portions of the extrinsic semiconductor layer 160 and the underlying portions of the intrinsic semiconductor layer 150 on the areas B as well as the first portion 214 of the photoresist pattern 212 and 214 are removed by dry etch. The etching is performed under the conduction that the photoresist pattern 212 and 214, the extrinsic semiconductor layer 160 and the intrinsic semiconductor layer 150 are easily etched and the gate insulating layer 140 is hardly etched. In particular, it is preferable that the etching ratios for the photoresist pattern 212 and 214 and the intrinsic semiconductor layer 150 are nearly the same. For instance, the etched thicknesses of the photoresist pattern 212 and 214 and the semiconductor layer 150 can be nearly the same by using a gas mixture of $SF_6$ and HCl, or a gas mixture of $SF_6$ and $O_2$. When the etching ratios for the photoresist pattern 212 and 214 and for the intrinsic semiconductor pattern 150 are the same, the initial thickness of the first portion 214 is equal to or less than the sum of the thickness of the intrinsic semiconductor layer 150 and the thickness of the extrinsic semiconductor layer 160.

Consequently, as shown in FIGS. 14A and 14B, the first portions 214 on the channel areas C are removed to expose the underlying portions of the S/D conductors 178. In the meantime, the second portions 212 on the data areas A are also etched to become thinner.

Then, photoresist remnants left on the surface of the S/D conductors 178 on the channel areas C are removed by ashing.

Figure 15A:
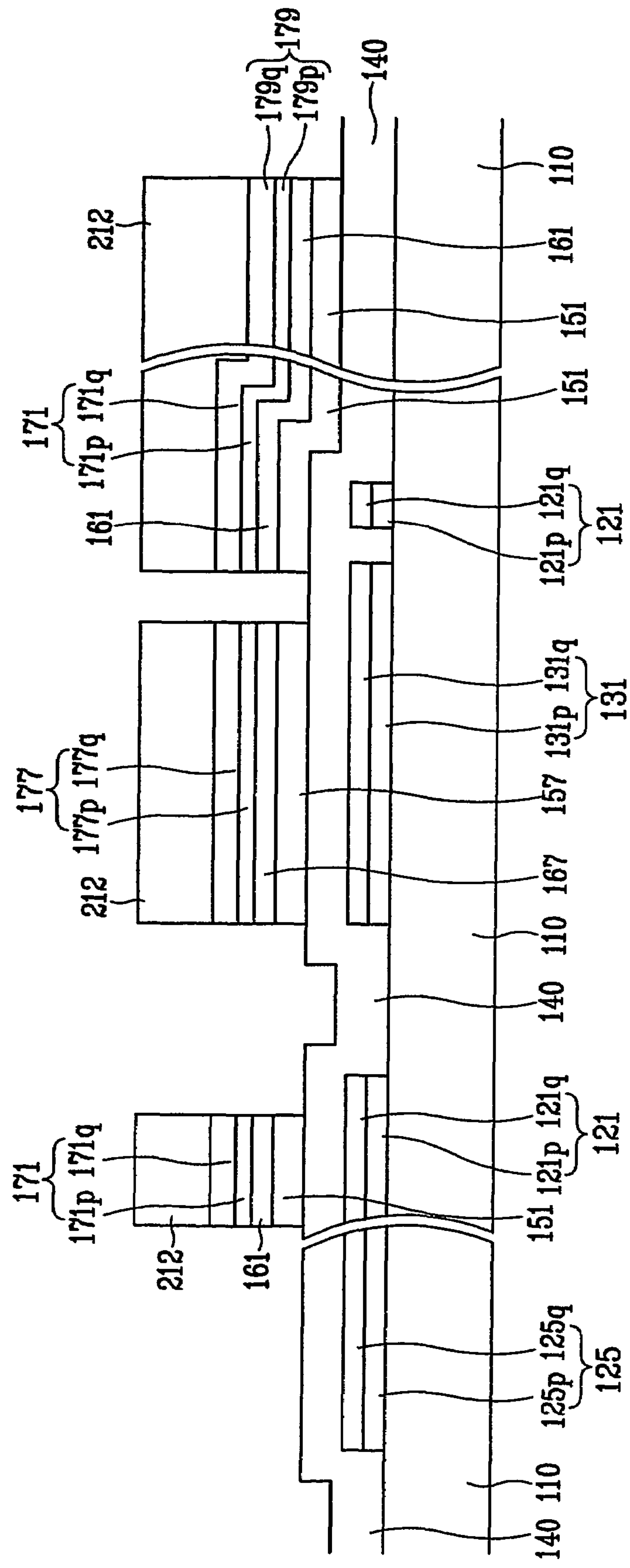
Figure 15B:
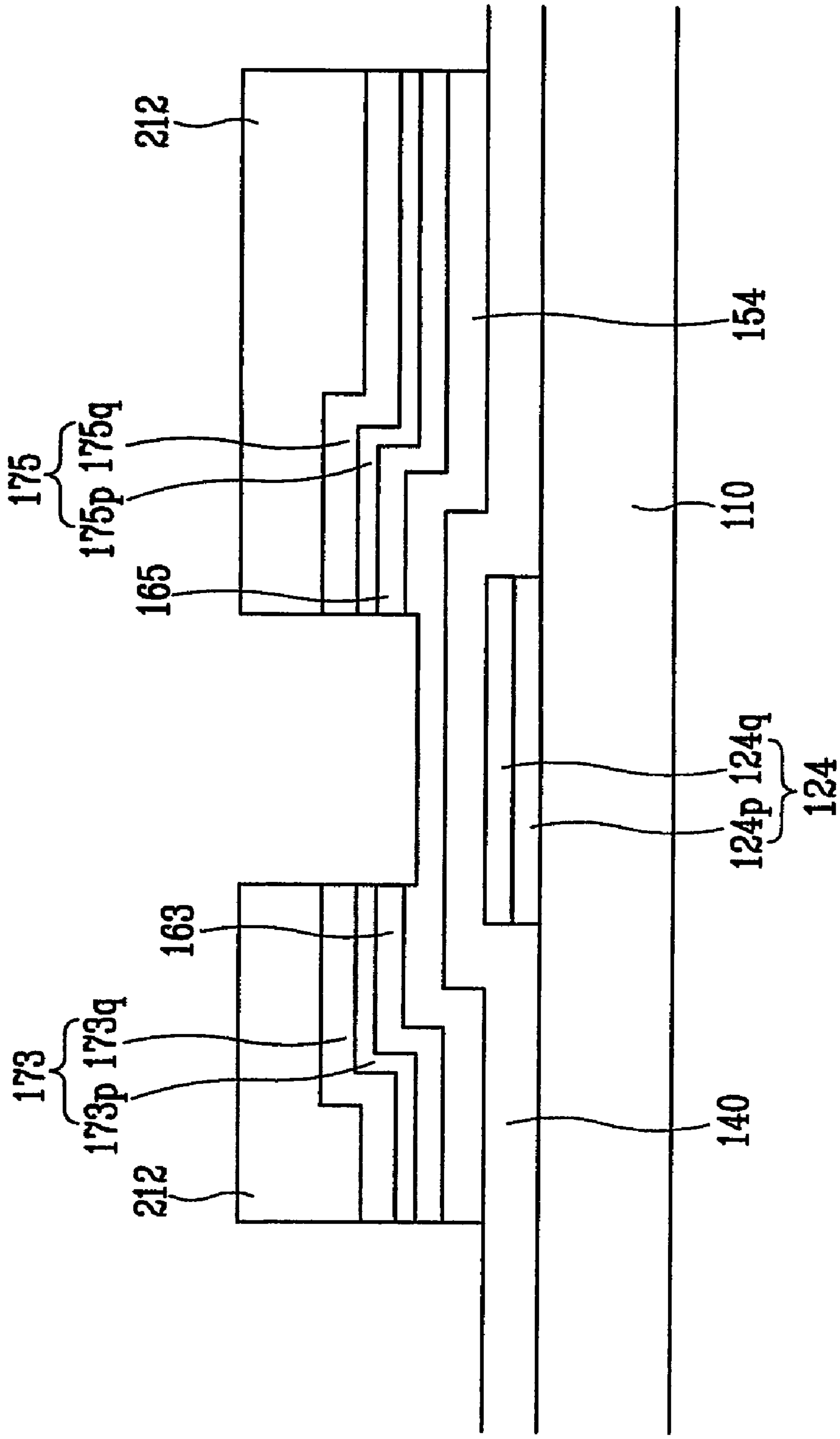

Next, as shown in FIGS. 15A and 15B, portions of the S/D conductors 178 and the underlying portions of the extrinsic semiconductor layer 160 on the channel areas C are etched to be removed. Here, the etching of both the S/D conductors 178 and the extrinsic semiconductor layer 160 may be done using only dry etching. Alternatively, the S/D conductors 178 are etched by wet etching and the extrinsic semiconductor layer 160 is etched by dry etching. In the former case, it is preferable to perform the etching under the condition that etching selectivity between the S/D conductors 178 and the extrinsic semiconductor layer 160 is high. It is because the low etching selectivity makes the determination of the etching finish point difficult, thereby causing the adjustment of the thickness of the portions of the semiconductor pattern left on the channel areas C to be difficult. In the latter case alternately applying wet etching and dry etching, a stepwise lateral sidewall is formed since the wet etch etches the lateral sides of the S/D conductors 178, while the dry etch hardly etches the lateral sides of the extrinsic semiconductor layer 160. Examples of etching gases used for etching the extrinsic semiconductor layer 160 are a gas mixture of $CF_4$ and HCl and a gas mixture of $CF_4$ and $O_2$. Use of the gas mixture of CF4 and O2 enables to obtain uniform thickness of etched portions of the intrinsic semiconductor 150. In this regard, as shown in FIG. 15B, the exposed portions of the semiconductor 154 may be etched to have a reduced thickness. It is preferable that the photoresist pattern 212 and 214 is thick enough to prevent the second portions 212 from being removed to expose the underlying the data lines.

Accordingly, the source electrodes 173 and the drain electrodes 175 are separated from each other, and, simultaneously, the data lines and the ohmic contacts 163 and 165 thereunder are completed.

Finally, the residual second portions 212 of the photoresist pattern 212 and 214 left on the data areas A are removed. Alternatively, the second portions 212 may be removed after the portions of the S/D conductors 178 on the channel areas C are removed and before the underlying portions of the extrinsic semiconductor layer 160 are removed.

As described above, wet etching and dry etching may be performed one after the other, but only dry etching may be used. The latter is relatively simple but it is not easy to find a proper etching condition compared with the former. On the contrary, it is easy to find a proper etching condition for the former case but the former is relatively complicated compared with the latter.

Thereafter, as shown in FIGS. 16A and 16B, a passivation layer 180 is formed by CVD of silicon nitride, a-Si:C:O or a-Si:O:F, or by coating an organic insulating material.

As shown in FIGS. 17A to 17C, the passivation layer 180 together with the gate insulating layer 140 is photo-etched to form a plurality of contact holes 182, 185, 187, and 189 exposing the drain electrodes 175, the expansions 125 of the gate lines 121, the expansions 179 of the data lines 171, and the storage capacitor conductors 177, respectively.

Finally, as shown in FIGS. 7 to 9, an IZO layer and an ITO layer are deposited and photo-etched to form a plurality of pixel electrodes 901 connected to the drain electrodes 175 and the storage capacitor conductors 177, a plurality of contact assistants 906 connected to the expansions 125 of the gate lines 121, and a plurality of contact assistants 908 connected to the expansions 179 of the data lines 171.

The pixel electrodes 901 and the contact assistants 906 and 908 have double layers of lower films 901*p*, 906*p*, and 908*p* and upper films 901*q*, 906*q*, and 908*q*. Here, the lower films 901*p*, 906*p*, and 908*p* are made of IZO and the upper films 901*q*, 906*q*, and 908*q* are made of ITO.

Here, an IZO etchant is used for etching the IZO layer and the ITO layer. The IZO etchant contains HCl, $CH_3COOH$, deionized water, and a surfactant. Preheating for deposition of the IZO layer and the ITO layer is performed under $N_2$ gas atmosphere in order to prevent formation of a metal oxide layer on the portions of the metal layers 125, 175, and 179, which are exposed through the contact holes 182, 185, and 189.

Since the data wire 171, 173, 175, 177, and 179, the ohmic contacts 163, 165, and 167 thereunder and the semiconductors 151 and 157 thereunder are formed using a single mask, and the source electrode 173 and the drain electrode 175 are separated from each other in this process, the embodiment illustrated in FIGS. 7, 8, and 9 gives a simple manufacturing method as well as the advantage which the embodiment illustrated in FIGS. 1 and 2 gives.

A TFT array panel for an LCD according to another embodiment of the present invention will be described in detail with reference to FIGS. 18-24B.

Figure 18:
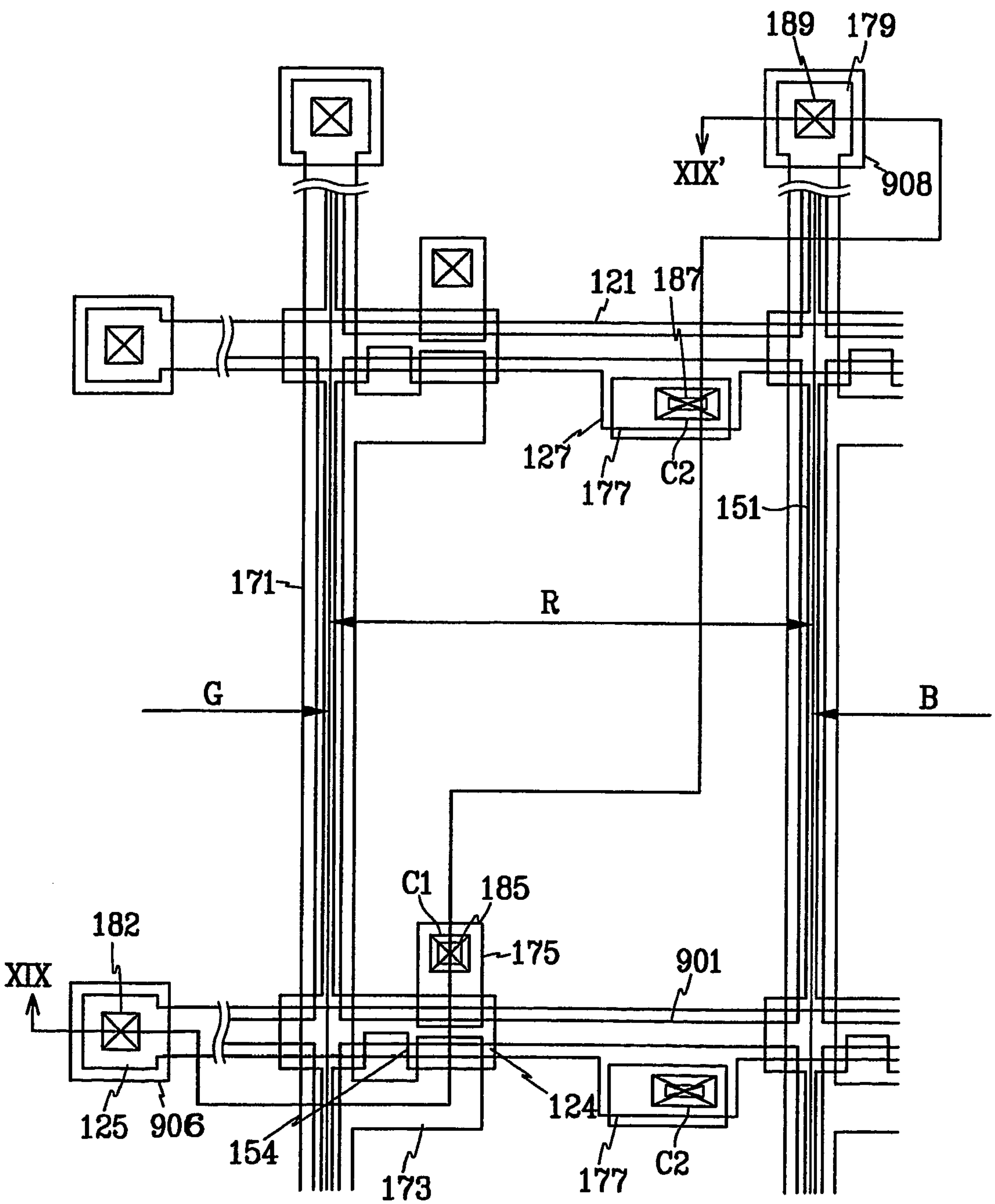
FIG. 18 is a layout view of a TFT array panel for an LCD according to another embodiment of the present invention.
Figure 19:
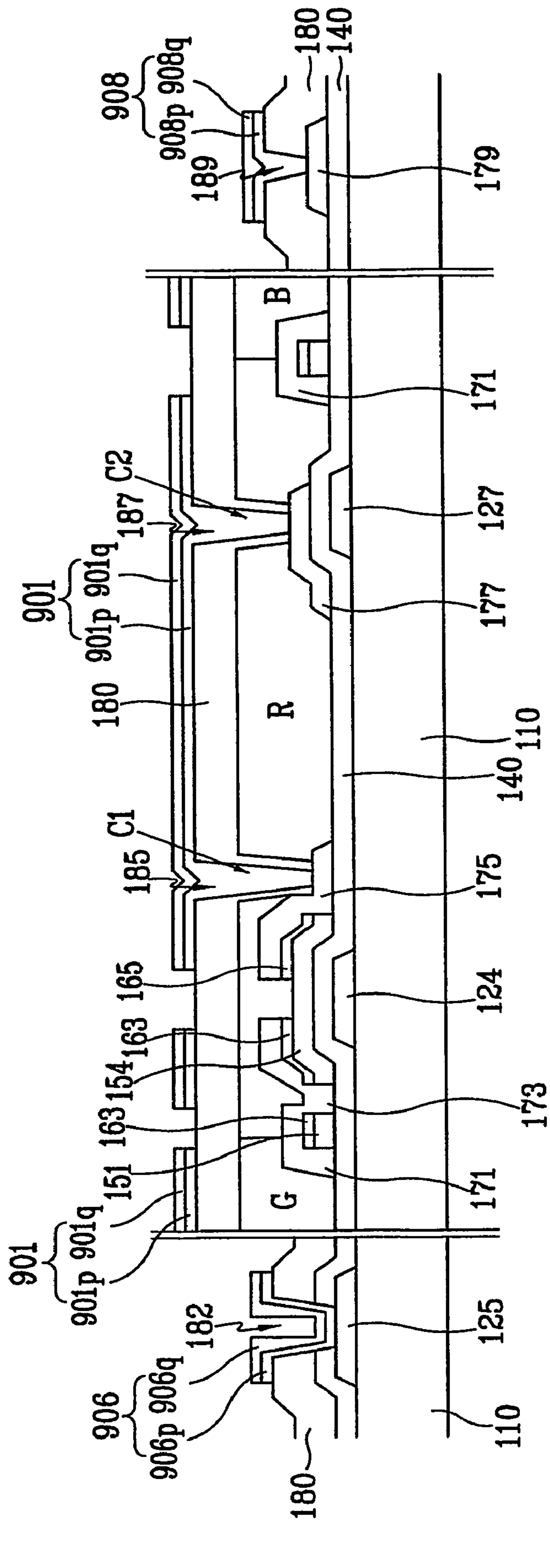
FIG. 19 is a sectional view of the TFT array panel taken along the line XIX-XIX' of FIG. 18.

FIG. 18 is a layout view of a TFT array panel for an LCD according to another embodiment of the present invention. FIG. 19 is a sectional view of the TFT array panel taken along the line XIX-XIX' of FIG. 18.

A plurality of gate lines 121 for transmitting gate signals are formed on an insulating substrate 110. Each gate line 121 extends substantially in a transverse direction and a plurality of portions of each gate line 121 form a plurality of gate electrodes 124. Each gate line 121 includes a plurality of projections 127 protruding downward and an expansion 129 having a large area for contact with another layer or an external device.

In addition, the lateral sides of the gate lines 121 are inclined relative to a surface of the substrate 110, and the inclination angle thereof ranges about 30-80 degrees.

A gate insulating layer 140 preferably made of silicon nitride (SiNx) is formed on the gate lines 121.

A plurality of semiconductor stripes 151 preferably made of hydrogenated amorphous silicon (abbreviated to "a-Si") are formed on the gate insulating layer 140. Each semiconductor stripe 151 extends substantially in the longitudinal direction and has a plurality of projections 154 branched out toward the gate electrodes 124. The width of each semiconductor stripe 151 becomes large near the gate lines 121 such that the semiconductor stripe 151 covers large areas of the gate lines 121.

A plurality of ohmic contact stripes and islands 161 and 165 preferably made of silicide or n+hydrogenated a-Si heavily doped with n type impurity are formed on the semiconductor stripes 151. Each ohmic contact stripe 161 has a plurality of projections 163, and the projections 163 and the ohmic contact islands 165 are located in pairs on the projections 154 of the semiconductor stripes 151.

The lateral sides of the semiconductor stripes 151 and the ohmic contacts 161 and 165 are inclined relative to a surface of the substrate 110, and the inclination angles thereof are preferably in a range between about 30-80 degrees.

A plurality of data lines 171, a plurality of drain electrodes 175, and a plurality of storage capacitor conductors 177 are formed on the ohmic contacts 161 and 165 and the gate insulating layer 140.

The data lines 171 for transmitting data voltages extend substantially in the longitudinal direction and intersect the gate lines 121. Each data line 171 includes an expansion 179 having a larger area for contact with another layer or an external device. Larger portion of the data line 171 is disposed on the display area but the expansion 179 is disposed on the boundary area.

A plurality of branches of each data line 171, which project toward the drain electrodes 175, form a plurality of source electrodes 173. Each pair of the source electrodes 173 and the drain electrodes 175 are separated from each other and opposite each other with respect to a gate electrode 124. A gate electrode 124, a source electrode 173, and a drain electrode 175 along with a projection 154 of a semiconductor stripe 151 form a TFT having a channel formed in the projection 154 disposed between the source electrode 173 and the drain electrode 175.

The storage capacitor conductors 177 overlap the projections 127 of the gate lines 121.

Like the gate lines 121, the data lines 171, the drain electrodes 175, and the storage capacitor conductors 177 have tapered lateral sides relative to the surface of the substrate 110, and the inclination angles thereof range about 30-80 degrees.

The ohmic contacts 161 and 165 are interposed only between the underlying semiconductor stripes 151 and the overlying data lines 171 and the overlying drain electrodes 175 thereon and reduce the contact resistance therebetween. The semiconductor stripes 151 include a plurality of exposed portions, which are not covered with the data lines 171 and the drain electrodes 175, such as portions located between the source electrodes 173 and the drain electrodes 175. Although the semiconductor stripes 151 are narrower than the data lines 171 at most places, the width of the semiconductor stripes 151 becomes large near the gate lines 121 as described above, to smooth the profile of the surface, thereby preventing the disconnection of the data lines 171.

A plurality of color filters R, G, and B are formed on the data lines 171, the drain electrodes 175, the storage electrode capacitors 177, exposed portions of the semiconductor stripes 151, which are not covered with the data lines 171 and the drain electrodes 175, and the gate insulating layer 140 which are not covered with them. The color filters R, G, and B have openings C1 and C2 exposing the drain electrode 175 and the storage capacitor conductor 177.

A passivation layer 180 is formed on the color filters R, G, and B. The passivation layer 180 is preferably made of photosensitive organic material having a good flatness characteristic, low dielectric insulating material such as a-Si:C:O and a-Si:O:F formed by plasma enhanced chemical vapor deposition (PECVD), or inorganic material such as silicon nitride and silicon oxide.

The passivation layer 180 has a plurality of contact holes 185, 187 and 189 exposing the drain electrodes 175, and the storage conductors 177, and the expansions 179 of the data lines 171, respectively. The passivation layer 180 and the gate insulating layer 140 have a plurality of contact holes 182 exposing the expansions 129 of the gate lines 121.

A plurality of pixel electrodes 901 and a plurality of contact assistants 906 and 908 are formed on the passivation layer 180.

The pixel electrodes 901 and the contact assistants 906 and 908 have double layers of lower films 901*p*, 906*p*, and 908*p* and upper films 901*q*, 906*q*, and 906*q*. Here, the lower films 901*p*, 906*p*, and 908*p* are made of IZO and the upper films 901*q*, 906*q*, and 906*q* are made of ITO.

Here, the IZO layers 901*p*, 906*p*, and 908*p* have a thickness between 500 Å to 1500 Å and the ITO layers 901*q*, 906*q*, and 908*q* have a thickness between 50 Å to 250 Å. Especially, the IZO layers 901*p*, 906*p*, and 908*p* preferably have thickness of 900 Å and the ITO layers 901*q*, 906*q*, and 908*q* have thickness of 200 Å.

The pixel electrodes 901 are physically and electrically connected to the drain electrodes 175 through the contact holes 185 and to the storage capacitor conductors 177 through the contact holes 187 such that the pixel electrodes 901 receive the data voltages from the drain electrodes 175 and transmit the received data voltages to the storage capacitor conductors 177.

The pixel electrodes 901 supplied with the data voltages generate electric fields in cooperation with a common electrode (not shown) on another panel (not shown), which reorient liquid crystal molecules in a liquid crystal layer (not shown) disposed therebetween.

A pixel electrode 901 and a common electrode form a liquid crystal capacitor, which stores applied voltages after turn-off of the TFT. An additional capacitor called a "storage capacitor," which is connected in parallel to the liquid crystal capacitor, is provided for enhancing the voltage storing capacity. The storage capacitors are implemented by overlapping the pixel electrodes 901 with the gate lines 121 adjacent thereto. The capacitances of the storage capacitors, i.e., the storage capacitances are increased by providing the projections 127 at the gate lines 121 for increasing overlapping areas and by providing the storage capacitor conductors 177, which are connected to the pixel electrodes 901 and overlap the projections 127, under the pixel electrodes 901 for decreasing the distance between the terminals.

The pixel electrodes 901 overlap the gate lines 121 and the data lines 171 to increase aperture ratio but it is optional.

The contact assistants 906 and 908 are connected to the exposed expansions 125 of the gate lines 121 and the exposed expansions 179 of the data lines 171 through the contact holes 182 and 189, respectively. The contact assistants 906 and 908 protect the expansions 125 and 179 and complement the adhesion between the expansions 125 and 179 and external devices.

A method of manufacturing the TFT array panel illustrated in FIGS. 18 and 19 will now be described in detail with reference to FIGS. 20A to 24B as well as FIGS. 18 and 19.

Figure 20A:
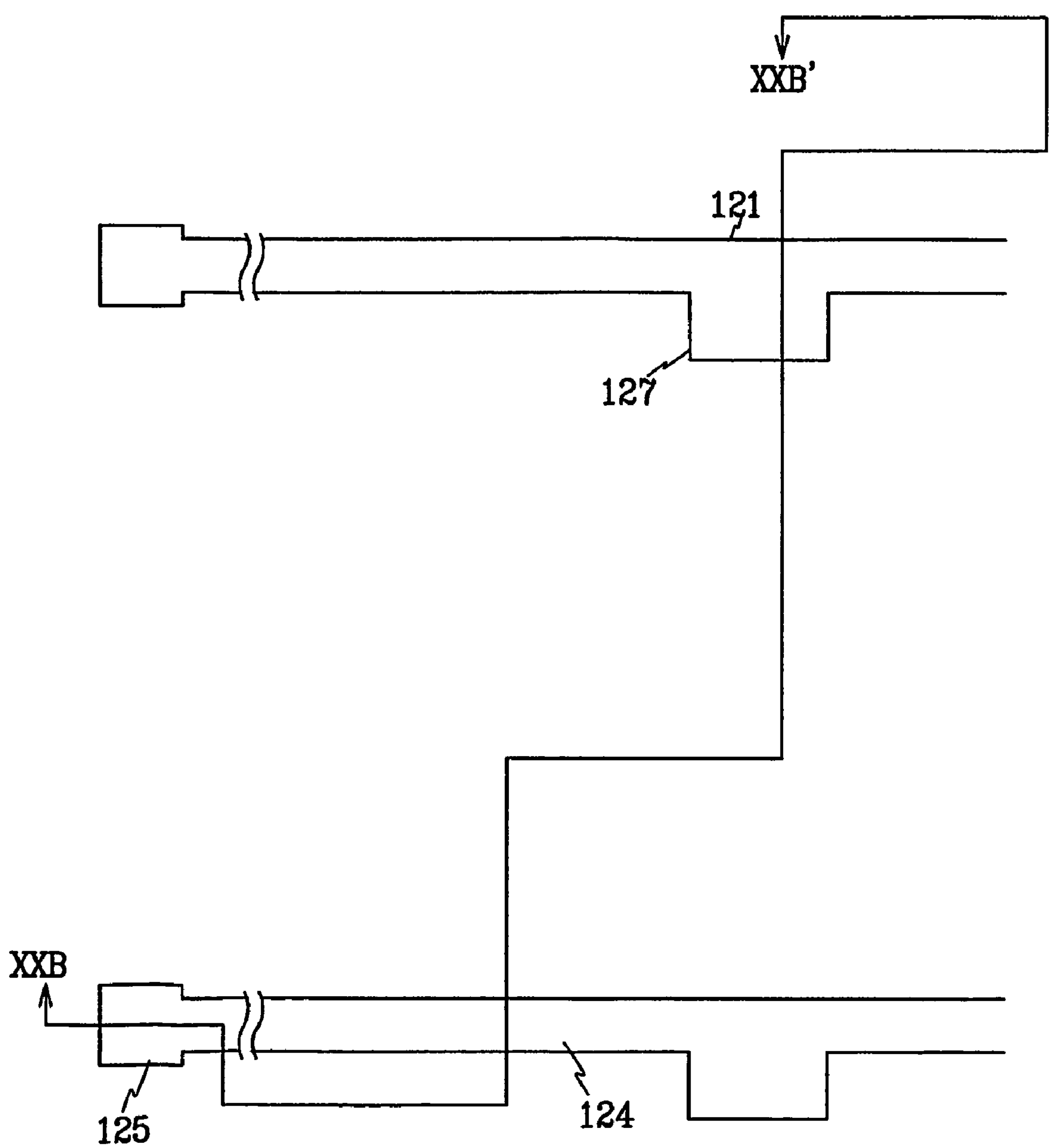
FIG. 20A is a layout view of a TFT array panel in the first step of a manufacturing method thereof according to an embodiment of the present invention.
Figure 20B:
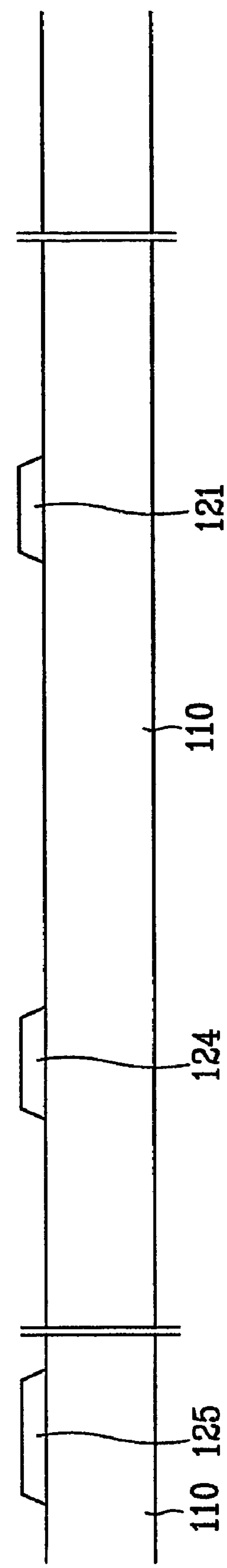
FIG. 20B is a sectional view of the TFT array panel shown in FIG. 20A taken along the line XXb-XXb'.
Figure 21A:
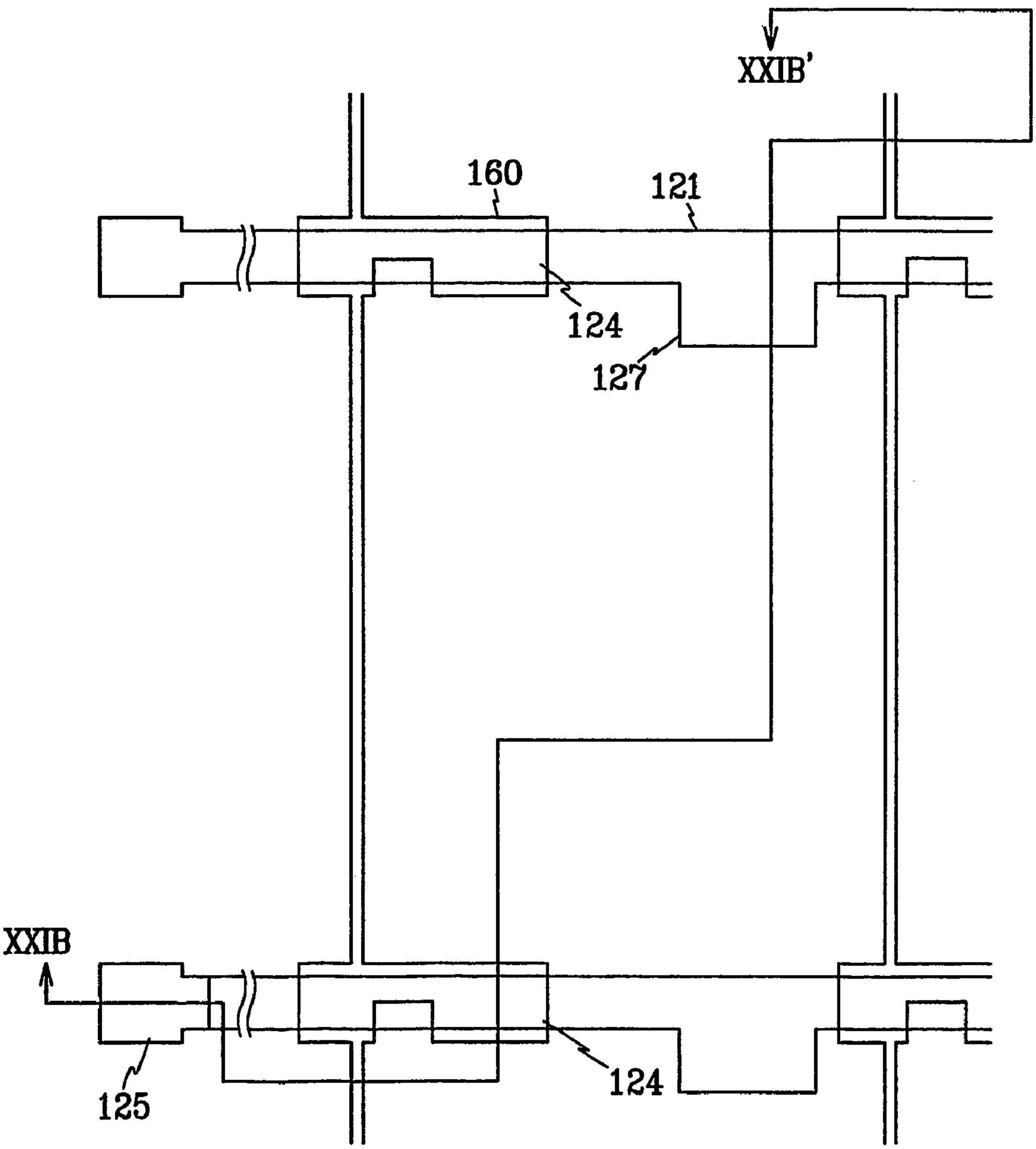
FIG. 21A is a layout view of a TFT array panel in the step following the step shown in FIG. 20A.
Figure 21B:
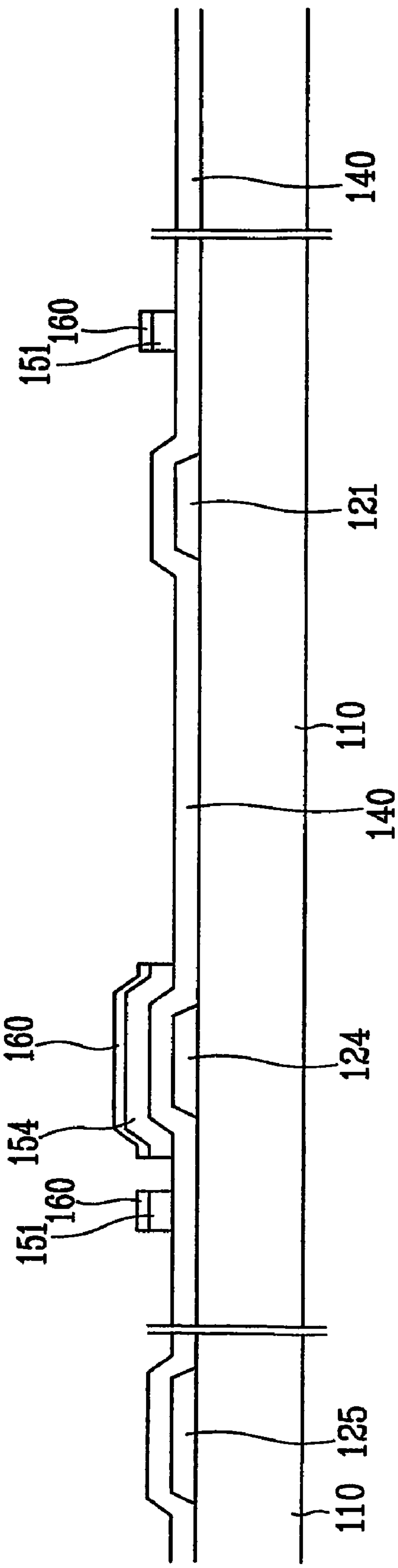
FIG. 21B is a sectional view of the TFT array panel shown in FIG. 21A taken along the line XXIb-XXIb'.
Figure 22A:
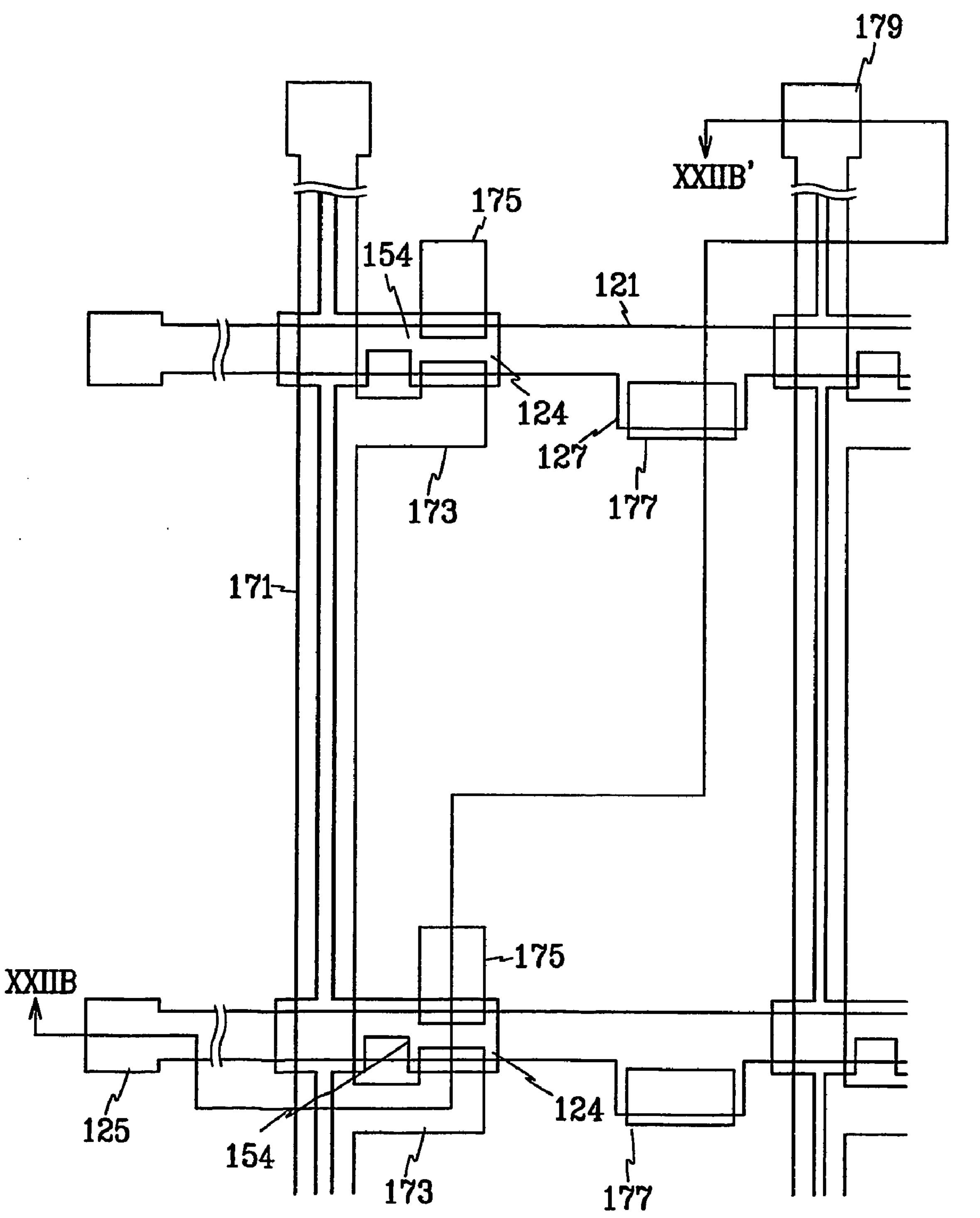
FIG. 22A is a layout view of a TFT array panel in the step following the step shown in FIG. 21A.
Figure 22B:
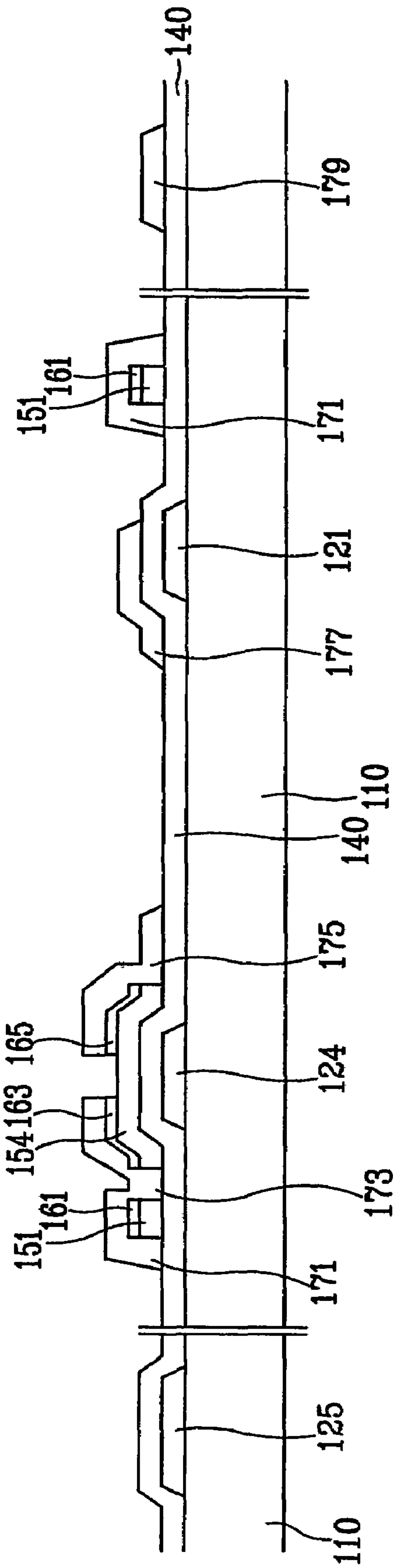
FIG. 22B is a sectional view of the TFT array panel shown in FIG. 22A taken along the line XXIIb-XXIIb'.
Figure 23A:
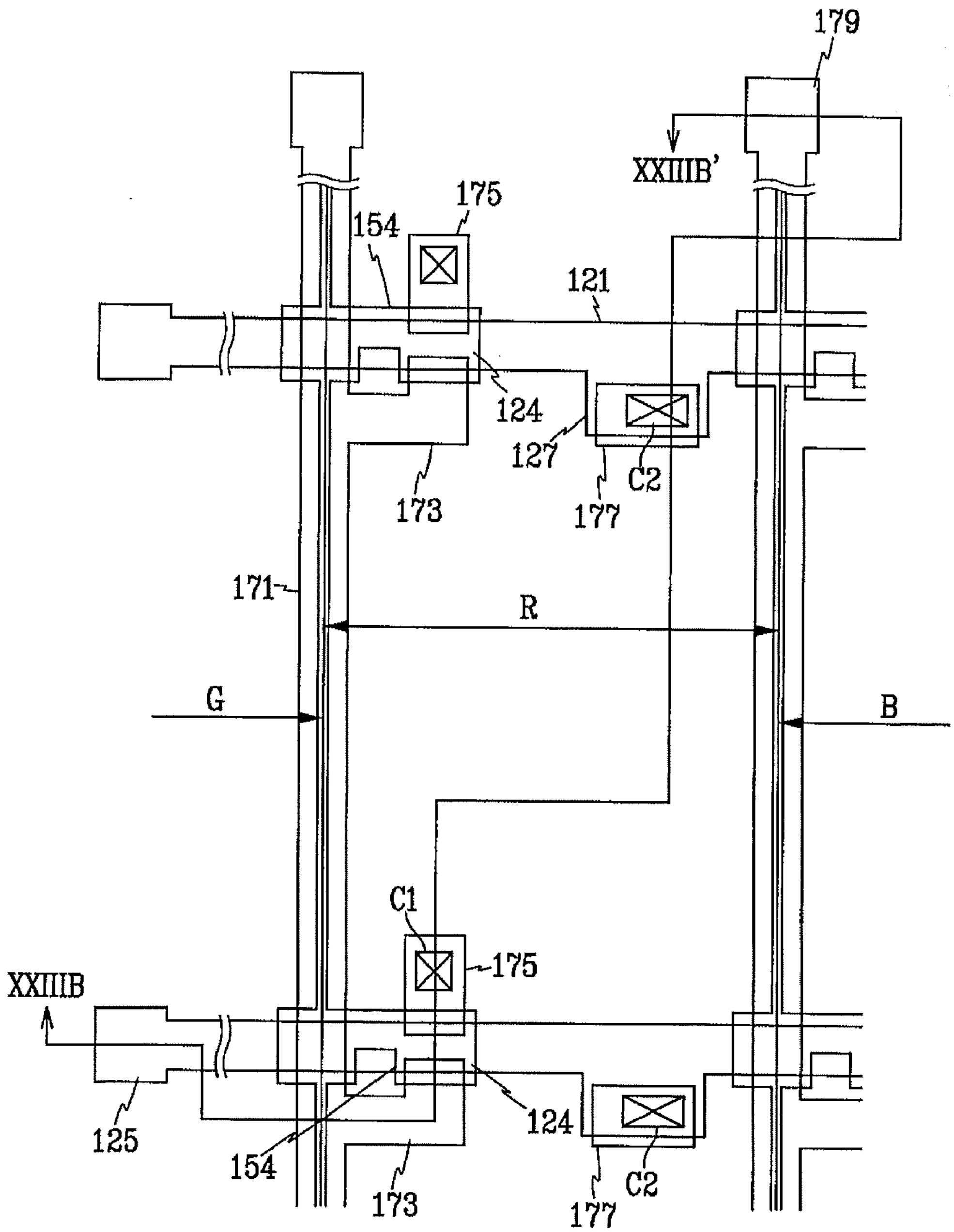
FIG. 23A is a layout view of a TFT array panel in the step following the step shown in FIG. 22A.
Figure 23B:
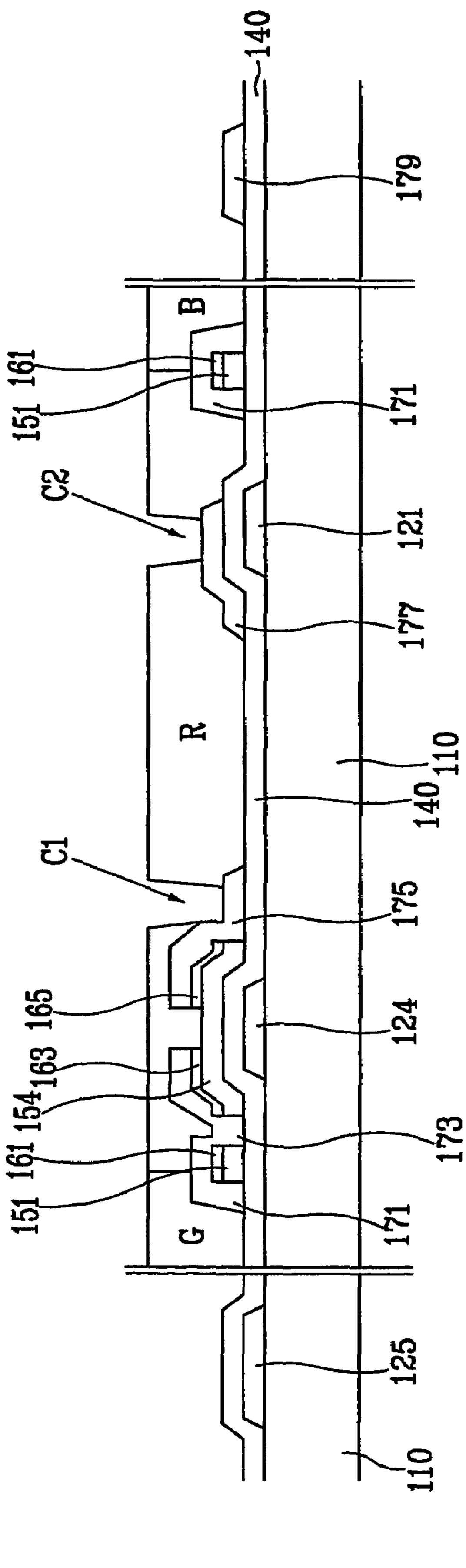
FIG. 23B is a sectional view of the TFT array panel shown in FIG. 23A taken along the line XXIIIb-XXIIIb'.
Figure 24A:
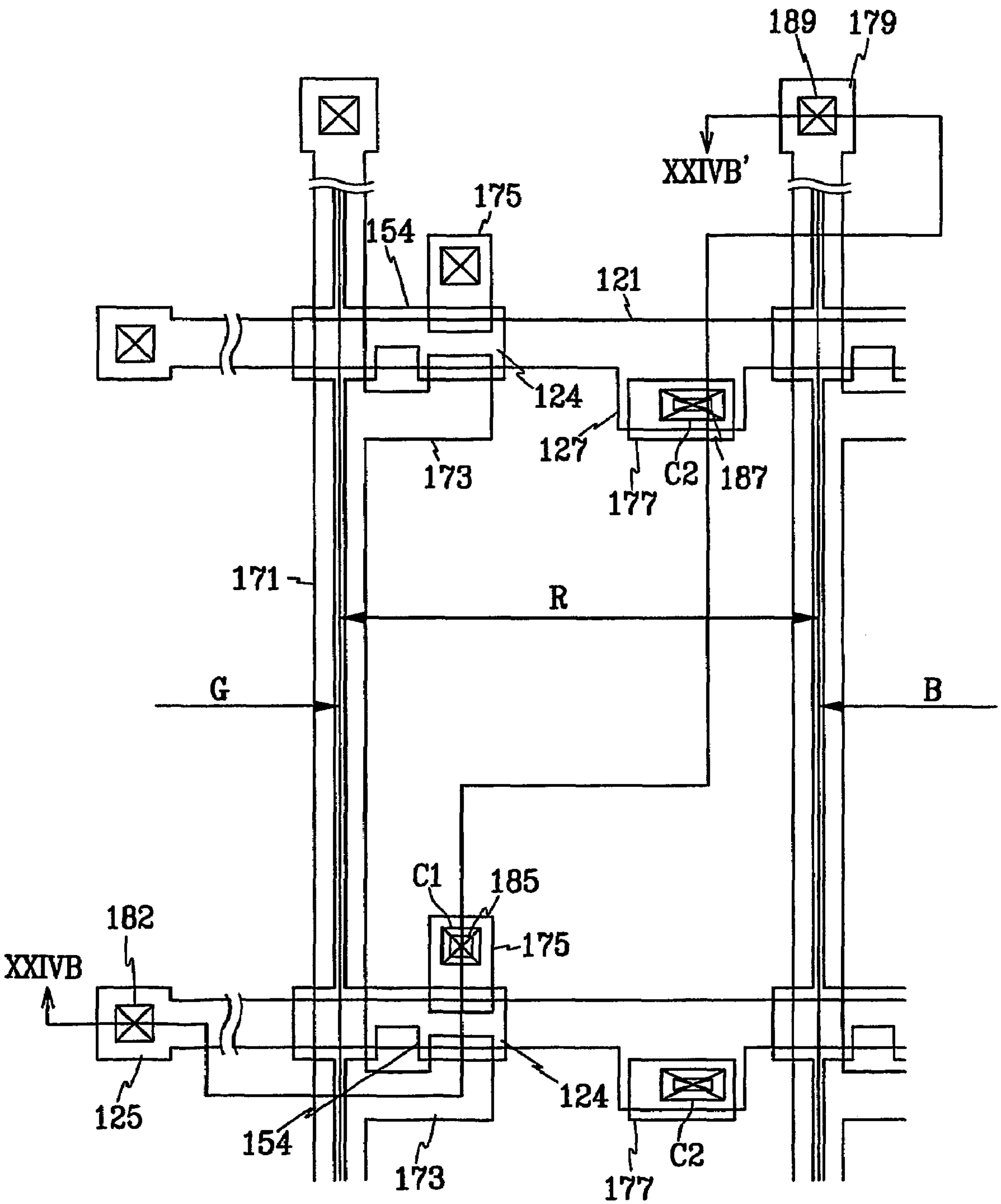
FIG. 24A is a layout view of a TFT array panel in the step following the step shown in FIG. 23A.
Figure 24B:
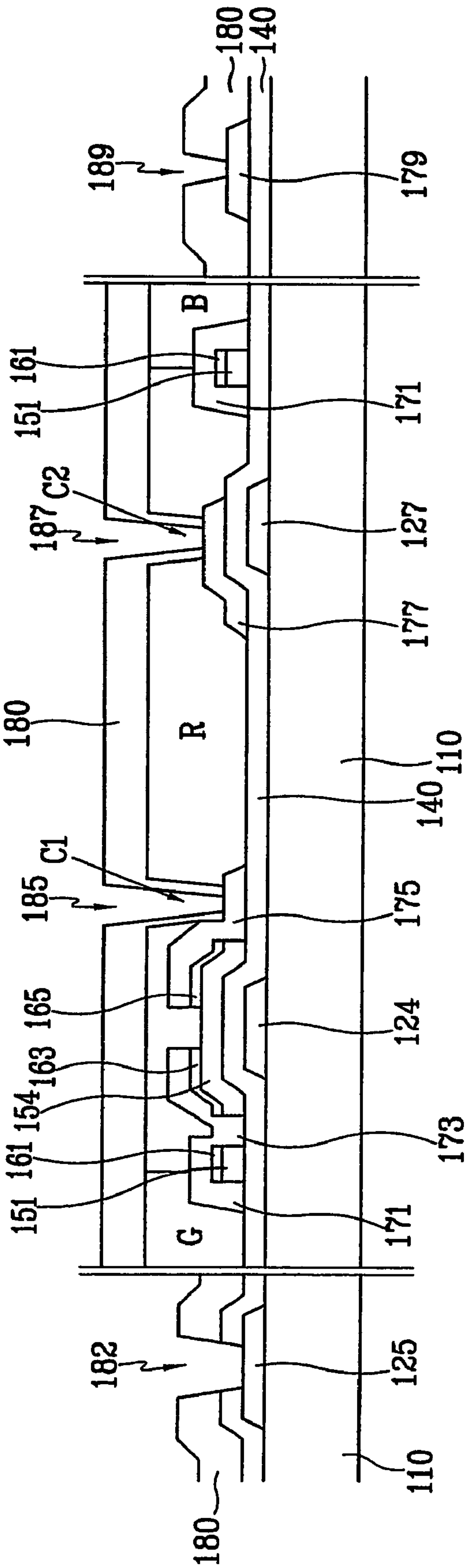
FIG. 24B is a sectional view of the TFT array panel shown in FIG. 24A taken along the line XXIVb-XXIVb'.

FIG. 20A is a layout view of a TFT array panel in the first step of a manufacturing method thereof according to an embodiment of the present invention. FIG. 20B is a sectional view of the TFT array panel shown in FIG. 20A taken along the lime XXb-XXb'. FIG. 21A is a layout view of a TFT array panel in the step following the step shown in FIG. 20A. FIG. 21B is a sectional view of the TFT array panel shown in FIG. 21A taken along the line XXIb-XXIb'. FIG. 22A is a layout view of a TFT array panel in the step following the step shown in FIG. 21A. FIG. 22B is a sectional view of the TFT array panel shown in FIG. 22A taken along the line XXIIb-XXIIb'. FIG. 23A is a layout view of a TFT array panel in the step following the step shown in FIG. 22A. FIG. 23B is a sectional view of the TFT array panel shown in FIG. 23A taken along the line XXIIIb-XXIIIb'. FIG. 24A is a layout view of a TFT array panel in the step following the step shown in FIG. 23A. FIG. 24B is a sectional view of the TFT array panel shown in FIG. 24A taken along the line XXIVb-XXIVb'.

First, a conductive film is sputtered on an insulating substrate 110 such as transparent glass.

Referring to FIGS. 20A and 20B, the conductive film is patterned to form a plurality of gate lines 121 including a plurality of gate electrodes 124 and projections 127.

Referring to FIGS. 21A and 21B, after sequential deposition of a gate insulating layer 140, an intrinsic a-Si layer, and an extrinsic a-Si layer, the extrinsic a-Si layer and the intrinsic a-Si layer are photo-etched to form a plurality of extrinsic semiconductors 160 and a plurality of intrinsic semiconductors 150. The gate insulating layer 140 is preferably made of silicon nitride with thickness of about 2,000 Å to about 5,000 Å, and the deposition temperature is preferably in a range between about 250° C. and about 500° C.

Referring to FIGS. 22A and 22B, a conductive layer is sputtered and patterned to form a plurality of data lines 171 including a plurality of source electrodes 173, a plurality of drain electrodes 175, and a plurality of storage capacitor conductors 177.

Next, portions of the extrinsic semiconductors 160, which are not covered with the data lines 171 and the drain electrodes 175 are removed by etch to complete a plurality of ohmic contacts 163 and 165 and to expose portions of the intrinsic semiconductors 151. Oxygen plasma treatment may follow thereafter in order to stabilize the exposed surfaces of the semiconductors 151.

Next, as shown in FIGS. 23A and 23B, organic photo-resist materials respectively containing pigments of red, green, and blue are coated and are patterned by photo process to form a plurality of color filters R, G, and B in sequence. At this time, openings C1 and C2 exposing the drain electrode 175 and the storage capacitor conductor 177 are simultaneously formed. The openings C1 and C2 are formed in order to make contact holes of the passivation layer 180, which expose the drain electrode 175 and the storage capacitance conductor 177 to have a good profile.

Referring to FIGS. 24A and 24B, a passivation layer 180 is formed by the coating of an organic insulating film having low dielectric constant and a good flatness characteristic or by the PECVD of low dielectric insulating material such as a-Si:C:O and a-Si:O:F having dielectric constant lower than about 4.0. Thereafter, the passivation layer 180 and the gate insulating layer 140 are photo-etched to form a plurality of contact holes 182, 185, 187, and 189.

Here, the contact holes 185 and 187 exposing the drain electrodes 175 and the storage capacitor conductor 177 are formed in the openings C1 and C2 of the color filters R, G, and B. In the present invention, the color filters R, G, and B are formed to have openings C1 and C2 and the passivation layer 180 is patterned to form the contact holes 185 and 187 respectively exposing the drain electrodes 175 and the storage capacitor conductor 177 such that the contact holes 185 and 187 have good profiles.

Finally, as shown in FIGS. 18 and 19, a plurality of pixel electrodes 901 and a plurality of contact assistants 906 and 908 including double layers are formed by sputtering and photo-etching an IZO layer and an ITO layer.

Here, an IZO etchant is used for etching the IZO layer and the ITO layer. The IZO etchant contains HCl, $CH_3COOH$, deionized water, and a surfactant.

A TFT array panel for an LCD according to another embodiment of the present invention will be described in detail with reference to FIGS. 25 to 35C.

Figure 25:
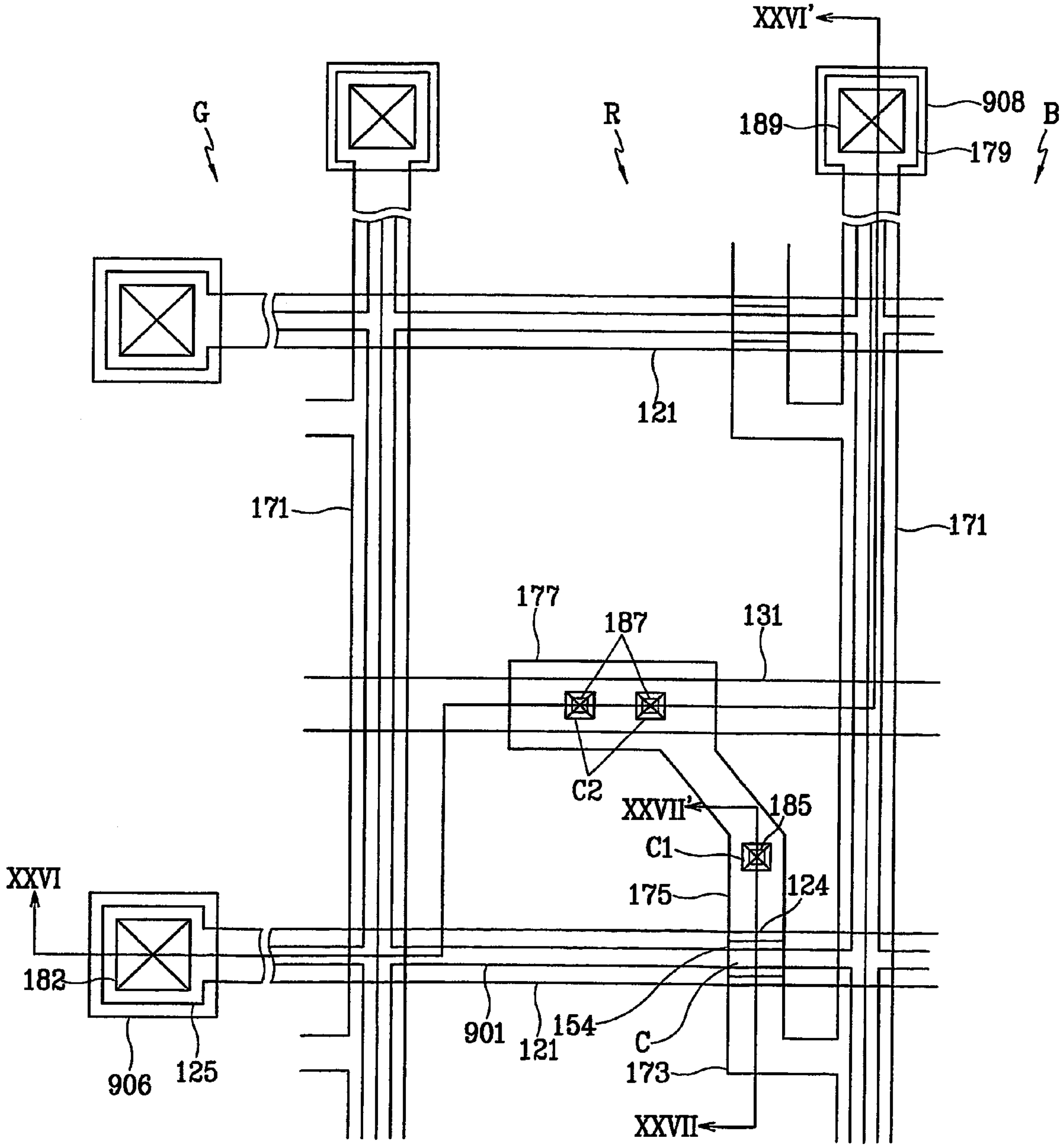
FIG. 25 is a layout view of a TFT array panel for an LCD according to another embodiment of the present invention.
Figure 26:
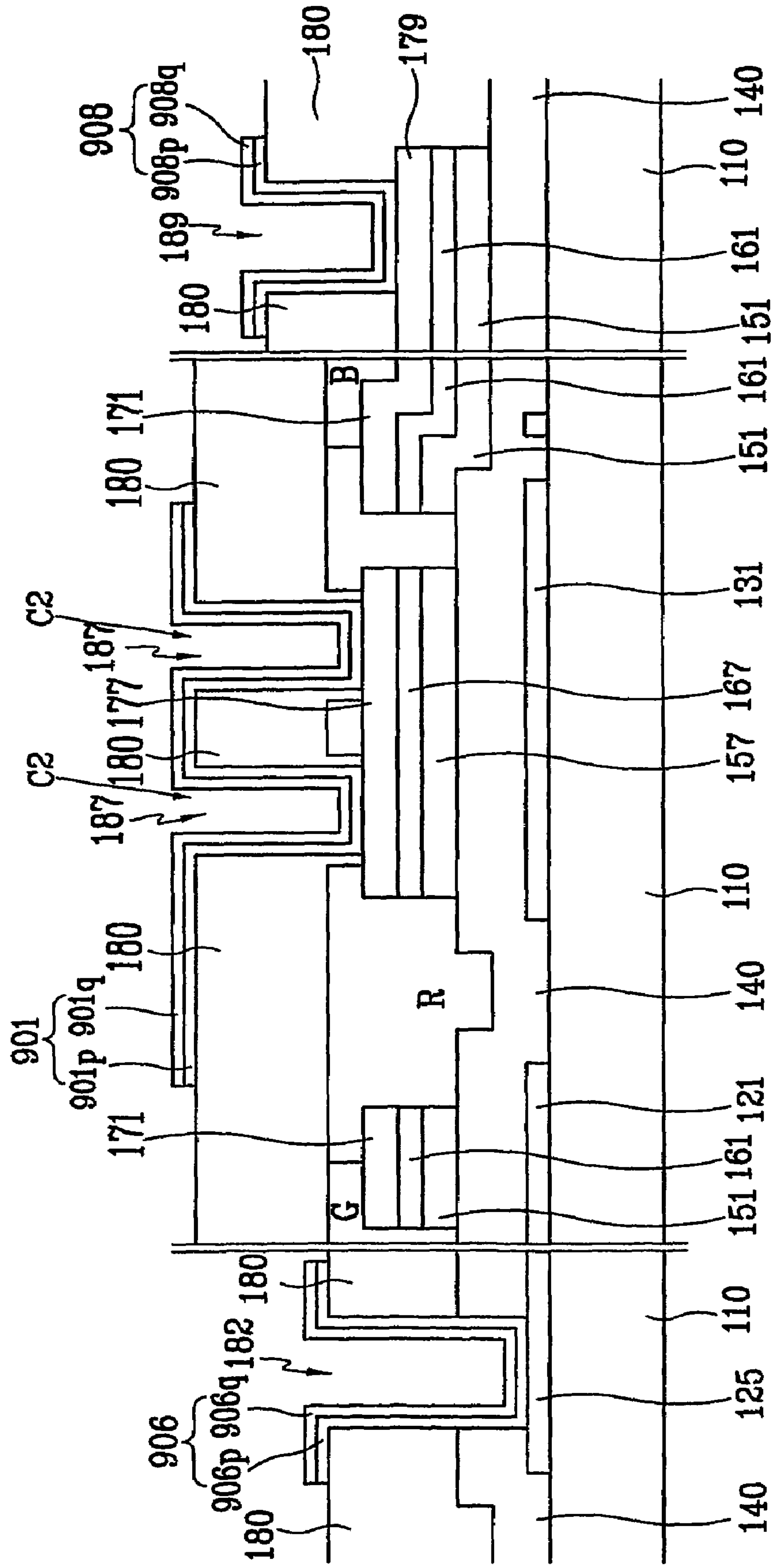
FIGS. 26 and 27 are sectional views of the TFT array panel shown in FIG. 25 taken along the line XXVI-XXVI' and the line XXVII-XXVII'.
Figure 27:
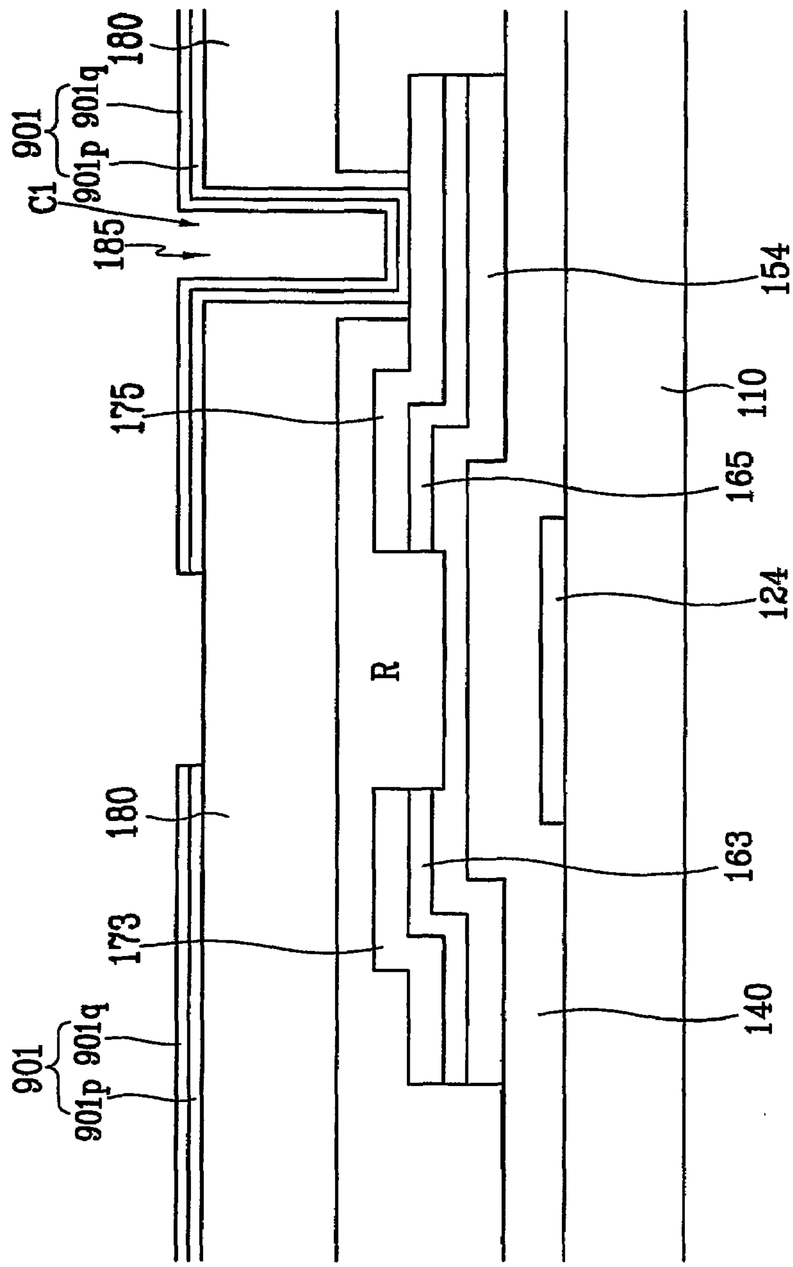

FIG. 25 is a layout view of a TFT array panel for an LCD according to another embodiment of the present invention. FIGS. 26 and 27 are sectional views of the TFT array panel shown in FIG. 25 taken along the line XXVI-XXVI' and the line XXVII-XXVII'.

Referring to FIGS. 25 to 27, a plurality of gate lines 121 including a plurality of gate electrodes 124 and expansions 125 for contacting an external circuit and a plurality of storage electrode lines 131 which are electrically separated from the gate lines 121 are formed on a substrate 110.

The storage electrode lines 131 are supplied with a predetermined voltage such as the common voltage. The storage electrode lines 131 may be omitted if the storage capacitance generated by the overlapping of the gate lines 121 and the pixel electrodes 901 is sufficient. In such a case, storage capacitor conductors 177 are also omitted.

In addition, the lateral sides of the gate lines 121 and the storage electrode lines 131 are inclined relative to a surface of the substrate 110, and the inclination angle thereof ranges about 30-80 degrees.

A gate insulating layer 140 preferably made of silicon nitride (SiNx) is formed on the gate lines 121.

A plurality of semiconductor stripes 151 preferably made of hydrogenated amorphous silicon (abbreviated to "a-Si") are formed on the gate insulating layer 140. Each semiconductor stripe 151 extends substantially in the longitudinal direction and has a plurality of projections 154 branched out toward the gate electrodes 124. A plurality of semiconductor segments 157 are formed to cover portions of the storage electrode lines 131 and are connected to the projections 154.

A plurality of ohmic contact stripes 161, islands 165, and segments 167 preferably made of silicide or n+hydrogenated a-Si heavily doped with n type impurity are formed on the semiconductor stripes 151. Each ohmic contact stripe 161 has a plurality of projections 163, and the projections 163 and the ohmic contact islands 165 are located in pairs on the projections 154 of the semiconductor stripes 151. The ohmic contact segments 167 are formed on the semiconductor segments 157. Like the semiconductor segments 157 are connected to the projections 154, the ohmic contact segments 167 are also connected to the ohmic contact islands 165.

The lateral sides of the semiconductors 151 and 157 and the ohmic contacts 161, 165, and 167 are inclined relative to a surface of the substrate 110, and the inclination angles thereof are preferably in a range between about 30-80 degrees.

A plurality of data lines 171, a plurality of drain electrodes 175, and a plurality of storage capacitor conductors 177 are formed on the ohmic contacts 161, 165, and 167 and the gate insulating layer 140. The drain electrodes 175 and the storage capacitor conductor 177 are connected to each other.

The data lines 171 for transmitting data voltages extend substantially in the longitudinal direction and intersect the gate lines 121. Each data line 171 includes an expansion 179 having a larger area for contact with another layer or an external device. Larger portion of the data line 171 is disposed on the display area but the expansion 179 of the data line 171 is disposed on the boundary area.

A plurality of branches of each data line 171, which project toward the drain electrodes 175, form a plurality of source electrodes 173. Each pair of the source electrodes 173 and the drain electrodes 175 are separated from each other and opposite each other with respect to a gate electrode 124. A gate electrode 124, a source electrode 173, and a drain electrode 175 along with a projection 154 of a semiconductor stripe 151 form a TFT having a channel formed in the projection 154 disposed between the source electrode 173 and the drain electrode 175. Far ends of the drain electrode 175 from the source electrode 173 are connected to the storage capacitor conductors 177.

The storage capacitor conductors 177 overlap portions of the storage electrode lines 131 and the storage capacitor conductors 177 is formed on the ohmic contact segments 167 and the semiconductor segments 157.

Like the gate lines 121 and the storage electrode lines 131, the data lines 171, the drain electrodes 175, and the storage capacitor conductors 177 have tapered lateral sides relative to the surface of the substrate 110, and the inclination angles thereof range about 30-80 degrees.

The ohmic contacts 161, 165, and 167 are interposed only between the underlying semiconductors 151 and 157 and the overlying data lines 171, drain electrodes 175, and storage capacitor conductors 177 and reduce the contact resistance therebetween. The semiconductor stripes 151 include a plurality of exposed portions, which are not covered with the data lines 171 and the drain electrodes 175, such as portions located between the source electrodes 173 and the drain electrodes 175. The semiconductor segments 157 are disposed under the ohmic contact segments 167 formed under the storage capacitor conductors 177.

A plurality of color filters R, G, and B are formed on the data lines 171, the drain electrodes 175, the storage electrode capacitors 177, exposed portions of the semiconductor stripes 151, which are not covered with the data lines 171 and the drain electrodes 175, and the gate insulating layer 140 which are not covered with them. The color filters R, G, and B have openings C1 and C2 exposing the drain electrode 175 and the storage capacitor conductor 177.

A passivation layer 180 is formed on the color filters R, G, and B. The passivation layer 180 is preferably made of photosensitive organic material having a good flatness characteristic, low dielectric insulating material such as a-Si:C:O and a-Si:O:F formed by plasma enhanced chemical vapor deposition (PECVD), or inorganic material such as silicon nitride and silicon oxide.

The passivation layer 180 has a plurality of contact holes 185, 187, and 189 exposing the drain electrodes 175, the storage conductors 177, and the expansions 179 of the data lines 171, respectively. The passivation layer 180 and the gate insulating layer 140 have a plurality of contact holes 181 exposing the expansions 125 of the gate lines 121.

A plurality of pixel electrodes 901 and a plurality of contact assistants 906 and 908 are formed on the passivation layer 180.

The pixel electrodes 901 have double layers of a lower film 901*p* and an upper film 901*q*. Here, the lower film 901*p* is made of IZO and the upper film 901*q* is made of ITO.

The pixel electrodes 901 are physically and electrically connected to the drain electrodes 175 and the storage capacitor conductors 177 through the contact holes 185 and 187 such that the pixel electrodes 901 receive the data voltages from the drain electrodes 175 and transmit the data voltages to the storage capacitor conductors 177.

The pixel electrodes 901 supplied with the data voltages generate electric fields in cooperation with a common electrode (not shown) on another panel (not shown), which reorient liquid crystal molecules in a liquid crystal layer (not shown) disposed therebetween.

A pixel electrode 901 and a common electrode form a liquid crystal capacitor, which stores applied voltages after turn-off of the TFT. An additional capacitor called a "storage capacitor" is connected in parallel to the liquid crystal capacitor. The storage capacitors are implemented by overlapping the pixel electrodes 190 with the storage lines 131.

The pixel electrodes 901 overlap the gate lines 121 and the data lines 171 to increase aperture ratio but it is optional.

The contact assistants 906 and 908 are connected to the exposed expansions 125 of the gate lines 121 and the exposed expansions 179 of the data lines 171 through the contact holes 182 and 189, respectively. The contact assistants 906 and 908 protect the expansions 125 and 179 and complement the adhesion between the expansions 125 and 179 and external devices.

The contact assistants 906 and 908 also have double layers of lower films 906*p* and 908*p* and upper films 906*q* and 908*q*. Here, the lower films 906*p* and 908*p* are made of IZO and the upper films 906*q* and 908*q* are made of ITO.

Here, the IZO layers 901*p*, 906*p*, and 908*p* have a thickness between 500 Å to 1500 Å and the ITO layers 901*q*, 906*q*, and 908*q* have a thickness between 50 Å to 250 Å. Especially, the IZO layers 901*p*, 906*p*, and 908*p* preferably have thickness of 900 Å and the ITO layers 901*q*, 906*q*, and 908*q* have thickness of 200 Å.

A method of manufacturing the TFT array panel illustrated in FIGS. 25, 26, and 27 will be now described in detail with reference to FIGS. 28A to 35C as well as FIGS. 25, 26, and 27.

Figure 28A:
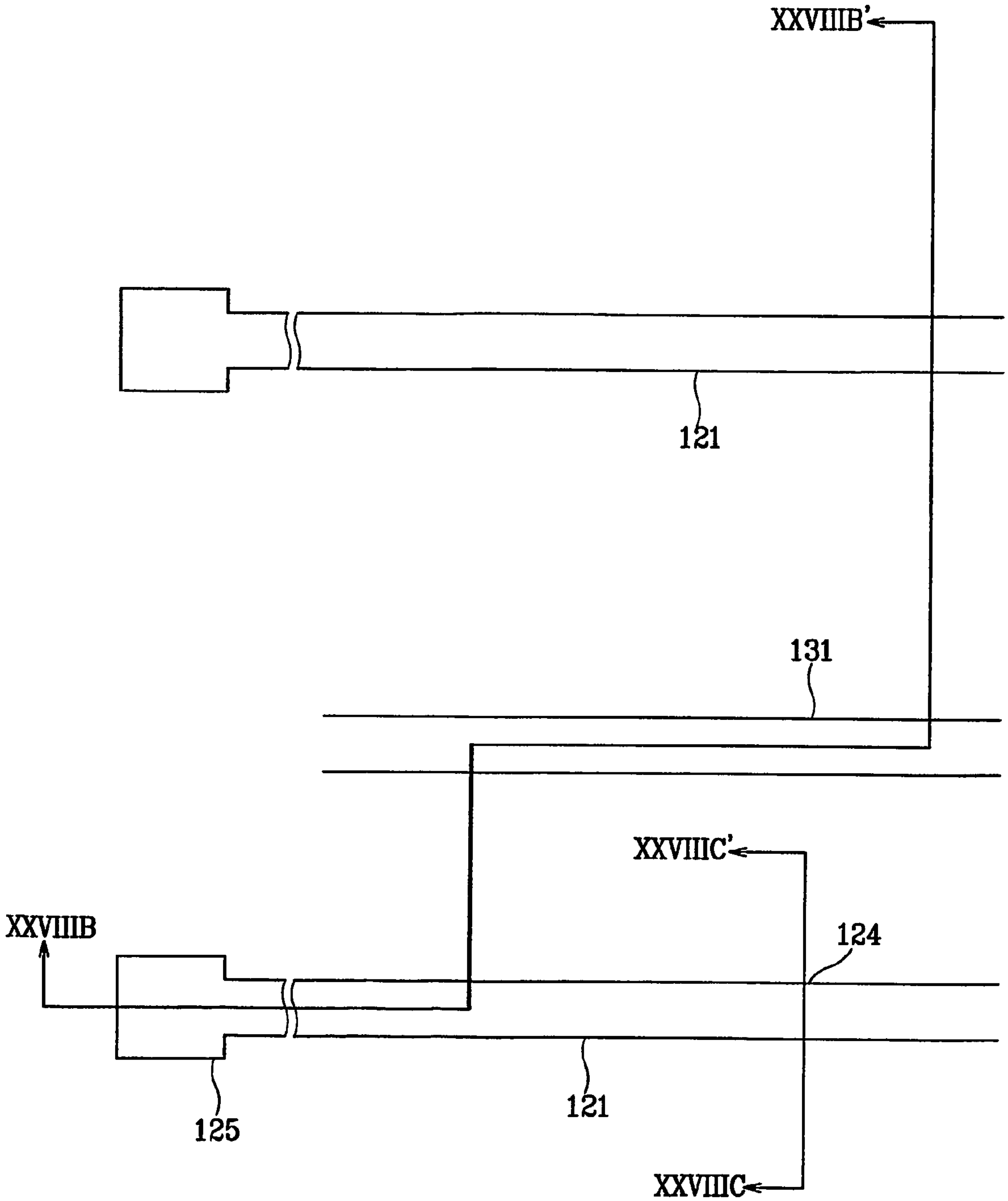
FIG. 28A is a layout view of a TFT array panel in the first step of a manufacturing method thereof according to the fourth embodiment of the present invention.
Figure 28B:
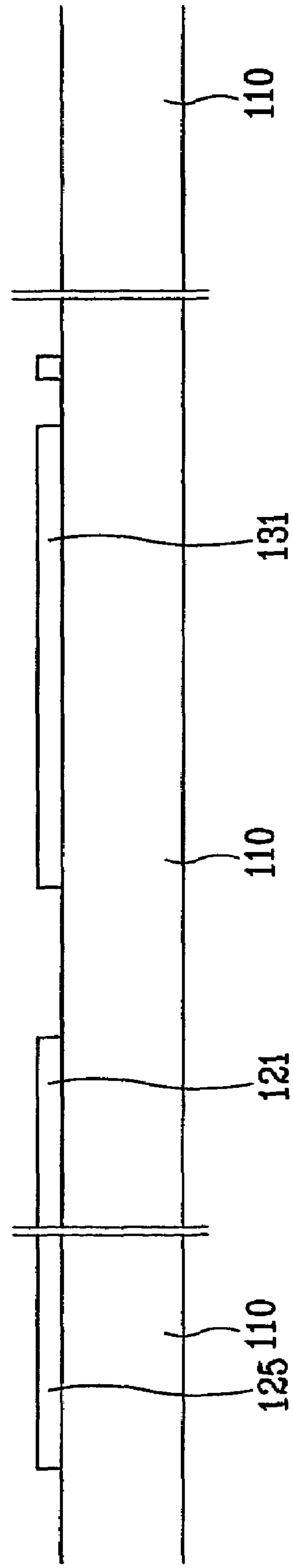
FIGS. 28B and 28C are sectional views of the TFT array panel shown in FIG. 28A taken along the line XXVIIIb-XXVIII' and the line XXVIIIc-XXVIIIc', respectively.
Figure 28C:
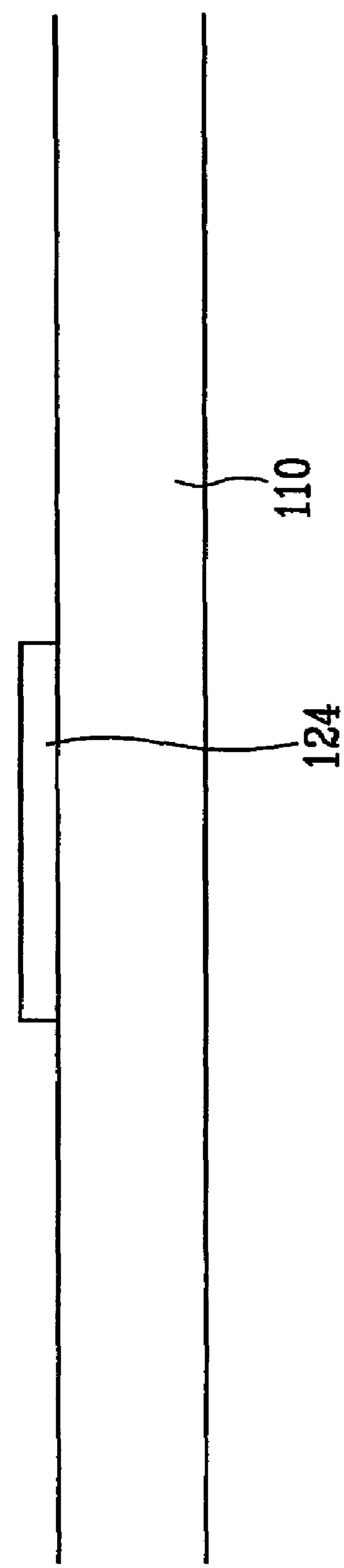
Figure 29A:
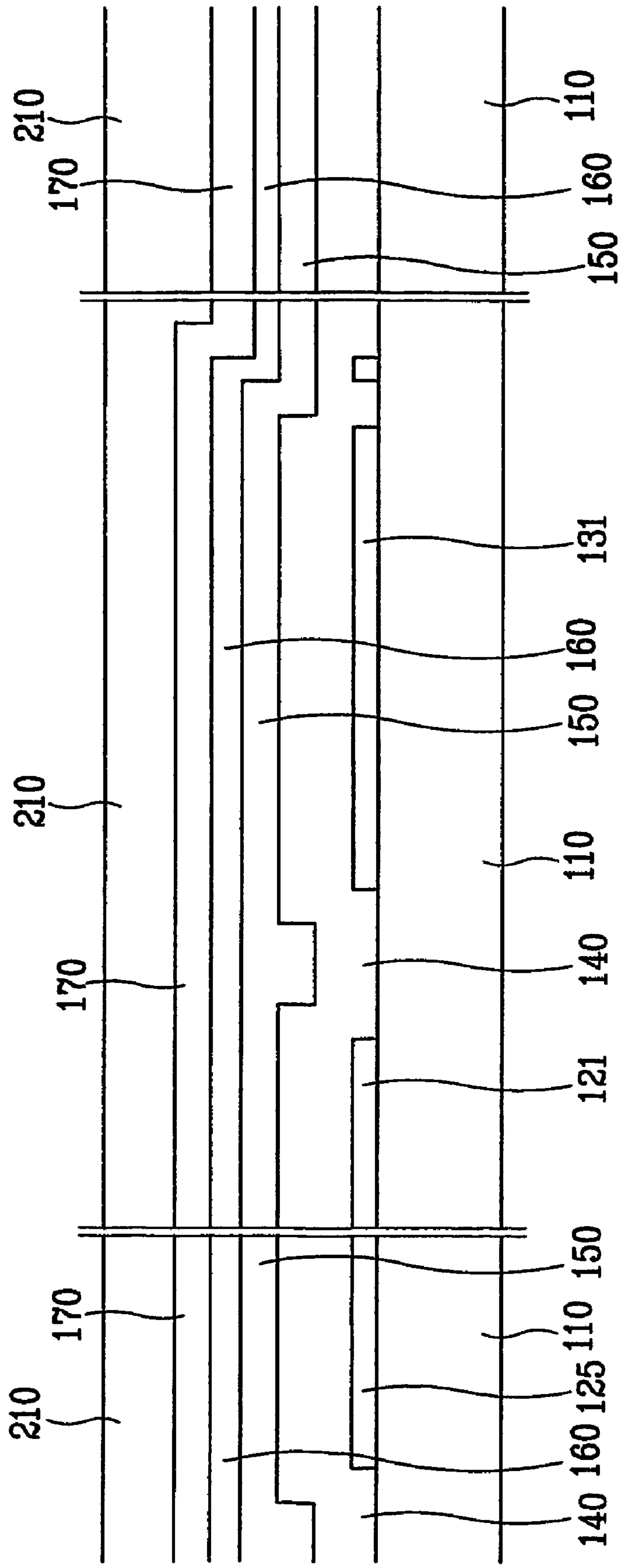
FIGS. 29A and 29B are sectional views of the TFT array panel shown in FIG. 28A taken along the line XXVIIIb-XXVIIIb' and the line XXVIIIc-XXVIIIc', respectively, in the step following the step illustrated in FIGS. 28B and 28C.
Figure 29B:
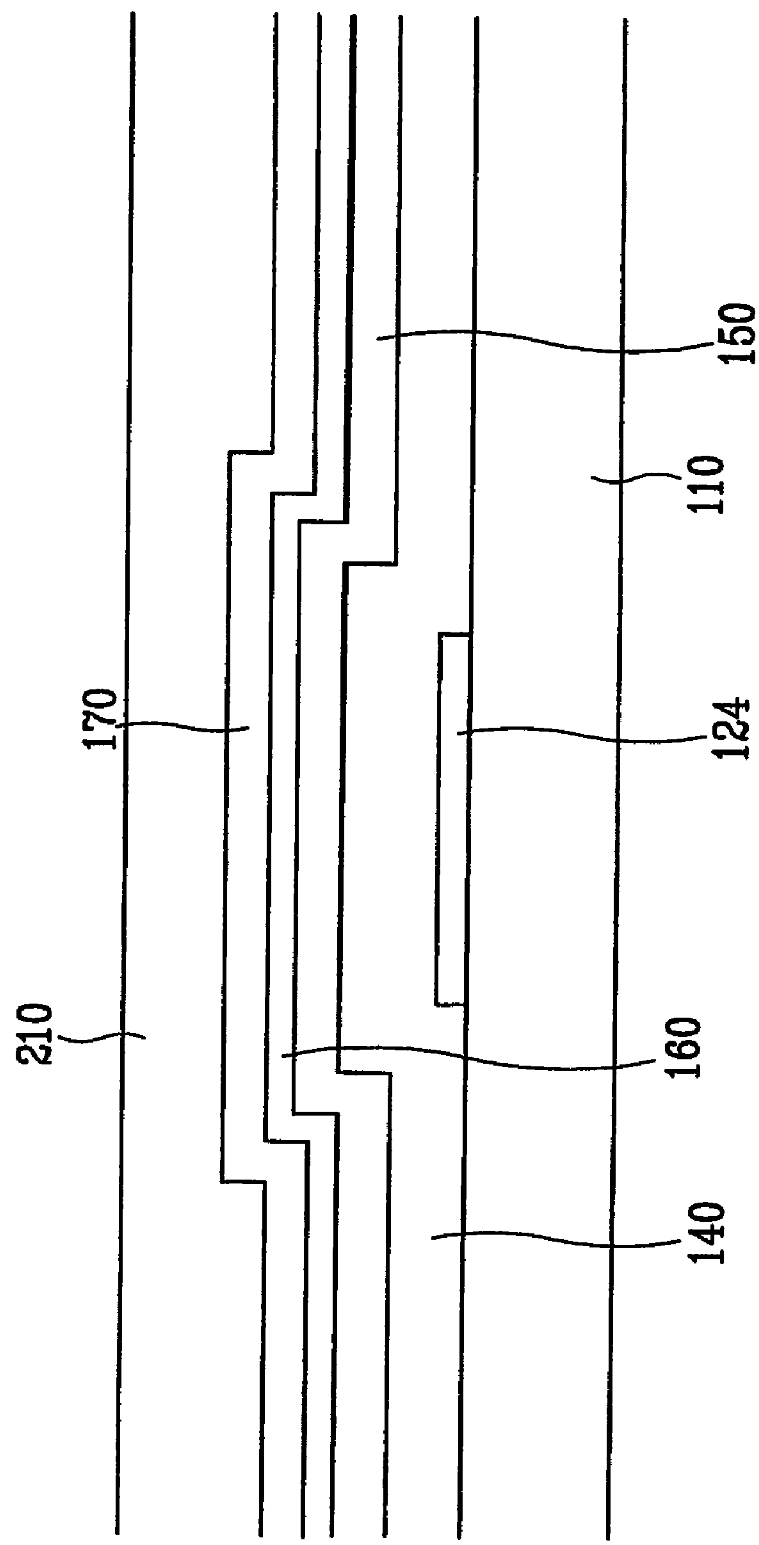
Figure 30A:
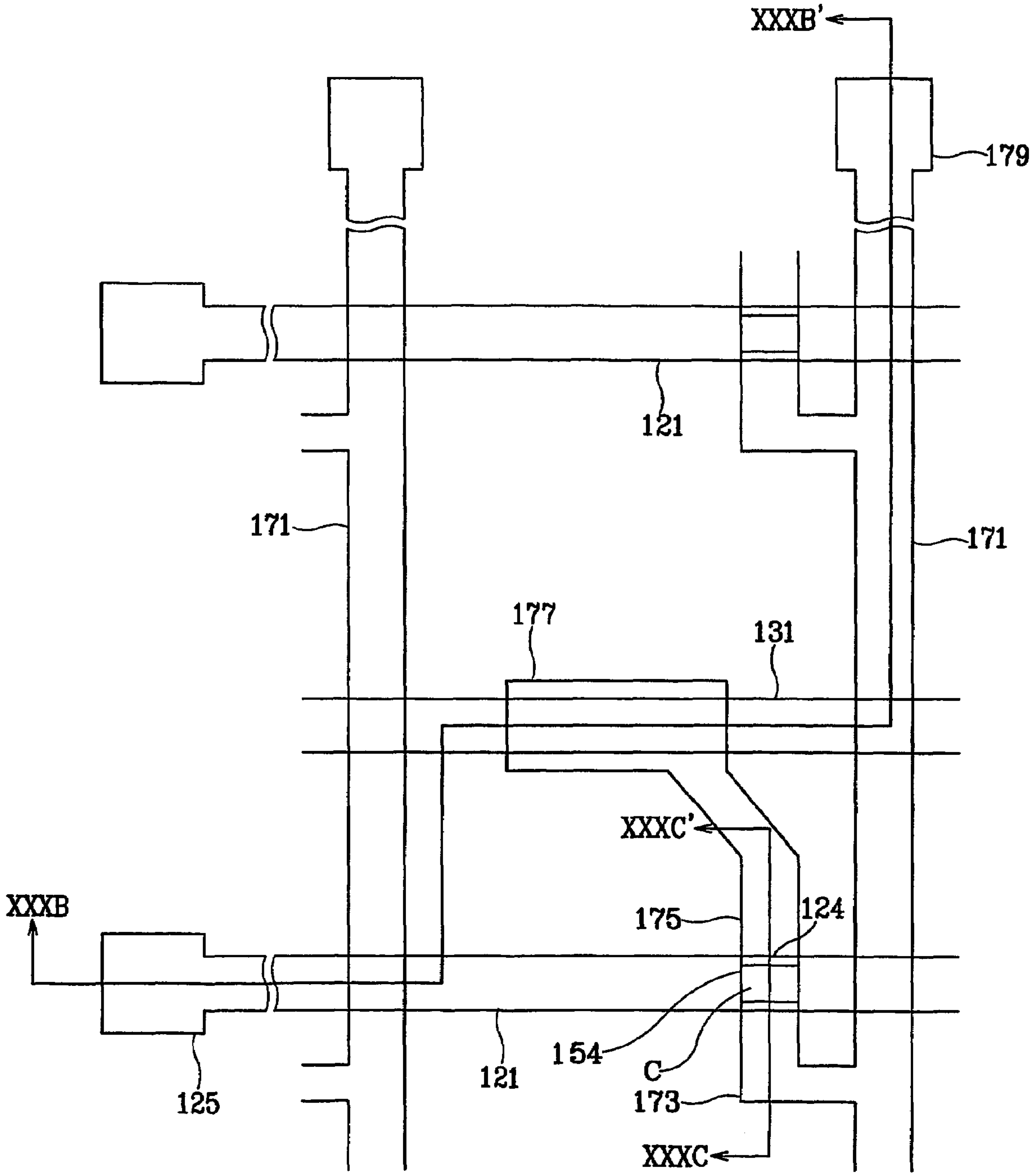
FIG. 30A is a layout view of the TFT array panel in the step following the step illustrated in FIGS. 29A and 29B.
Figure 30B:
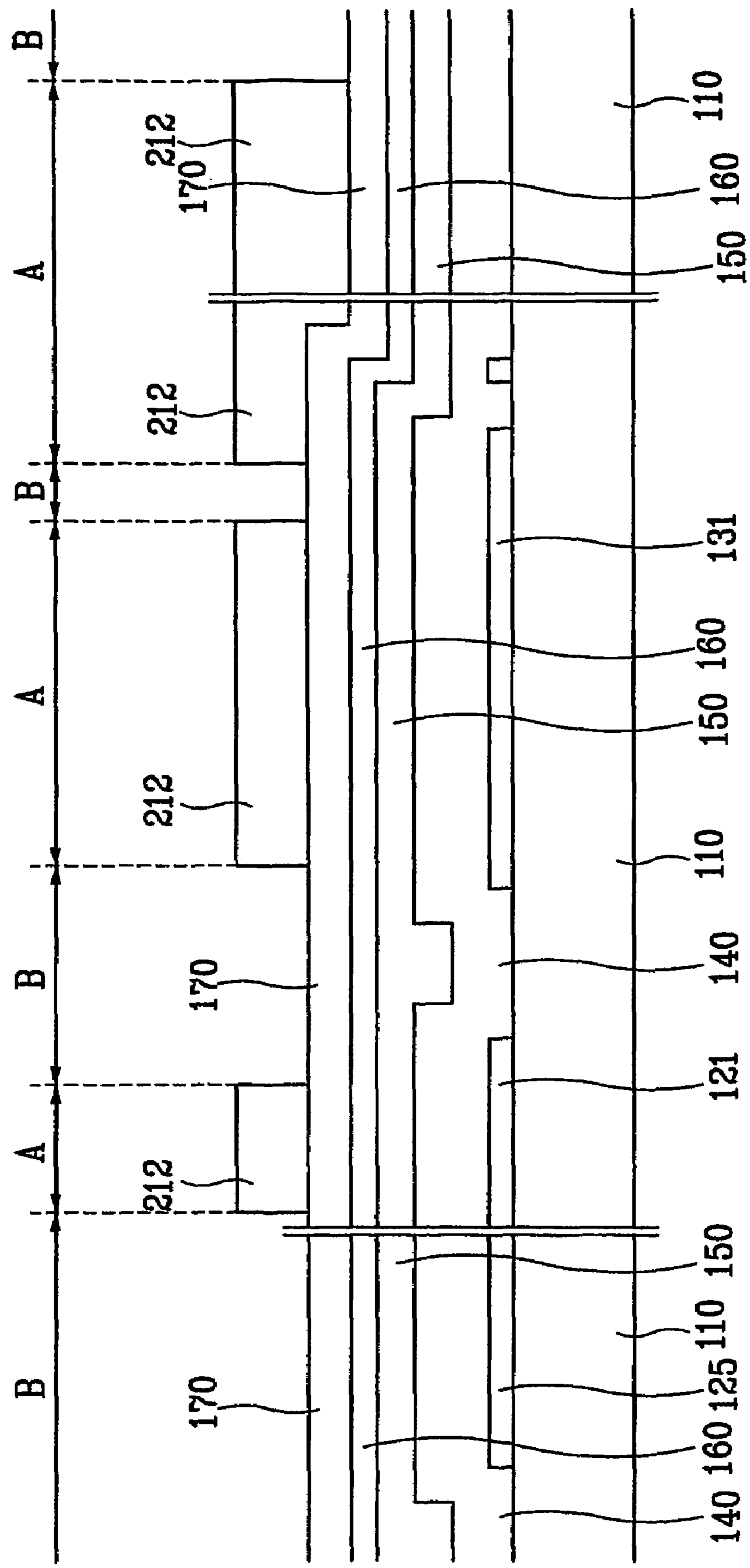
FIGS. 30B and 30C are sectional views of the TFT array panel shown in FIG. 30A taken along the line XXXb-XXXb' and the line XXXc-XXXc', respectively.
Figure 30C:
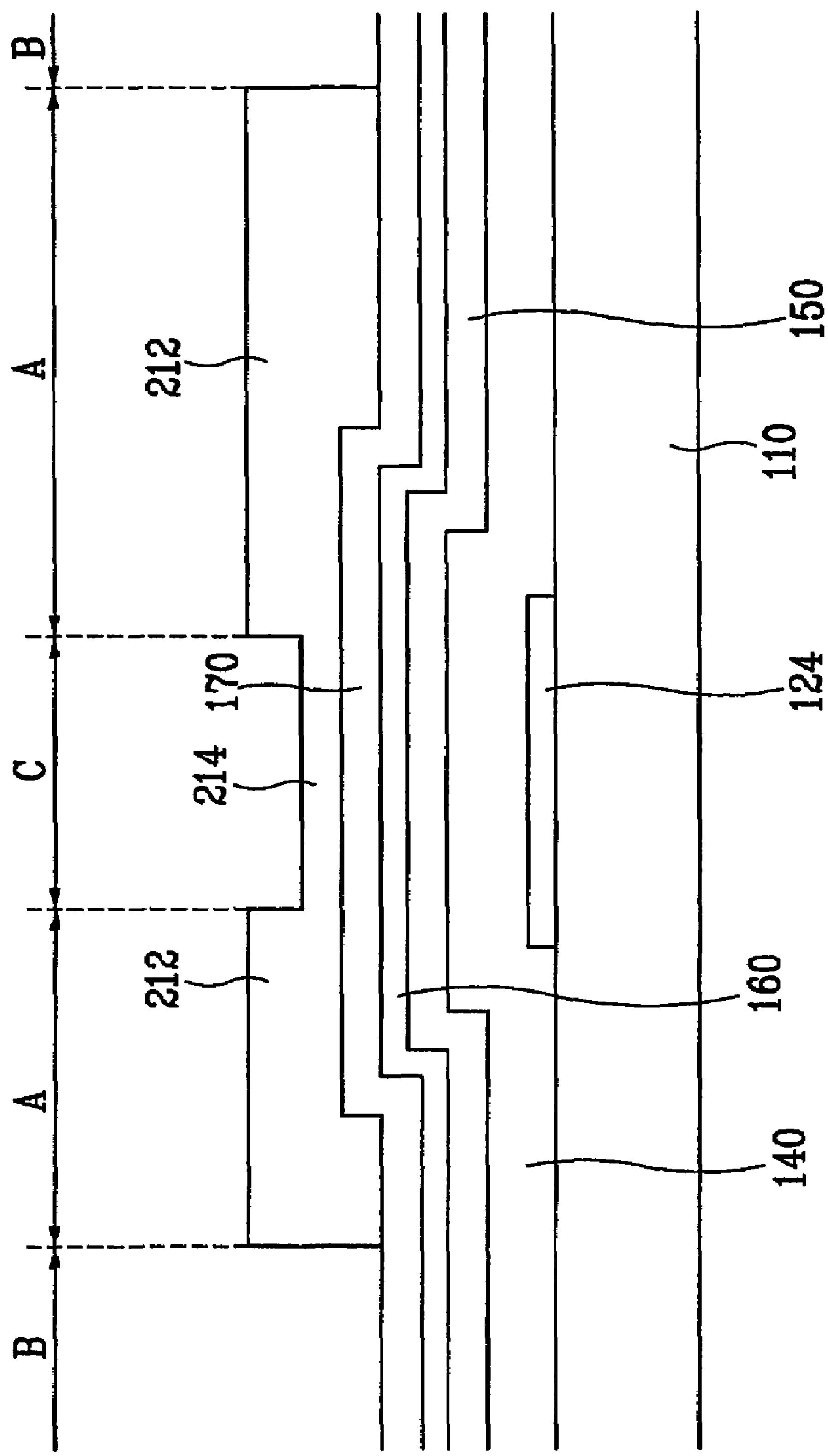

FIG. 28A is a layout view of a TFT array panel in the first step of a manufacturing method thereof according to the fourth embodiment of the present invention. FIGS. 28B and 28C are sectional views of the TFT array panel shown in FIG. 28A taken along the line XXVIIIb-XXVIIIb' and the line XXVIIIc-XXVIIIc', respectively. FIGS. 29A and 29B are sectional views of the TFT array panel shown in FIG. 28A taken along the line XXVIIIb-XXVIIIb' and the line XXVIIIc-XXVIIIc', respectively, in the step following the step illustrated in FIGS. 28B and 28C. FIG. 30A is a layout view of the TFT array panel in the step following the step illustrated in FIGS. 29A and 29B. FIGS. 30B and 30C are sectional views of the TFT array panel shown in FIG. 30A taken along the line XXXb-XXXb' and the line XXXc-XXXc', respectively. FIGS. 31A, 32A and 33A and 31B, 32B and 33B are sectional views of the TFT array panel shown in FIG. 30A taken along the line XXXb-XXXb' and the line XXXc-XXXc', respectively, sequentially illustrating the steps following the step illustrated in FIGS. 30B and 30C. FIG. 34A is a layout view of the TFT array panel in the step following the step illustrated in FIGS. 33A and 33B. FIGS.

Figure 33A:
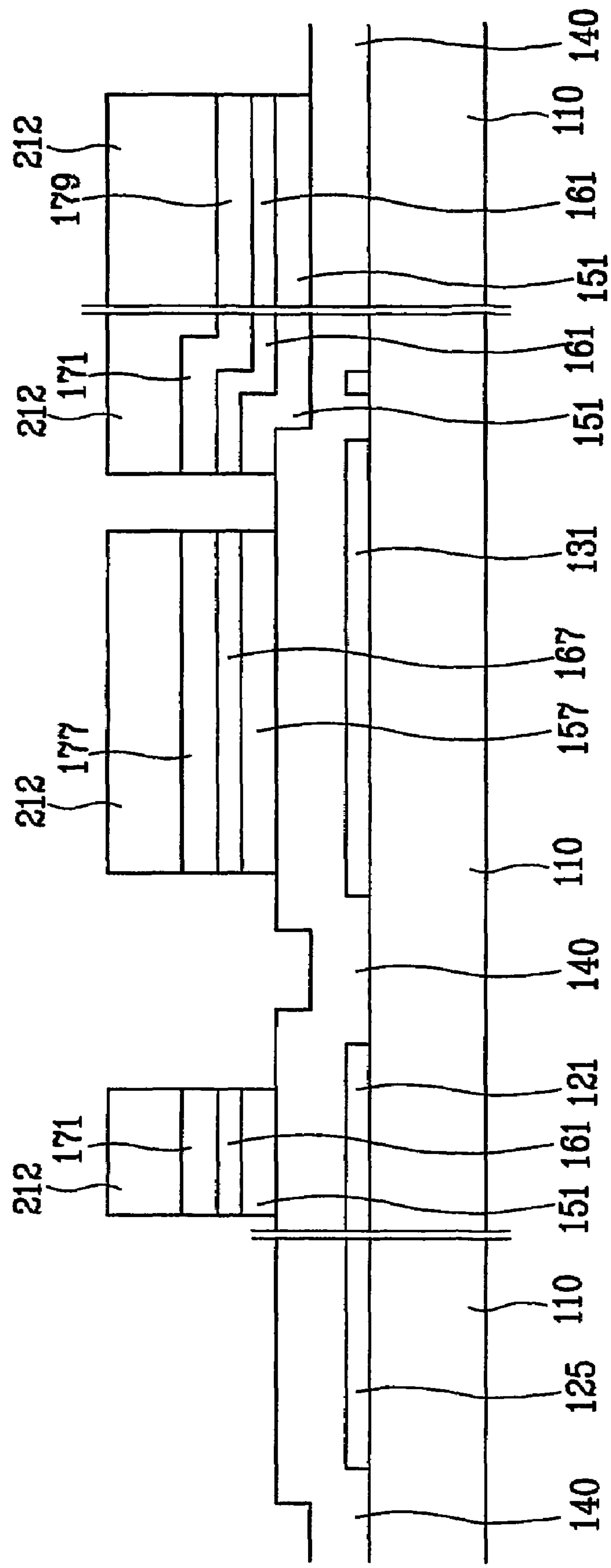
Figure 33B:
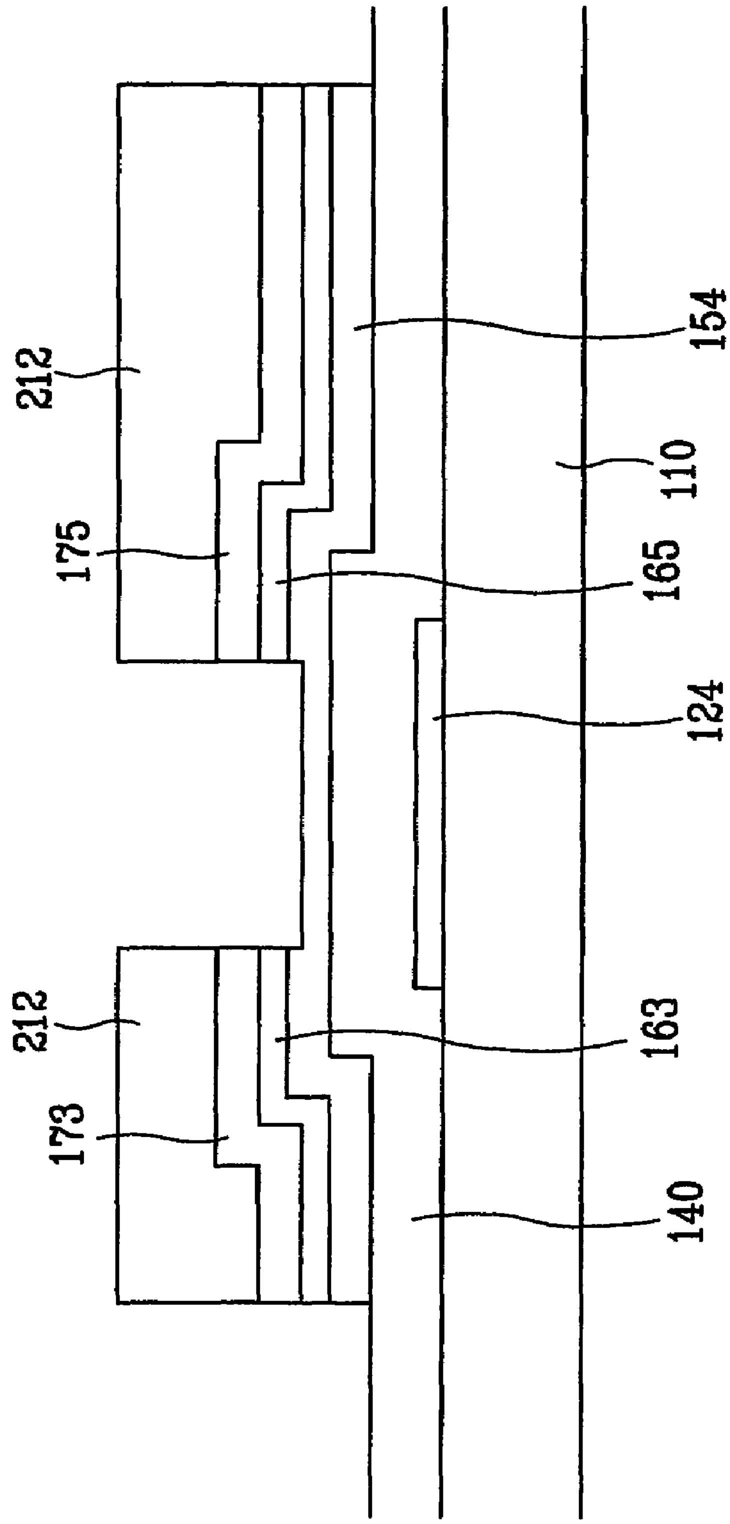
Figure 34A:
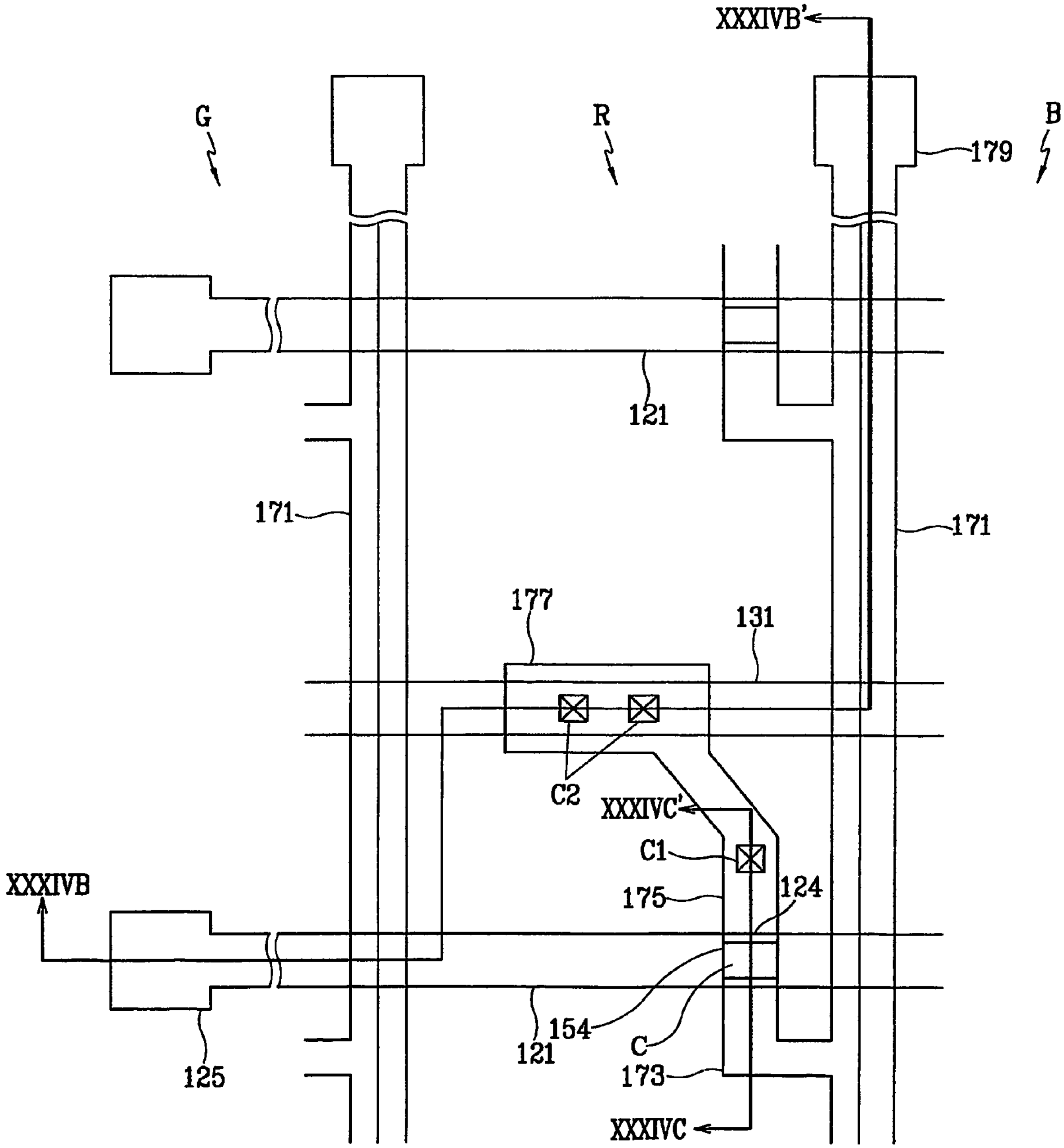
FIG. 34A is a layout view of the TFT array panel in the step following the step illustrated in FIGS. 33A and 33B.
Figure 34B:
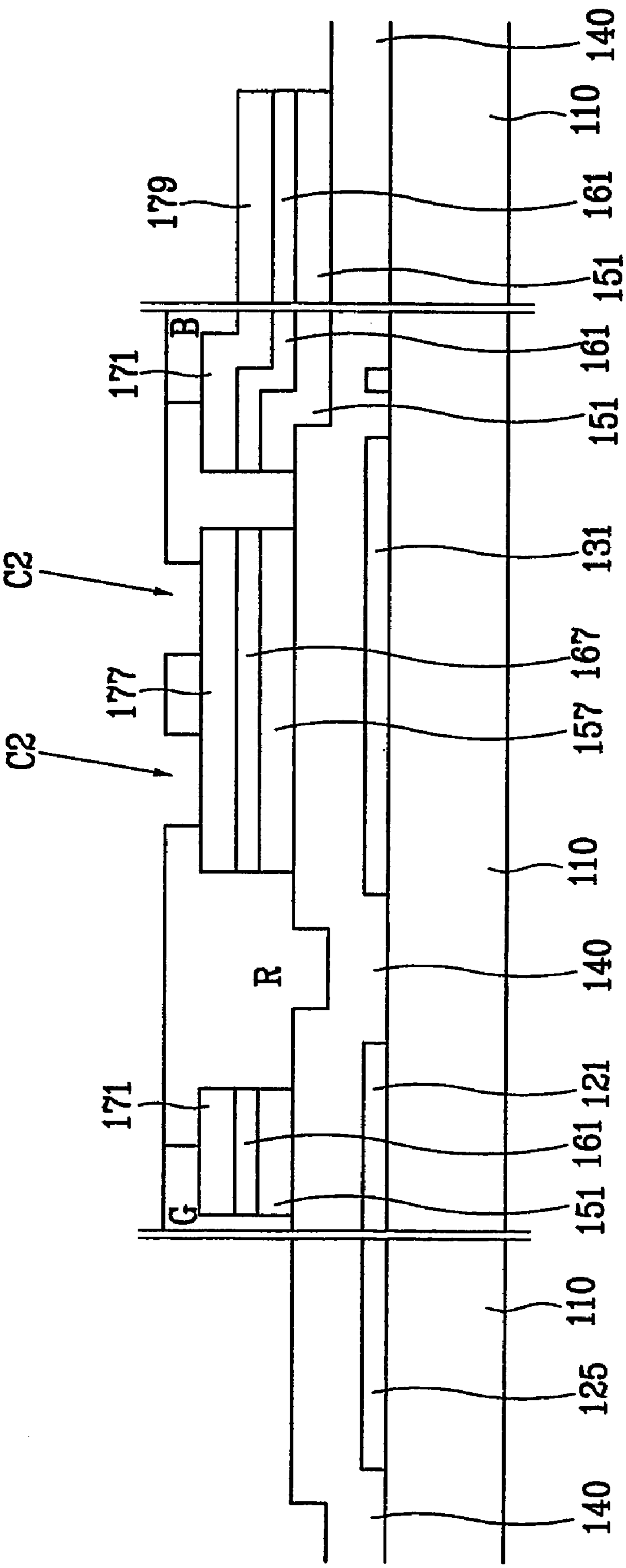
FIGS. 34B and 34C are sectional views of the TFT array panel shown in FIG. 34A taken along the line XXXIVb-XXXIVb' and the line XXXIVc-XXXIVc'.
Figure 35A:
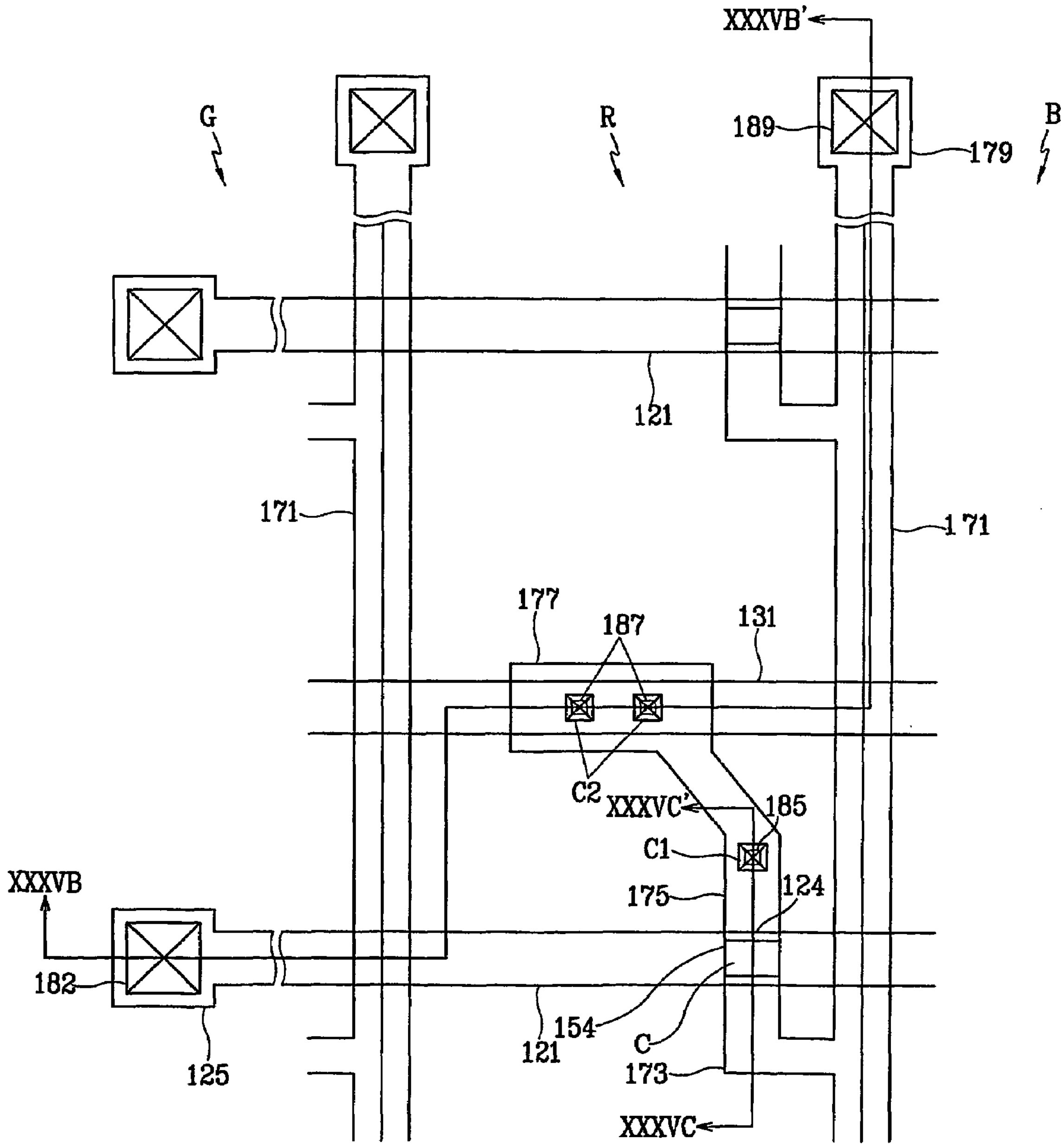
FIG. 35A is a layout view of the TFT array panel in the step following the step illustrated in FIGS. 33A-33C.
Figure 35B:
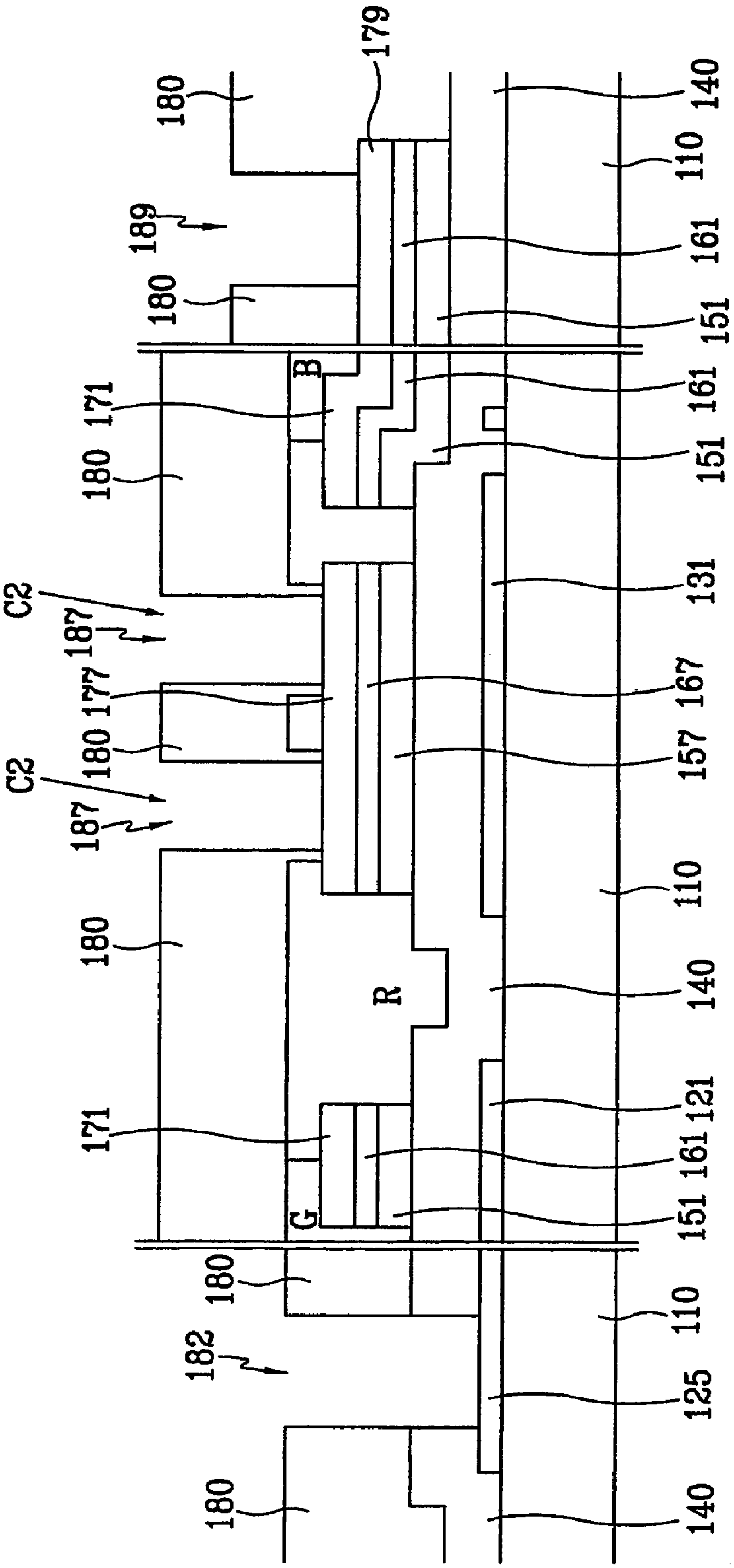
FIGS. 35B and 35C are sectional views of the TFT array panel shown in FIG. 35A taken along the line XXXVb-XXXVb' and the line XXXVc-XXXVc'.
Figure 35C:
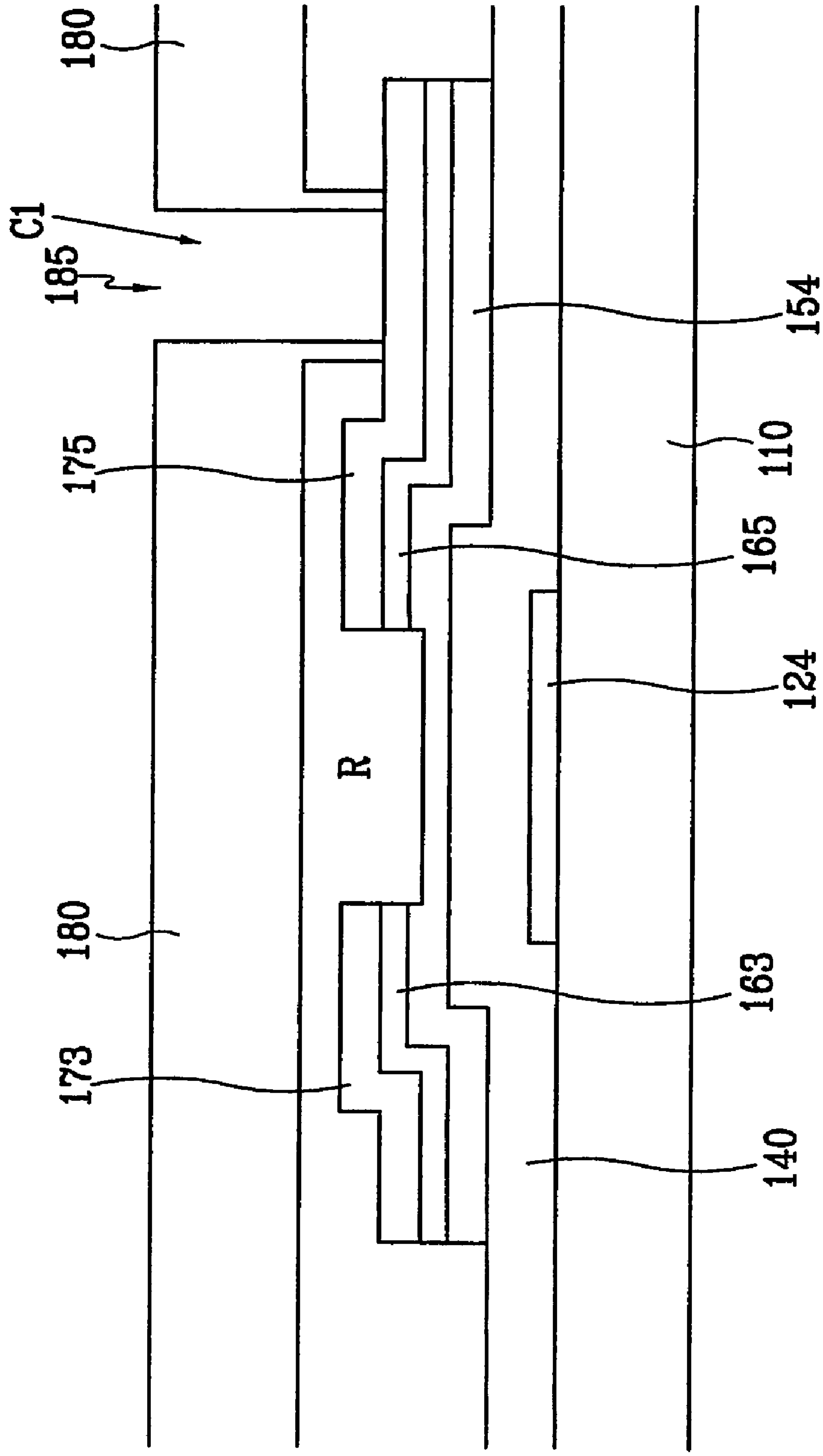

34B and 34C are sectional views of the TFT array panel shown in FIG. 34A taken along the line XXXIVb-XXXIVb' and the line XXXIVc-XXXIVc'. FIG. 35A is a layout view of the TFT array panel in the step following the step illustrated in FIGS. 33A-33C. FIGS. 35B and 35C are sectional views of the TFT array panel shown in FIG. 35A taken along the line XXXVb-XXXVb' and the line XXXVc-XXXVc'.

First, a conductive film is sputtered on an insulating substrate 110 such as transparent glass.

Referring to FIGS. 28A to 28C, the conductive film is patterned to form a plurality of gate lines 121 including a plurality of gate electrodes 124 and a plurality of storage electrode lines 131.

Referring to FIGS. 11A and 11B, a gate insulating layer 140 made of SiNx, an intrinsic a-Si layer 150, and an extrinsic a-Si layer 160 are sequentially deposited. A conductive layer including a lower film and an upper film is deposited by sputtering, and a photoresist film 210 is coated on the conductive layer.

The photoresist film 210 is exposed to light through an exposure mask (not shown), and developed such that the developed photoresist has a position dependent thickness as shown in FIGS. 30B and 30C. The developed photoresist includes a plurality of first to third portions 214 and 212. The first portions 214 located on channel areas C and the second portions 212 located on the data line areas A, and no reference numeral is assigned to the third portions located on remaining areas B since they have substantially zero thickness. Here, the thickness ratio of the first portions 214 to the second portions 212 is adjusted depending upon the process conditions in the subsequent process steps. It is preferable that the thickness of the first portions 214 is equal to or less than half of the thickness of the second portions 212.

The position-dependent thickness of the photoresist is obtained by several techniques, for example, by providing translucent areas on the exposure mask as well as transparent areas and light blocking opaque areas. The translucent areas may have a slit pattern, a lattice pattern, a thin film(s) with intermediate transmittance or intermediate thickness. When using a slit pattern, it is preferable that the width of the slits or the distance between the slits is smaller than the resolution of a light exposer used for the photolithography.

When a photoresist film is exposed to light through such a mask polymers of a portion directly exposed to the light are almost completely decomposed, and those of a portion exposed to the light through a slit pattern or a translucent film are not completely decomposed because the amount of a light irradiation is small. The polymers of a portion of the photoresist film blocked by a light-blocking film provided on the mask is hardly decomposed. After the photoresist film is developed, the portions containing the polymers, which are not decomposed, is left. At this time, the thickness of the portion with less light exposure is thinner than that of the portion without light exposure. Since too long exposure time decomposes all the molecules, it is necessary to adjust the exposure time.

Another example forming a thin photoresist layer 214 is to use reflowable photoresist. In detail, once a photoresist pattern made of a reflowable material is formed by using a normal exposure mask only with transparent areas and opaque areas, it is subject to reflow process to flow onto areas without the photoresist, thereby forming thin portions.

Next, the photoresist film 212 and 214 and the underlying layers are etched such that the data wire and the underlying layers are left on the data areas A, only the intrinsic semiconductor layer is left on the channel areas C, and the gate insulating layer 140 is exposed on the remaining areas B.

Figure 31A:
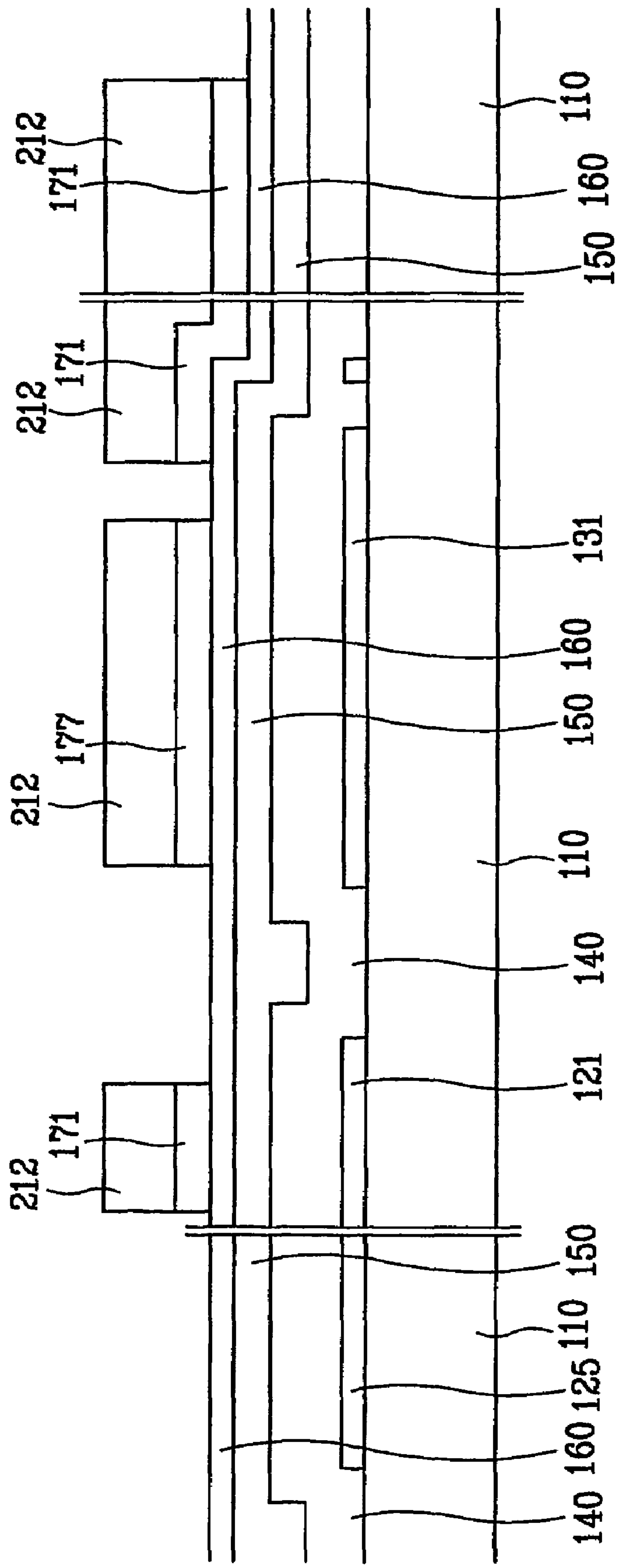
FIGS. 31A, 32A and 33A and 31B, 32B and 33B are sectional views of the TFT array panel shown in FIG. 30A taken along the line XXXb-XXXb' and the line XXXc-XXXc', respectively, sequentially illustrating the steps following the step illustrated in FIGS. 30B and 30C.
Figure 31B:
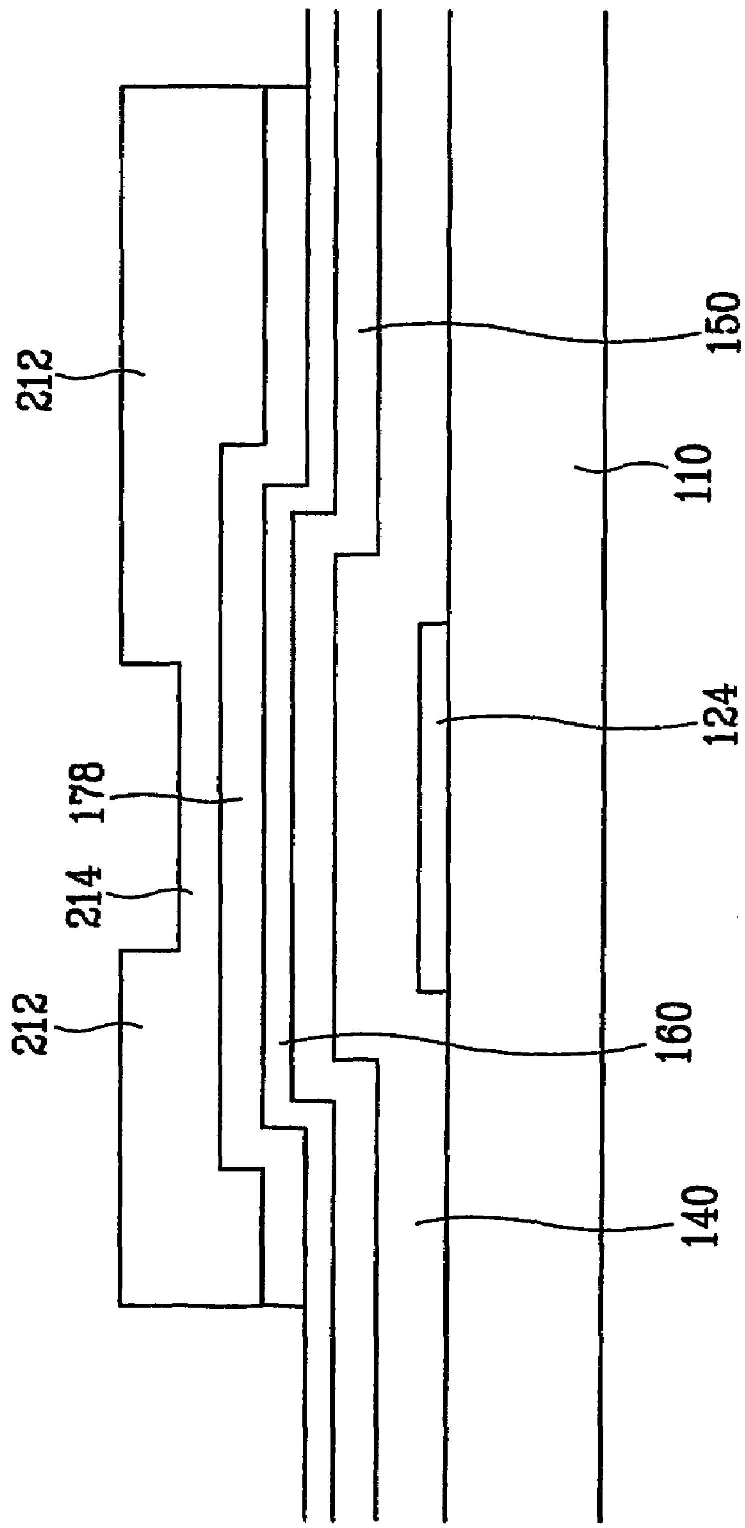

First, as shown in FIGS. 31A and 31B, the exposed portions of the conductive layer on the other areas B are removed to expose the underlying portions of the extrinsic semiconductor layer 160. Both dry etch and wet etch are selectively used in this step and preferably performed under the condition that the conductive layer is easily etched and the photoresist pattern 212 and 214 are hardly etched. However, since it is hard to identify the above-described condition for dry etch, and the dry etch may be performed under the condition that the photoresist pattern 212 and 214 and the conductive layer are etched simultaneously. In this case, the first portion 214 for dry etch is preferably made to be thicker than that for the wet etch to prevent the removal of the first portion 214 and thus the exposure of the underlying portions of the conductive layer.

As a result, as shown in FIG. 31A and FIG. 31B, the portions of the conductive layer on the channel areas C and the data areas A, that is, the data lines 171, the source/drain ("S/D") conductors 178, and the storage capacitor conductors 177 are left and the remaining portions of the conductive layer on the remaining areas B are removed to expose the underlying portions of the extrinsic semiconductor layer 160. Here, the S/D conductors 178 have substantially the same planar shapes as the source and drain electrodes 173 and 175 illustrated in FIGS. 7 to 9 except that the source electrodes 173 and the drain electrodes 175 are not disconnected from but connected to each other.

Figure 32A:
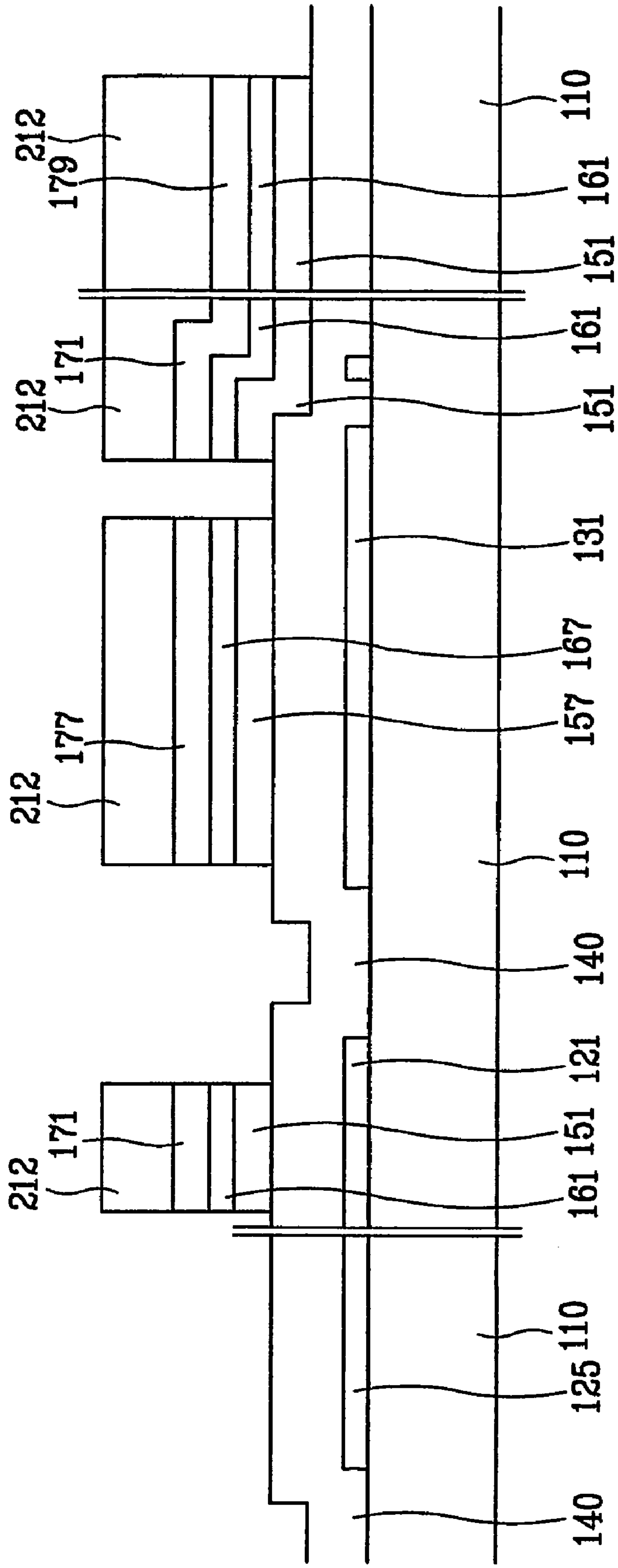
Figure 32B:
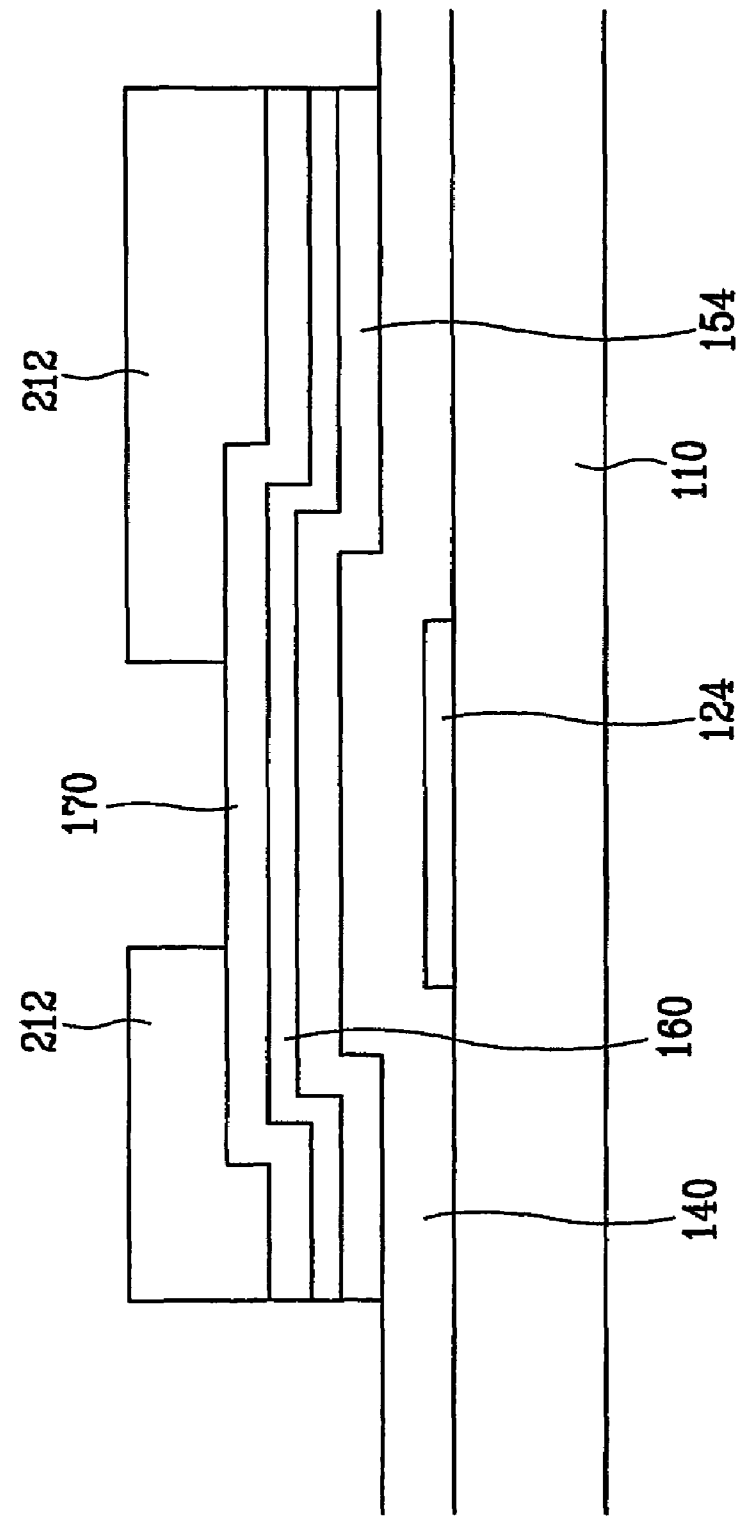

Next, as shown in FIG. 32A and FIG. 32B, the exposed portions of the extrinsic semiconductor layer 160 and the underlying portions of the intrinsic semiconductor layer 150 on the areas B as well as the first portion 214 of the photoresist pattern 212 and 214 are removed by dry etch. The etching is performed under the conduction that the photoresist pattern 212 and 214, the extrinsic semiconductor layer 160 and the intrinsic semiconductor layer 150 are easily etched and the gate insulating layer 140 is hardly etched. In particular, it is preferable that the etching ratios for the photoresist pattern 212 and 214 and the intrinsic semiconductor layer 150 are nearly the same. For instance, the etched thicknesses of the photoresist pattern 212 and 214 and the semiconductor layer 150 can be nearly the same by using a gas mixture of $SF_6$ and HCl, or a gas mixture of $SF_6$ and $O_2$. When the etching ratios for the photoresist pattern 212 and 214 and for the intrinsic semiconductor pattern 150 are the same, the initial thickness of the first portion 214 is equal to or less than the sum of the thickness of the intrinsic semiconductor layer 150 and the thickness of the extrinsic semiconductor layer 160.

Consequently, as shown in FIGS. 32A and 32B, the first portions 214 on the channel areas C are removed to expose the underlying portions of the S/D conductors 178. In the meantime, the second portions 212 on the data areas A are also etched to become thinner.

Then, photoresist remnants left on the surface of the S/D conductors 178 on the channel areas C are removed by ashing.

Next, portions of the S/D conductors 178 and the underlying portions of the extrinsic semiconductor layer 160 on the channel areas C are etched to be removed. Here, the etching of both the S/D conductors 178 and the extrinsic semiconductor layer 160 may be done using only dry etching. Alternatively, the S/D conductors 178 are etched by wet etching and the extrinsic semiconductor layer 160 is etched by dry etching. In the former case, it is preferable to perform the etching under the condition that etching selectivity between the S/D conductors 178 and the extrinsic semiconductor layer 160 is high. It is because the low etching selectivity makes the determination of the etching finish point difficult, thereby causing the adjustment of the thickness of the portions of the semiconductor pattern left on the channel areas C to be difficult. In the latter case alternately applying wet etching and dry etching, a stepwise lateral sidewall is formed since the wet etch etches the lateral sides of the S/D conductors 178, while the dry etch hardly etches the lateral sides of the extrinsic semiconductor layer 160. Examples of etching gases used for etching the extrinsic semiconductor layer 160 are a gas mixture of $CF_4$ and HCl and a gas mixture of $CF_4$ and $O_2$. Use of the gas mixture of CF4 and $O_2$ enables to obtain uniform thickness of etched portions of the intrinsic semiconductor 150. In this regard, as shown in FIG. 33B, the exposed portions of the semiconductor 154 may be etched to have a reduced thickness. It is preferable that the photoresist pattern 212 and 214 is thick enough to prevent the second portions 212 from being removed to expose the underlying the data lines.

Accordingly, as shown in FIGS. 33*a* and 33*b*, the source electrodes 173 and the drain electrodes 175 are separated from each other, and, simultaneously, the data lines 171 and the ohmic contacts 161, 163, and 165 thereunder are completed.

Finally, the residual second portions 212 of the photoresist pattern 212 and 214 left on the data areas A are removed. Alternatively, the second portions 212 may be removed after the portions of the S/D conductors 178 on the channel areas C are removed and before the underlying portions of the extrinsic semiconductor layer 160 are removed.

As described above, wet etching and dry etching may be performed one after the other, but only dry etching may be used. The latter is relatively simple but it is not easy to find a proper etching condition compared with the former. On the contrary, it is easy to find a proper etching condition for the former case but the former is relatively complicated compared with the latter.

By the described processes, the structure shown in FIGS. 33A and 33B is achieved.

Figure 34C:
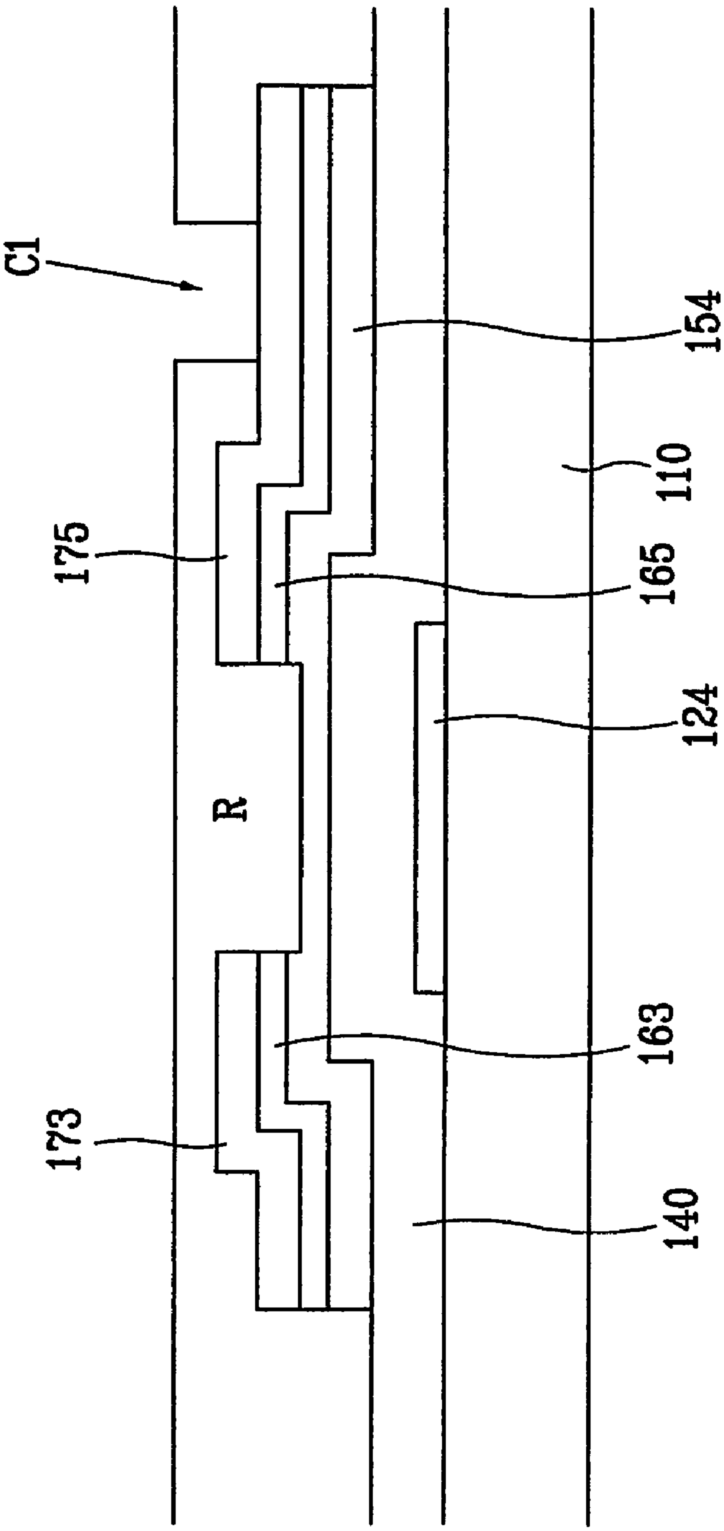

Next, as shown in FIGS. 34A and 34C, organic photo-resist materials respectively containing pigments of red, green, and blue are coated and are patterned by photo process to form a plurality of color filters R, G, and B in sequence. At this time, openings C1 and C2 exposing the drain electrode 175 and the storage capacitor conductor 177 are simultaneously formed.

At this time, a light blocking layer formed of the red or green color filter may be disposed on the channel region C of the thin film transistor to block light having short wave length by absorption.

Next, a passivation layer 180 is formed by the coating of an acrylic organic insulating film or an insulating material having a low dielectric constant lower than about 4.0. Thereafter, the passivation layer 180 and the gate insulating layer 140 are photo-etched to form a plurality of contact holes 182, 185, 187, and 189 exposing the drain electrode 175, the expansion 125 of the gate line, the storage capacitor conductor 177, and the expansion 179 of the data line, respectively.

Here, the contact holes 185 and 187 exposing the drain electrode 175 and the storage capacitor conductor 177 are formed in the openings C1 and C2 of the color filters R, G, and B, to make the contact holes 185 and 187 having good profiles.

Finally, as shown in FIGS. 18 and 19, a plurality of pixel electrodes 901 and a plurality of contact assistants 906 and 908 including double layers are formed by sputtering and photo-etching an IZO layer and an ITO layer.

Here, an IZO etchant is used for etching the IZO layer and the ITO layer. The IZO etchant contains HCl, $CH_3COOH$, deionized water, and a surfactant.

A TFT array panel for an LCD according to another embodiment of the present invention will be described in detail with reference to FIGS. 36 to 45.

Figure 36:
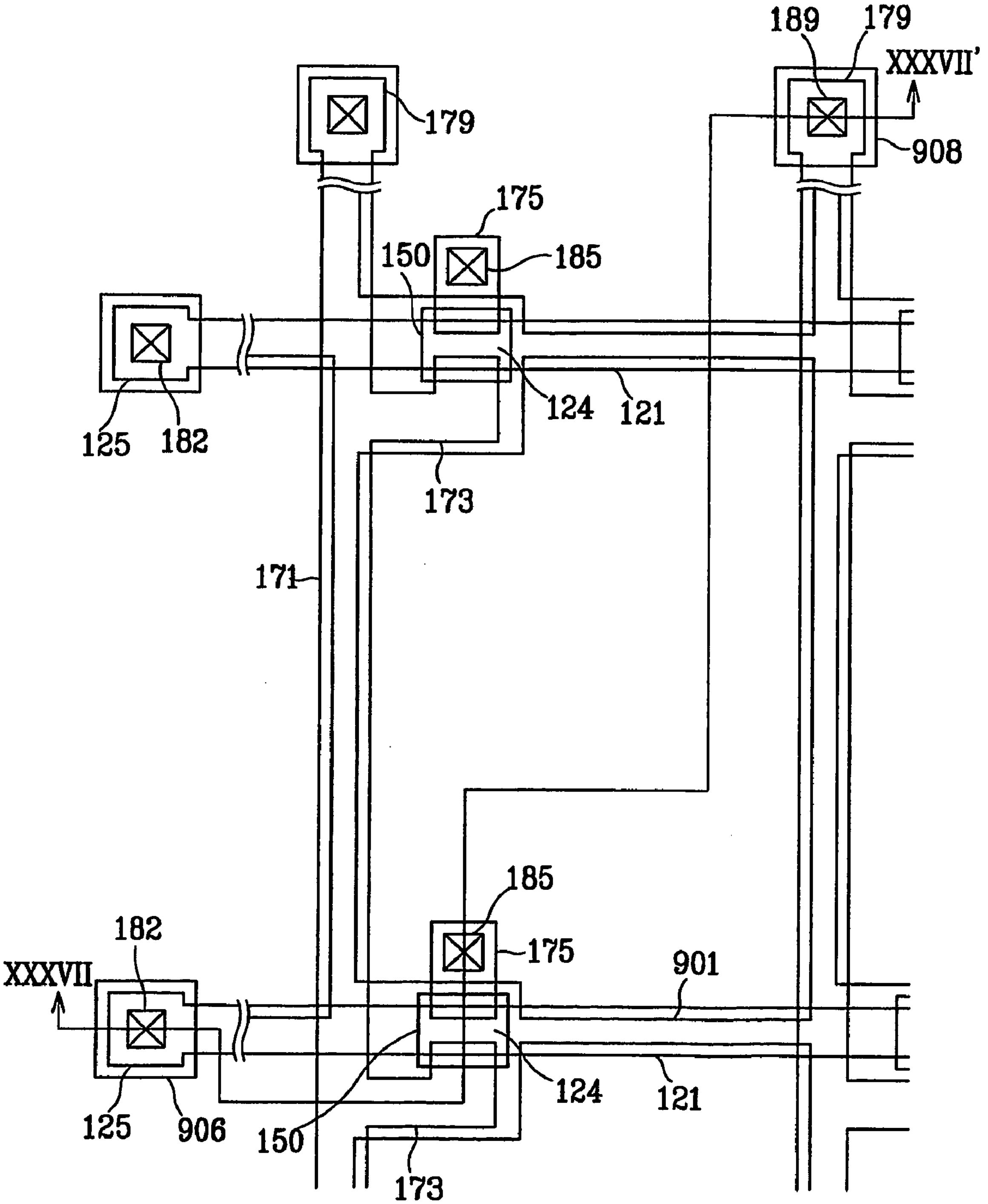
FIG. 36 is a layout view of a TFT array panel for a LCD according to another embodiment of the present invention.
Figure 37:
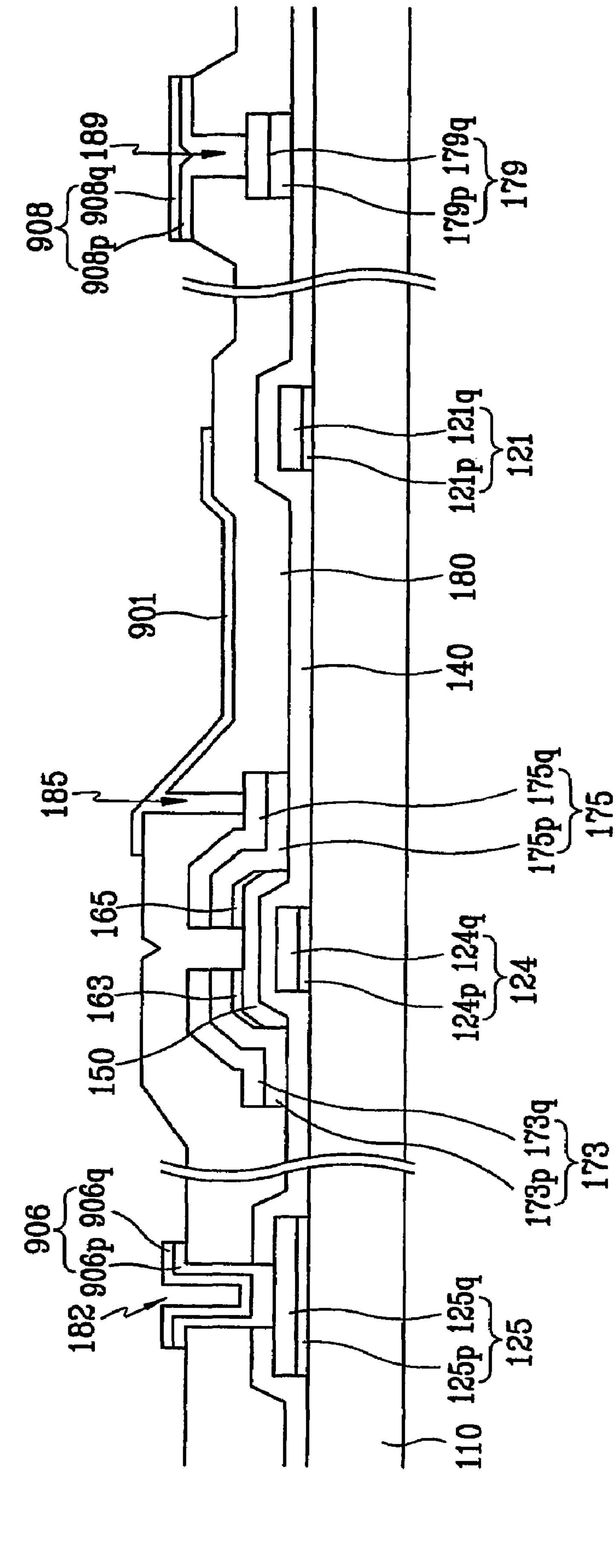
FIG. 37 is a sectional view of the TFT array panel shown in FIG. 36 taken along the line XXXVII-XXXVII'.

FIG. 36 is a layout view of a TFT array panel for a LCD according to another embodiment of the present invention. FIG. 37 is a sectional view of the TFT array panel shown in FIG. 36 taken along the line XXXVII-XXXVII'.

When the present embodiment is compared with the embodiment of FIGS. 1 and 2, pixel electrodes 901 formed of single layer are peculiar thing of the present embodiment. However, the contact assistants 906 and 908 have double layers of IZO and ITO like that of FIGS. 1 and 2.

Henceforth, detail description will be follow.

A plurality of gate lines 121 for transmitting gate signals are formed on an insulating substrate 110.

Each gate line 121 includes a plurality of portions projecting downward to form a plurality of gate electrodes 124 and an expansion 125 having a large area for contact with another layer or an external device. Larger portion of the gate line 121 is disposed on a display area and the expansion 125 of the gate line 121 is disposed on the boundary area of the display area.

The gate lines 121 include two films having different physical characteristics, a lower film 121*p* and an upper film 121*q*. The upper film 121*q* is preferably made of low specific resistance metal including Al containing metal such as Al and Al alloy for reducing signal delay or voltage drop in the gate lines 121. On the other hand, the lower film 121*p* is preferably made of material such as Cr, Mo, Mo alloy such as MoW, Ta and Ti, which has good physical, chemical, and electrical contact characteristics with other materials such as indium tin oxide (ITO) and indium zinc oxide (IZO). Good examples of combination of the lower film 121*p* material and the upper film 121*q* material is Cr and Al—Nd alloy. In FIG. 37, the lower and the upper films of the gate electrodes 124 are indicated by reference numerals 124*p* and 124*q*, respectively, and the lower and the upper films of the expansions 125 are indicated by reference numerals 125*p* and 125*q*, respectively.

In addition, the lateral sides of the upper and lower films 121*p* and 121*q* are inclined relative to a surface of the substrate 110, and the inclination angle thereof ranges about 30-80 degrees.

A gate insulating layer 140 preferably made of silicon nitride (SiNx) is formed on the gate lines 121.

A plurality of semiconductors 150 preferably made of hydrogenated amorphous silicon (abbreviated to "a-Si") are formed on the gate insulating layer 140. Each semiconductor 150 is disposed on the gate electrodes 124 and covers the gate electrode 124 and the boundary region of the gate electrode 124.

A plurality of ohmic contact islands 163 and 165 preferably made of silicide or n+ hydrogenated a-Si heavily doped with n type impurity are formed on the semiconductor islands 150. The ohmic contact islands 163 and 165 are located in pairs on the semiconductor islands 150.

The lateral sides of the semiconductor stripes 151 and the ohmic contacts 163 and 165 are inclined relative to a surface of the substrate 110, and the inclination angles thereof are preferably in a range between about 30-80 degrees.

A plurality of data lines 171 and a plurality of drain electrodes 175 are formed on the ohmic contacts 163 and 165 and the gate insulating layer 140.

The data lines 171 for transmitting data voltages extend substantially in the longitudinal direction and intersect the gate lines 121. Each data line 171 includes an expansion 179 having a larger area for contact with another layer or an external device. Larger portion of the data line 171 is disposed on the display area but the expansion 179 is disposed on the boundary area.

A plurality of branches of each data line 171, which project toward the drain electrodes 175, form a plurality of source electrodes 173. Each pair of the source electrodes 173 and the drain electrodes 175 are separated from each other and opposite each other with respect to a gate electrode 124. A gate electrode 124, a source electrode 173, and a drain electrode 175 along with the semiconductor islands 150 form a TFT having a channel formed in the semiconductor islands 150 disposed between the source electrode 173 and the drain electrode 175.

The data lines 171 and the drain electrodes 175 include a lower film 171*p* and 175*p* preferably made of Mo, a Mo alloy, and Cr and an upper film 171*q* and 175*q* located thereon and preferably made of an Al containing metal or an Ag containing metal. The expansion 179 of the data line 171 also includes an upper film 179*q* and a lower film 179*p*.

Like the gate lines 121, the upper films 171*p*, 175*p* and the lower films 171*q* and 175*q* of the data lines 171 and the drain electrodes 175 have tapered lateral sides relative to the surface of the substrate 110, and the inclination angles thereof range about 30-80 degrees.

The ohmic contacts 163 and 165 are interposed only between the underlying semiconductor 150 and the overlying source electrodes 173 and the overlying drain electrodes 175 thereon and reduce the contact resistance therebetween. The semiconductor 150 includes exposed portions, which are not covered with the data lines 171 and the drain electrodes 175 such as portions between the source electrodes 173 and the drain electrodes 175.

A passivation layer 180 is formed on the data lines 171 and the drain electrodes 175 and exposed portions of the semiconductors 150. The passivation layer 180 is preferably made of photosensitive organic material having a good flatness characteristic, low dielectric insulating material such as a-Si:C:O and a-Si:O:F formed by plasma enhanced chemical vapor deposition (PECVD), or inorganic material such as silicon nitride and silicon oxide.

The passivation layer 180 has a plurality of contact holes 185 and 189 exposing the drain electrodes 175 and the expansion 179 of the data lines 171, respectively. The passivation layer 180 and the gate insulating layer 140 have a plurality of contact holes 182 exposing the expansion 125 of the gate lines 121.

A plurality of pixel electrodes 901 and a plurality of contact assistants 906 and 908 are formed on the passivation layer 180.

The pixel electrodes 901 have single layer of IZO. However, the contact assistants 906 and 908 have double layers of IZO and ITO.

The pixel electrodes 901 are physically and electrically connected to the drain electrodes 175 through the contact holes 185 such that the pixel electrodes 901 receive the data voltages from the drain electrodes 175.

The pixel electrodes 901 supplied with the data voltages generate electric fields in cooperation with a common electrode (not shown) on another panel (not shown), which reorient liquid crystal molecules in a liquid crystal layer (not shown) disposed therebetween.

A pixel electrode 901 and a common electrode form a liquid crystal capacitor, which stores applied voltages after turnoff of the TFT. An additional capacitor called a "storage capacitor," which is connected in parallel to the liquid crystal capacitor, may be provided for enhancing the voltage storing capacity.

The contact assistants 906 and 908 are connected to the exposed expansions 125 of the gate lines 121 and the exposed expansions 179 of the data lines 171 through the contact holes 182 and 189, respectively. The contact assistants 906 and 908 protect the expansions 125 and 179 and complement the adhesion between the expansions 125 and 179 and external devices. The contact assistants 906 and 908 are not an essential element. Therefore, they maybe omitted The contact assistants 906 and 908 have double layers of lower films 906*p* and 908*p* and upper films 906*q* and 908*q*. Here, the lower films 906*p* and 908*p* are made of IZO and the upper films 906*q* and 908*q* are made of ITO.

A method of manufacturing the TFT array panel illustrated in FIGS. 36 and 37 will be now described in detail with reference to FIGS. 38A to 45 as well as FIGS. 36 and 37.

Figure 42:
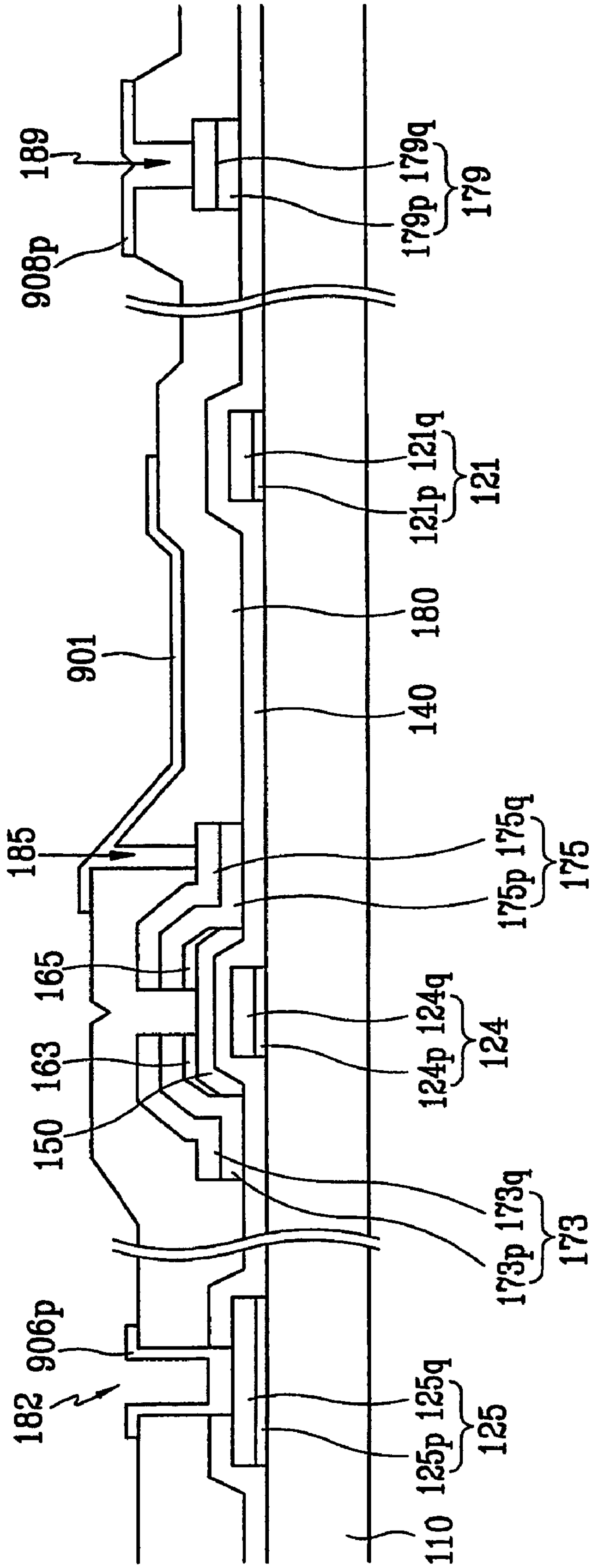
FIG. 42 is a sectional view of the TFT array panel shown in FIG. 41A taken along the line XLIb-XLIb' in the step following the step shown in FIG. 41B.
Figure 43:
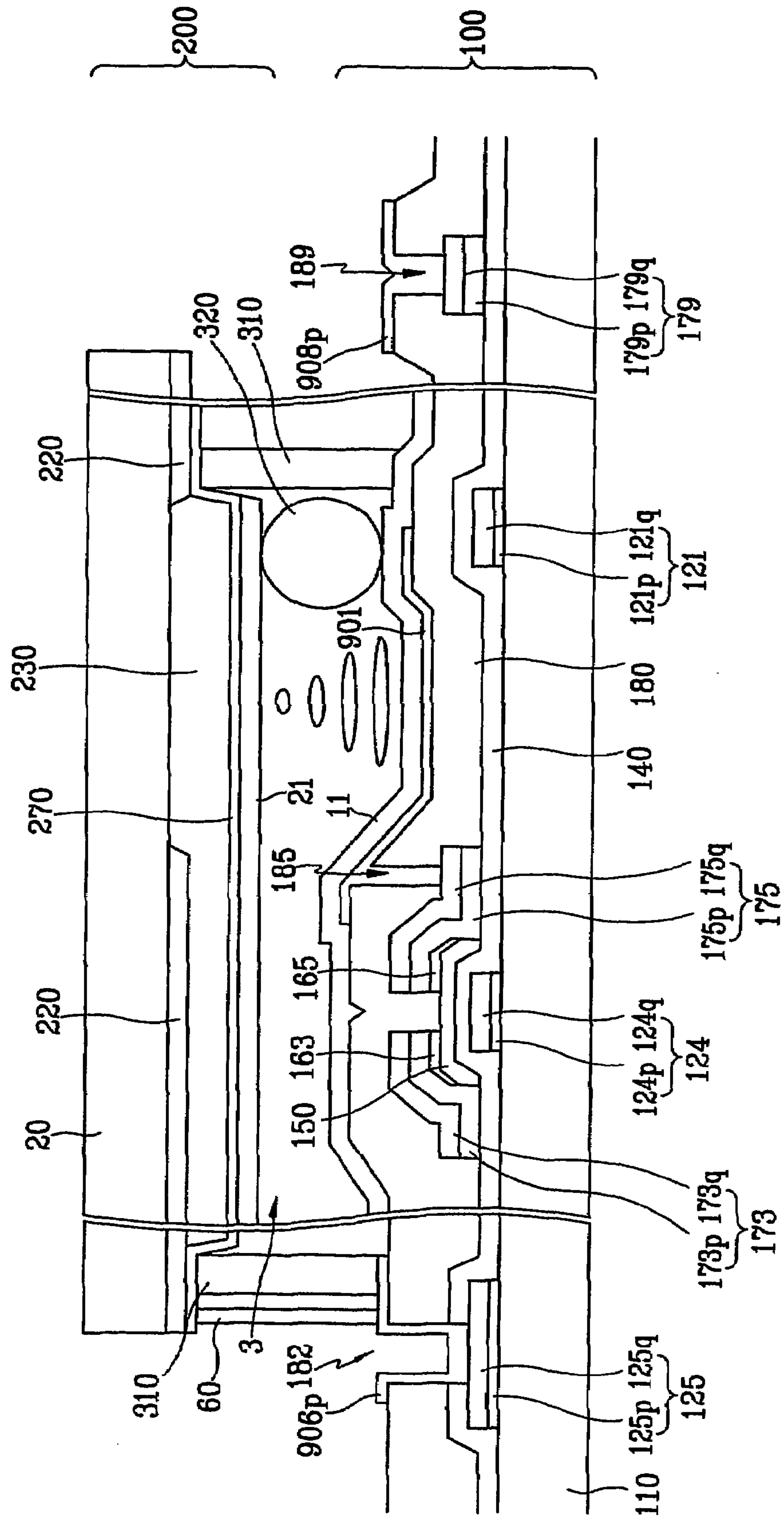
FIG. 43 is a sectional view of an LCD using the TFT array panel shown in FIG. 41A taken along the line XLIb-XLIb' in the step following the step shown in FIG. 42.
Figure 44:
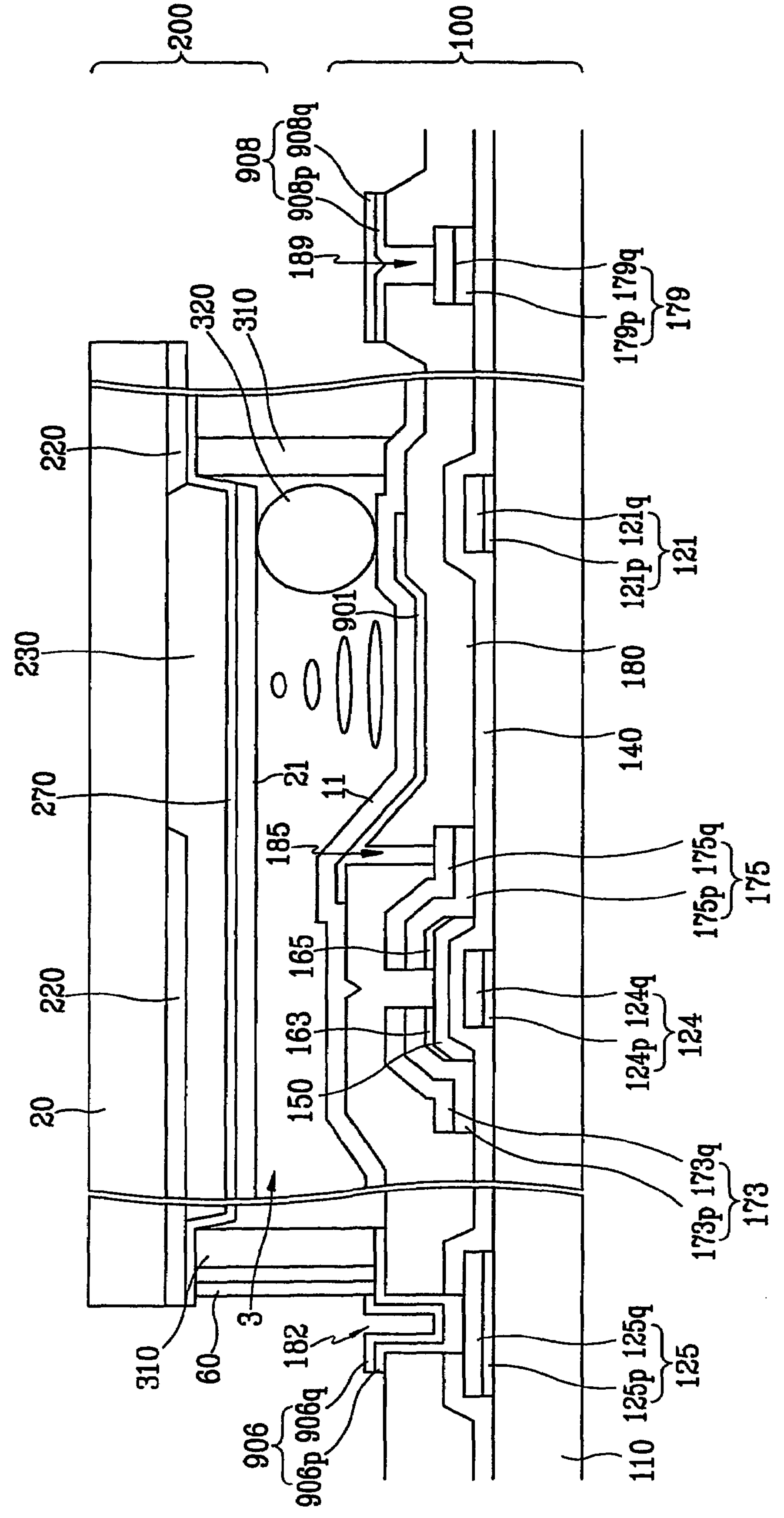
FIG. 44 is a sectional view of an LCD using the TFT array panel shown in FIG. 41A taken along the line XLIb-XLIb' in the step following the step shown in FIG. 43.
Figure 45:
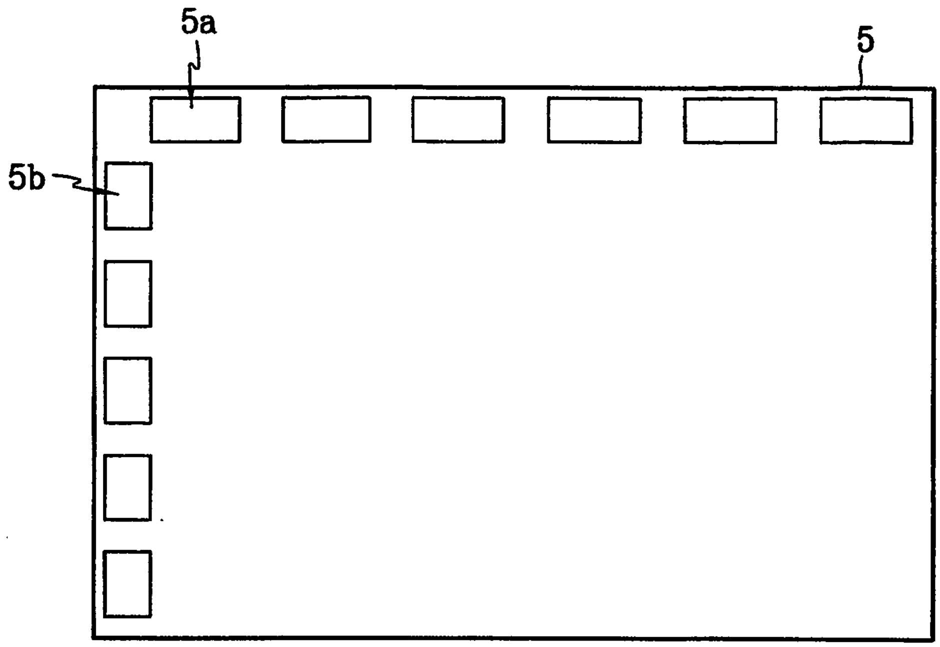
FIG. 45 is a layout view of a shadow mask for manufacturing the LCD illustrated in FIG. 44.

FIGS. 38A, 39A, 40A and 41A are layout views sequentially illustrating the intermediate steps of a method of manufacturing the TFT array panel illustrated in FIGS. 36 and 37. FIG. 38B is a sectional view of the TFT array panel shown in FIG. 38A taken along the line XXXVIIIb-XXXVIIIb'. FIG. 39B is a sectional view of the TFT array panel shown in FIG. 39A taken along the line XXXIXb-XXXIb' in the step following the step shown in FIG. 38B. FIG. 40B is a sectional view of the TFT array panel shown in FIG. 40A taken along the line XLb-XLb' in the step following the step shown in FIG. 39B. FIG. 41B is a sectional view of the TFT array panel shown in FIG. 41A taken along the line XLIb-XLIb' in the step following the step shown in FIG. 40B. FIG. 42 is a sectional view of the TFT array panel shown in FIG. 41A taken along the line XLIb-XLIb' in the step following the step shown in FIG. 41B. FIG. 43 is a sectional view of an LCD using the TFT array panel shown in FIG. 41A taken along the line XLIb-XLIb' in the step following the step shown in FIG. 42. FIG. 44 is a sectional view of an LCD using the TFT array panel shown in FIG. 41A taken along the line XLlb-XLlb' in the step following the step shown in FIG. 43. FIG. 45 is a layout view of a shadow mask for manufacturing the LCD illustrated in FIG. 44.

Two conductive films, a lower conductive film and an upper conductive film are sputtered in sequence on an insulating substrate 110 such as transparent glass. The upper conductive film is preferably made of an Al containing metal and preferably has a thickness of about 2,500 Å. The Al—Nd target preferably includes 2 atm % of Nd.

Figure 38A:
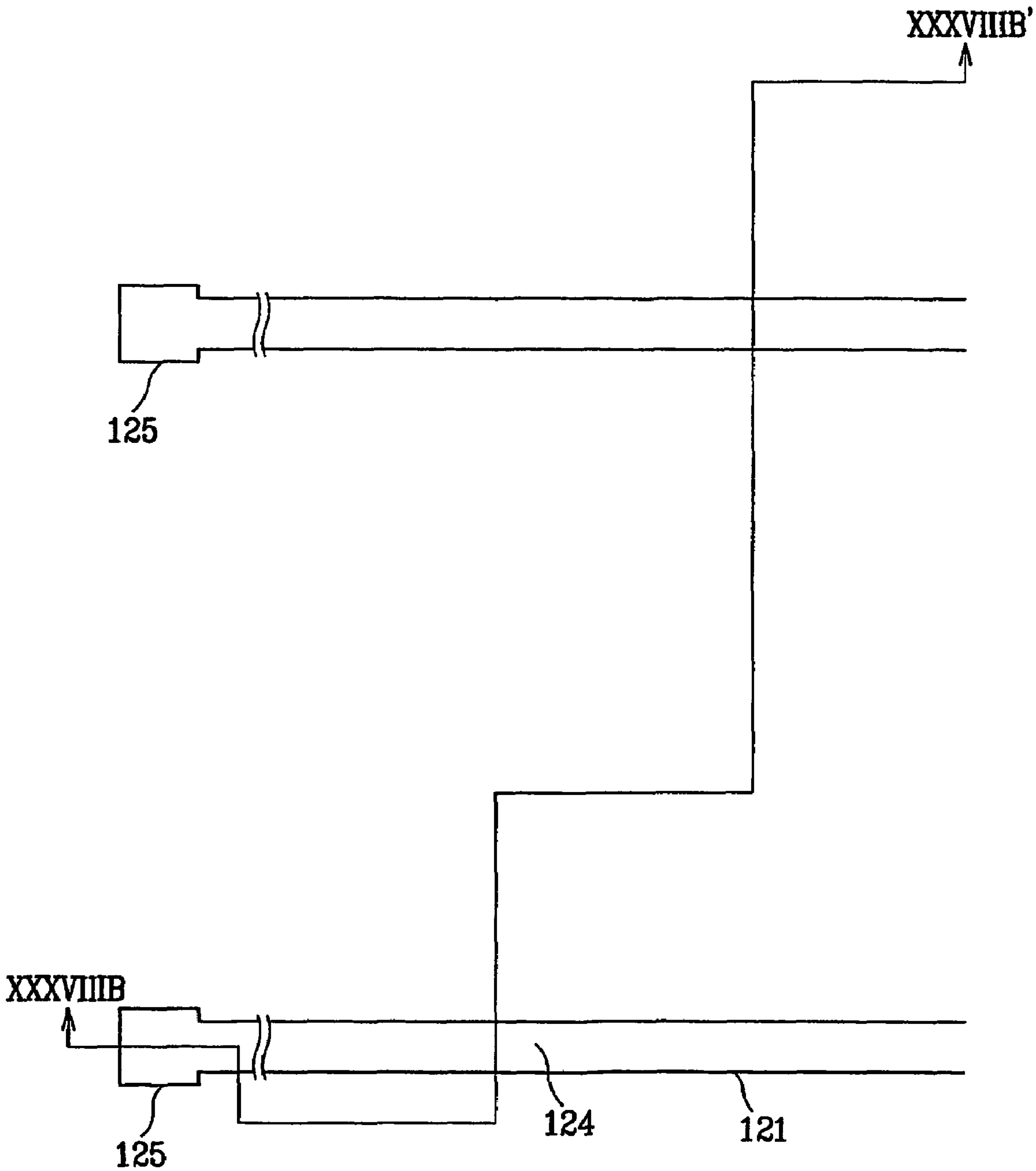
FIGS. 38A, 39A, 40A and 41A are layout views sequentially illustrating the intermediate steps of a method of manufacturing the TFT array panel illustrated in FIGS. 36 and 37.
Figure 38B:
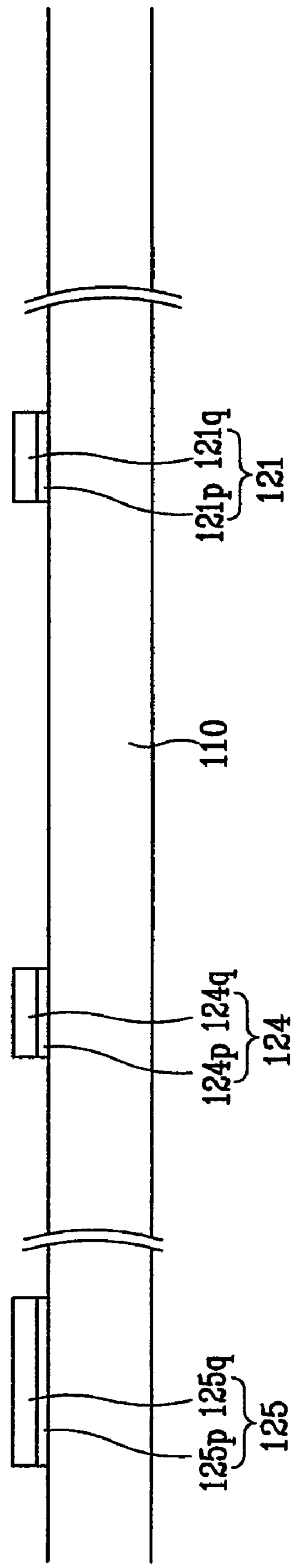
FIG. 38B is a sectional view of the TFT array panel shown in FIG. 38A taken along the line XXXVIIIb-XXXVIIIb'.

Referring to FIGS. 38A and 38B, the upper conductive film and the lower conductive film are patterned in sequence by photo-etching with a photoresist pattern to form a plurality of gate lines 121 including a plurality of gate electrodes 124.

Figure 39A:
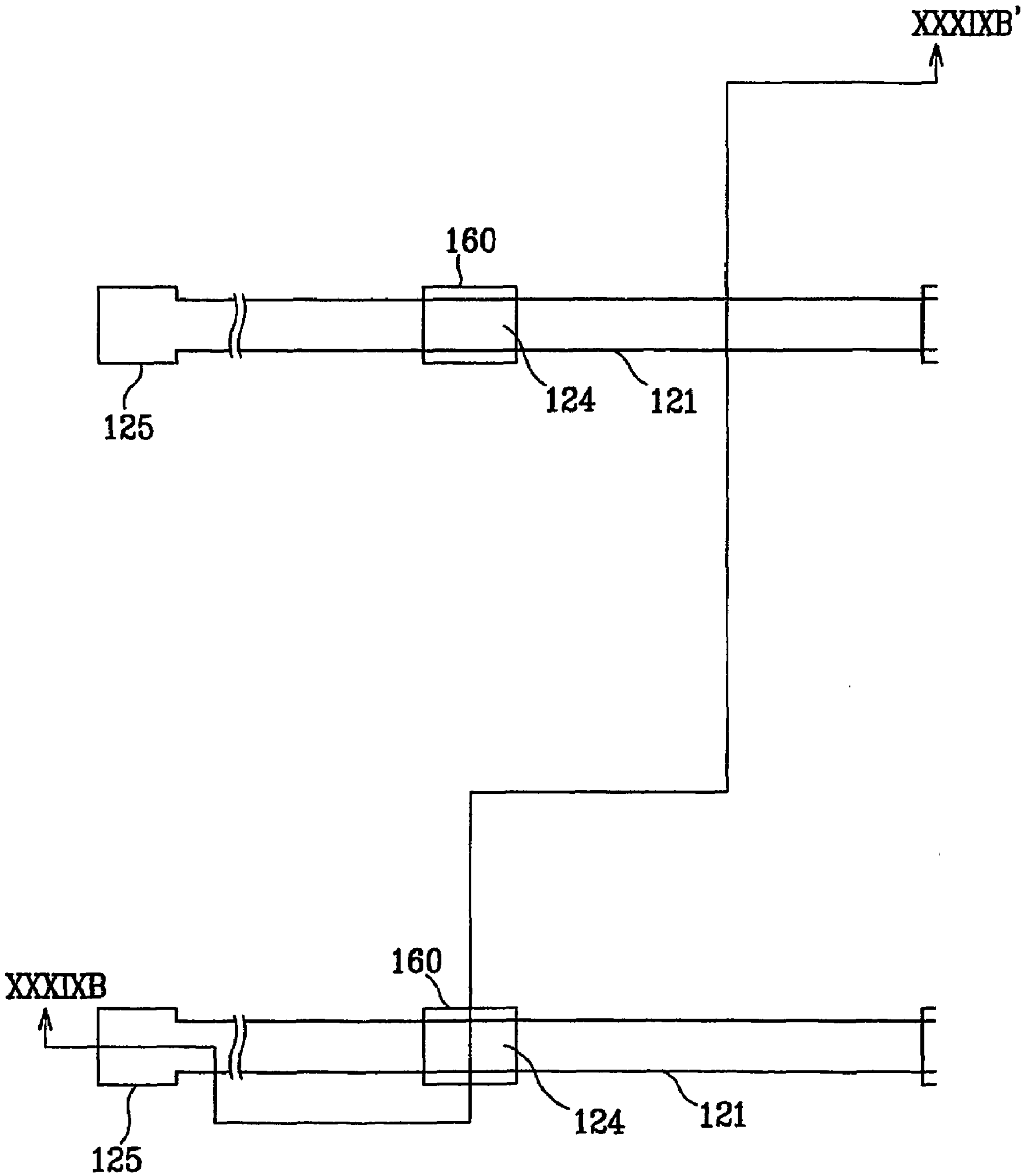
Figure 39B:
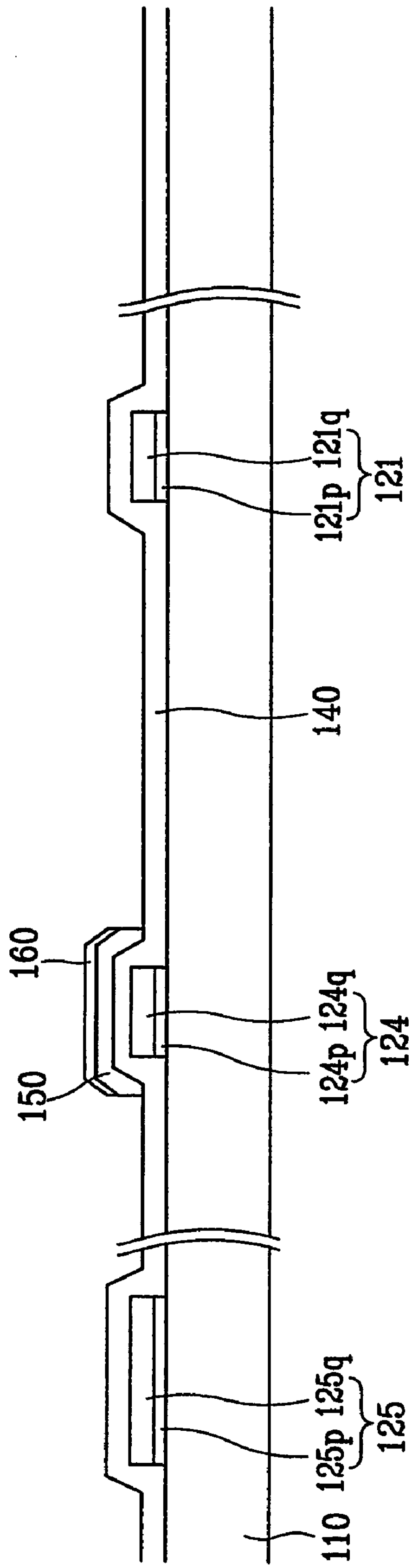
FIG. 39B is a sectional view of the TFT array panel shown in FIG. 39A taken along the line XXXIXb-XXXIXb' in the step following the step shown in FIG. 38B.

Referring to FIGS. 39A and 39B, after sequential deposition of a gate insulating layer 140, an intrinsic a-Si layer, and an extrinsic a-Si layer, the extrinsic a-Si layer and the intrinsic a-Si layer are photo-etched to form a plurality of extrinsic semiconductors 160 and a plurality of intrinsic semiconductors 150. The gate insulating layer 140 is preferably made of silicon nitride with thickness of about 2,000 Å to about 5,000 Å, and the deposition temperature is preferably in a range between about 250° C. and about 500° C.

Figure 40A:
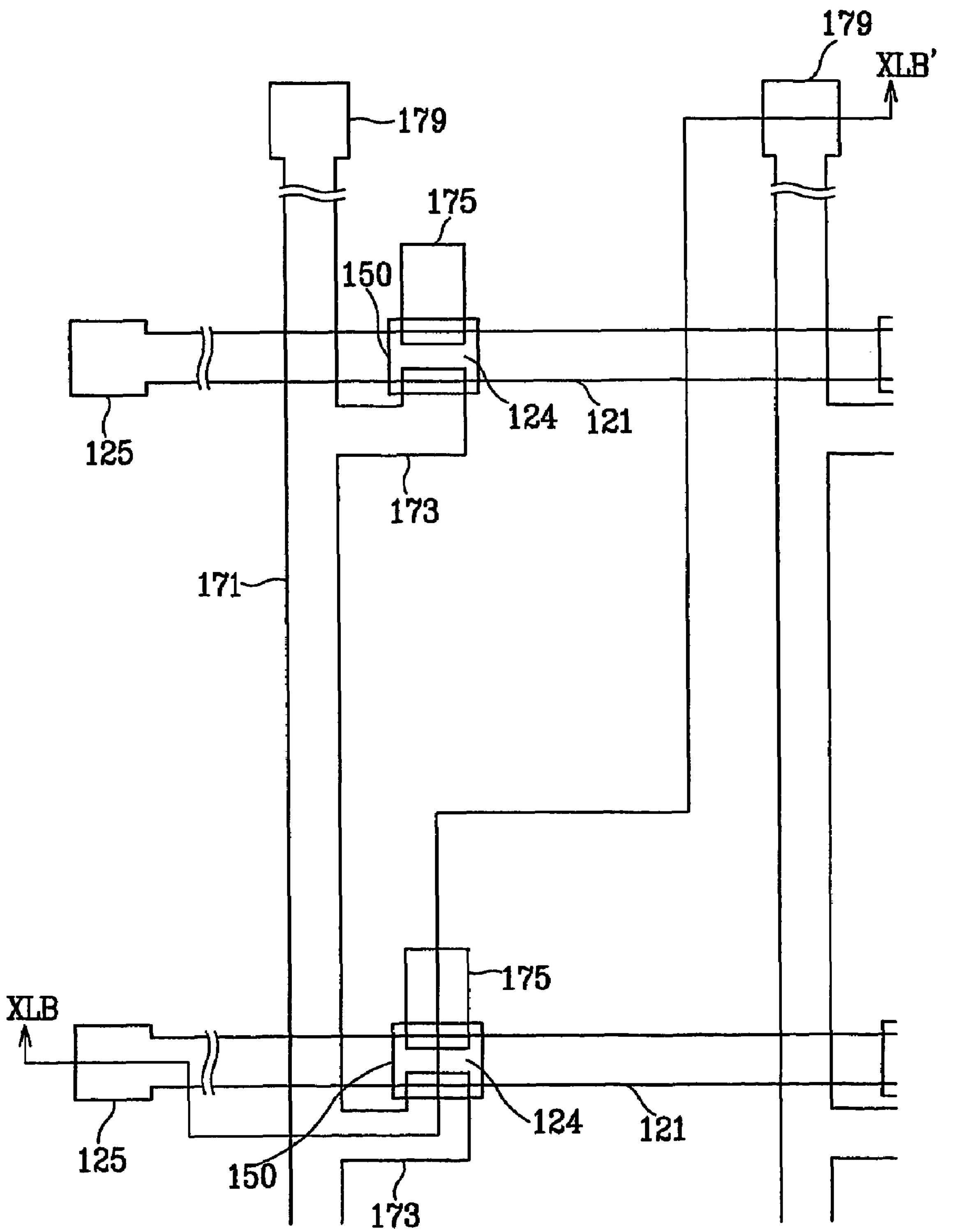
Figure 40B:
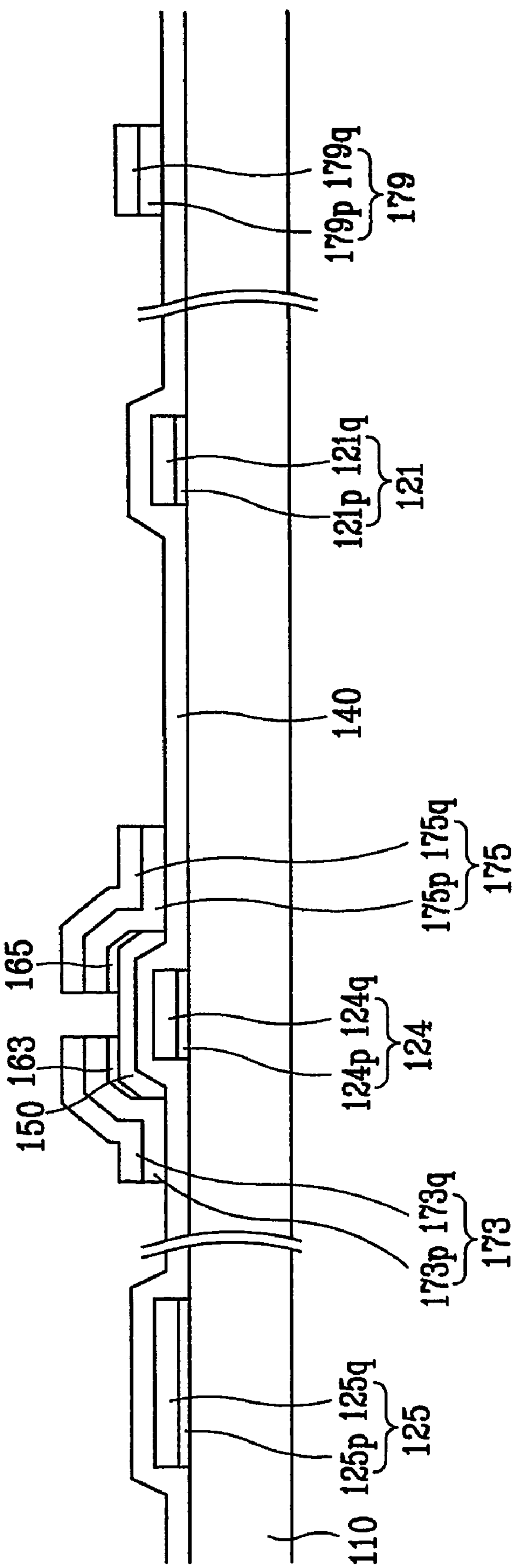
FIG. 40B is a sectional view of the TFT array panel shown in FIG. 40A taken along the line XLb-XLb' in the step following the step shown in FIG. 39B.

Referring to FIGS. 40A and 40B, two conductive films, a lower conductive film and an upper conductive film are sputtered in sequence. The lower conductive film is preferably made of a metal such as Cr, Mo, and Mo alloy and preferably has a thickness of about 500 Å. The upper conductive film preferably has a thickness of about 2,500 Å. The target for the upper film is preferably made of Al or Al—Nd containing 2 atomic % of Nd. The sputtering temperature is preferably about 150° C.

Next, the upper and lower conductive films are etched to form a plurality of data lines 171 including a plurality of source electrodes 173 and a plurality of drain electrodes 175. At this time, the upper and lower films may be etched by a wet etch simultaneously or the upper film is etched by a wet etch and the lower film is etched by a dry etch. When the lower film 171*p* is made of Mo or a Mo alloy, it may be etched along with the upper film 171*q* under a etch condition.

Next, portions of the extrinsic semiconductors 160, which are not covered with the data lines 171 and the drain electrodes 175 are removed by etch to complete a plurality of ohmic contacts 163 and 165 and to expose portions of the intrinsic semiconductors 150. Oxygen plasma treatment may follow thereafter in order to stabilize the exposed surfaces of the semiconductors 150.

Figure 41A:
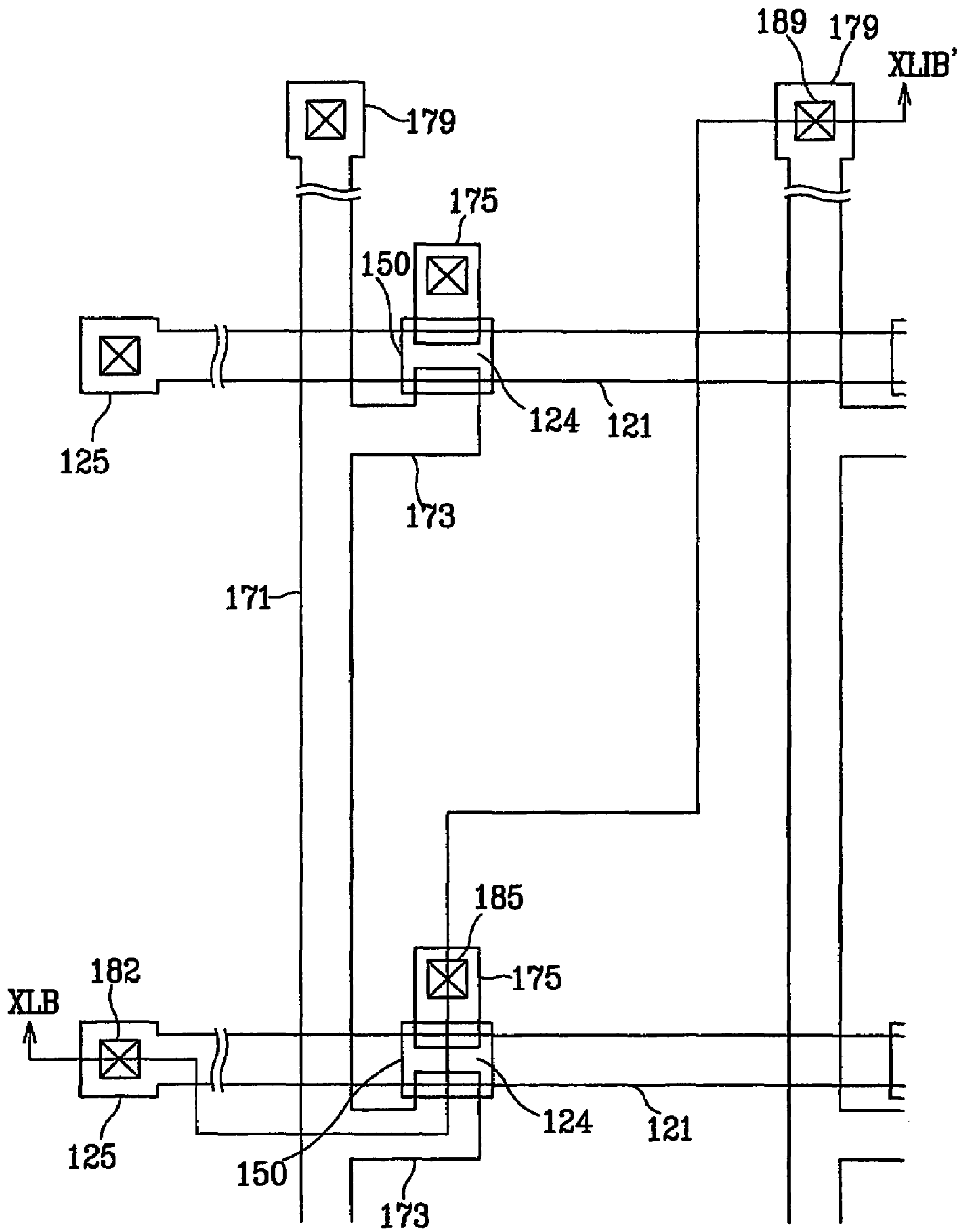
Figure 41B:
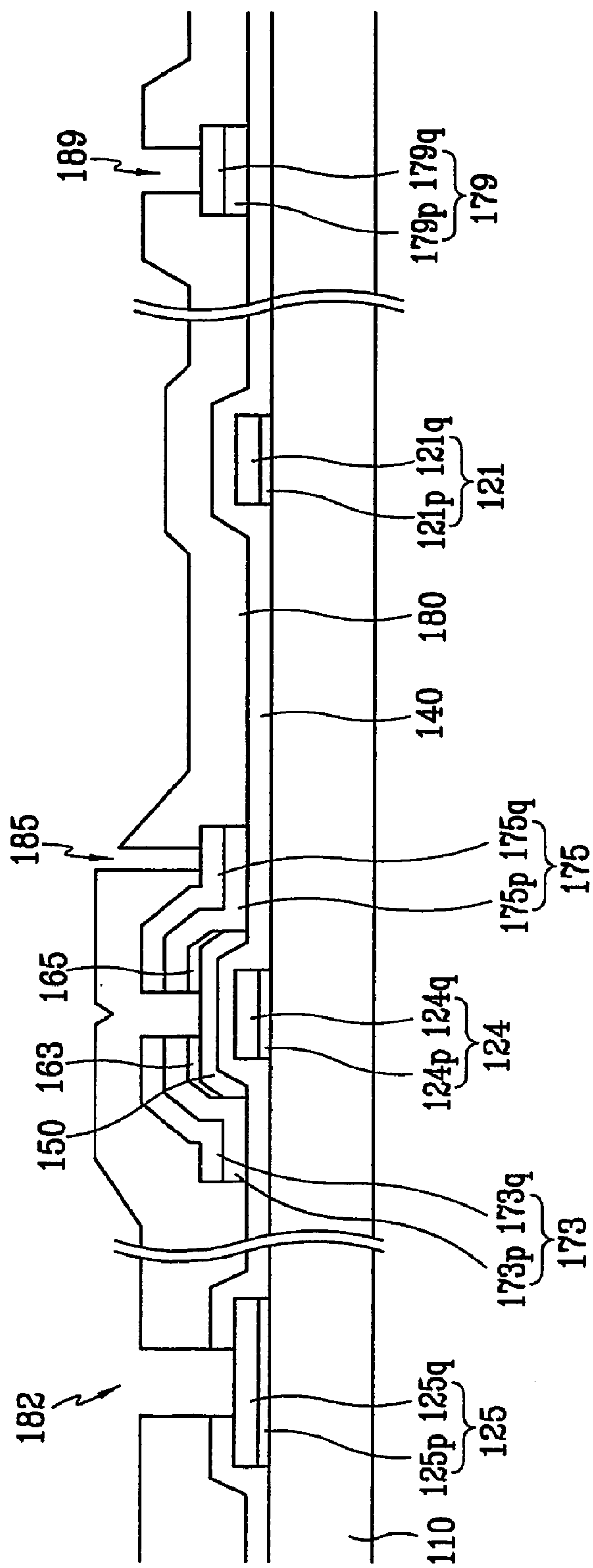
FIG. 41B is a sectional view of the TFT array panel shown in FIG. 41A taken along the line XLIb-XLIb' in the step following the step shown in FIG. 40B.

Referring to FIGS. 41A and 41B, a passivation layer 180 is deposited and dry etched along with the gate insulating layer 140 to form a plurality of contact holes 182, 185, and 189. The gate insulating layer 140 and the passivation layer 180 are preferably etched under an etch condition having substantially the same etch ratio for both the gate insulating layer 140 and the passivation layer 180.

Next, as shown in FIGS. 36 and 42, an IZO layer is deposited and photo-etched to form a plurality of pixel electrodes 901 connected to the drain electrodes 175 through the contact holes 185, a plurality of lower layers 906*p* and 908*p* of contact assistants 906 and 908 connected to the expansions 125 of the gate lines and the expansions 179 of the data lines.

Preheating for deposition of the IZO layer and the ITO layer is performed under $N_2$ gas atmosphere in order to prevent formation of a metal oxide layer on the portions of the metal layers 125, 175, and 179, which are exposed through the contact holes 182, 185, and 189.

When the pixel electrode 901 is formed of IZO, etchant for Cr or Al can be used to photo-etch the IZO layer such that the lower wires are prevented from getting damage. However, if the contact assistants 906 and 908 are made of IZO, the elements C and Si of the contact assistants 906 and 908 stick to the probe pins during gross test (GT) such that taking appropriate test is hindered.

To avoid such problem, as shown in FIGS. 36 and 37, ITO layers are deposited on the lower layer 906*p* and 908*p* made of IZO.

Another method of forming ITO layer only on the lower layers 906*p* and 908*p* of the contacts, which is made of IZO will be disclosed in detail.

FIG. 43 illustrates a liquid crystal display having the thin film transistor array panel of FIGS. 36 and 42, which has pixel electrodes 901 and contact assistants 906*p* and 908*p* made of IZO and a color filter array panel having a black matrix 220, color filters 230, and a common electrode 270 facing the thin film transistor array panel.

Referring to FIG. 43, an alignment layer 11 is formed on the pixel electrode 901 and the passivation layer 180. Next, spacers 320 for preserving cell gap are formed on the alignment layer 11. Next, a sealant 310 is formed on the boundary area of the thin film transistor array panel. When a liquid crystal layer is formed by dropping, the sealant 310 is formed to make a closed curve. When a liquid crystal layer is formed by injection after assembling the thin film transistor array panel and the color filter array panel, the sealant 310 is formed to make an open curve to have injection hole In the dropping method, liquid crystal material is dropped in and fill the space surrounded by the sealant 310. After that, the color filter array panel is assembled on the thin film transistor array panel.

In the injection method, the thin film transistor array panel and the color filter panel are assembled to form a space and, after that, the liquid crystal material is injected into the space. The injection hole is sealed after the injection.

A shorting ball 60 for connecting the common electrode 270 to a wire formed on the thin film transistor array panel and transmitting common voltage is formed outside of the sealant 310.

Next, as shown in FIG. 44, ITO layers 906*p* and 908*q* are formed in the lower layers 906*p* and 908*p* of the contact assistants.

The ITO layers 906*q* and 908*q* are deposited on the lower layers 906*p* and 908*p* of the contact assistants by masking and evaporation. A shadow mask 5 illustrated in FIG. 45 is used for masking.

Evaporation is a deposition method that a material for deposition is evaporated and is deposited on a substrate. The material is evaporated by thermal heating or electron beam heating.

When the evaporation is compared with a sputtering which uses collisions of ions in a plasma state, the evaporation has merits that it does not need a high energy or a high vacuum. Furthermore, when the evaporation is used, selective deposition is possible by using a shadow mask.

Deposition of ITO layer by the evaporation is preferably performed after all of the processes, assembling of the thin film transistor panel 100 and the color filter panel 200, injection of liquid crystal material, and cutting the mother panels into cells. That is, deposition of ITO layer is preferably performed before the visual test which is performed before the module process.

Since the deposition of ITO layer on the lower layers of the contact assistants by the evaporation is performed after cutting the mother panels into cells and the ITO layer is selectively deposited on the lower layers of the contact assistants by using shadow mask, the evaporation method can be easily adapted to a large size panel.

The shadow mask 5 has openings for exposing the lower layer 906*p* and 908*p* of the contact assistants. That is, the shadow mask 5 has gate openings 5*b* for exposing the lower layers 906*p* of the contact assistants which are connected to the expansions 125 of the gate lines and data openings 5*a* for exposing the lower layers 908*p* of the contact assistants which are connected to the expansions 179 of the data lines.

Accordingly, the contact assistants 906 and 908 include the lower layers 906*p* and 908*p* of IZO and the upper layers 906*q* and 908*q* of ITO. Since the probe pins contact with the upper layer 906*q* and 908*q* of ITO during the gross test, the prove pins do not have accumulation of foreign body.

The present invention can be applied to an electro luminescence (EL) display.

An EL display according to an embodiment of the present invention will be described in the below.

Two embodiments of EL display will be described. One is illustrated in FIGS. 46 to 62*b* and the other is illustrated in FIGS. 63 to 67.

The embodiments of EL display include thin film transistor array panels using amorphous silicon as a semiconductor of thin film transistors.

Figure 46:
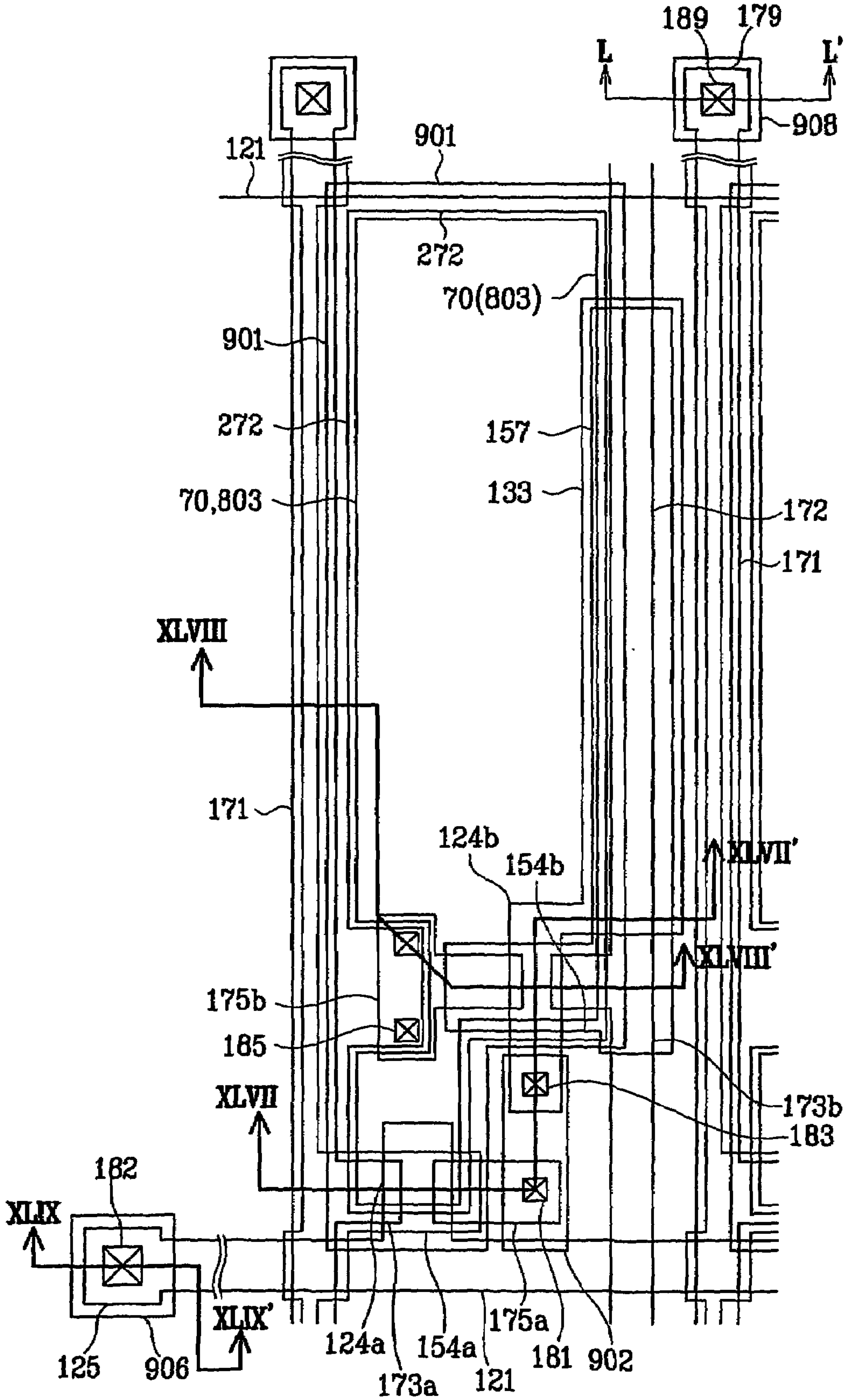
FIG. 46 is a layout view of a TFT array panel for an electro-luminescence ("EL") display according to an embodiment of the present invention.
Figure 47:
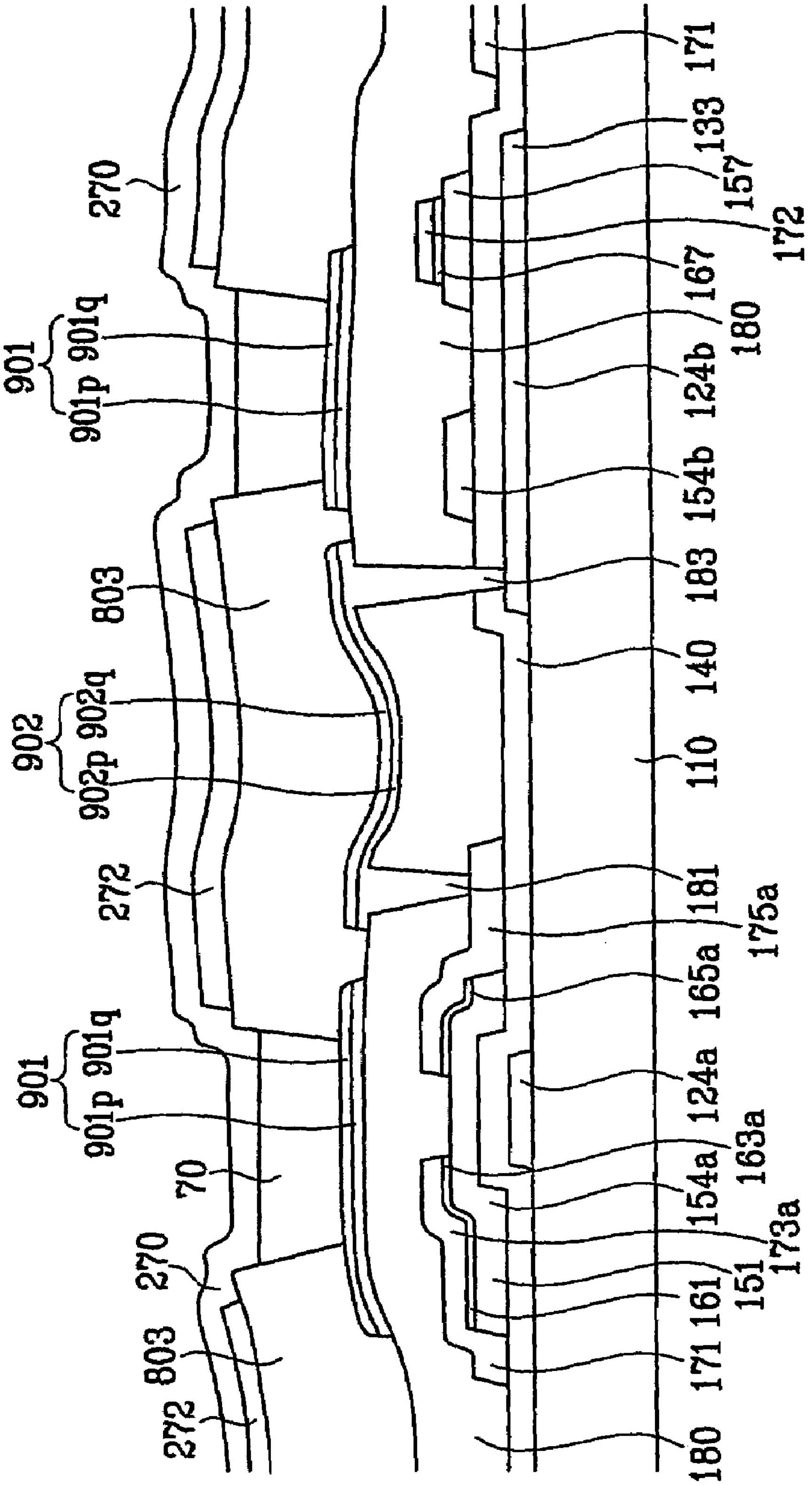
FIGS. 47 and 48 are sectional views of the TFT array panel shown in FIG. 46 taken along the line XLVIIb-XLVIIb' and the line XLVIII-XLVIII', respectively.
Figure 48:
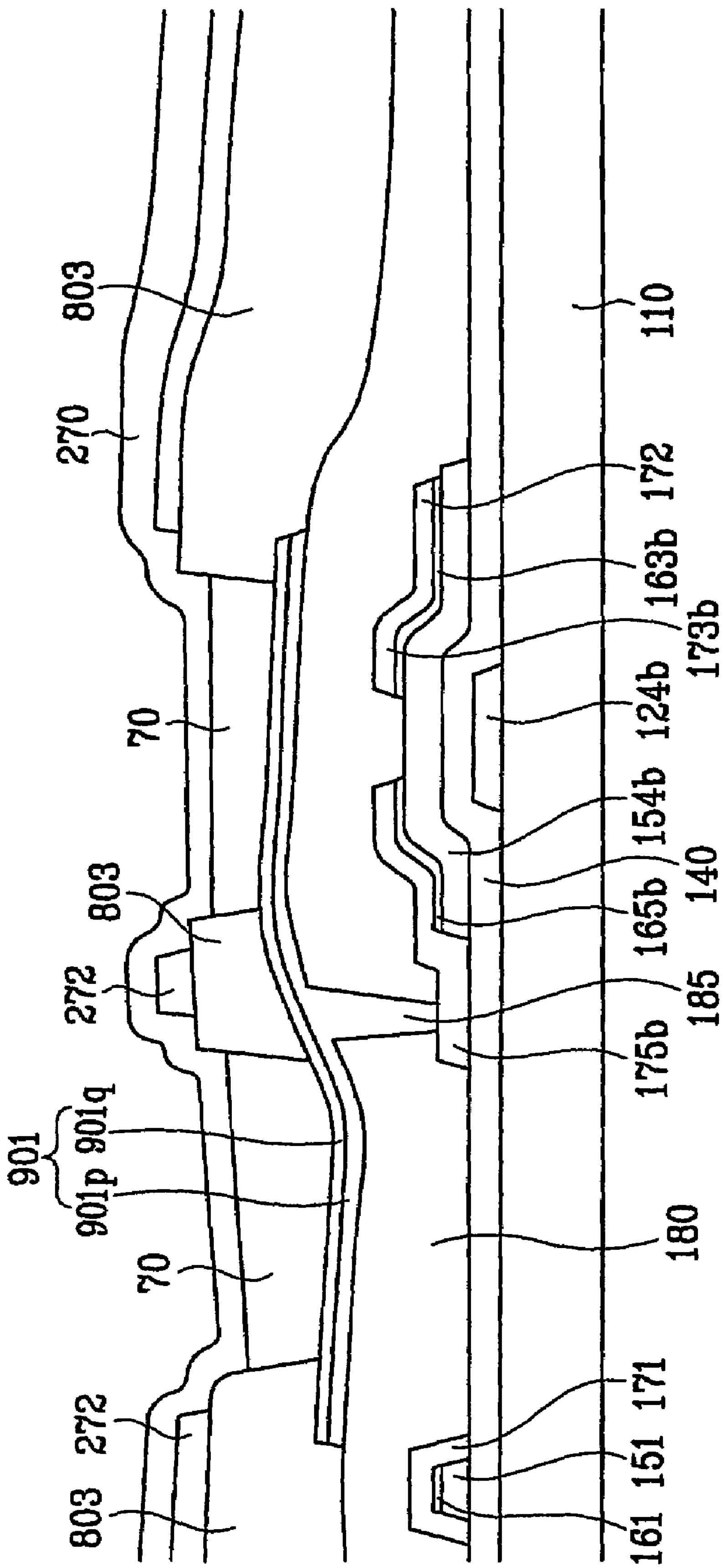
Figure 49:
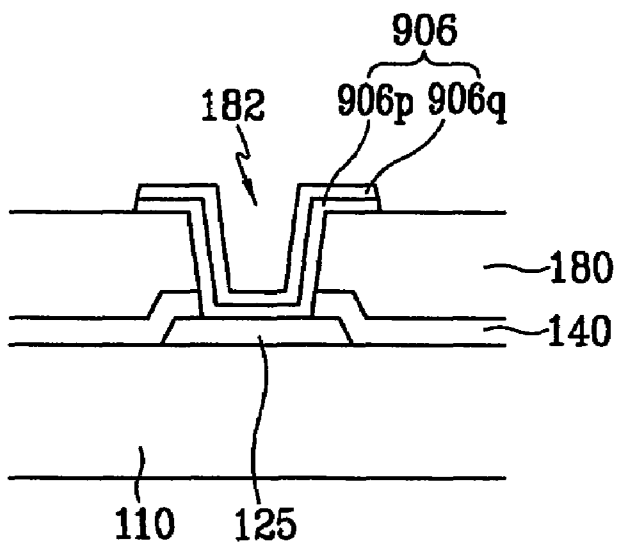
FIGS. 49 and 50 are sectional views of the TFT array panel shown in FIG. 46 taken along the line XLIX-XLIX' and the line L-L', respectively.
Figure 50:
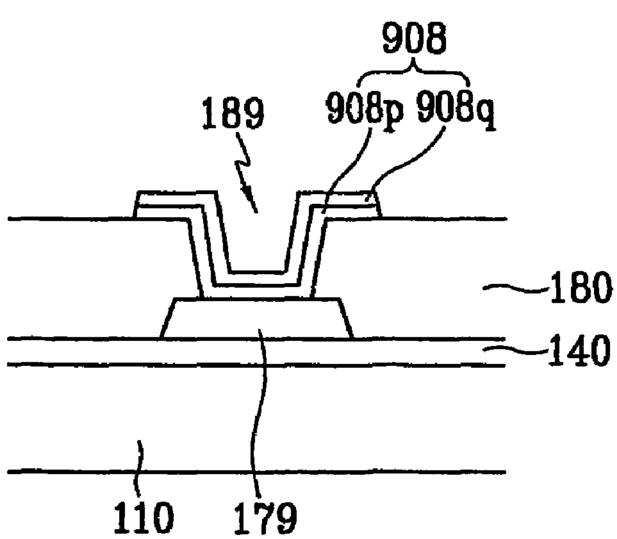

FIG. 46 is a layout view of a TFT array panel for an electro-luminescence ("EL") display according to an embodiment of the present invention. FIGS. 47 and 48 are sectional views of the TFT array panel shown in FIG. 46 taken along the line XLVIIb-XLVIIb' and the line XLVIII-XLVIII', respectively. FIGS. 49 and 50 are sectional views of the TFT array panel shown in FIG. 46 taken along the line XLIX-XLIX' and the line L-L', respectively.

A plurality of gate lines 121 for transmitting gate signals are formed on an insulating substrate 110. Each gate line 121 extends substantially in a transverse direction and a plurality of portions of each gate line 121 form a plurality of first gate electrodes 124*a*. a plurality of second gate electrode 124*b* are formed on the same layer with the gate lines 121 and each second gate electrode 124*b* is connected to a storage electrode 133 which is extends in a longitudinal direction.

The gate lines 121, the first and second gate electrodes 124*a* and 124*b*, and the storage electrodes 133 may include two films having different physical characteristics. One film is preferably made of low specific resistance metal including Al containing metal such as Al and Al alloy for reducing signal delay or voltage drop in the gate lines 121. The other film is preferably made of material such as Cr, Mo, and Mo alloy such as MoW, which has good physical, chemical, and electrical contact characteristics with other materials such as ITO and IZO. Good examples of combination of the two films is Cr and Al—Nd alloy.

The lateral sides of the gate lines 121 and the storage electrodes 133 are inclined relative to a surface of the substrate 110, and the inclination angle thereof ranges about 30-80 degrees.

A gate insulating layer 140 preferably made of silicon nitride (SiNx) is formed on the gate lines 121.

A plurality of semiconductor stripes 151 and island 154*b* preferably made of hydrogenated amorphous silicon (abbreviated to "a-Si") are formed on the gate insulating layer 140. Each semiconductor stripe 151 extends substantially in the longitudinal direction and has a plurality of first projections 154*a* branched out toward the first gate electrodes 124*a*. The width of each semiconductor stripe 151 becomes large near the gate lines 121. The semiconductor islands 154*b* include second projections which intersect the second gate electrode 124*b*.

A plurality of ohmic contact stripes and islands 161, 165*a*, 163*b*, and 165*b* preferably made of silicide or n+hydrogenated a-Si heavily doped with n type impurity are formed on the semiconductor stripes 151 and island 154*b*. Each ohmic contact stripe 161 has a plurality of projections 163*a*, and the projections 163*a* and the ohmic contact islands 165*a* are located in pairs on the first projections 154*a* of the semiconductor stripes 151. The ohmic contact islands 163*b* and 165*b* are located in pairs on the semiconductor islands 154*b* with respect to the second gate electrodes 124*b*.

The lateral sides of the semiconductors 151 and 154*b* and the ohmic contacts 161, 165*a*, 163*b*, and 165*b* are inclined relative to a surface of the substrate 110, and the inclination angles thereof are preferably in a range between about 30-80 degrees.

A plurality of data lines 171, first drain electrodes 175*a*, power lines 172, and second drain electrodes 175*b* are formed on the ohmic contacts 161, 165*a*, 163*b*, and 165*b* and the gate insulating layer 140.

The data lines 171 and the power lines 172 for respectively transmitting data voltages and a power voltage extend substantially in the longitudinal direction and intersect the gate lines 121.

A plurality of branches of each data line 171, which project toward the first drain electrodes 175*a* form a plurality of first source electrodes 173*a*. A plurality of branches of each power line 172, which project toward the second drain electrodes 175*b* form a plurality of second source electrodes 173*b*. Each pairs of the first and second source electrodes 173*a* and 173*b* and the first and second drain electrodes 175*a* and 175*b* are separated from each other and opposite each other with respect to the first and second gate electrodes 124*a* and 124*b*.

A first gate electrode 124*a*, a first source electrode 173*a*, and a first drain electrode 175*a* along with a first projection 154*a* of a semiconductor stripe 151 form a switching TFT and A second gate electrode 124*b*, a second source electrode 173*b*, and a second drain electrode 175*b* along with a semiconductor island 154*b* form a driving TFT. Each power line 172 overlaps the semiconductor islands 154*b* and the storage electrode portion 157.

The data lines 171, the first and second drain electrodes 175*a* and 175*b*, and the power lines 172 contain Mo or a Mo alloy. When they have a structure of double layers or triple layers, a Al or Al alloy layer may be included. When they have a structure of double layers, the Al or Al alloy layer is preferably disposed under the Mo or Mo alloy layer. When they have a structure of triple layers, the Al or Al alloy layer is preferably applied as a middle layer.

Like the gate lines 121, the data lines 171, the first and second drain electrodes 175*a* and 175*b*, and the power lines 172 have tapered lateral sides relative to the surface of the substrate 110, and the inclination angles thereof range about 30-80 degrees.

The ohmic contacts 161, 163*b*, 165*a*, and 165*b* are interposed only between the underlying semiconductors 151 and 154*b* and the overlying data lines 171, the first and second drain electrodes 175*a* and 175*b*, and the power lines 172 and reduce the contact resistance therebetween. The semiconductor stripes 151 include a plurality of exposed portions, which are not covered with the data lines 171 and the first drain electrodes 175*a*, such as portions located between the first source electrodes 173*a* and the first drain electrodes 175*a*. Although the semiconductor stripes 151 are narrower than the data lines 171 at most places, the width of the semiconductor stripes 151 becomes large near the gate lines 121 as described above, to smooth the profile of the surface, thereby preventing the disconnection of the data lines 171.

A passivation layer 180 is formed on the data lines 171, the first and second drain electrodes 175*a* and 175*b*, the power line 172, and exposed portions of the semiconductors 151 and 154*b*. The passivation layer 180 is preferably made of photosensitive organic material having a good flatness characteristic, low dielectric insulating material such as a-Si:C:O and a-Si:O:F formed by plasma enhanced chemical vapor deposition (PECVD), or inorganic material such as silicon nitride and silicon oxide.

When the passivation layer 180 is formed of an organic insulating material, an additional insulating layer made of an inorganic material such as silicon nitride and silicon oxide may be formed under the organic insulating layer to prevent contacting of the organic layer and the exposed portions of the semiconductors 151 and 154*b*.

The passivation layer 180 has a plurality of contact holes 185, 183, 181, 182, and 189 exposing the first drain electrodes 175*a*, the second gate electrodes 124*b*, the second drain electrodes 175*b*, the expansions 125 of the gate lines, and the expansion 179 of the data lines 171, respectively.

The contact holes 182 and 189 of the passivation layer 180 expose the expansions 125 and 179 of the gate line 121 and the data line 171. The expansions 125 and 179 contact with an external driving circuit through the contact holes 181 and 189. Here, an asymmetric conductive film (ACF) is disposed between the output terminal of the external driving circuit and the expansions 125 and 179 to enhance their electrical connection and physical adhesion. However, when driving circuits are directly fabricated on the substrate 110, the gate lines 121 and the data lines 171 may be connected to the driving circuits without contact holes. Sometimes, a gate driving circuit is directly fabricated on the substrate and a data driving circuit is packed on the substrate 110 in a form of chip. At that time, the contact hole 189 may only be formed to expose the expansion 179 of the data line 171.

The contact holes 185, 183, 181, 182, and 189 expose the first and second drain electrodes 175*a* and 175*b*, the second gate electrodes 124*b*, and the expansions 125 and 179 of the gate lines 121 and data lines 171. It is preferable that a conductive layer of Al family is not exposed through the contact holes 185, 183, 181, 182, and 189 to assure proper contact with an upper conductive layer which is formed later. When a conductive layer of Al family is exposed through the contact holes 185, 183, 181, 182, and 189, the exposed portions are preferably removed by blanket etch.

A plurality of pixel electrodes 901, a plurality of connection assistants 902, and a plurality of contact assistants 906 and 908 are formed on the passivation layer 180.

The pixel electrodes 901 are physically and electrically connected to the second drain electrodes 175*b* through the contact holes 185. Each connection assistant 902 connects the first drain electrode 175*a* and the second gate electrode 124*b* through the contact holes 181 and 183. The contact assistants 906 and 908 are connected to the exposed expansions 125 of the gate lines 121 and the exposed expansions 179 of the data lines 171 through the contact holes 182 and 189, respectively.

The pixel electrodes 901, the connection assistants 902, and the contact assistants 906 and 908 have double layers of lower films 901*p*, 902*p*, 906*p*, and 908*p* and upper films 901*q*, 902*q*, 906*q*, and 906*q*. Here, the lower films 901*p*, 902*p*, 906*p*, and 908*p* are made of IZO and the upper films 901*q*, 902*q*, 906*q*, and 906*q* are made of ITO.

A partitioning wall 803 made of an organic insulating material or an inorganic insulating material is formed on the passivation layer 180 to isolate each organic luminescence cell. The partitioning wall 803 is formed along boundaries of the pixel electrodes 901 to surround the pixel electrodes 901 and to partition spaces in which organic luminescence layers 70 are filled.

The organic luminescence layers 70 are formed on the pixel electrodes 901 and fill the spaces partitioned by the partitioning wall 803.

Each organic luminescence layer 70 is made of a light luminescence material which lumpiness one of red, green, and blue light. The organic luminescence layers 70 of red, green, and blue are sequentially and repeatedly arranged.

A subsidiary electrode 272 made of a conductive material having low specific resistance such as metal is formed on the partitioning wall 803 to have the similar pattern with the partitioning wall 803. The subsidiary electrode 272 contacts with a common electrode 270 which is formed on the subsidiary electrode 272 and reduces resistance of the common electrode 270.

The common electrode 270 is formed on the partitioning wall 803, the organic luminescence layer 70, and the subsidiary electrode 272. The common electrode 270 is made of a conductive material having a low resistance such as Al. An EL display emitting light from back face is illustrated in this embodiment. However, when an EL display emitting light from front face or both back and front face is considered, the common electrode 270 is formed of a transparent conductive material such as ITO or IZO.

A method of manufacturing the TFT array panel illustrated in FIGS. 46 to 50 will now be described in detail with reference to FIGS. 51 to 62B as well as FIGS. 46 and 50.

FIGS. 51, 53, 55, 57, 59, and 61 are layout views sequentially illustrating the intermediate steps of a method of manufacturing the TFT array panel illustrated in FIGS. 46 to 50. FIGS. 52A, 52B, and 52C are sectional views of the TFT array panel shown in FIG. 51 taken along the lines LIIa-LIIa', LIIb-LIIb', and LIIc-LIIc', respectively. FIGS. 54A, 54B, and 54C are sectional views of the TFT array panel shown in FIG. 53 taken along the lines LIVa-LIVa', LIVb-LIVb', and LVIc-LVIc', respectively. FIGS. 56A, 56B, 56C, and 56D are sectional views of the TFT array panel shown in FIG. 55 taken along the lines LVIa-LVIa', LVIb-LVIb', LVIc-LVIc', and LVId-LVId', respectively. FIGS. 58A, 58B, 58C, and 58D are sectional views of the TFT array panel shown in FIG. 57 taken along the lines LVIIIa-LVIIIa', LVIIIb-LVIIIb', LVIIIc-LVIIIc', and LVIIId-LVIIId', respectively. FIGS. 60A, 60B, 60C, and 60D are sectional views of the TFT array panel shown in FIG. 59 taken along the lines LXa-LXa', LXb-LXb', LXc-LXc', and LXd-LXd', respectively. FIGS. 62A and 62B are sectional views of the TFT array panel shown in FIG. 61 taken along the line LXIIa-LXIIa' and the line LXIIb-LXIIb', respectively.

Figure 51:
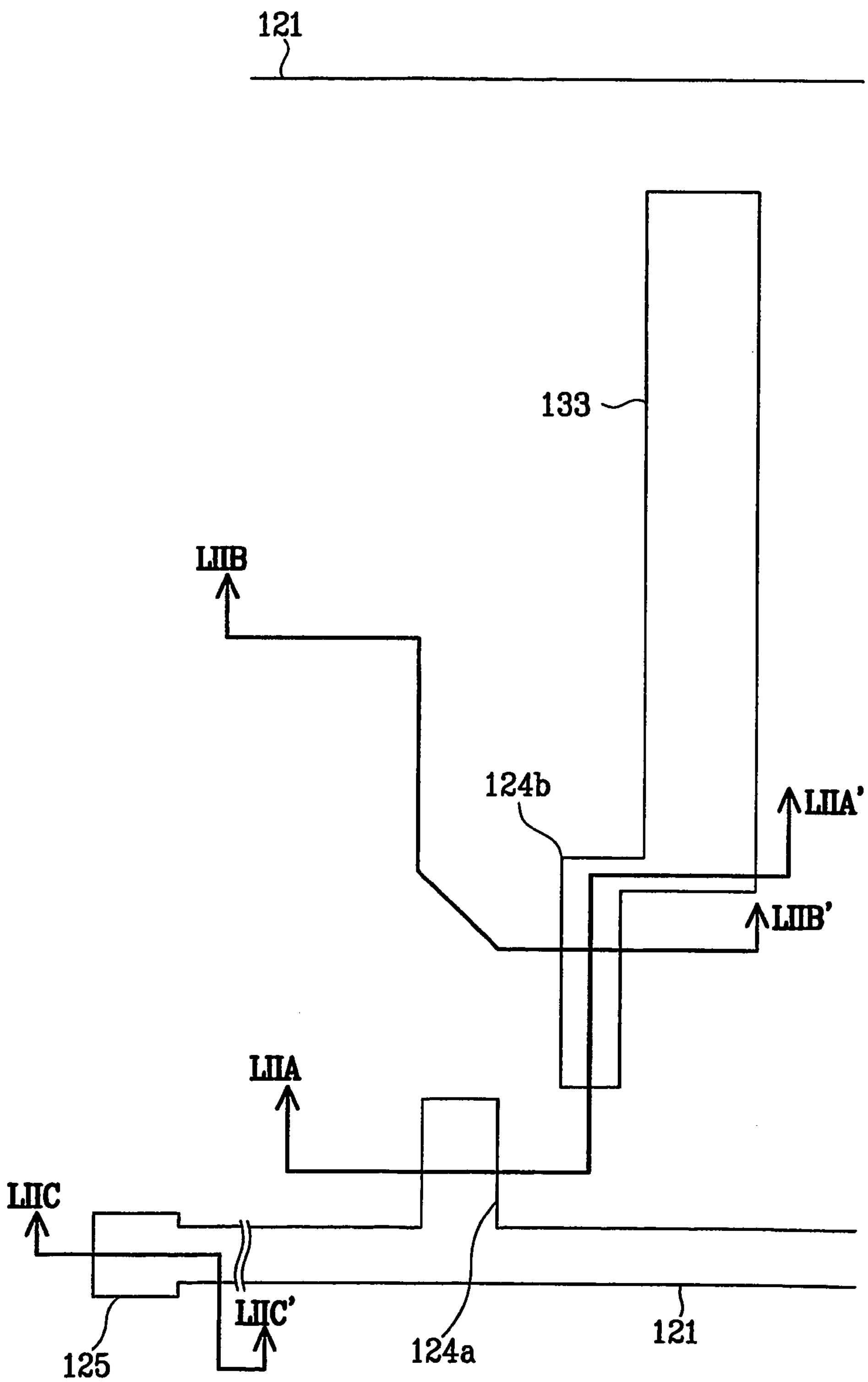
FIGS. 51, 53, 55, 57, 59, and 61 are layout views sequentially illustrating the intermediate steps of a method of manufacturing the TFT array panel illustrated in FIGS. 46 to 50.
Figure 52A:
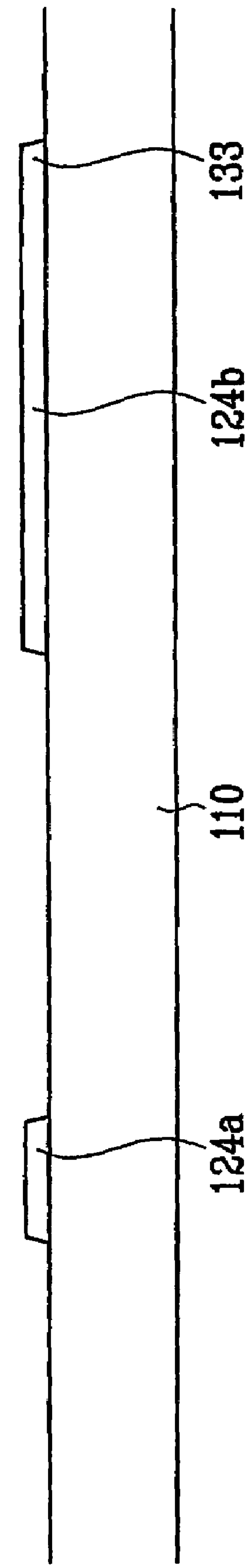
FIGS. 52A, 52B, and 52C are sectional views of the TFT array panel shown in FIG. 51 taken along the lines LIIa-LIIa', LIIb-LIIb', and LIIc-LIIc', respectively.
Figure 52B:
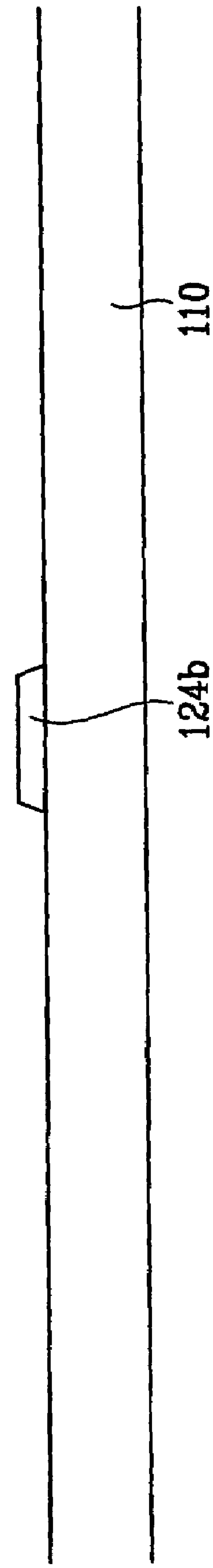
Figure 52C:
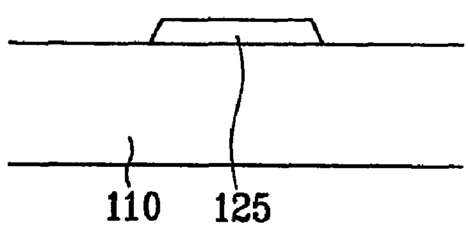

First, as shown in FIGS. 51 to 52C, a conductive film is sputtered on an insulating substrate 110 such as transparent glass and the conductive film is patterned by photo-etching to form a plurality of gate lines 121 including a plurality of first gate electrodes 124*a*, a plurality of second gate electrodes 124*b*, and a plurality of storage electrodes 133.

Figure 53:
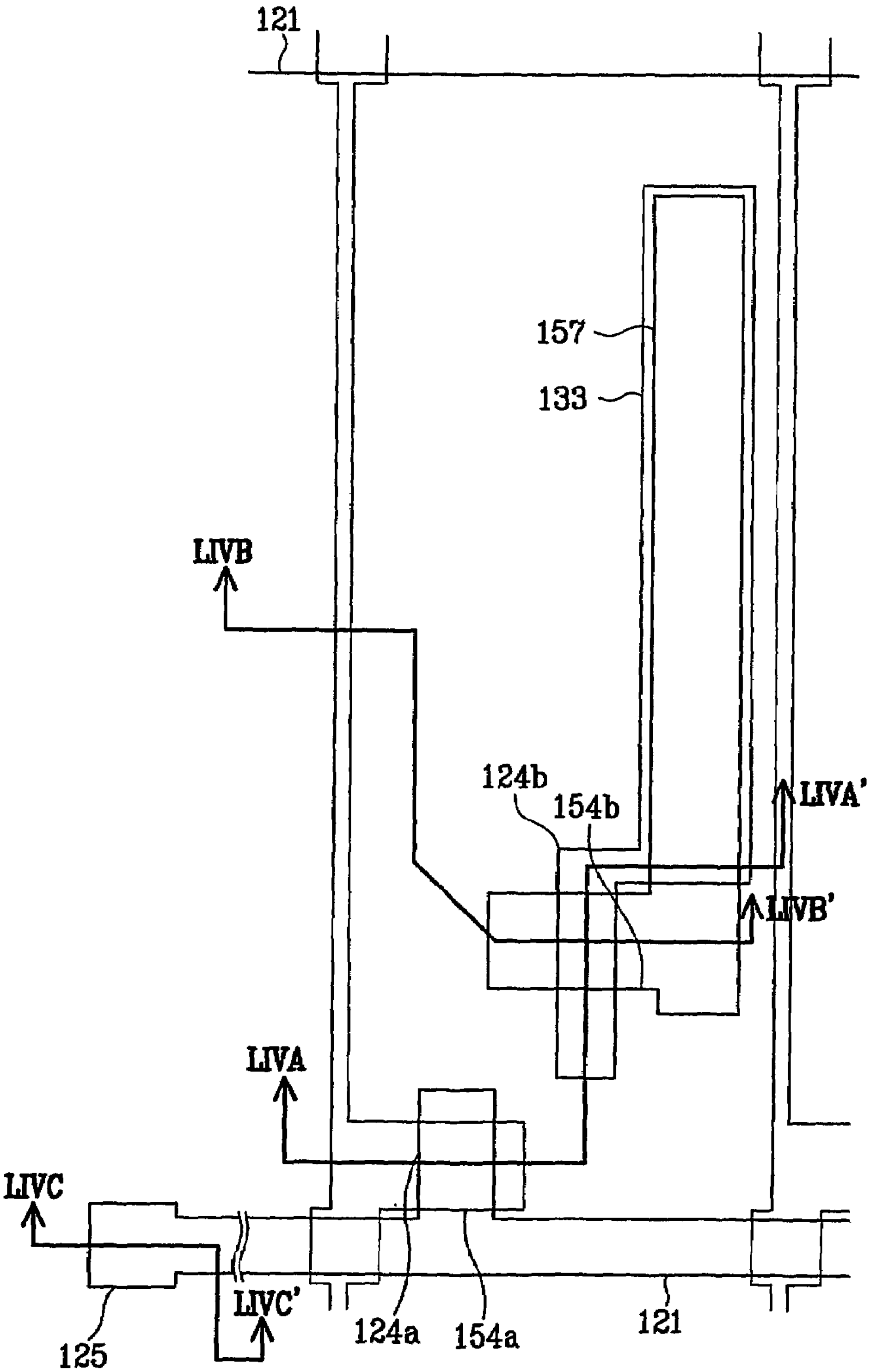
Figure 54A:
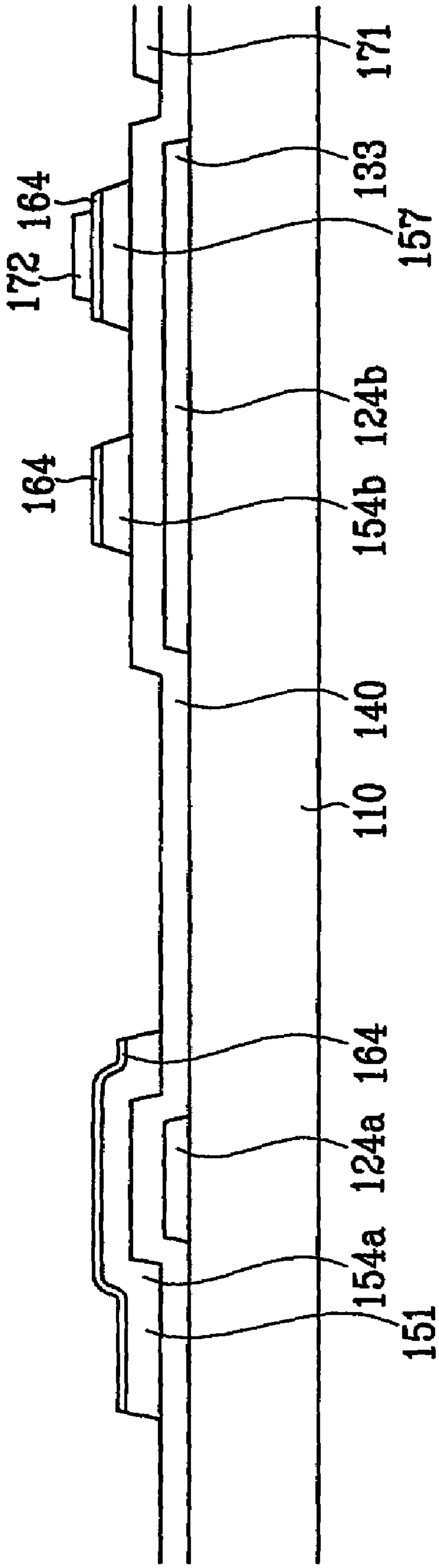
FIGS. 54A, 54B, and 54C are sectional views of the TFT array panel shown in FIG. 53 taken along the lines LIVa-LIVa', LIVb-LIVb', and LVIc-LVIc', respectively.
Figure 54B:
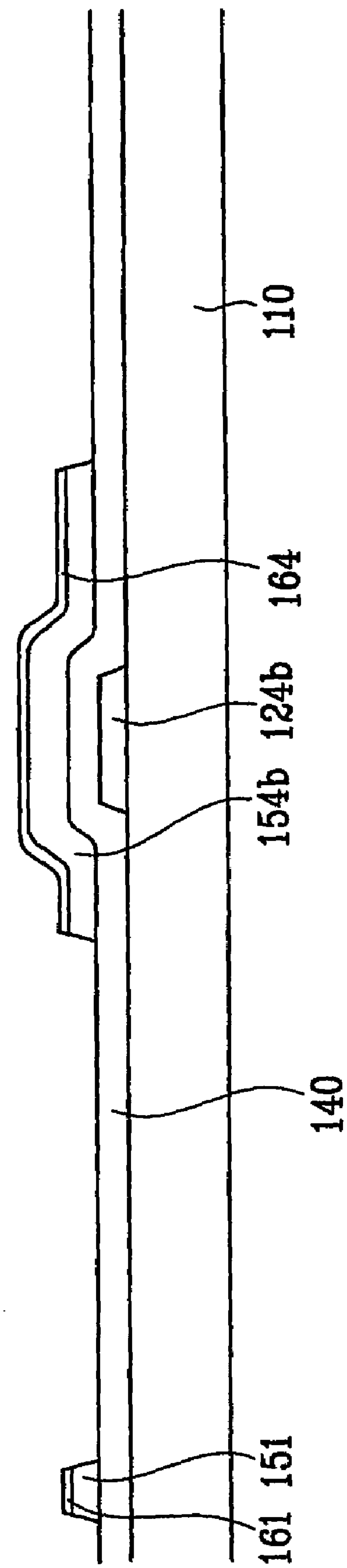
Figure 54C:
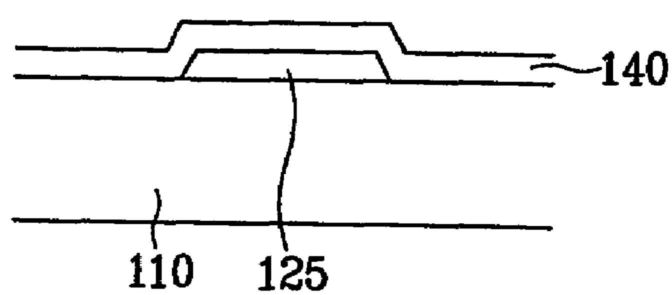

Referring to FIGS. 53 to 54C, after sequential deposition of a gate insulating layer 140, an intrinsic a-Si layer, and an extrinsic a-Si layer, the extrinsic a-Si layer and the intrinsic a-Si layer are photo-etched to form a plurality of extrinsic semiconductor stripes 164 and a plurality of intrinsic semiconductor stripes 151 including first protrusions 154*a* and intrinsic semiconductor islands 154*b*. The gate insulating layer 140 is preferably made of silicon nitride with thickness of about 2,000 Å to about 5,000 Å, and the deposition temperature is preferably in a range between about 250° C. and about 500° C.

Figure 55:
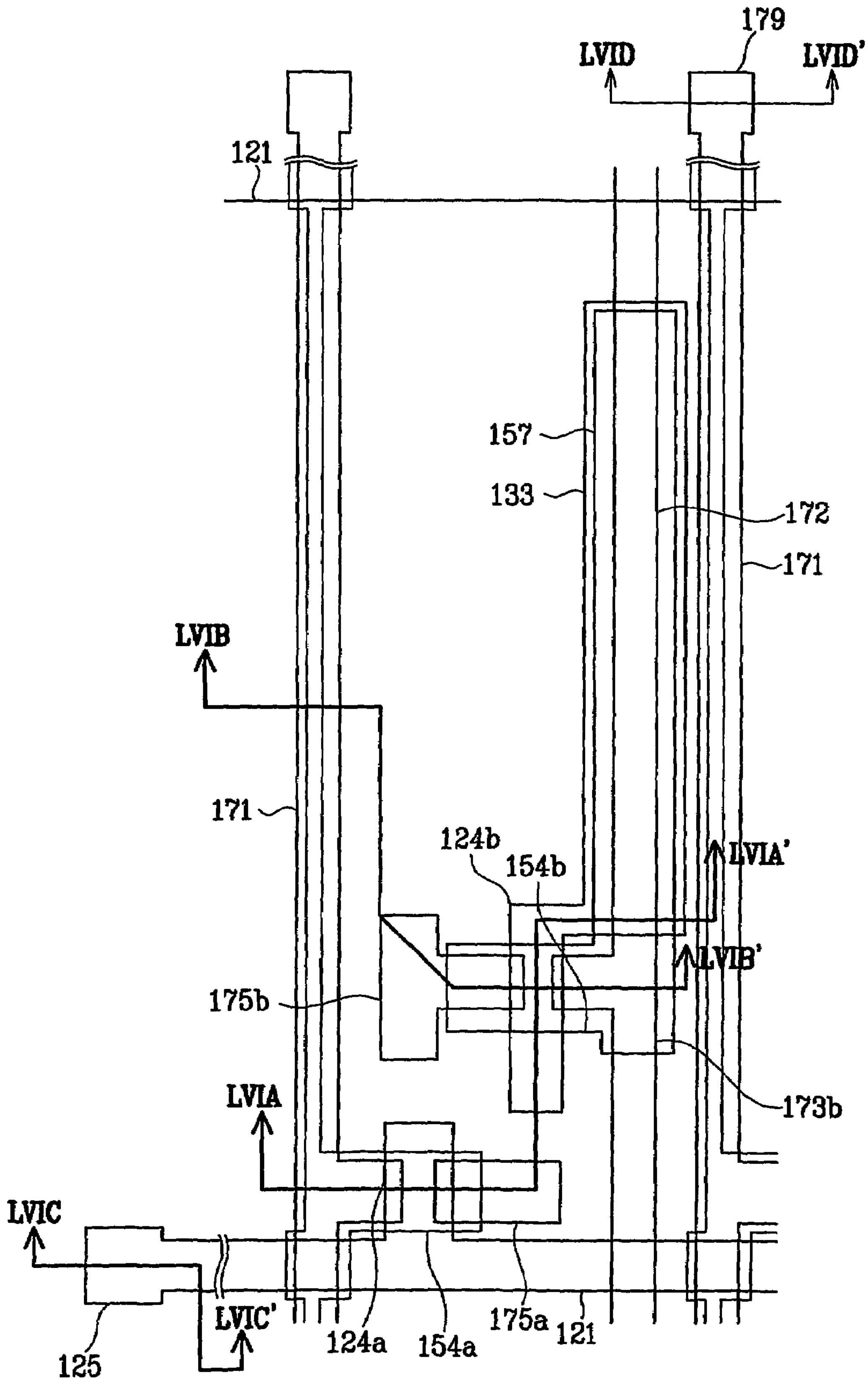
Figure 56A:
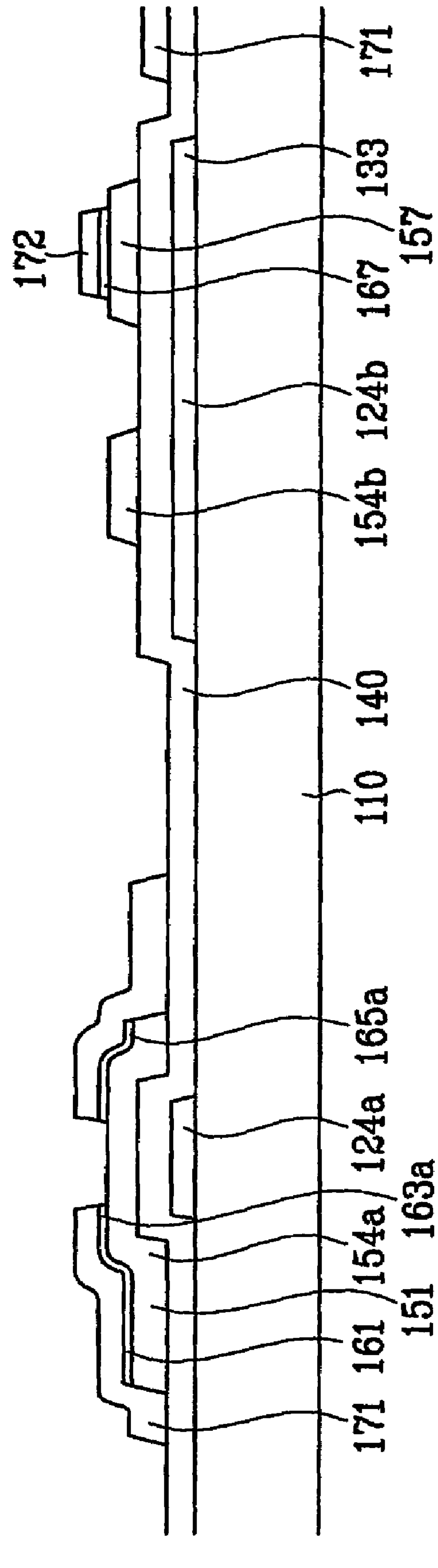
FIGS. 56A, 56B, 56C, and 56D are sectional views of the TFT array panel shown in FIG. 55 taken along the lines LVIa-LVIa', LVIb-LVIb', LVIc-LVIc', and LVId-LVId', respectively.
Figure 56B:
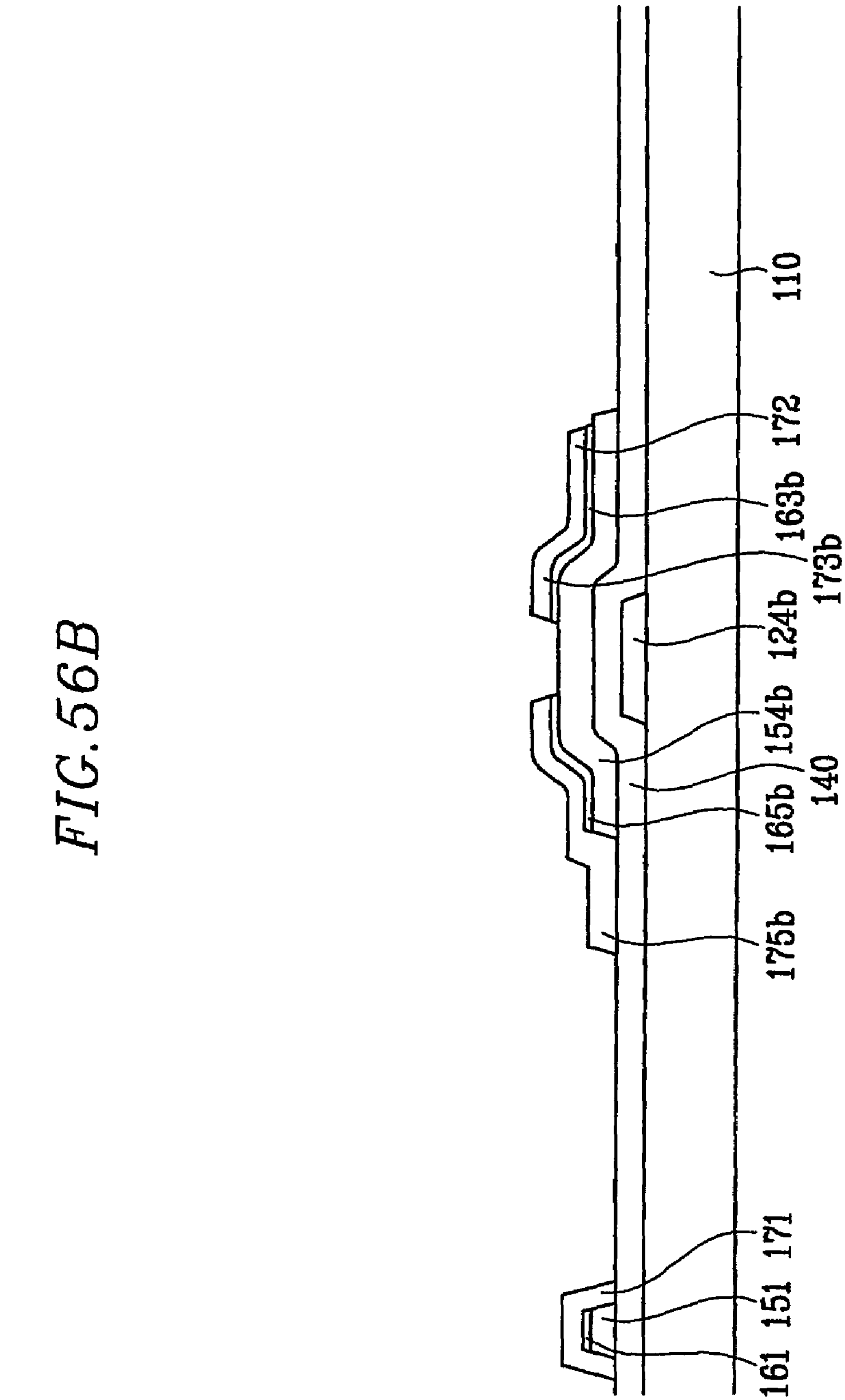
Figure 56C:
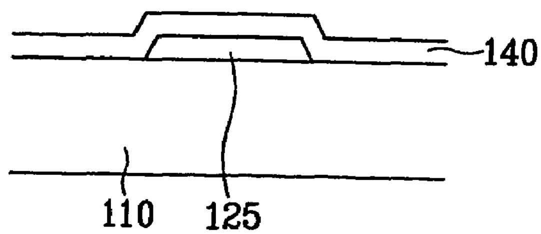
Figure 56D:
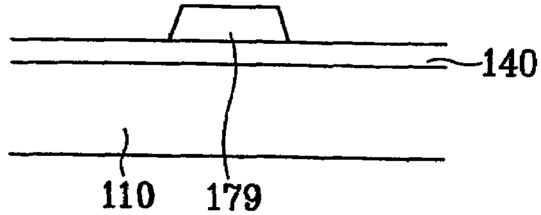

Next, as shown in FIGS. 55 to 56D, single or multiple conductive layers including Al, Al alloy, Cr, Mo, or Mo alloy are deposited and a photoresist pattern is formed on the conductive layers. The conductive layers are etched by using the photoresist pattern as a etch-mask to form a plurality of data lines 171 including a plurality of first source electrodes 173*a*, a plurality of first and second drain electrodes 175*a* and 175*b*, and a plurality of power lines 172 including a plurality of second source electrodes 173*b*.

Next, portions of the extrinsic semiconductors 164, which are not covered with the data lines 171, the power line 172, and the first and second drain electrodes 175*a* and 175*b* are removed by etch to complete a plurality of ohmic contact stripes 161 and islands 165*a*, 165*b*, and 163*b* and to expose portions of the intrinsic semiconductor stripes 151 and islands 154*b*.

Oxygen plasma treatment may follow thereafter in order to stabilize the exposed surfaces of the intrinsic semiconductors 151 and 154*b*.

Figure 57:
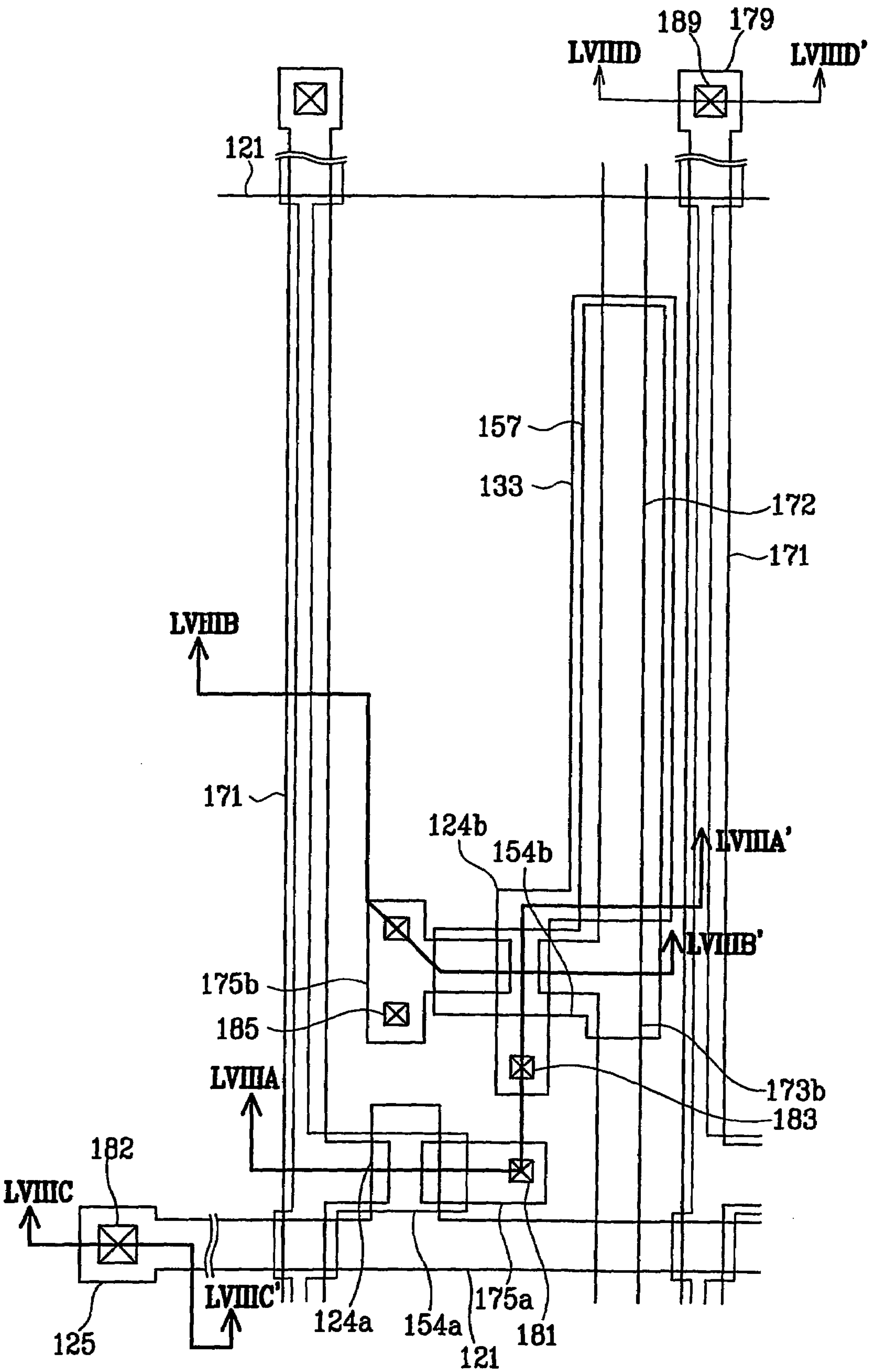
Figure 58A:
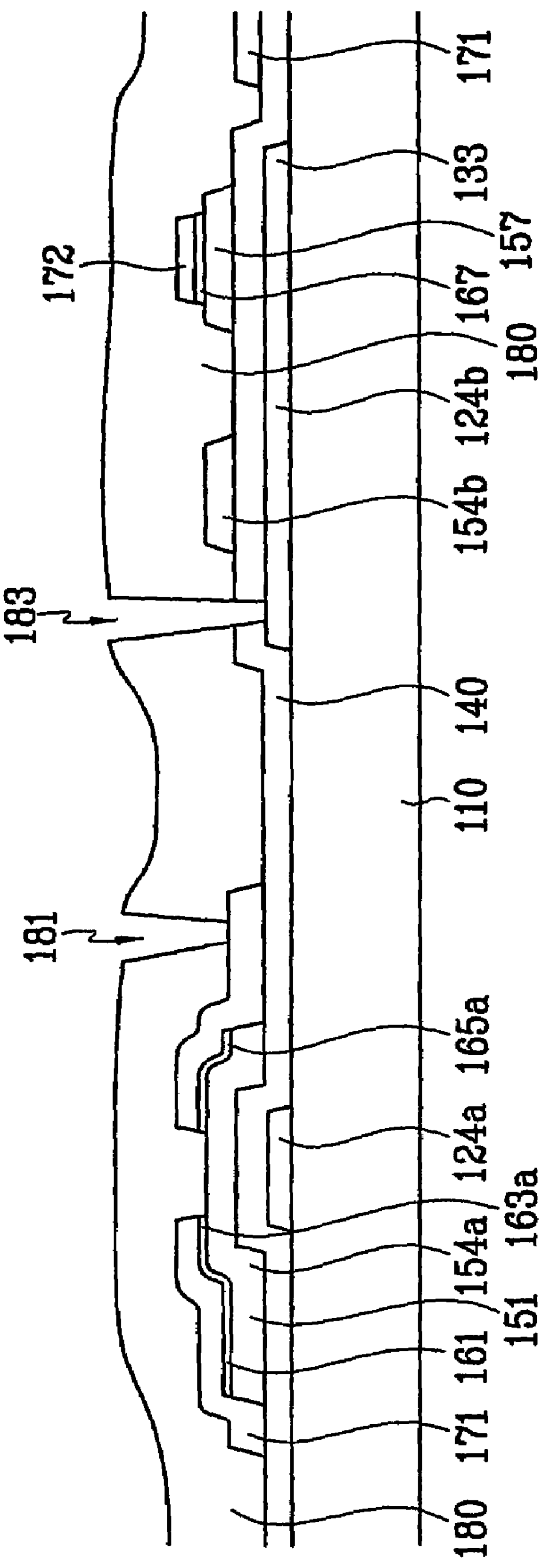
FIGS. 58A, 58B, 58C, and 58D are sectional views of the TFT array panel shown in FIG. 57 taken along the lines LVIIIa-LVIIIa', LVIIIb-LVIIIb', LVIIIc-LVIIIc', and LVIIId-LVIIId', respectively.
Figure 58B:
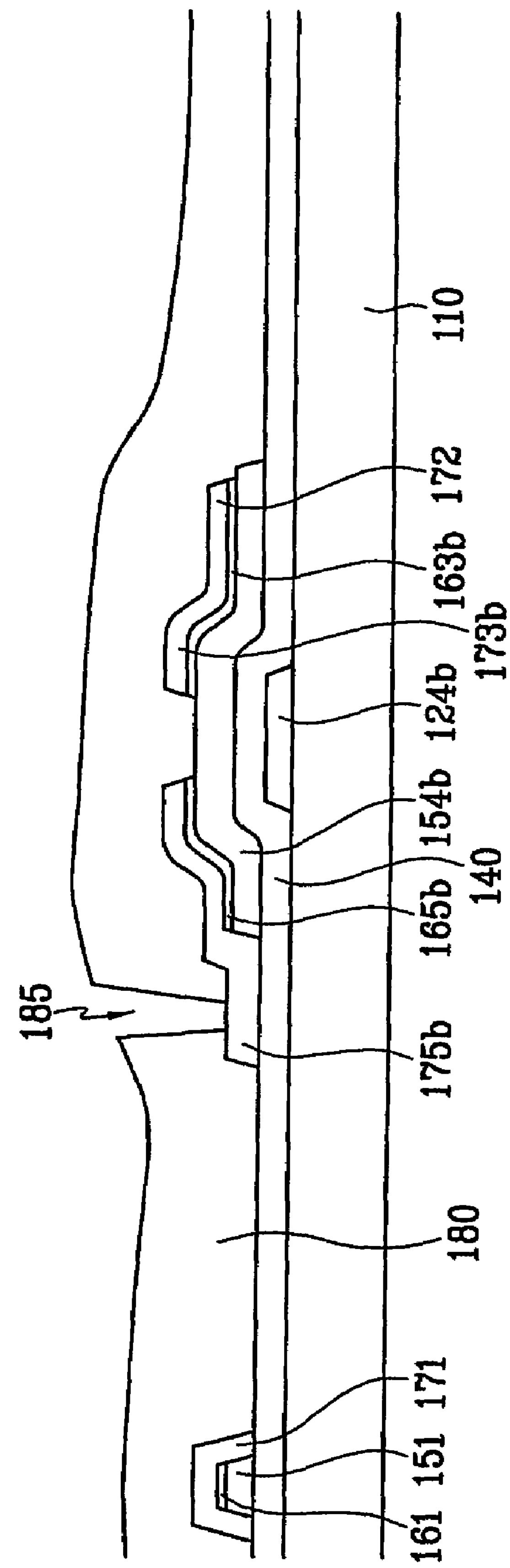
Figure 58C:
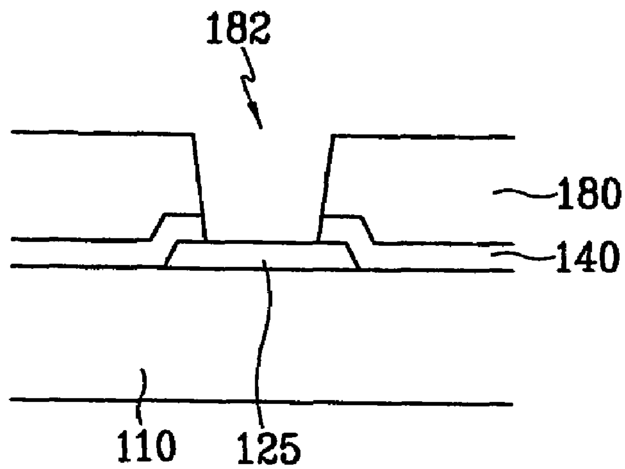
Figure 58D:
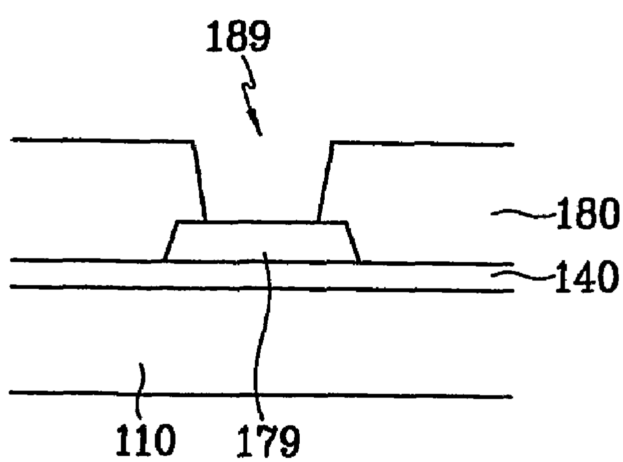

Next, as shown in FIGS. 57 to 58D, a passivation layer 180 is formed by coating an organic insulating material or depositing an inorganic insulating material. The passivation layer 180 is photo-etched to form a plurality of contact holes 189, 185, 183, 181, and 182. The contact holes 181, 182, 185, 183, and 189 expose the first and second drain electrodes 175*a* and 175*b*, the second gate electrodes 124*b*, the expansions 125 of the gate lines, and the expansions 179 of the data lines.

Figure 59:
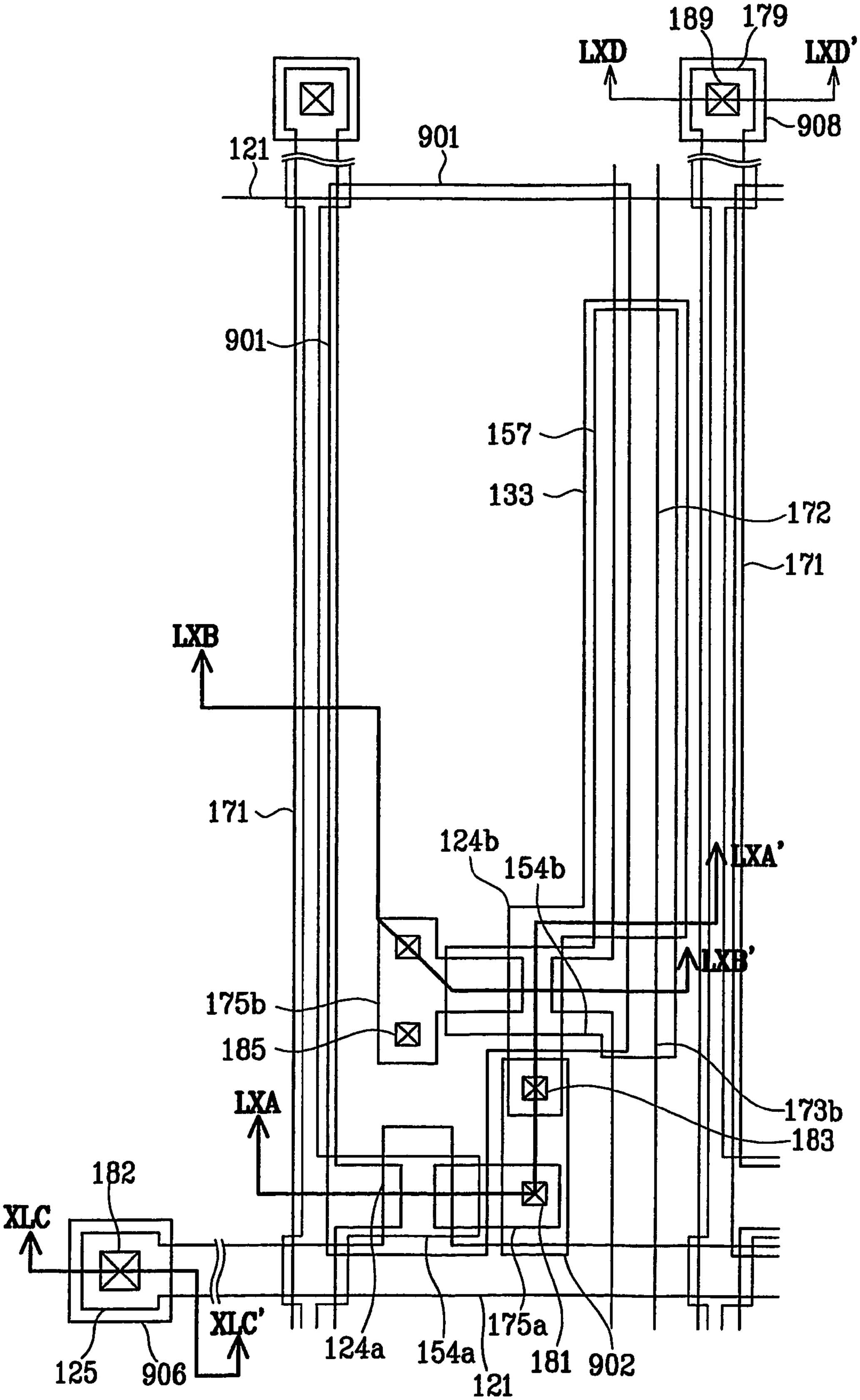
Figure 60A:
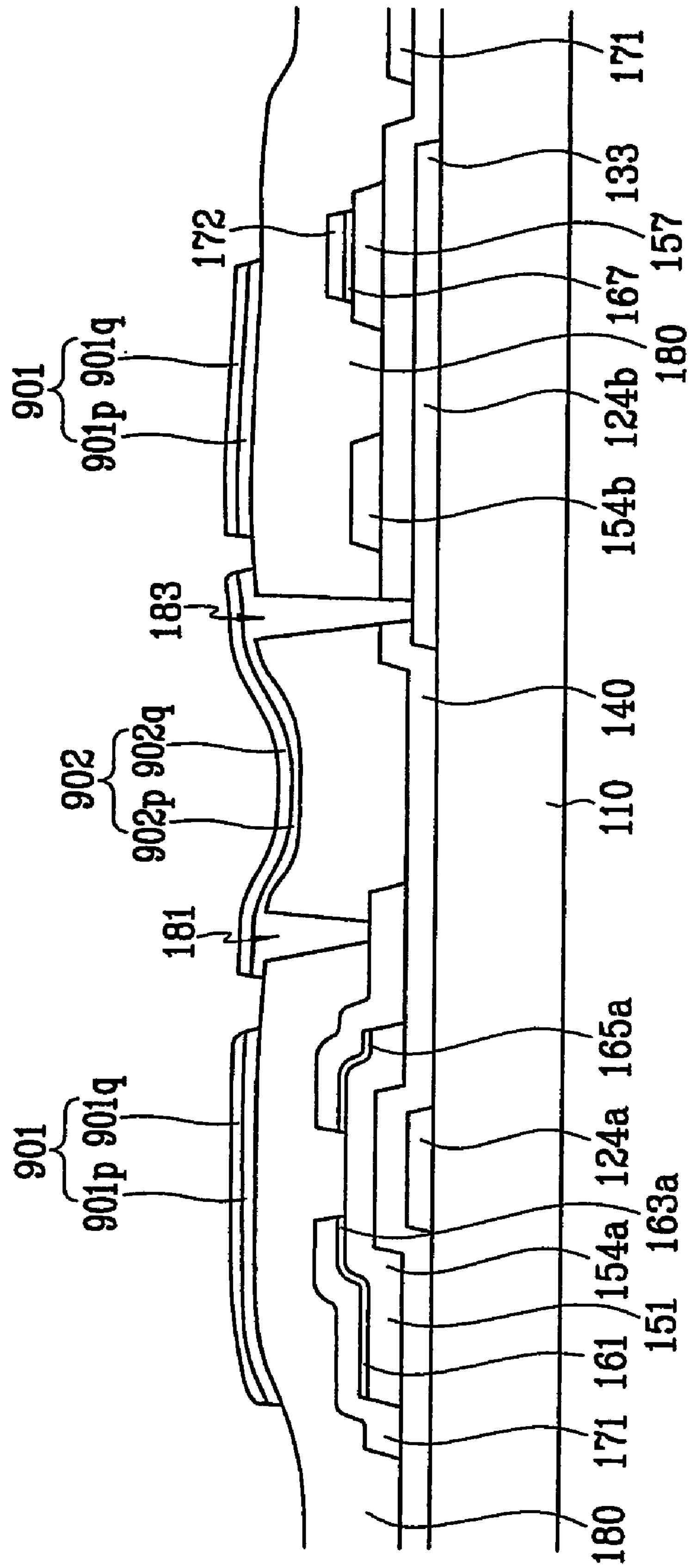
FIGS. 60A, 60B, 60C, and 60D are sectional views of the TFT array panel shown in FIG. 59 taken along the lines LXa-LXa', LXb-LXb', LXc-LXc', and LXd-LXd', respectively.
Figure 60B:
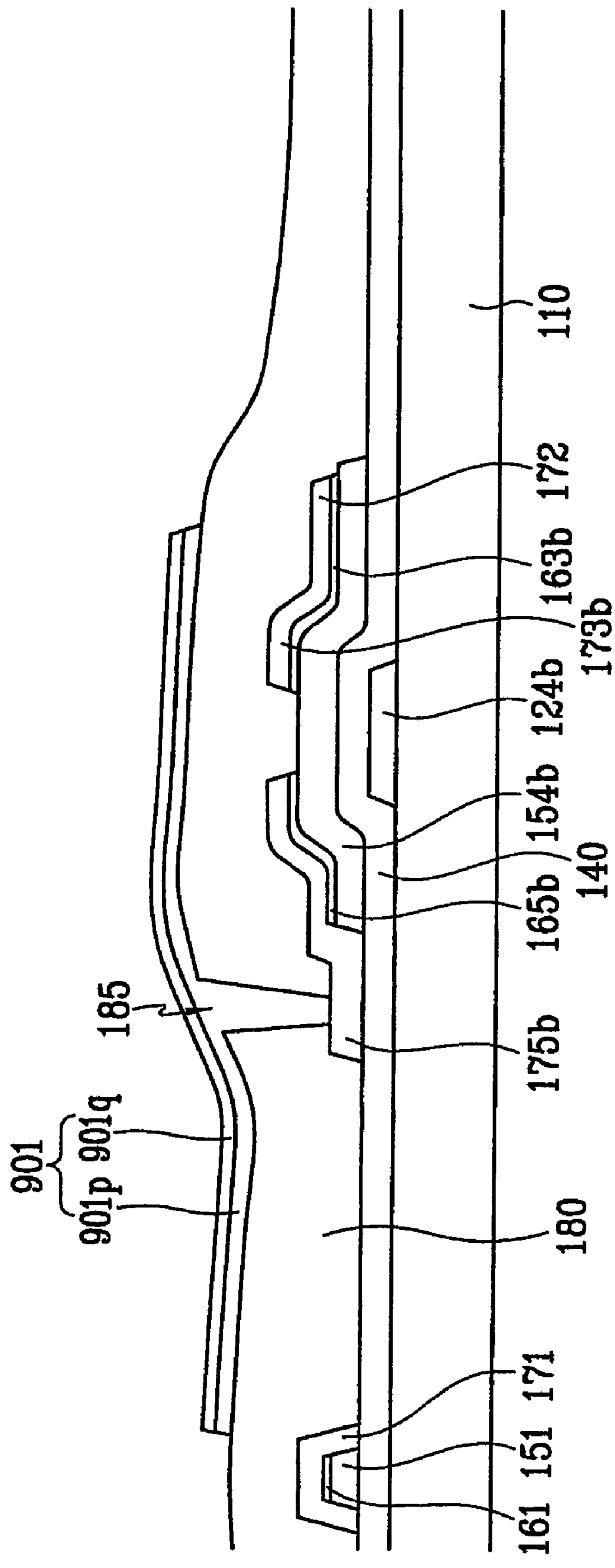
Figure 60C:
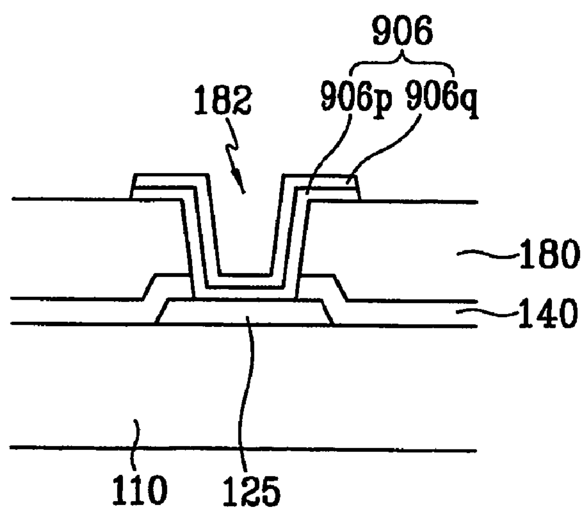
Figure 60D:
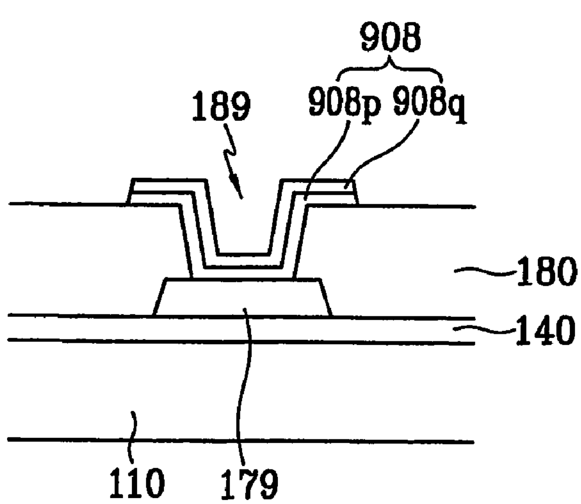

Next, as shown in FIGS. 59 to 60*d*, a plurality of pixel electrodes 901, a plurality of connection assistants 902, and a plurality of contact assistants 906 and 908 including double layers are formed by sputtering and photo-etching an lower layer 901*p*, 902*p*, 906*p*, and 908*p* of IZO and an upper layer 901*q*, 902*q*, 906*q*, and 908*q* of ITO.

Figure 61:
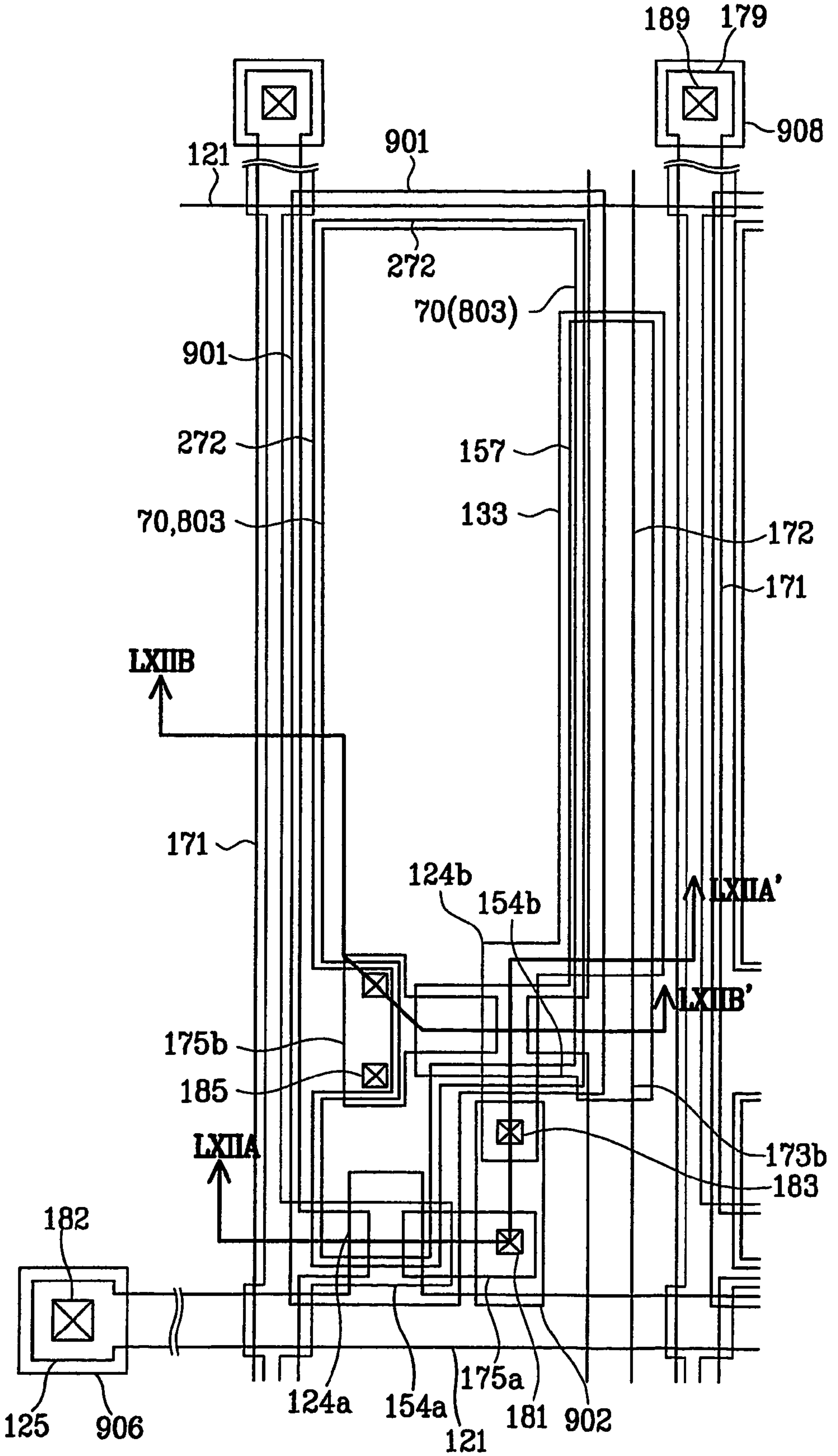
Figure 62A:
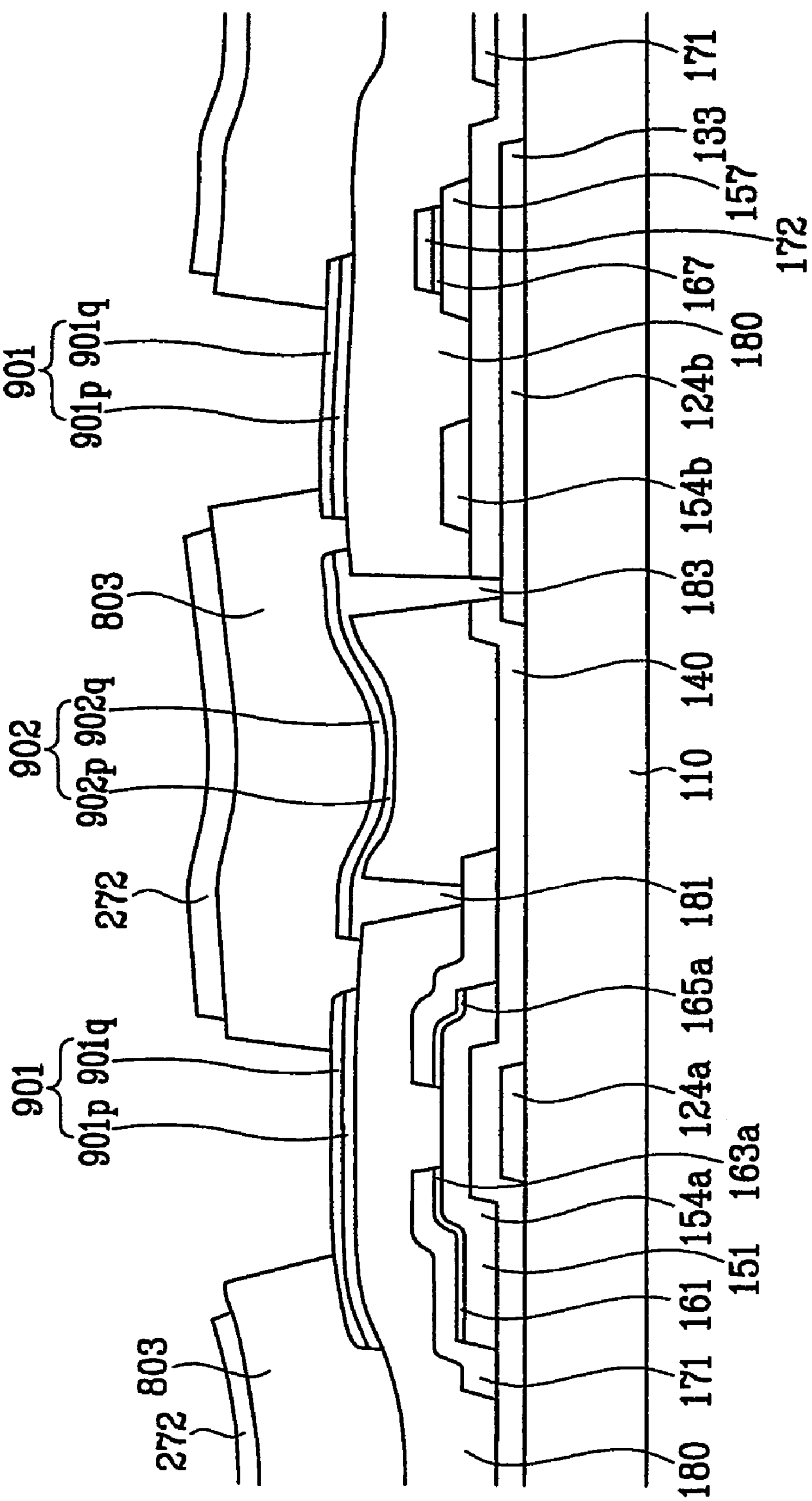
FIGS. 62A and 62B are sectional views of the TFT array panel shown in FIG. 61 taken along the line LXIIa-LXIIa' and the line LXIIb-LXIIb', respectively.
Figure 62B:
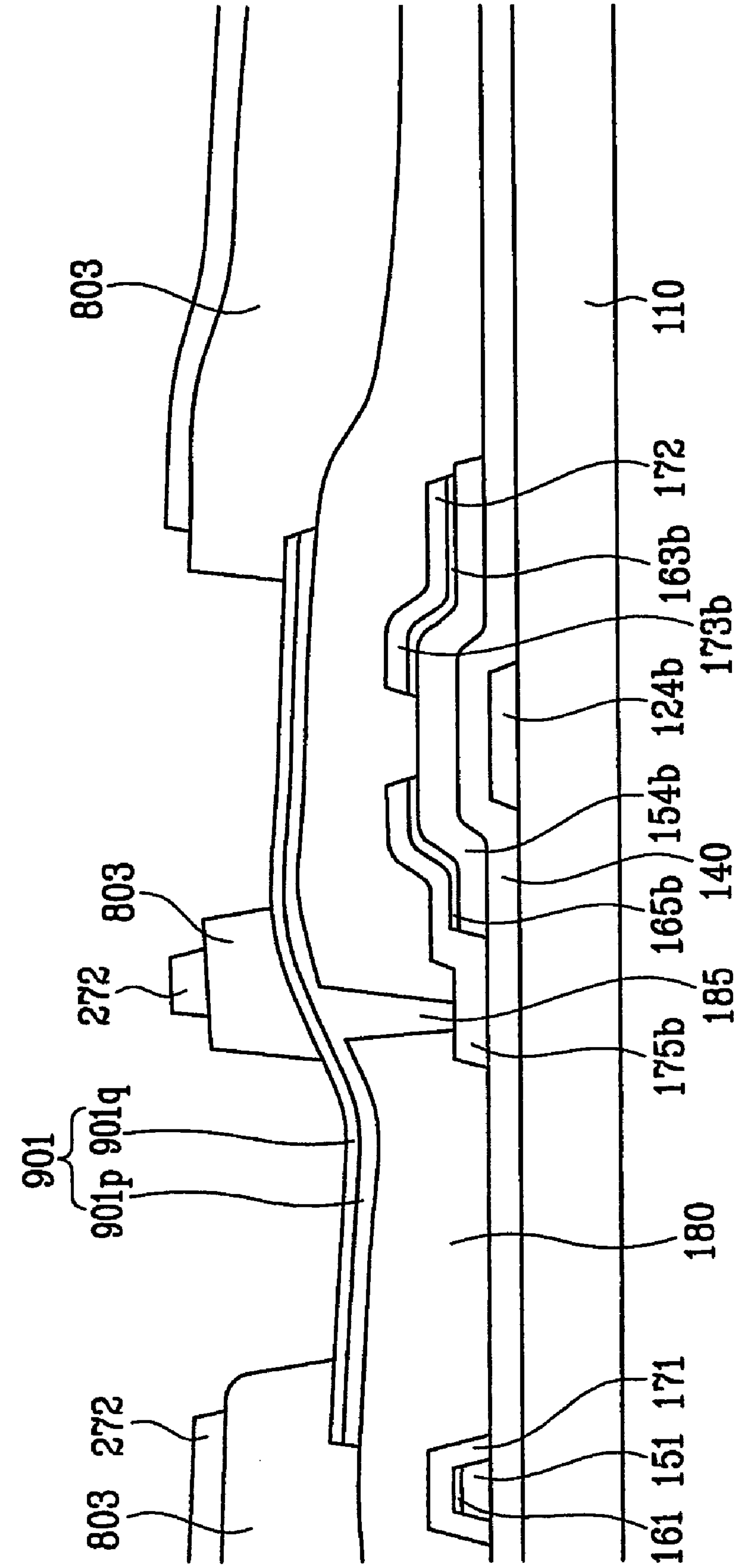

Next, as shown in FIGS. 61 to 62*b*, a partitioning wall 803 and a subsidiary electrode 272 are formed by a photo-etching process of using a photo-mask.

Next, as shown in FIGS. 46 to 48, a plurality of luminescence layers 70 and a common electrode 270 are formed.

An EL display may have pixel electrodes 901 and connection assistants 902 having single layered structure and ohmic contact assistants 906 and 908 having double layered structure. Such an EL display will be described.

Figure 63:
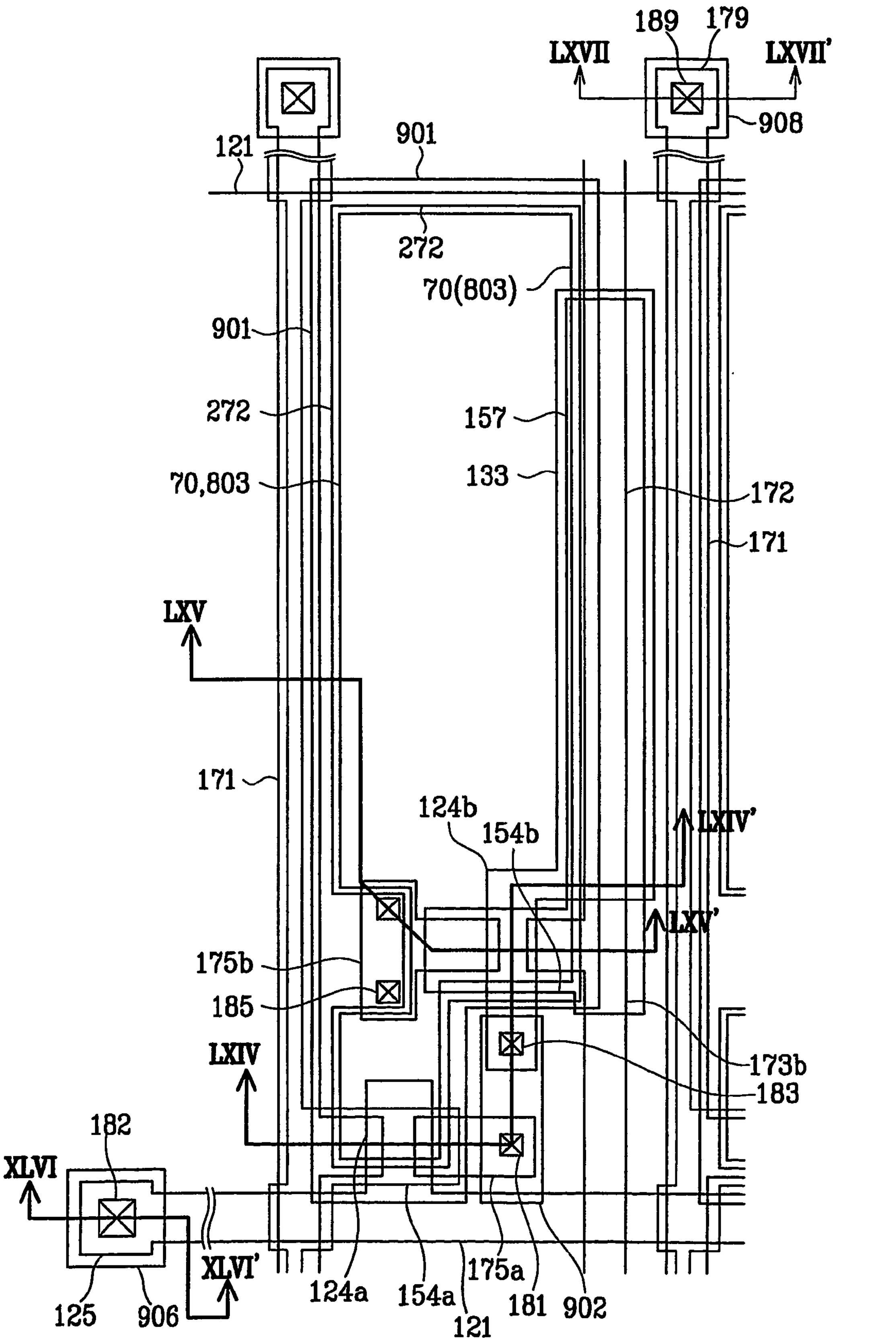
FIG. 63 is a layout view of a TFT array panel for an electro-luminescence ("EL") display according to another embodiment of the present invention.
Figure 64:
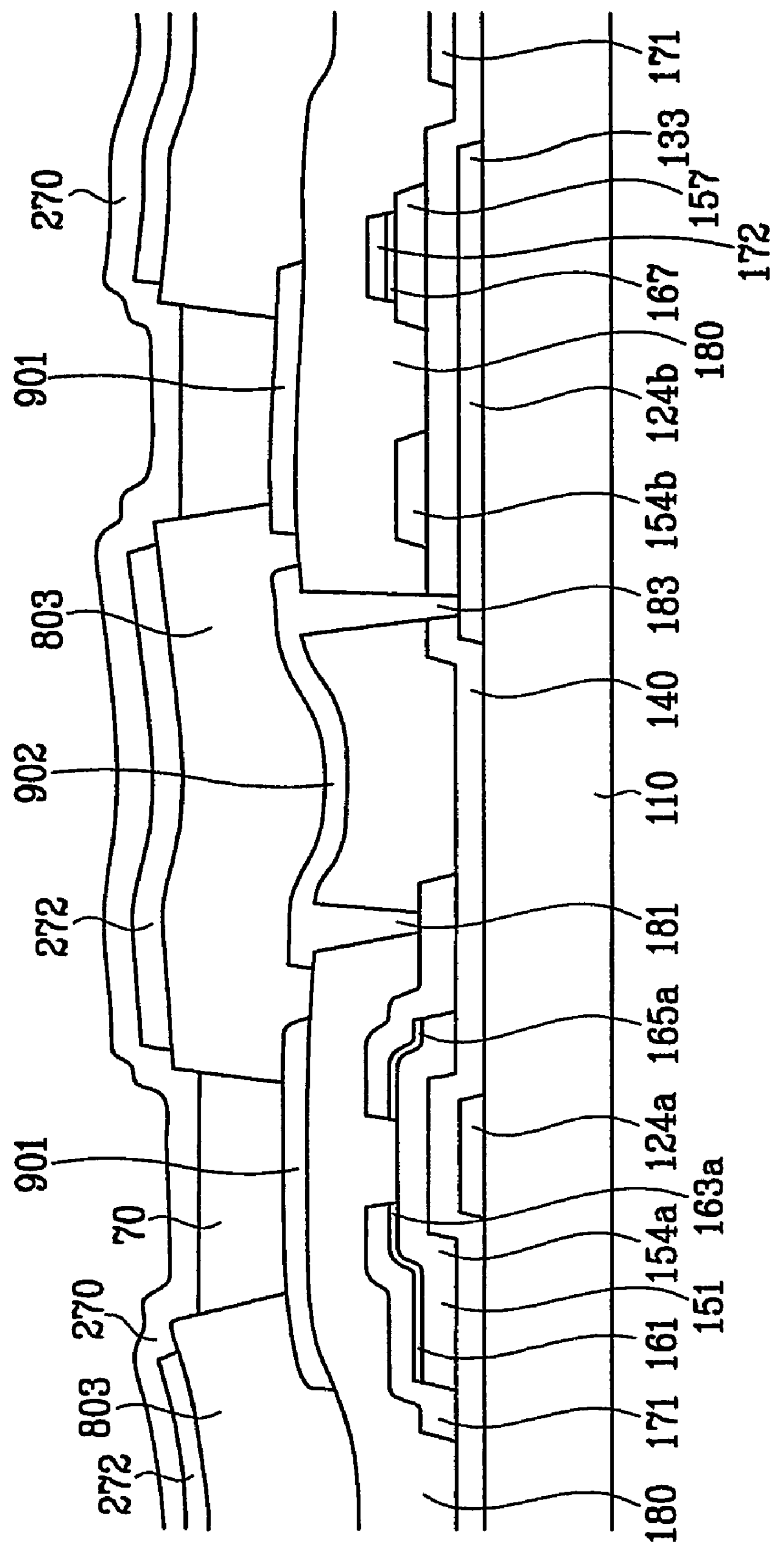
FIGS. 64 and 65 are sectional views of the TFT array panel shown in FIG. 63 taken along the line LXIV-LXIV' and the line LXV-LXV', respectively.
Figure 65:
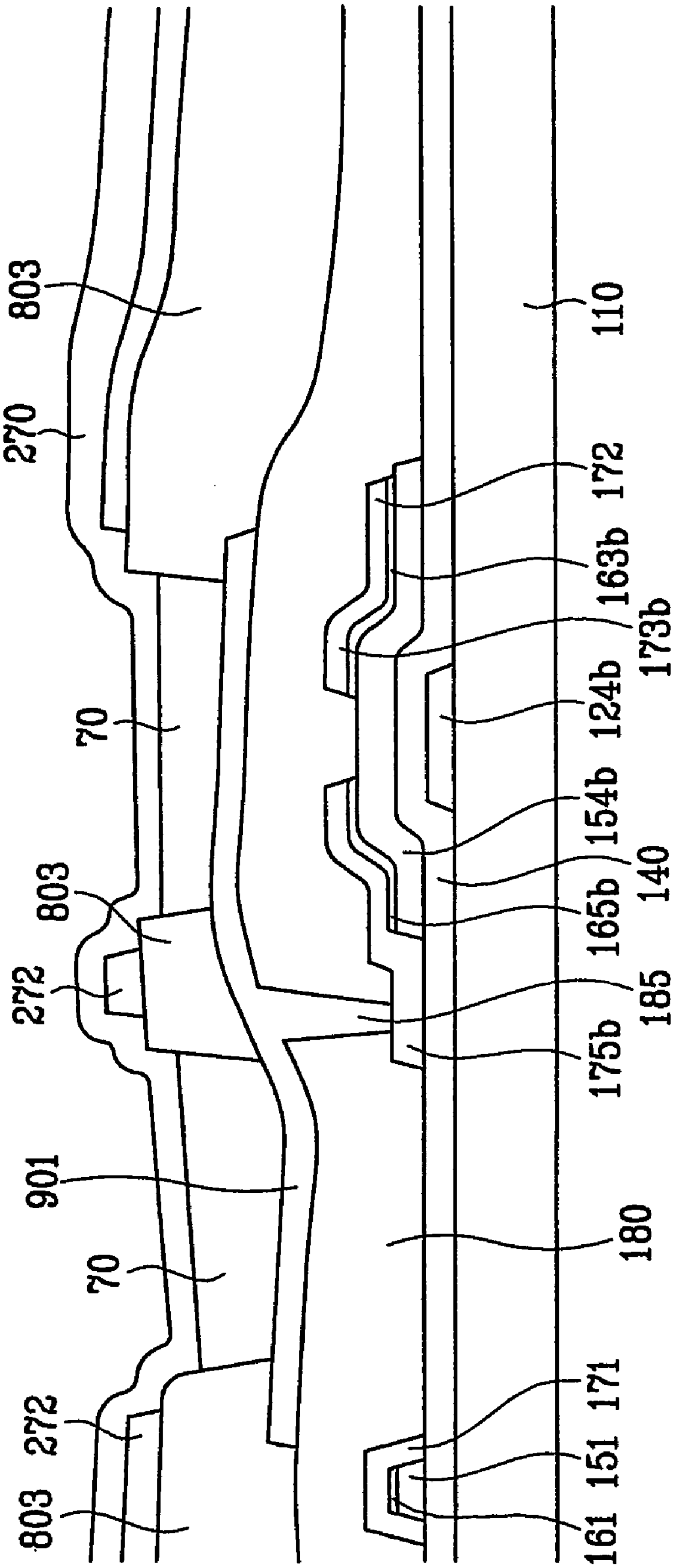
Figure 66:
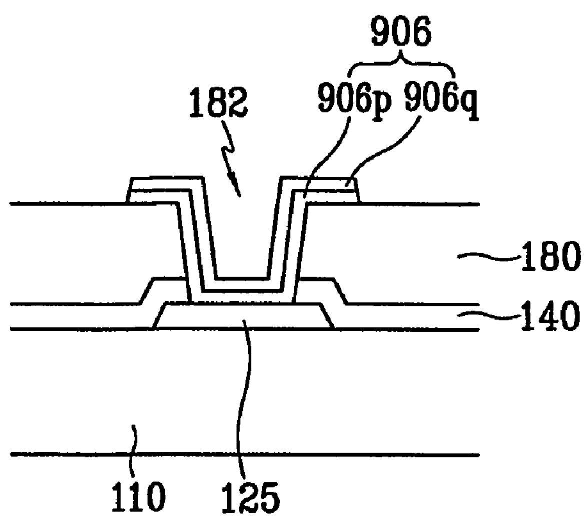
FIGS. 66 and 67 are sectional views of the TFT array panel shown in FIG. 63 taken along the line LXVI-LXVI' and the line LXVII-LXVII', respectively.
Figure 67:
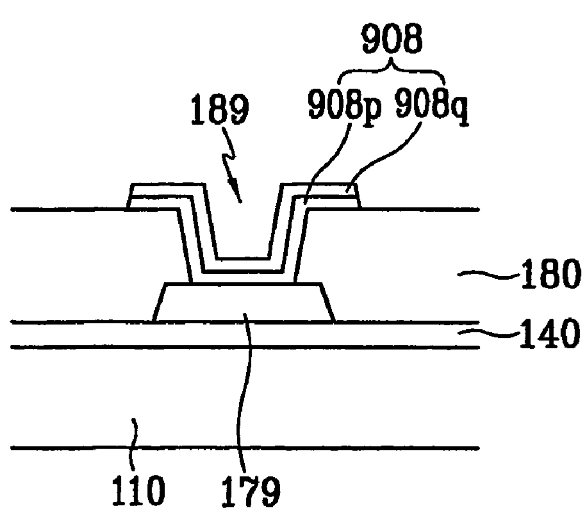

FIG. 63 is a layout view of a TFT array panel for an electro-luminescence ("EL") display according to another embodiment of the present invention. FIGS. 64 and 65 are sectional views of the TFT array panel shown in FIG. 63 taken along the line LXIV-LXIV' and the line LXV-LXV', respectively. FIGS. 66 and 67 are sectional views of the TFT array panel shown in FIG. 63 taken along the line LXVI-LXVI' and the line LXVII-LXVII', respectively.

When the present embodiment is compared with the embodiment of FIGS. 63 and 67, pixel electrodes 901 and connection assistants 902 formed of single layer are peculiar things of the present embodiment.

The EL display illustrated in FIGS. 63 to 67 has a plurality of pixel electrodes 901 and connection assistants 902 having a structure of single layer not double layers. Accordingly, the pixel electrodes 901 and connection assistants 902 have a structure of single layer made of ITO or IZO.

The pixel electrodes 901 are physically and electrically connected to the second drain electrodes 175*b* through the contact holes 185. The connection assistants 902 connect the first drain electrodes 175*a* and the second gate electrodes 124*b*. These features are the same with that the EL display illustrated in FIGS. 46 to 50.

As shown in FIGS. 66 and 67, the passivation layer 180 has a plurality of contact holes 182 and 189 exposing the expansions 125 of the gate lines and the expansions 179 of the data lines, respectively. The contact assistants 906 and 908 are connected to the exposed expansions 125 of the gate lines and the exposed expansions 179 of the data lines through the contact holes 182 and 189, respectively. The contact assistants 906 and 908 have double layers of lower films 906*p* and 908*p* and upper films 906*q* and 908*q*. Here, the lower films 906*p* and 908*p* are made of IZO and the upper films 906*q* and 908*q* are made of ITO.

The present invention can be applied to a TFT array panel using polysilicon as semiconductor of TFT.

A TFT array panel according to an embodiment of the present invention will be described in the below.

Figure 68:
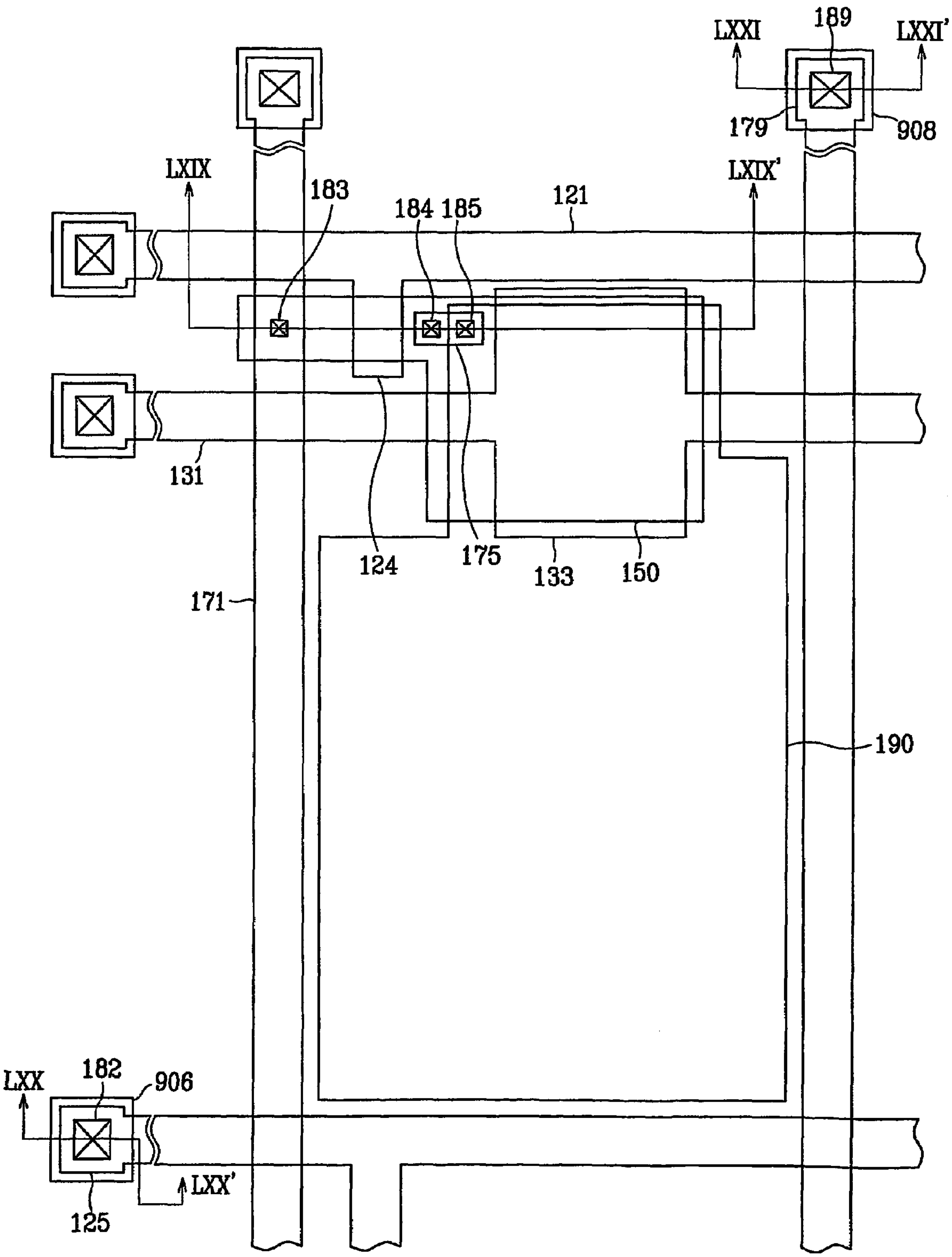
FIG. 68 is a layout view of a TFT array panel using polysilicon according to an embodiment of the present invention.
Figure 69:
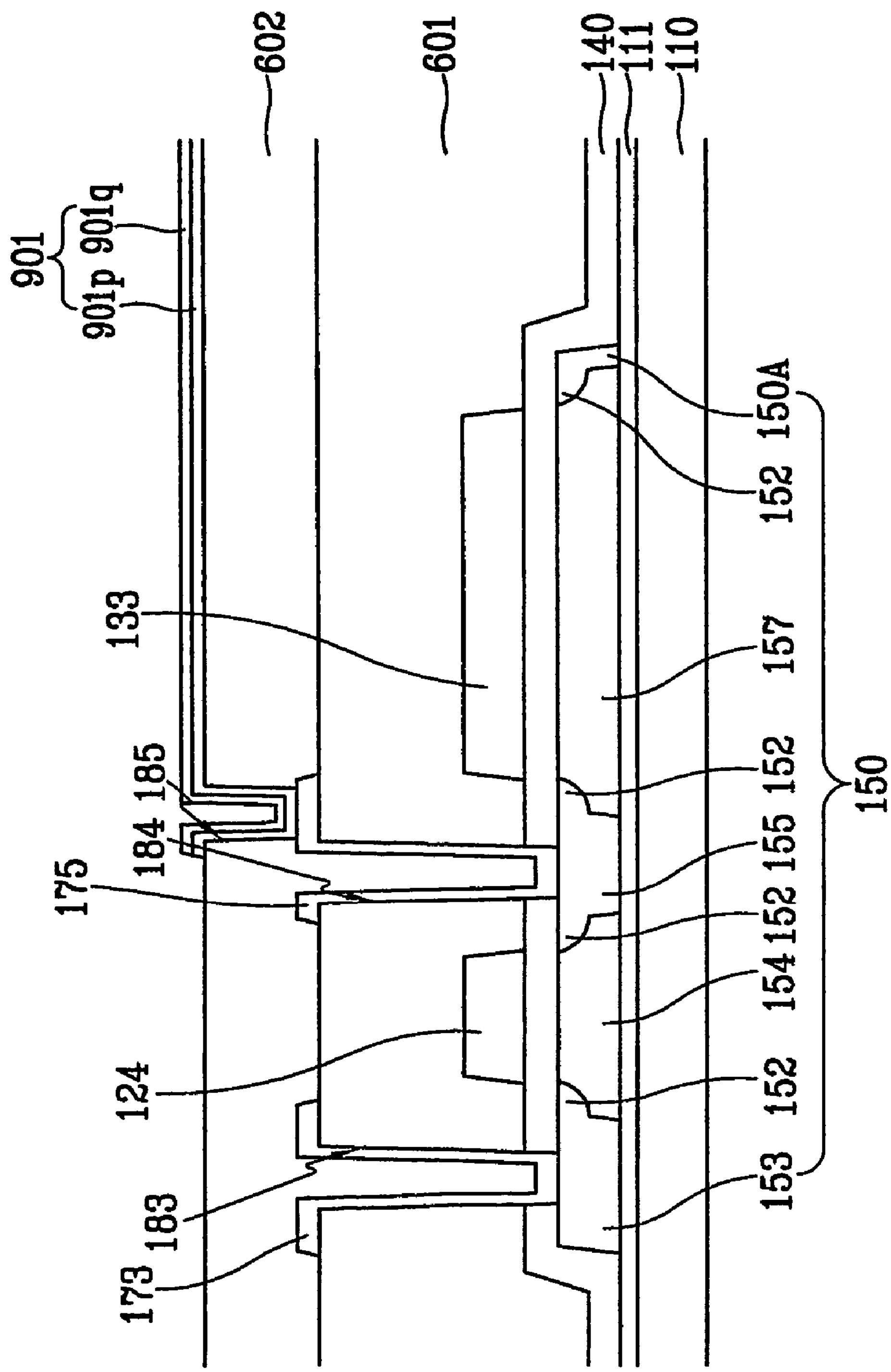
FIGS. 69, 70, and 71 are sectional views of the TFT array panel shown in FIG. 68 taken along the line LXIX-LXIX', the line LXX-LXX', and the line LXXI-LXXI', respectively.
Figure 70:
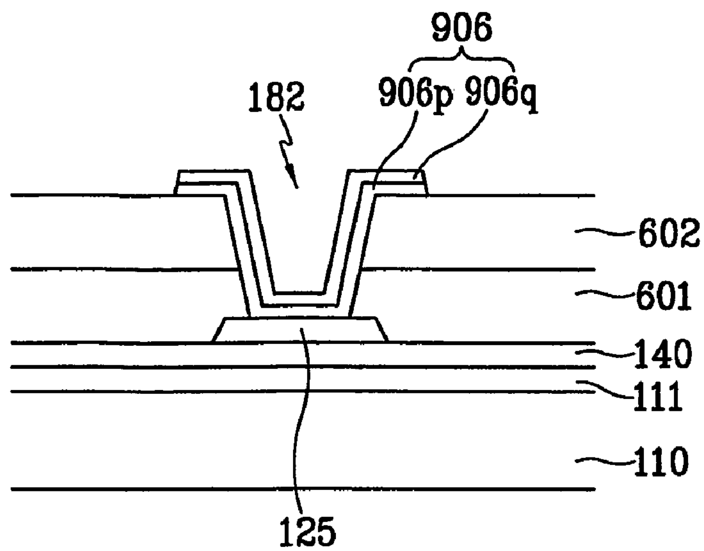
Figure 71:
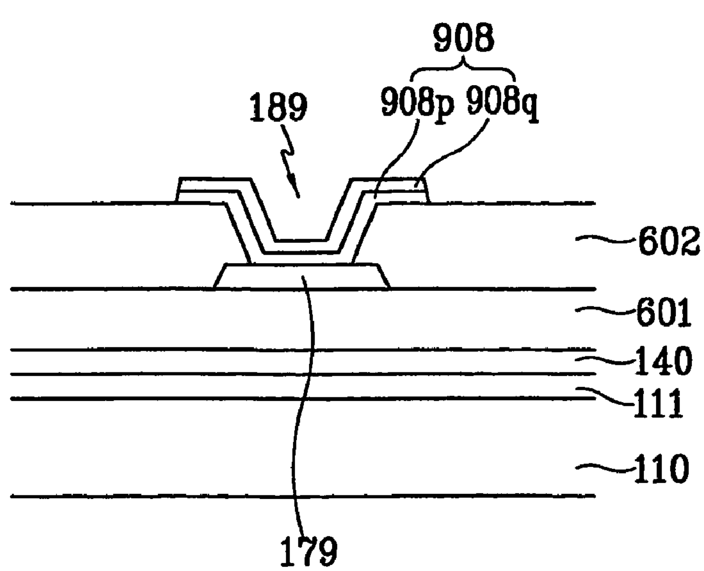

FIG. 68 is a layout view of a TFT array panel using polysilicon according to an embodiment of the present invention. FIGS. 69, 70, and 71 are sectional views of the TFT array panel shown in FIG. 68 taken along the line LXIX-LXIX', the line LXX-LXX', and the line LXXI-LXXI', respectively.

A blocking film 111 preferably made of silicon oxide ($SiO_2$) or silicon nitride (SiNx) is formed on a transparent insulating substrate 110.

A plurality of polysilicon layer 150 is formed on the blocking film 111. The polysilicon layer 150 includes a channel region 154, a source region 153, and a drain region 155.

The blocking layer 111 enhances adhesion between the insulating substrate 110 and the polysilicon layer 150 and blocks diffusion of conductive impurities which are included in the insulating substrate 110 to the polysilicon layer 150.

A gate insulating layer 140, preferably made of silicon nitride (SiNx), is formed on the polysilicon layer 150 and the blocking film 111.

A plurality of gate lines 121 extending in a direction are formed on the gate insulating layer 140. The gate lines 121 include a plurality of gate electrodes 124 protruding downward to overlap the channel regions 154 of the polysilicon layer 150. Lightly doped regions 152 are formed between the source region 153 and the channel region 154 and between the drain region 155 and the channel region 154.

A plurality of storage electrode lines 131 are formed on the same layer and of the same material with the gate lines 121. The storage electrode lines 131 are parallel with the gate lines 121.

Portions of the storage electrode lines 131, which are overlapping the polysilicon layer 150, are to be storage electrodes 133. The portions of the polysilicon layer 150 overlap the storage electrodes 133 are to be storage regions 157.

Each gate line 121 may have an expansion 125 to contact with an external circuit. That is, the expansion 125 of the gate line 121 is formed to assure contact with the external circuit. Accordingly, when the external circuit is fabricated on the substrate 110 and directly connected with the gate lines, the expansion 125 is not formed.

An interlayer insulating layer 601 is formed on the gate lines 121 and the storage electrode lines 131. The interlayer insulating layer 601 has a plurality of first and second contact holes 183 and 184 respectively exposing the source regions 153 and the drain regions 155.

A plurality of data lines 171 are formed on the interlayer insulating layer 601. The data lines 171 intersect the gate lines 121 to define pixel regions. Each data line 171 includes a plurality of source electrodes 173 connected to the source regions 153 through the first contact holes 183. The data lines 171 have expansions 179 for connection with an external circuit.

Drain electrodes 175 are formed on the same layer with the source electrodes 173 and are separated from the source electrodes 173. The drain electrodes 175 are connected to the drain regions 155 through the second contact holes 184.

A second interlayer insulating layer 602 is formed on the data conductors 171 and 175 and the first interlayer insulating layer 601. The second interlayer insulating layer 602 has a plurality of third contact holes 185 to expose the drain electrodes 175.

A plurality pixel electrodes 901 are formed on the second interlayer insulating layer 602.

The pixel electrodes 901 have double layers of a lower film 901*p* and an upper film 901*q*. Here, the lower film 901*p* is made of IZO and the upper film 901*q* is made of ITO.

As shown in FIGS. 70 and 71, a plurality of contact assistants 906 and 908 are formed on the expansions 125 of the gate lines 121 and the expansions 179 of the data lines 171.

The expansions 125 of the gate lines 121 are formed on the gate insulating layer 140 which are formed on the insulating substrate 110 and the blocking layer 111. The first and second interlayer insulating layer 601 and 602 are stacked on the expansions 125. The first and second interlayer insulating layer 601 and 602 have a plurality of fourth contact holes 182 exposing the expansions 125 of the gate lines 121. The contact assistants 906 contact with the expansions 125 of the gate lines 121 through the fourth contact holes 182.

The expansions 179 of the data lines 171 are formed on the first interlayer insulating layer 601 which are formed on the insulating substrate 110, the blocking layer 111, and the gate insulating layer 140. The second interlayer insulating layer 602 is formed on the expansions 179. The second interlayer insulating layer 602 has a plurality of fifth contact holes 189 exposing the expansions 179 of the data lines 171. The contact assistants 908 contact with the expansions 179 of the data lines 171 through the fifth contact holes 189.

The contact assistants 906 and 908 have double layers of lower films 906_p_ and 908_p_ and upper films 906_q_ and 908_q_. Here, the lower films 906_p_ and 908_p_ are made of IZO and the upper films 906_q_ and 908_q_ are made of ITO.

In the above described embodiment, all of the pixel electrodes 901 and contact assistants 906 and 908 have a structure of double layers. A polysilicon TFT panel may have pixel electrodes 901 having a structure of single layer or contact assistants 906 and 908 having a structure of double layers.

The contact assistants 906 which are formed on the expansions 125 of the gate lines 121 may not be omitted when the expansion 125 is not formed.

Although the illustrative embodiments have been described herein with reference to the accompanying drawings, it is to be understood that the present invention is not limited to those precise embodiments, and that various changes and modifications may be affected therein by one of ordinary skill in the related art without departing from the scope or spirit of the invention. All such changes and modifications are intended to be included within the scope of the invention as defined by the appended claims.

In the present invention, the pixel electrodes are formed to have double layers of IZO layer and ITO layer to avoid wires from getting damage by the ITO etchant and to prevent prove pins from having accumulation of foreign body during the gross test. In the present invention, the contact assistants may only be formed to have double layers of IZO layer and ITO layer to prevent prove pins from having accumulation of foreign body during the gross test. Since the consumption of ITO is reduced, manufacturing cost decreases.

What is claimed is:

1. A method of manufacturing a thin film transistor array panel comprising:

forming a gate line including a gate electrode on an insulating substrate;

forming a gate insulating layer coveting the gate line; forming a semiconductor on the gate insulating layer;

forming a data line including a source electrode and intersecting the gate line and a drain electrode separated from and opposite to the source electrode with respect to the gate electrode;

depositing a passivation layer;

patterning the passivation layer along with the gate insulating layer to form contact holes exposing an expansions of the gate line and the data line and the drain electrode;

depositing IZO layer and ITO layer in sequence; and photo-etching the IZO layer and ITO layer to form a pixel electrode and contact assistants respectively connected to the drain electrode and the expansions of the gate line and the data line, wherein the IZO layer and the ITO layer are etched by an IZO etchant containing HCl, $CH_3COOH$, deionized water, and a surfactant.

2. The method of claim 1, wherein the data line and the semiconductor are formed by a photo-etching process that use a photoresist pattern having a first portion, a second portion thicker than the first portion, and a third portion thinner than the first portion.

3. The method of claim 2, wherein the first portion is disposed on the region between the source electrode and the drain electrode and the second portion is disposed on the data line and the drain electrode.

4. A method of manufacturing a thin film transistor array panel comprising:

forming a gate line including a gate electrode on an insulating substrate;

forming a gate insulating layer covering the gate line;

forming a semiconductor on the gate insulating layer;

forming a data line including a source electrode and a drain electrode separated from and opposite to the source electrode on the gate insulating layer;

forming color filters on the data line using photoresist material including pigment of red, green, and blue, the color filter having a first opening exposing at least a portion of the drain electrode;

depositing a passivation layer on the color filter;

patterning the passivation layer to form a first contact hole within the first opening to expose at least a portion of the drain electrode; and forming a pixel electrode connected to the drain electrode via the first contact hole, wherein the step of forming the pixel electrode comprises depositing IZO layer and ITO layer in sequence and photo-etching the IZO layer and the ITO layer with an IZO etchant containing HCl, $CH_3COOH$, deionized water, and a surfactant.

5. The method of claim 4, further comprising a step of forming an interlayer insulating layer of silicon nitride or silicon oxide before the step of forming color filters.

6. A method of manufacturing a liquid crystal display comprising:

forming a gate line including a gate electrode on an first insulating substrate;

forming a gate insulating layer covering the gate line;

forming a semiconductor on the gate insulating layer;

forming a data line including a source electrode and a drain electrode separated from and opposite to the source electrode on the gate insulating layer;

forming a passivation layer having a first contact hole exposing the drain electrode, forming a pixel electrode connected to the drain electrode via the first contact hole and, contact assistants connecting the drain electrode and expansions of the gate line and the data line to an external circuit;

forming a common electrode on a second insulating substrate;

injecting liquid crystal material between the first substrate and the second substrate and sealing the liquid crystal material; and forming ITO layer on the contact assistants, wherein the ITO layer is etched by an IZO etchant containing HCl, $CH_3COOH$, deionized water, and a surfactant.

7. The method of claim 6, wherein the ITO layer is formed on the contact assistants by using a shadow mask having openings corresponding to the contact assistants.

8. The method of claim 6, wherein the ITO layer is formed on the contact assistants by evaporation.

9. The method of claim 6, wherein the evaporation is performed after all of the processes, assembling of the first substrate and the second substrate, injection of liquid crystal material, and cutting mother panels into cells.

10. A method of manufacturing a thin film transistor array panel comprising:

forming a first and second semiconductors made of polysilicon or amorphous silicon on an insulating substrate;

forming a gate line including a first gate electrode and a second gate electrode;

forming a gate insulating layer disposed between the first and second semiconductors and the first and second gate electrodes;

forming a first and second source electrodes, a data line, a first and second drain electrodes, and a power line on the gate insulating layer;

forming an interlayer insulating layer covering the first and second source electrodes, the data line, the first and second drain electrodes, and the power, forming a pixel electrode connected to the second drain electrode and contact assistants connected to expansions of the gate line and the data line on the interlayer insulating layer;

forming a partitioning wall having an opening for exposing the pixel electrode;

forming a subsidiary electrode on the partitioning wall;

forming an organic luminescence layer on the pixel electrode to fill the opening of the partitioning wall; and forming a common electrode on the subsidiary electrode and the organic luminescence layer, wherein the contact assistants have a structure of double layer including IZO layer and ITO layer, wherein the ITO layer and the ITO layer are etched by an IZO etchant containing HCl, $CH_3COOH$, deionized water, and a surfactant.

11. The method of claim 10, wherein the ITO layer is disposed on the IZO layer.

12. The method of claim 11, wherein the pixel electrode has a structure of double layers including IZO layer and ITO layer.

13. The method of claim 12 the ITO layer of the pixel electrode is disposed on the IZO layer of the pixel electrode.

* * * * *